US011049985B2

(12) United States Patent
Choi

(10) Patent No.: US 11,049,985 B2
(45) Date of Patent: *Jun. 29, 2021

(54) PHOTO DETECTION DEVICE USING RESONANCE AND RELATED METHOD

(71) Applicant: U.S. Army Research Laboratory ATTN: RDRL-LOC-I, Adelphi, MD (US)

(72) Inventor: Kwong-Kit Choi, Brookeville, MD (US)

(73) Assignee: The United States of America as represented by the Secretary of the Army, Washington, DC (US)

(*) Notice: Subject to any disclaimer, the term of this patent is extended or adjusted under 35 U.S.C. 154(b) by 0 days.

This patent is subject to a terminal disclaimer.

(21) Appl. No.: 15/856,632

(22) Filed: Dec. 28, 2017

(65) Prior Publication Data
US 2018/0138330 A1    May 17, 2018

Related U.S. Application Data

(63) Continuation-in-part of application No. 15/612,675, filed on Jun. 2, 2017, which is a continuation-in-part (Continued)

(51) Int. Cl.
*H01L 31/0232* (2014.01)
*H01L 31/0352* (2006.01)
(Continued)

(52) U.S. Cl.
CPC ........ *H01L 31/02327* (2013.01); *G06F 30/20* (2020.01); *G06F 30/23* (2020.01);
(Continued)

(58) Field of Classification Search
None
See application file for complete search history.

(56) References Cited

U.S. PATENT DOCUMENTS 9,679,091 B2 *   6/2017   Choi ................... G06F 17/5045

\* cited by examiner

*Primary Examiner* — Robert K Carpenter
(74) *Attorney, Agent, or Firm* — Alan I. Kalb

(57) ABSTRACT

A photo detection device comprising a contact layer through which light enters; an absorbing region positioned such that light admitted through the contact layer passes into the absorbing region; at least one diffractive element operatively associated with the absorbing region operating to diffract light into the absorbing region; the configuration of the at least one diffractive element being determined by computer simulation to determine an optimal diffractive element (or elements) and absorbing region configuration for optimal quantum efficiency for at least one predetermined wavelength detection range, the at least one diffractive element operating to diffract light entering through the contact layer such that phases of diffracted waves from locations within the photo detection device or waves reflected by sidewalls and waves reflected by the at least one diffractive element form a constructive interference pattern inside the absorbing region. A method of designing a photodetector comprises using a computer simulation to determine an optimal configuration for at least one wavelength range occurring when waves reflected by the diffractive element form a constructive interference pattern inside the absorbing region.

16 Claims, 129 Drawing Sheets
(22 of 129 Drawing Sheet(s) Filed in Color)

Related U.S. Application Data of application No. 13/745,338, filed on Jan. 18, 2013, now Pat. No. 9,679,091, which is a continuation-in-part of application No. 13/240,125, filed on Sep. 22, 2011, now Pat. No. 8,704,209, which is a continuation-in-part of application No. 13/082,945, filed on Apr. 8, 2011, now abandoned, which is a continuation-in-part of application No. 12/543,121, filed on Aug. 18, 2009, now abandoned.

(51) Int. Cl.

| | | |
|---|---|---|
| *H01L 51/44* | (2006.01) | |
| *H01L 31/103* | (2006.01) | |
| *H01L 51/42* | (2006.01) | |
| *H01L 31/101* | (2006.01) | |
| *H01L 31/0296* | (2006.01) | |
| *H01L 31/032* | (2006.01) | |
| *H01L 27/144* | (2006.01) | |
| *H01L 31/0216* | (2014.01) | |
| *H01L 31/0304* | (2006.01) | |
| *G06F 30/20* | (2020.01) | |
| *G06F 30/23* | (2020.01) | |
| *G06F 30/39* | (2020.01) | |
| *H01L 31/0256* | (2006.01) | |
| *H01L 51/00* | (2006.01) | |

(52) U.S. Cl.
CPC .......... *G06F 30/39* (2020.01); *H01L 27/1446* (2013.01); *H01L 31/0296* (2013.01); *H01L 31/02168* (2013.01); *H01L 31/02966* (2013.01); *H01L 31/0324* (2013.01); *H01L 31/03046* (2013.01); *H01L 31/035218* (2013.01); *H01L 31/035236* (2013.01); *H01L 31/035281* (2013.01); *H01L 31/103* (2013.01); *H01L 31/1013* (2013.01); *H01L 31/1037* (2013.01); *H01L 51/4213* (2013.01); *H01L 51/44* (2013.01); *H01L 51/447* (2013.01); *H01L 31/0304* (2013.01); *H01L 51/0046* (2013.01); *H01L 51/426* (2013.01); *H01L 2031/0344* (2013.01); *Y02E 10/544* (2013.01); *Y02E 10/549* (2013.01)

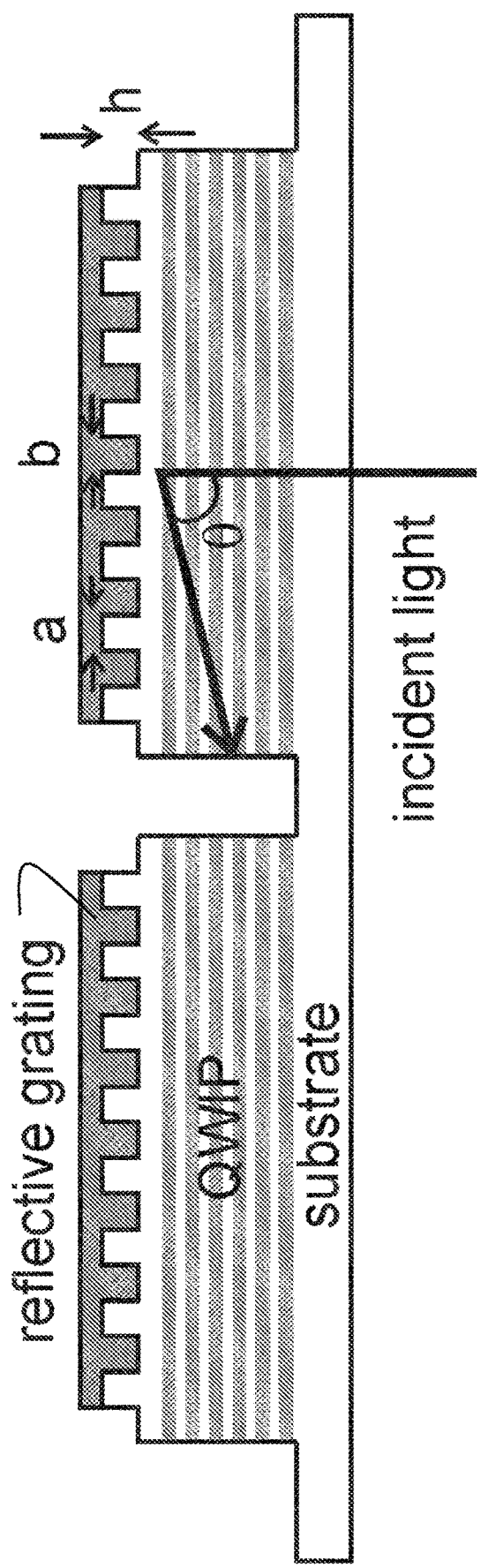
Fig.1 Grated coupled QWIP (PRIOR ART)

Schematic C-QWIP geometry with period p and common contact layer $t_g$. Wave interference is depicted for two C-QWIP pixels shown in cross-section.

The contour pattern shows the $E_z$ distribution of the optical field.

The contour pattern shows the $E_z$ distribution of the optical field.

Geometry of a PR-QWIP with an air cover and AR substrate coating. The $E_z$ distribution is shown at $\lambda = 9.0$ μm.

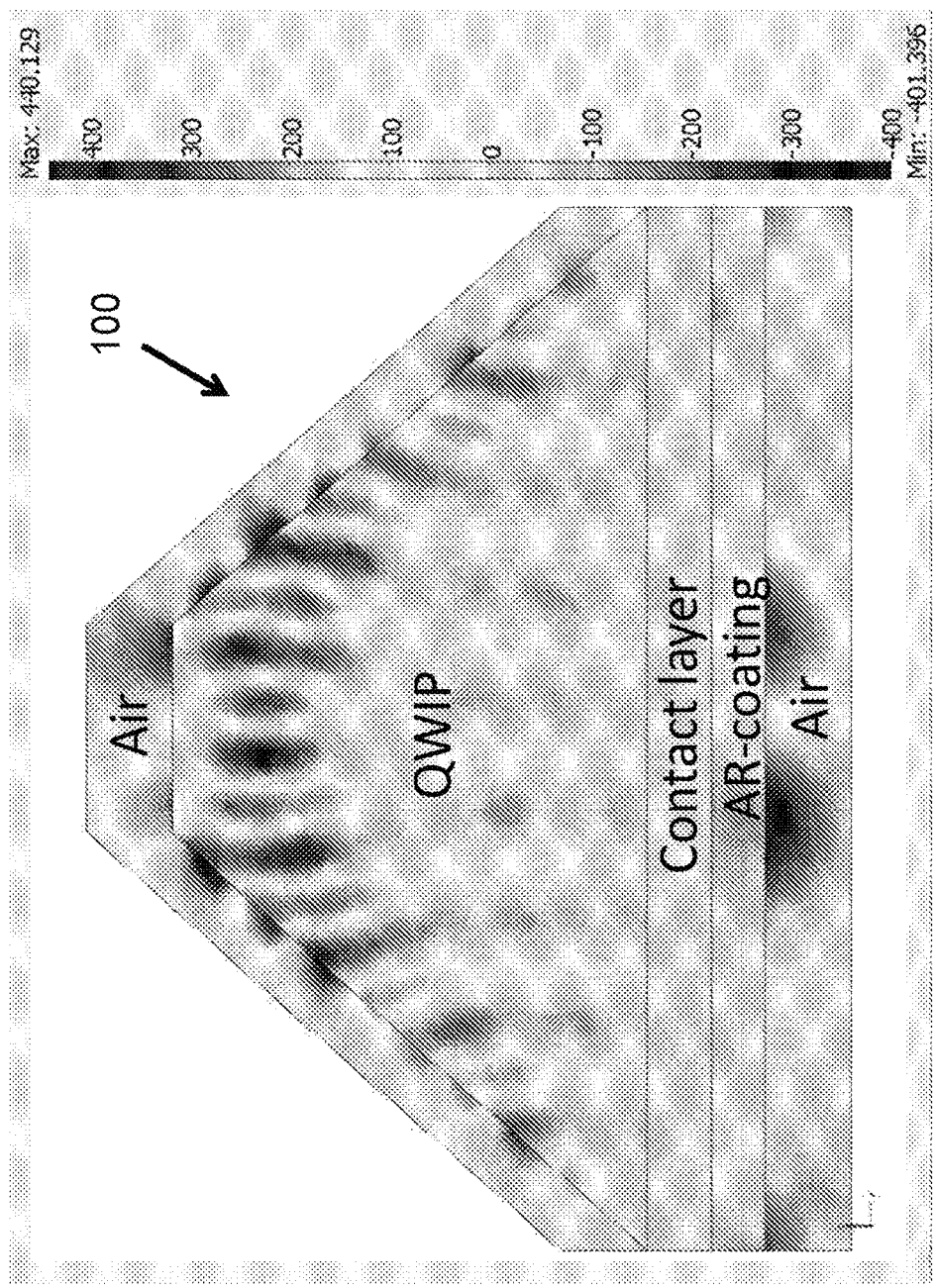
FIG. 6B  Cross-section of $E_z$ distribution at $\lambda = 9.0$ μm for a PR-QWIP with air cover and AR substrate coating.

External unpolarized QE (for unity pixel fill factor) of a PR-QWIP (PRISM) for different pixel geometries.

External unpolarized QE (for unity pixel fill factor) of a PY-QWIP (Pyramid) for different pixel geometries.

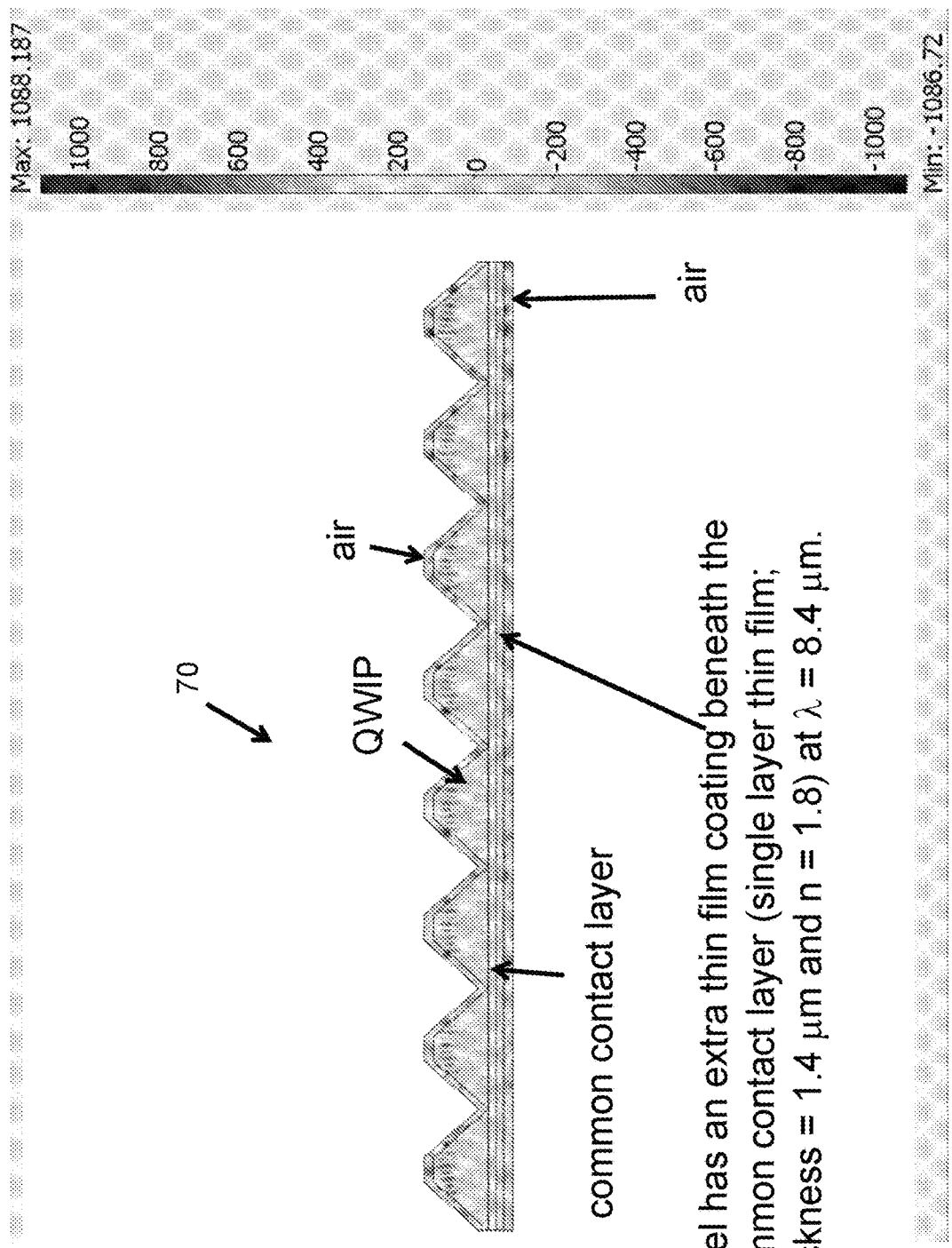
FIG. 8 $E_z$ distribution in PR-QWIPs with air cover.

Average magnification factor $M \equiv I_z/I_{inc}$ inside the C-QWIP with a thin film coating as a function of $\lambda$.

Average magnification factor $M \equiv I_z/I_{inc}$ inside the PR-QWIP with reflecting layers and 36 μm common contact layer.

QE of a PR-QWIP without a 9 μm AR-coating.

FIG. 11  QE of a PR-QWIP with a 9 μm AR-coating.

The geometry of a PY-QWIP with air cover and AR substrate coating. The $E_z$ distribution is shown at $\lambda = 9.0$ μm.

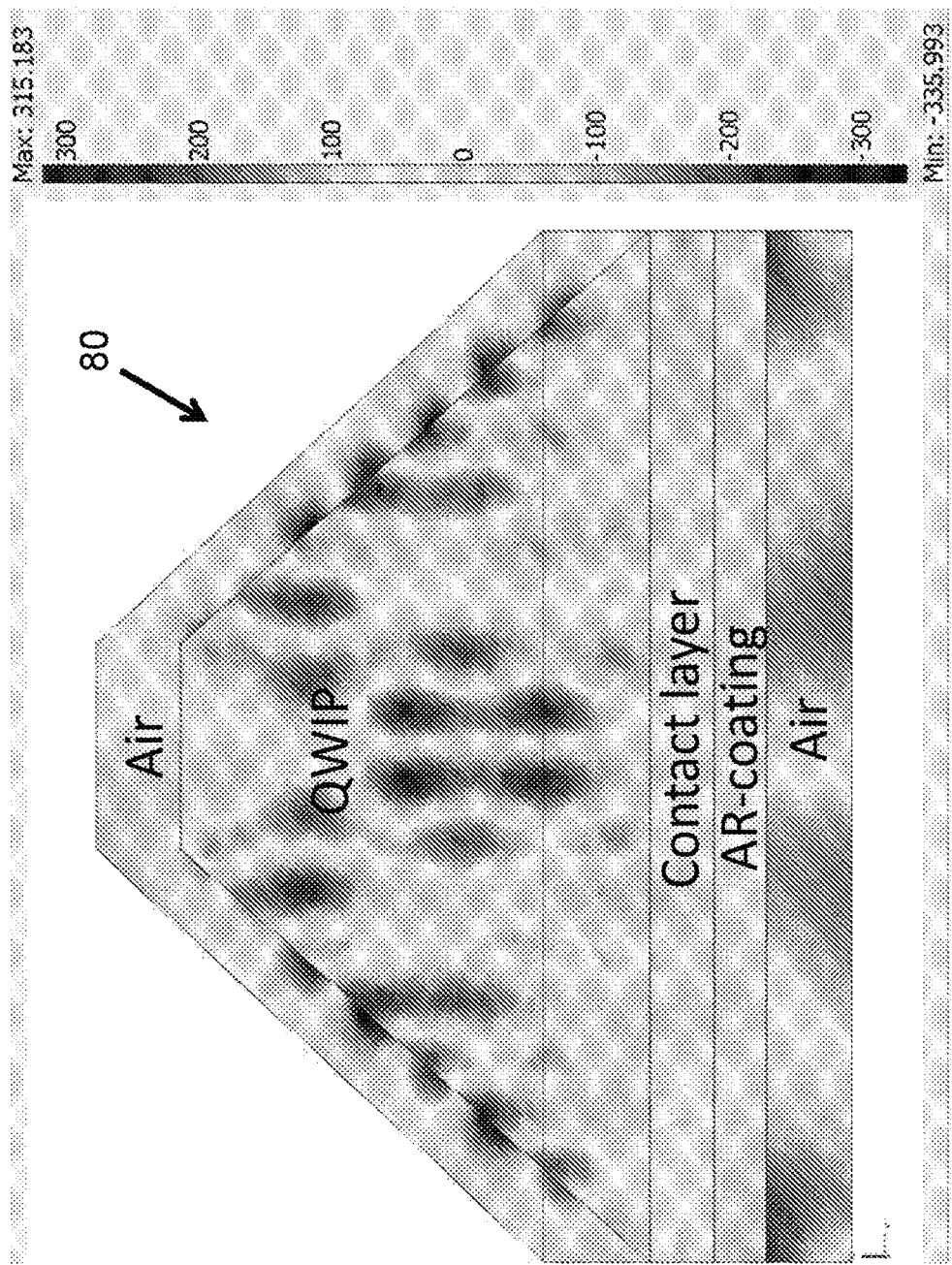
FIG. 13   Cross-section $E_z$ distribution at $\lambda = 9.0\ \mu m$ of the embodiment of FIG. 12.

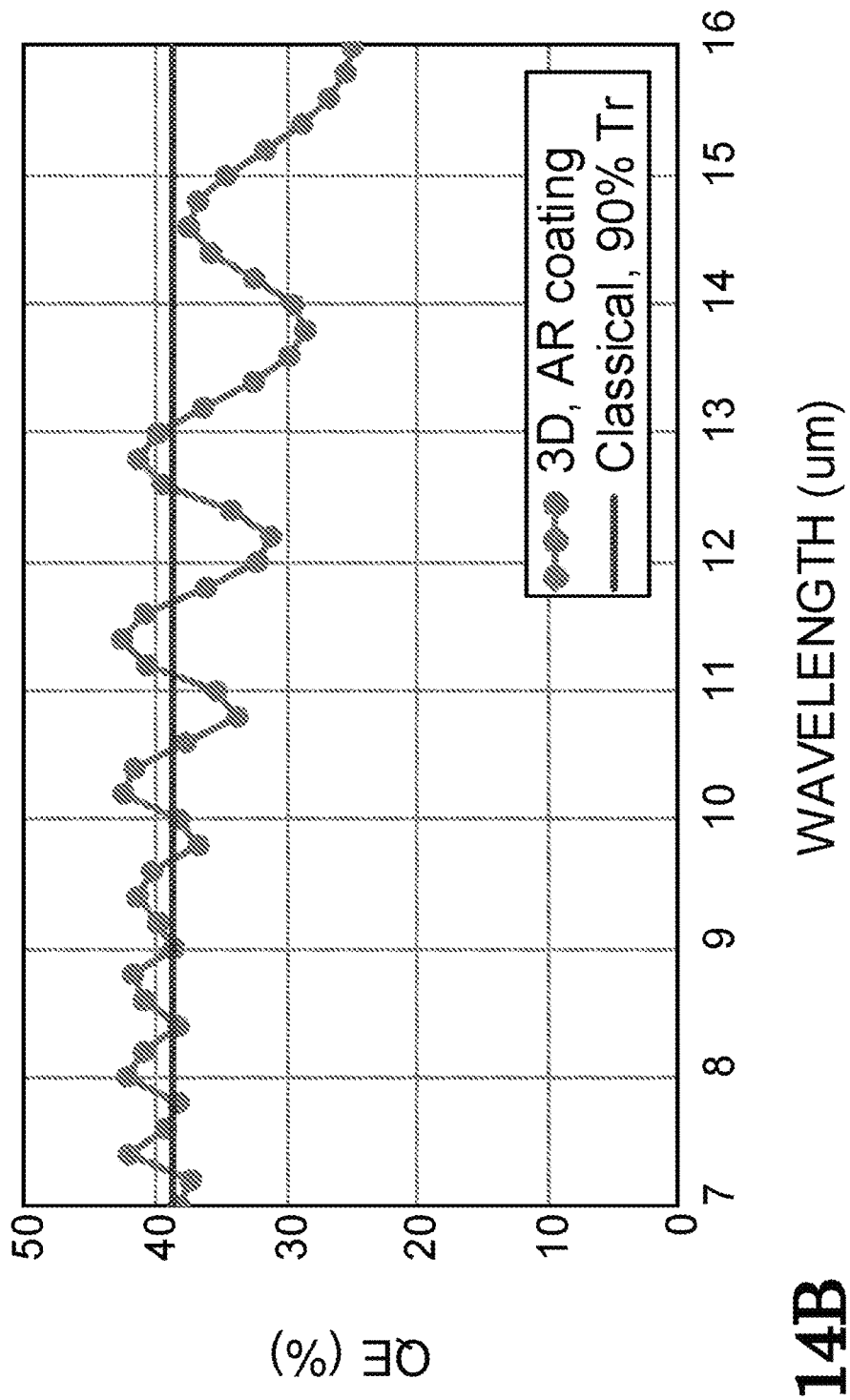
FIG. 14B QE of a PY-QWIP with a 9 μm AR-coating.

FIG. 15A illustrates the 3-D geometry of a CC-QWIP with air cover and AR substrate coating. The $E_z$ distribution is shown at $\lambda = 9.0$ μm.

FIG. 15 B illustrates in cross section of FIG. 15A illustrating the $E_z$ distribution at $\lambda = 9.0$ μm.

The QE of a CC-QWIP with and without a 9 μm AR-coating.

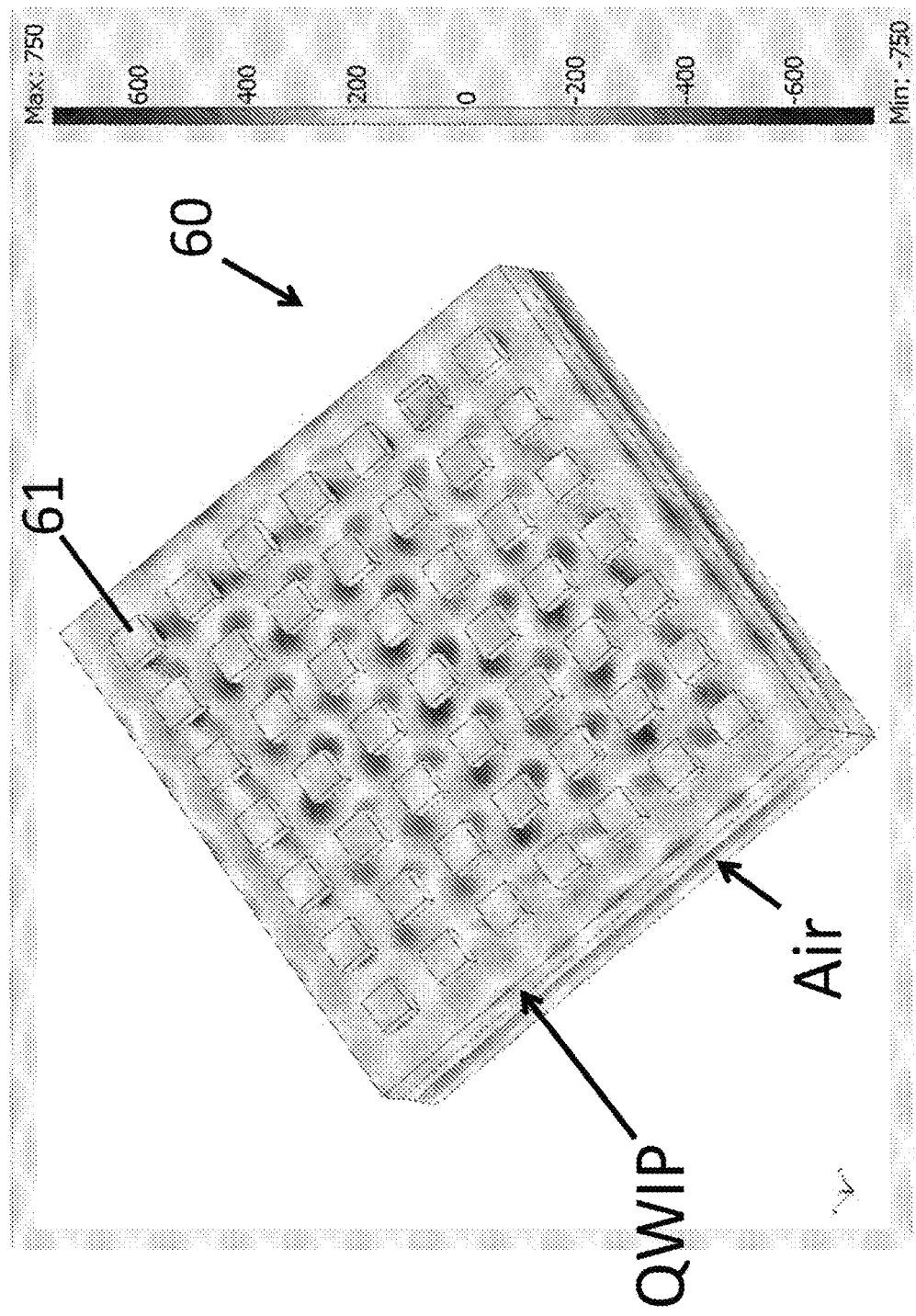
FIG. 17A illustrates the 3D geometry of a GR-QWIP with the $E_z$ distribution shown at $\lambda = 9.7$ μm.

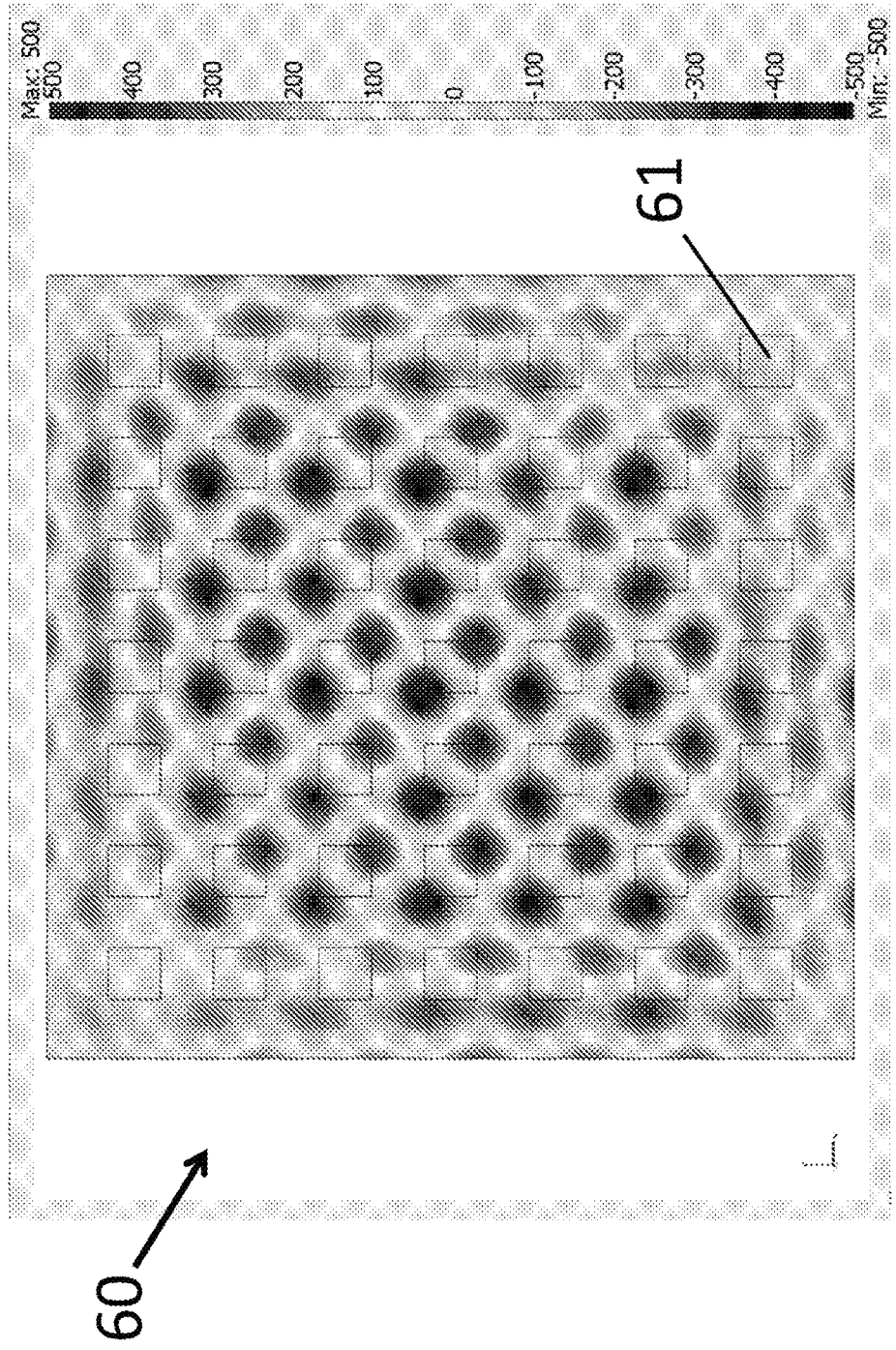
FIG. 17B illustrates the $E_z$ distribution at $\lambda = 9.7$ μm at the center plane of the active material of the embodiment of FIG. 17A.

The QE of three GR-QWIPs having different pixel size and common contact layer thickness. The grating period is 3.0 μm, the grating height is 0.75 μm, and the active layer thickness is 1.5 μm.

The measured noise gain of FPA#1.

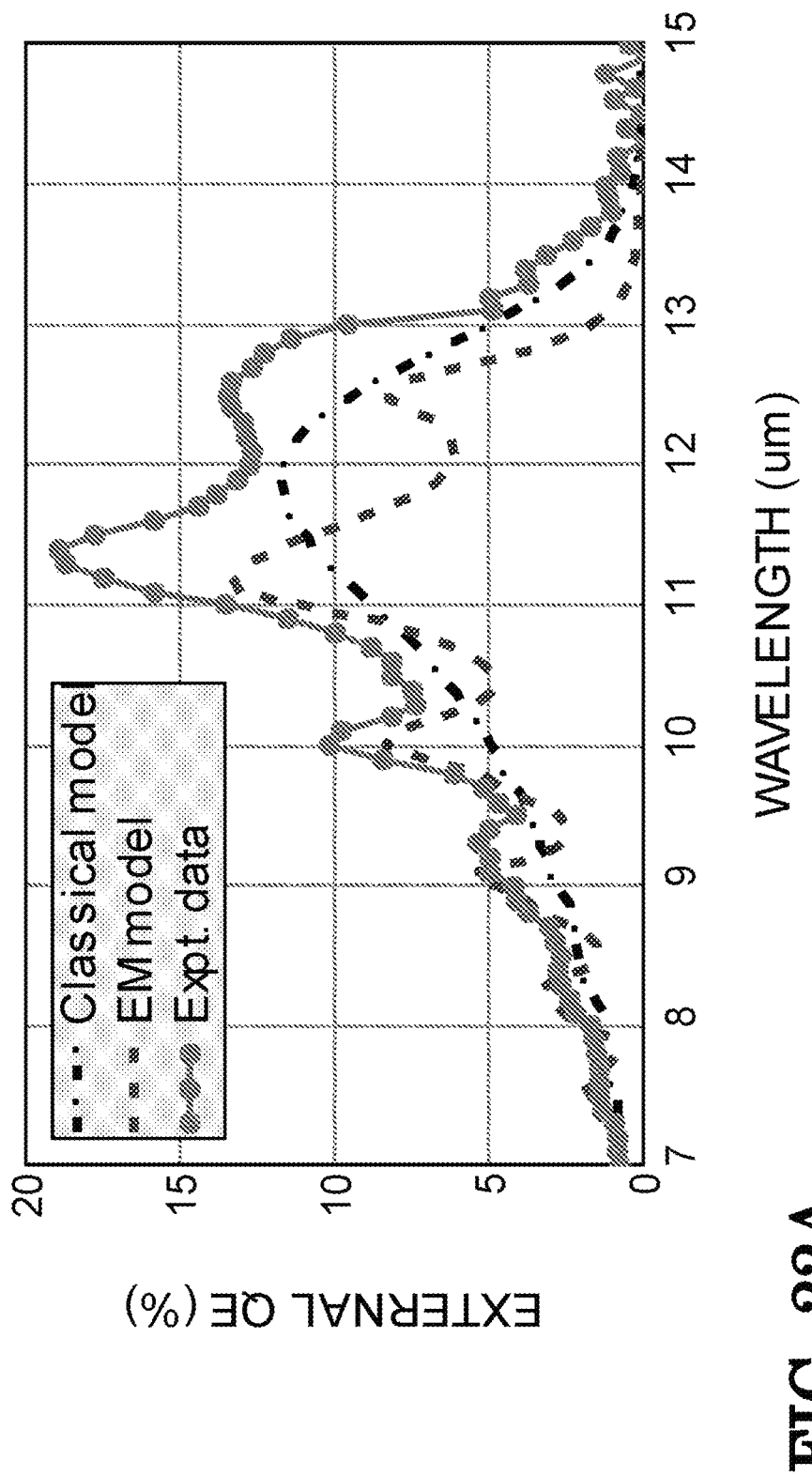
FIG. 22A  Calculated and measured external QE of PR-QWIP FPA#1.

Calculated and measured external QE of PR-QWIP FPA#1 multiplied by 0.7 to fit the predicted QE.

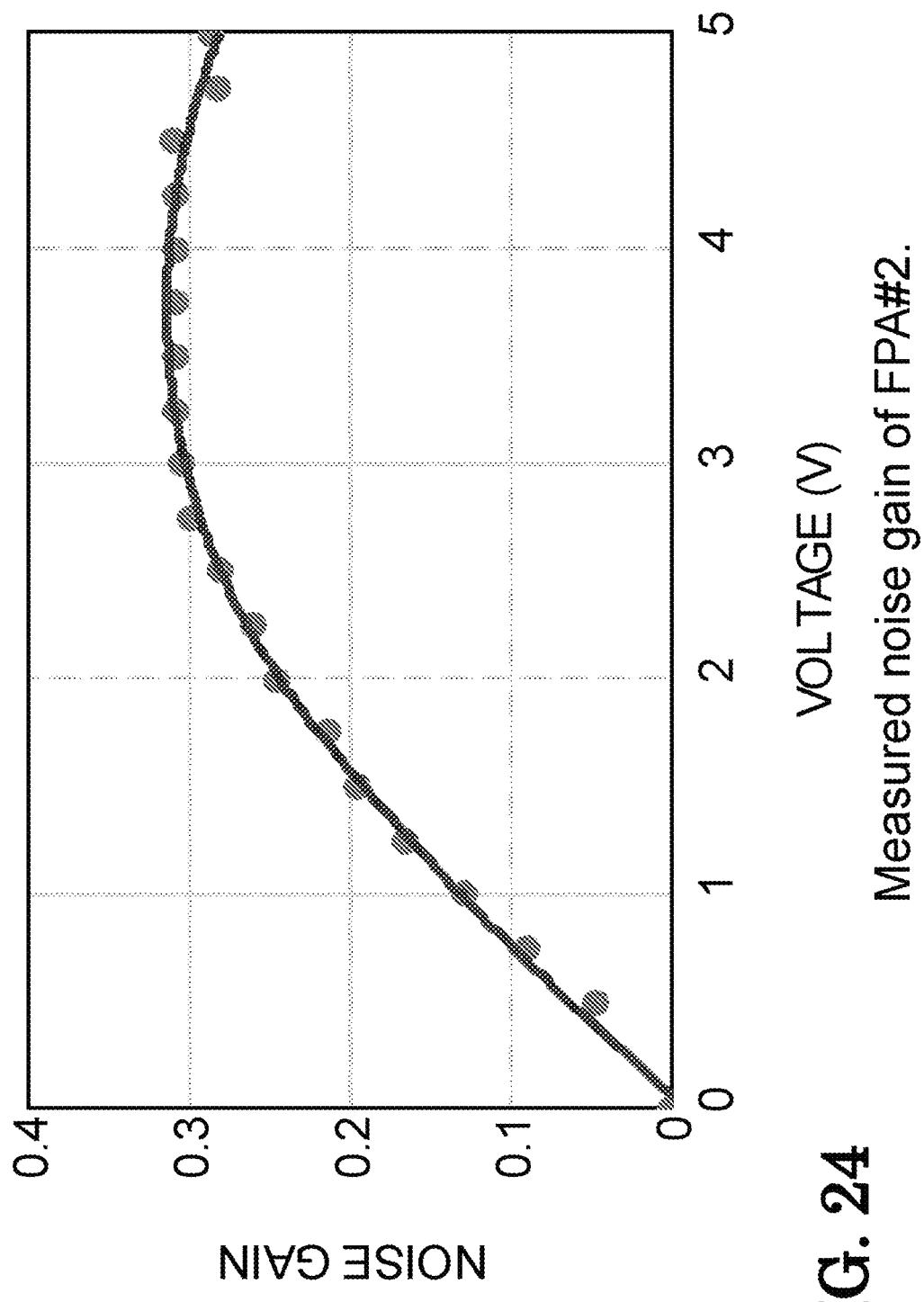
FIG. 24  Measured noise gain of FPA#2.

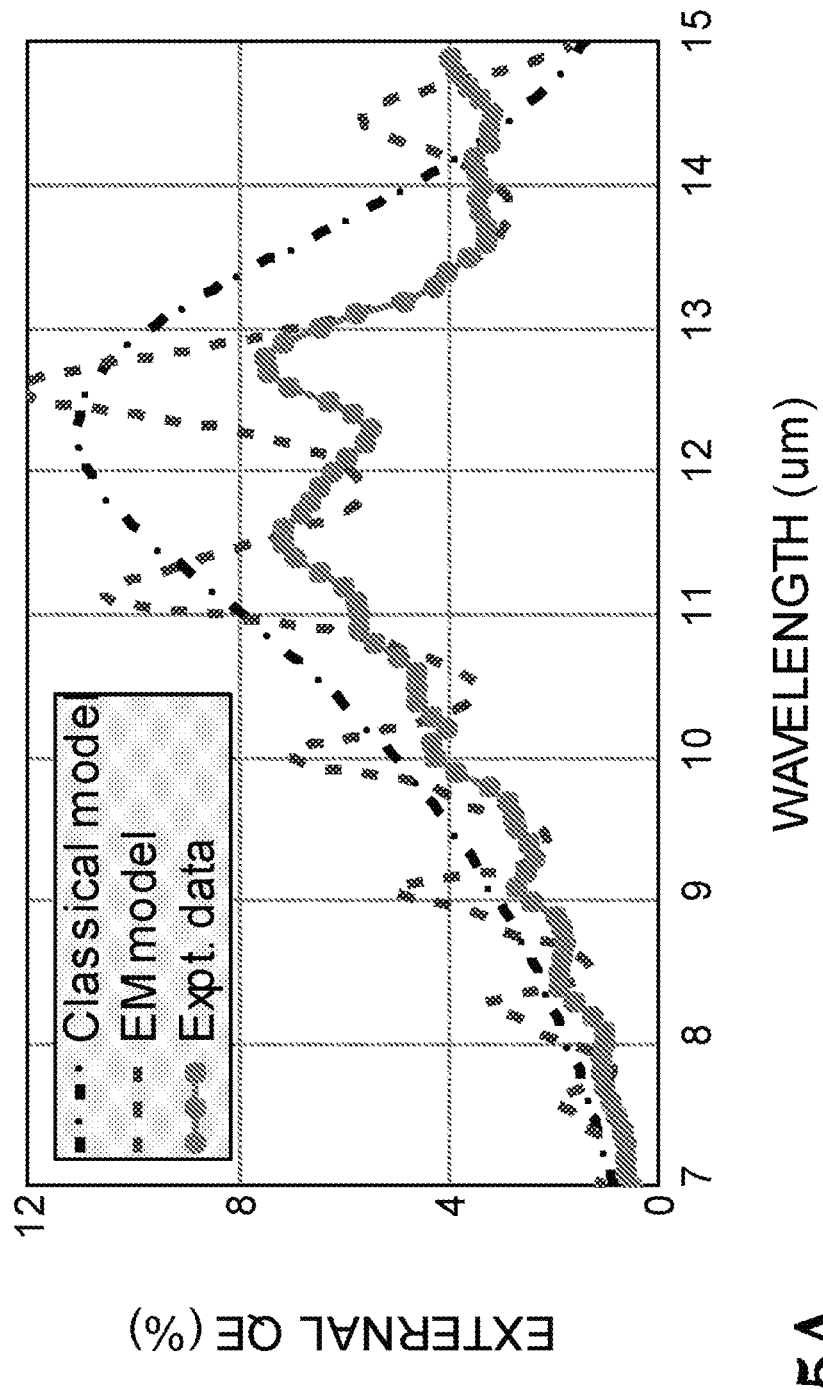
FIG. 25A Calculated and measured external QE of PR-QWIP FPA#2.

Calculated and measured external QE of PR-QWIP FPA#2 multiplied by 1.4 to fit the predicted QE.

Measured noise gain of FPA#3.

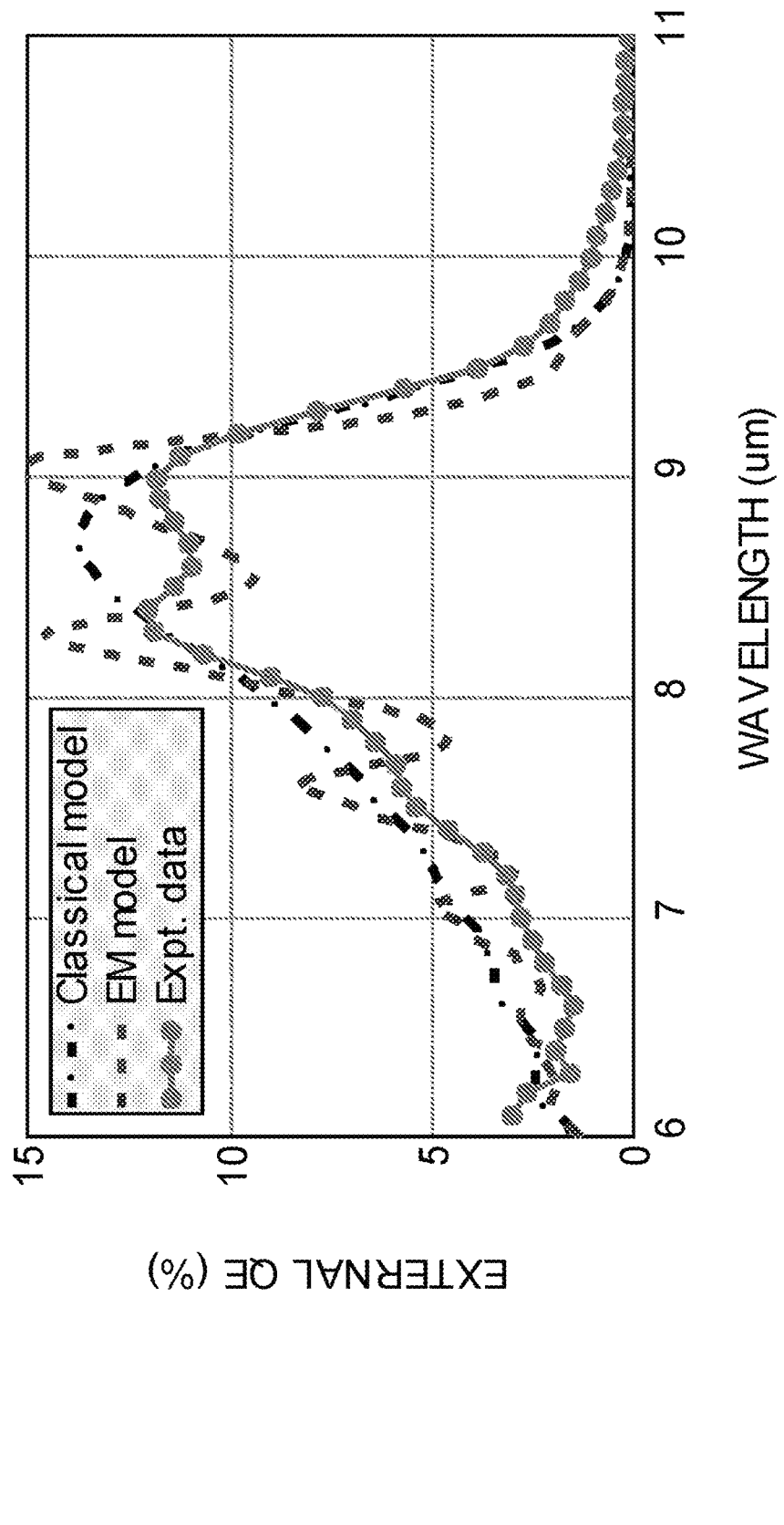
FIG. 28A Calculated and measured external QE of PR-QWIP FPA#3.

Measured QE (of FIG. 28A) multiplied by 1.12 to fit the predicted QE.

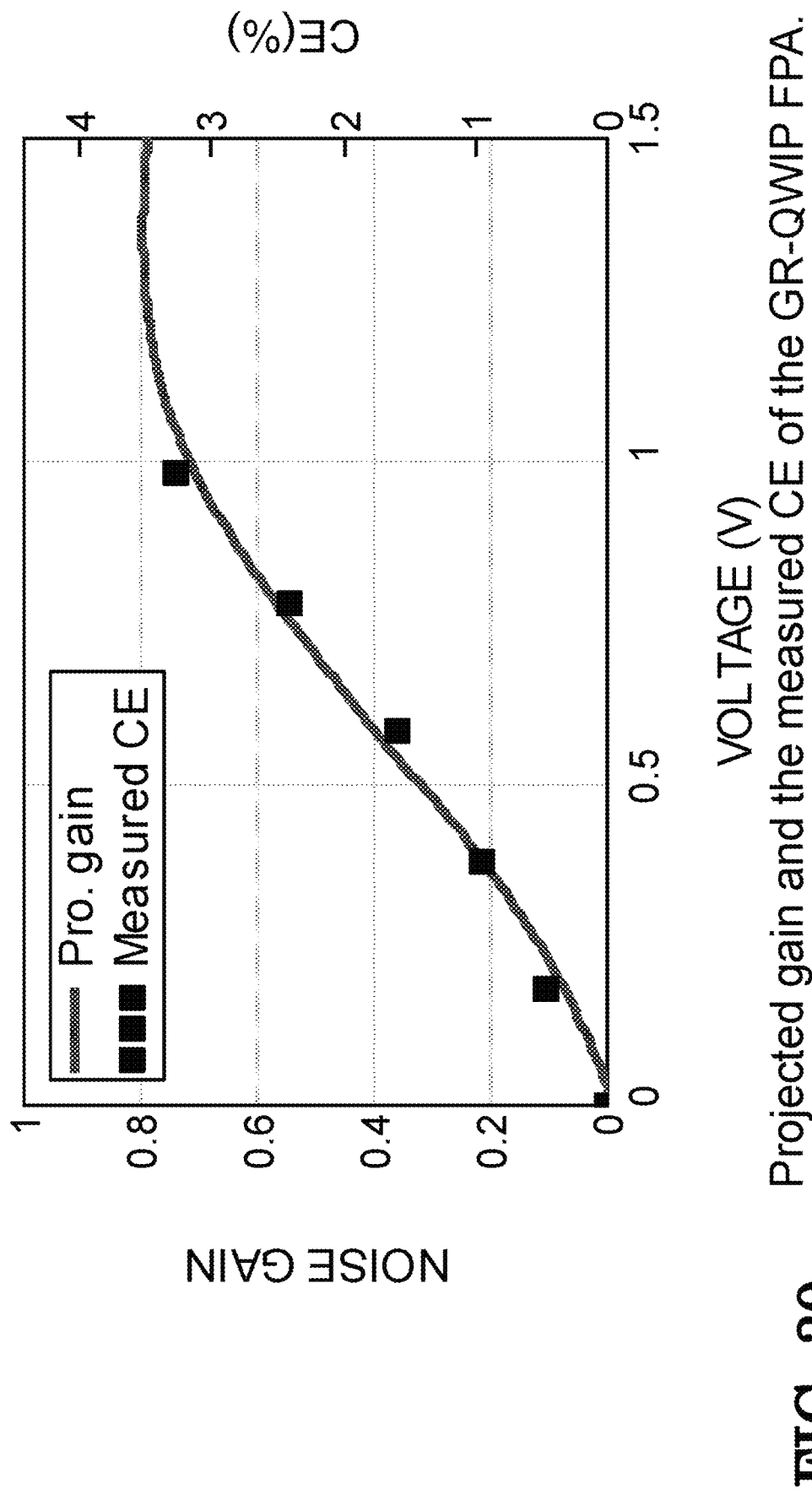
FIG. 30 Projected gain and the measured CE of the GR-QWIP FPA.

Top view of the modeled grating structure and the $E_z$ distribution on the center plane of the active layer at $\lambda = 10.6$ μm.

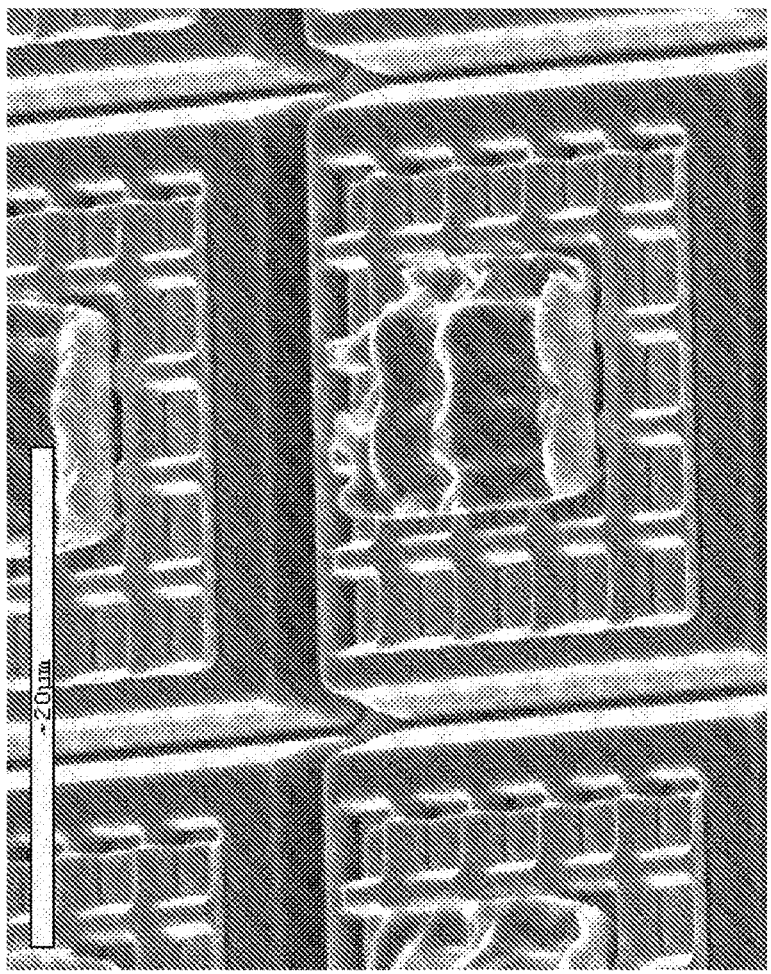
FIG. 31B  Experimental grating structure.

The theoretical QE is scaled by a factor of 0.3 to fit the experiment.

Plot of predicted QE versus measured QE for thinned PR-QWIPs (squares) and thick substrate PR-QWIPs (circles).

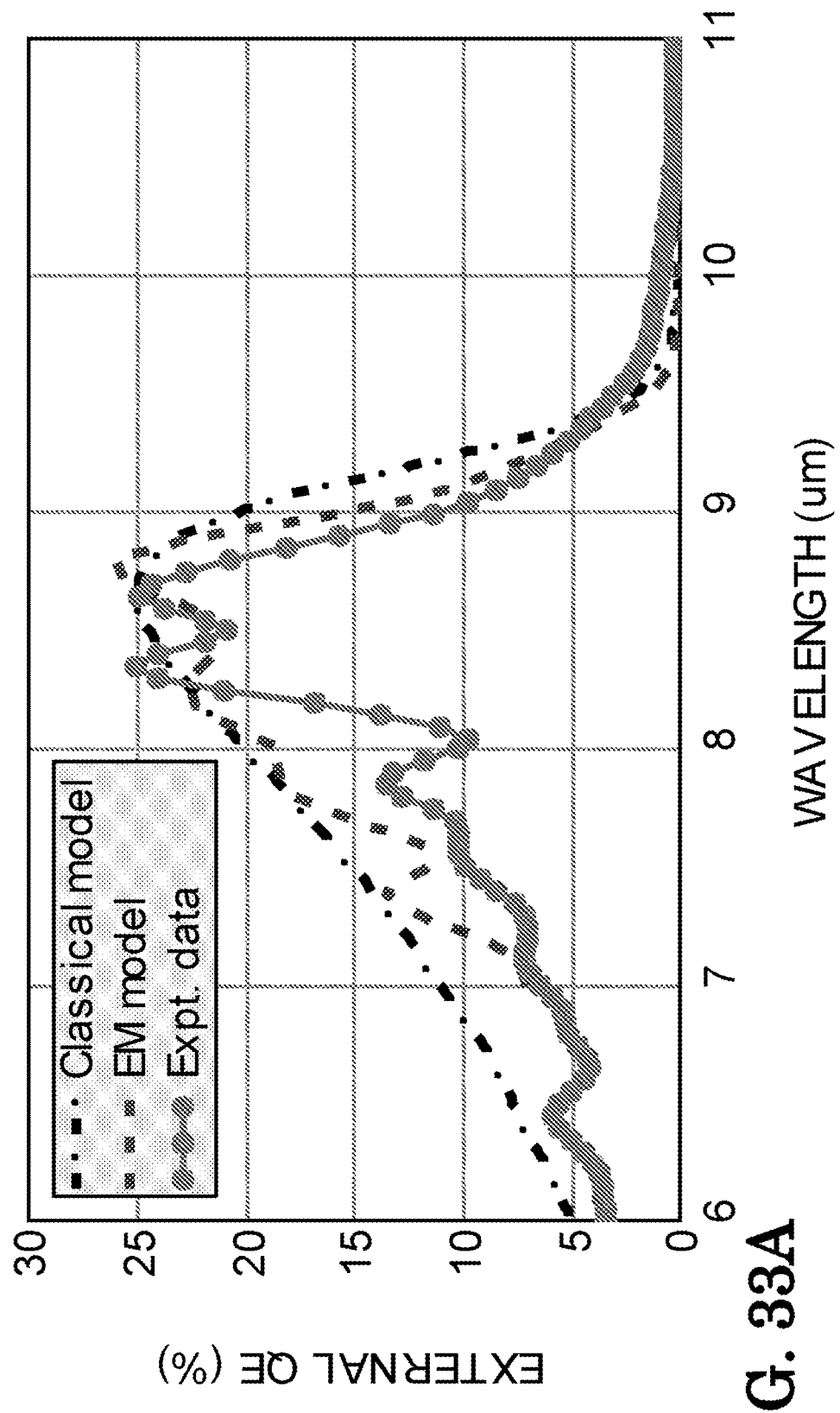
FIG. 33A Calculated and measured external QE spectra of a PY-QWIP FPA. The absolute QE value of the FPA has not been determined.

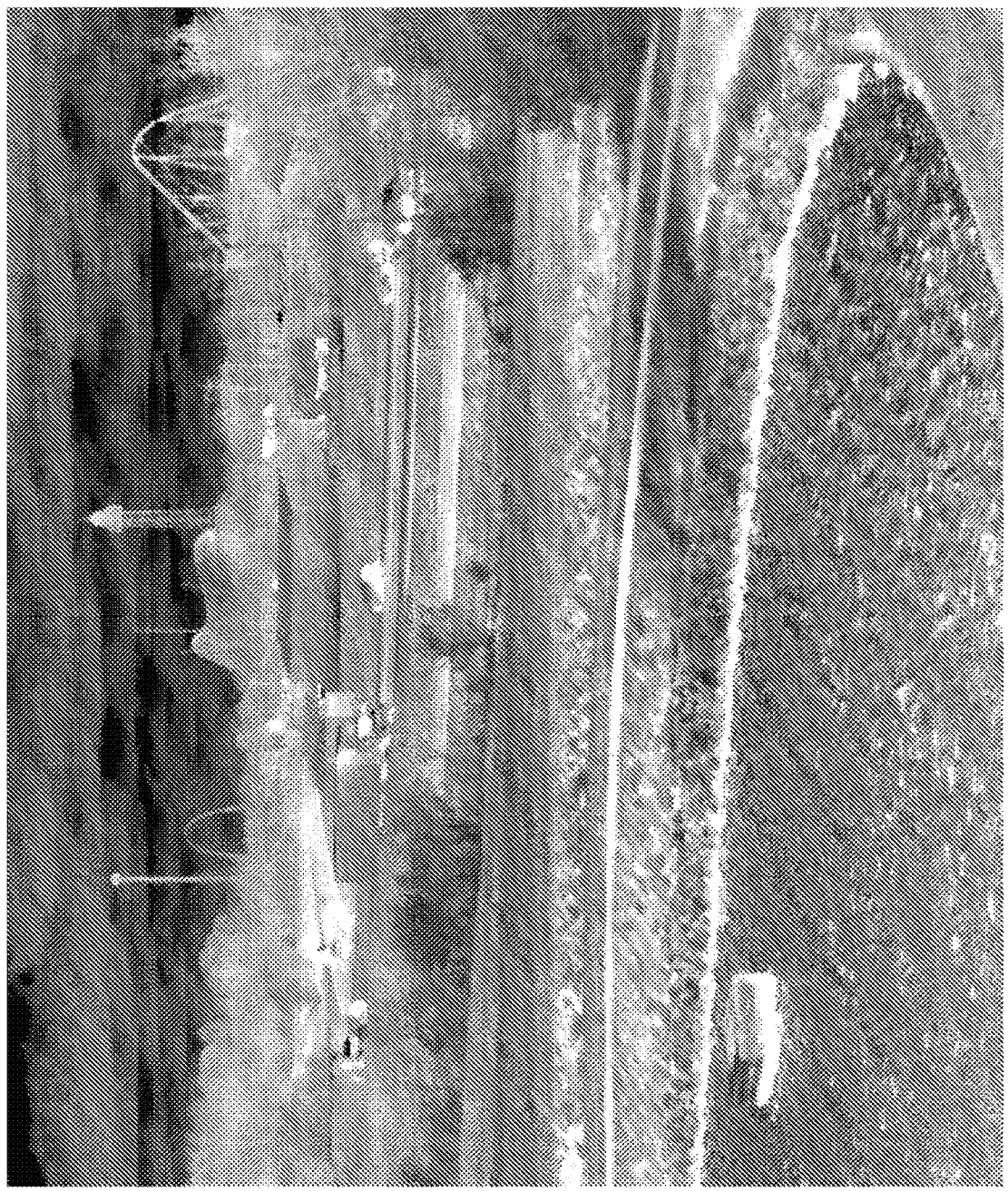
FIG. 33B Infrared image taken by the 1-megapixel PY-QWIP FPA.

3D geometry of a resonator-QWIP with square ring unit cells.

Calculated QE of the prism-shaped and pyramid-shaped C-QWIPs for a material with α spectrum shown in FIG. 20 and the R-QWIPs with the same α spectral lineshape but with a peak value of 0.20 μm$^{-1}$.

$E_z$ distribution at the center plane of the active layer at $\lambda = 7.0$ μm with the incident $E_0 = 377\sqrt{2}$.

$E_z$ distribution at the center plane of the active layer at $\lambda = 8.0$ μm.

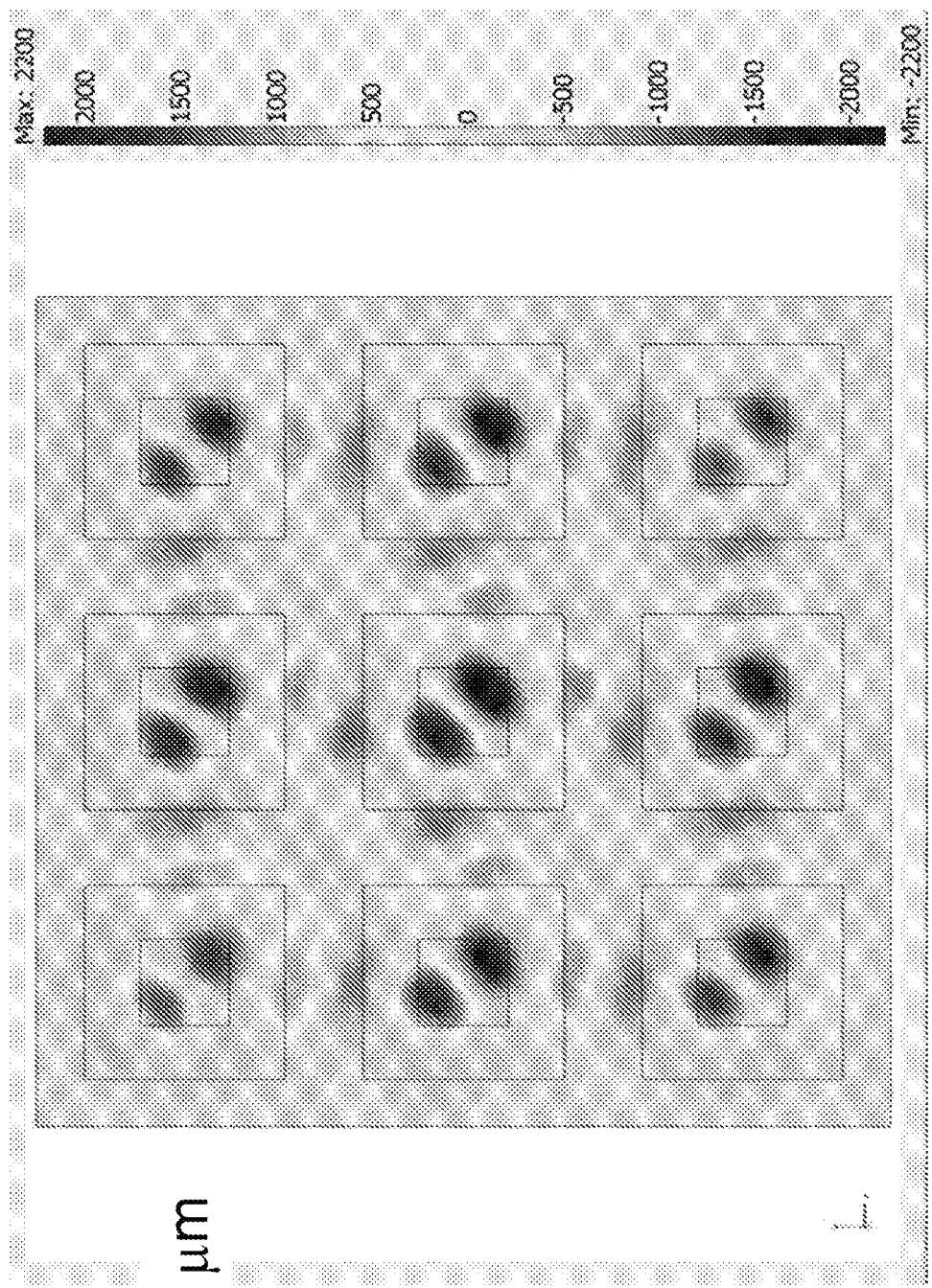
FIG. 36C  $\lambda = 8.8$ μm
$E_z$ distribution at the center plane of the active layer at $\lambda = 8.8$ μm.

$E_z$ distribution at the center plane of the active layer at $\lambda = 10.0$ μm.

The QE of different optimized detectors for 8 – 9.2 μm detection in a 12-μm pixel pitch array. The α value is assumed to be constant at 0.20 μm$^{-1}$.

FIG. 39

An example of material structure selection for 9 μm detection.

STEP 1: SPECIFICATION OF MATERIAL STRUCTURE

| Thickness | Material | Doping |
|---|---|---|
| 30000 Å | GaAs | $1 \times 10^{18}$ cm$^{-3}$ |
| 50 Å | AlGaAs (x = 0.230) | undoped |
| 19 Å | GaAs | undoped |
| 24 Å | GaAs | $2 \times 10^{18}$ cm$^{-3}$ |
| 5 Å | GaAs | undoped |
| 700 Å | AlGaAs (x = 0.230) | undoped |
| 19 Å | GaAs | undoped |
| 24 Å | GaAs | $2 \times 10^{18}$ cm$^{-3}$ |
| 5 Å | GaAs | undoped |
| 50 Å | AlGaAs (x = 0.230) | undoped |
| 49200 Å | GaAs | $1 \times 10^{18}$ cm$^{-3}$ |
| 1000 Å | AlGaAs (x = 0.3) | undoped |
| 2500 Å | GaAs | undoped |
| | S.I. SUBSTRATE | |

(× 60 repeat of middle section)

FIG. 40

STEP 2: Calculation of eigen functions and eigen energies of the material structure Express Eigen functions in material layer n as:

$$\Psi = A_n e^{ik_n z} + B_n e^{-ik_n z}$$

where $A_n$ and $B_n$ are two constants to be determined.

$A_n$ and $B_n$ of layer n are related to $A_{n+1}$ and $B_{n+1}$ of the next layer by:

$$\begin{bmatrix} A_n \\ B_n \end{bmatrix} = \frac{1}{2} \begin{bmatrix} (1+\gamma_{n,n+1})e^{i(k_{n+1}-k_n)d_{n,n+1}} & (1-\gamma_{n,n+1})e^{-i(k_{n+1}+k_n)d_{n,n+1}} \\ (1-\gamma_{n,n+1})e^{i(k_{n+1}+k_n)d_{n,n+1}} & (1+\gamma_{n,n+1})e^{-i(k_{n+1}-k_n)d_{n,n+1}} \end{bmatrix} \begin{bmatrix} A_{n+1} \\ B_{n+1} \end{bmatrix} = \frac{1}{2} M_{n,n+1} \begin{bmatrix} A_{n+1} \\ B_{n+1} \end{bmatrix}$$

where $\gamma_{n,n+1} = \dfrac{m_n^* k_{n+1}}{m_{n+1}^* k_n}$

At an eigen energy, the electron transmission coefficient $T_G(E)$ through all the layers has a local maximum, where $$T_G(E) = \frac{1}{|A_1(E)|^2} \frac{v_p(E)}{v_1(E)} = \frac{2^{2p-2}}{|a_{11}(E)|^2} \frac{m_1^*(E)}{m_p^*(E)} \frac{k_p(E)}{k_1(E)}$$

After identifying all the eigen energies, the corresponding eigen functions can be obtained by putting the energy values back into the second equation.

FIG. 41

STEP 3: Calculation of absorption coefficient of material based on step 2

DETERMINE $f_n$ — After obtaining $\Psi(E_n)$ in terms of A and B for the nth eigen energy $E_n$ (in Step 2) the oscillator strength $f_n$ is given by $$f_n = \frac{2\hbar}{m^*\omega} \left| \langle \Psi_n | \frac{\partial}{\partial z} | \Psi_1 \rangle \right|^2, \quad n = 2, 3, \ldots$$

DETERMINE $\rho_n(\lambda)$

Due to the layer thickness fluctuation in actual material, the eigen energies have finite energy distributions, which lead to finite energy distribution for each optical transition.

$$\rho_n(\lambda) = \frac{1}{\sqrt{2\pi}\,\sigma} \exp\left[ -\frac{1}{2\sigma^2} \left( \frac{hc}{\lambda} - E_n + E_1 \right)^2 \right]$$

where σ is a linewidth parameter depending on the material quality.

DETERMINE $\alpha(\lambda)$

After knowing $f_n$ and $\rho_n$, $\alpha(\lambda)$ is given by $$\alpha(\lambda) = \sum_n \frac{N_D W}{L} \frac{\pi e^2 \hbar}{2\sqrt{\varepsilon_h}\,\varepsilon_0 m^* c} f_n \rho_n(\lambda),$$

STEP 4: Design the detector physical geometry and construct computer aided design drawing in COMSOL Using the drawing tools in COMSOL, the physical geometry of a detector can be laid out.

Choice of geometry depends on the application requirement and insight into possible solutions.

EXAMPLE: PRISM.

FIG. 43
STEP 5: Input parameters for all materials used in the EM model

INPUT OF PARAMETERS INTO THE MODEL - The material properties such as the relative permittivity $\varepsilon_r$, which is related to $\alpha$, the conductivity $\sigma$ and the relative permeability $\mu_r$ of each geometrical subdomain can be input into the model.

For example, in the air domain, $(\varepsilon_r, \sigma, \mu_r)$ is $(1, 0, 1)$.

For example, in the substrate and contact domains, $(\varepsilon_r, \sigma, \mu_r)$ is $(10.49, 0, 1)$.

For example, in the QWIP material domain, the diagonal $\varepsilon_r$ tensor is $(10.49, 10.49, 10.49 - j*n\lambda\alpha/(2\pi))$, and $(\sigma, \mu_r)$ is $(0, 1)$.

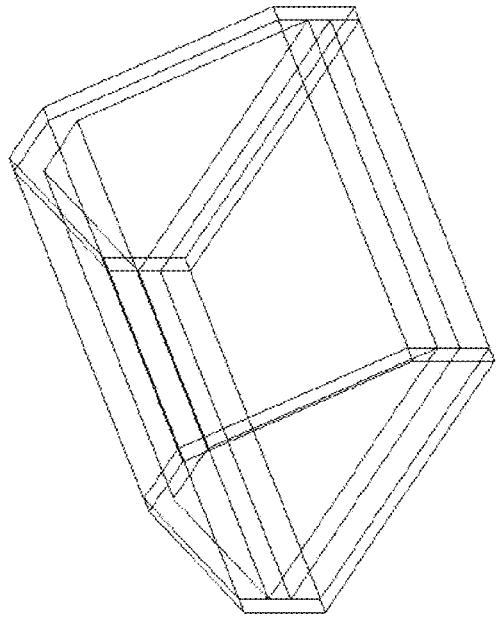

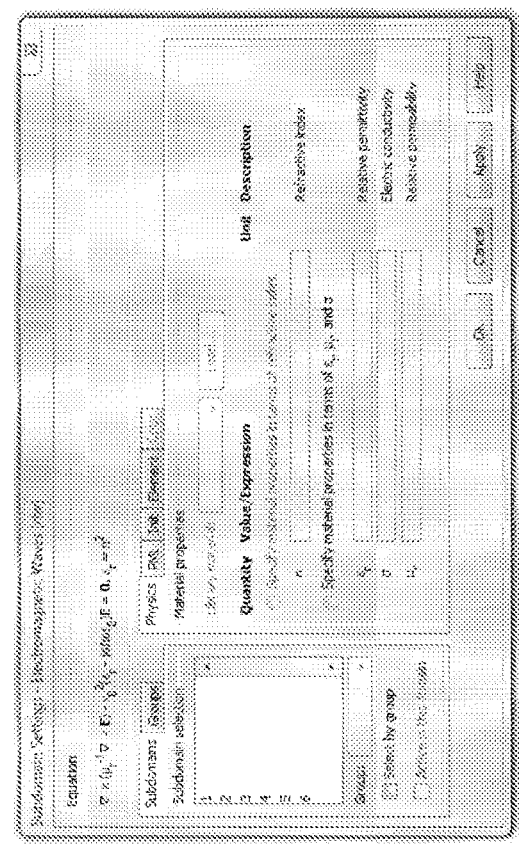

FIG. 44 STEP 6- Define material properties of all geometrical objects
DEFINE OF MATERIAL PROERTIES – Other than the absorption properties of the QWIP material, the properties of other geometrical objects, such as the conductivity of the gold metal, can be loaded from the material library in the subdomain setting page.
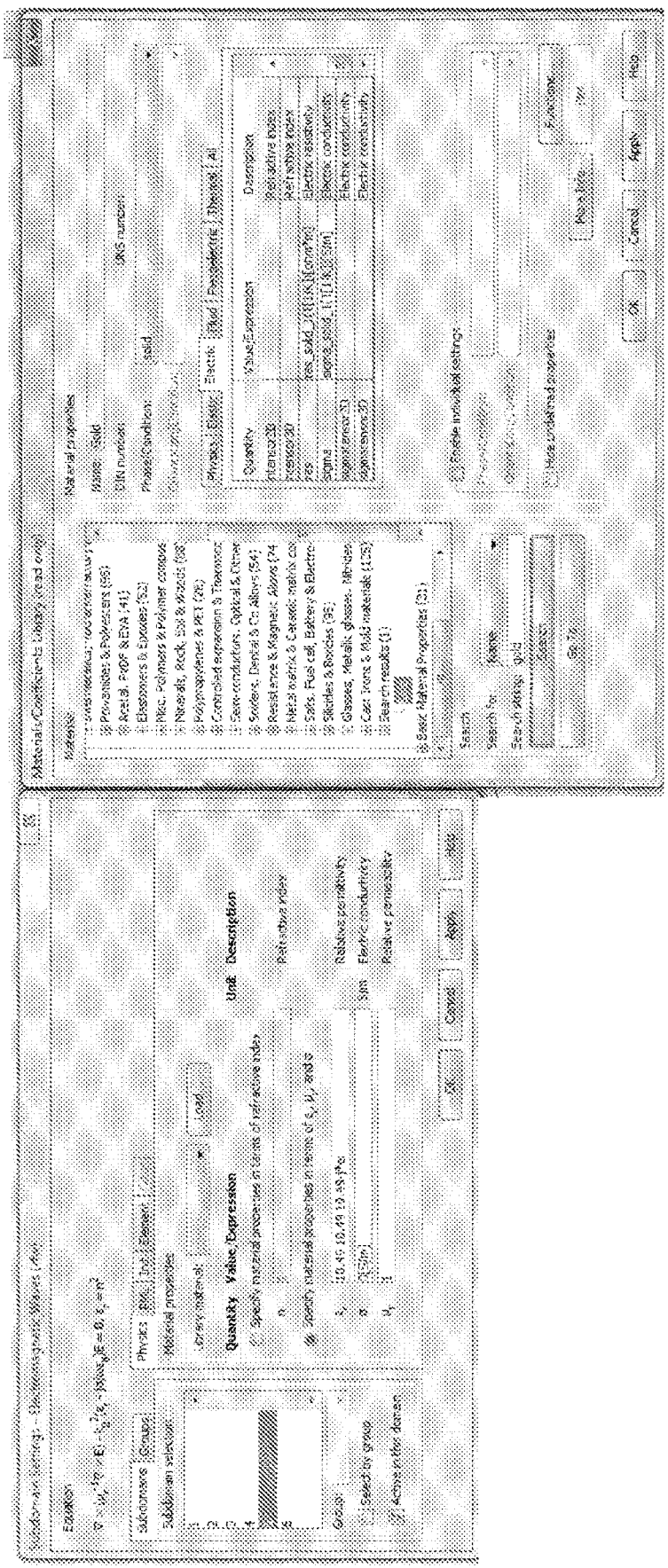

STEP 7: Define physical relations among all geometrical boundaries

Define all the internal and external boundaries in the geometry based on the known physical principles and symmetries.

For example, if the detectors are arranged in a regular array, certain boundaries are in periodic condition.

If the wave is expected to propagate out to infinity after leaving the detector material and into top air layer, one should select scattering boundary condition at the top air boundary, which artificially deletes any reflecting waves at that boundary.

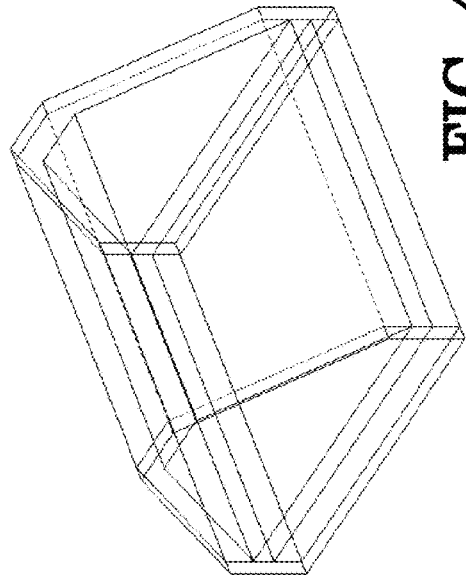

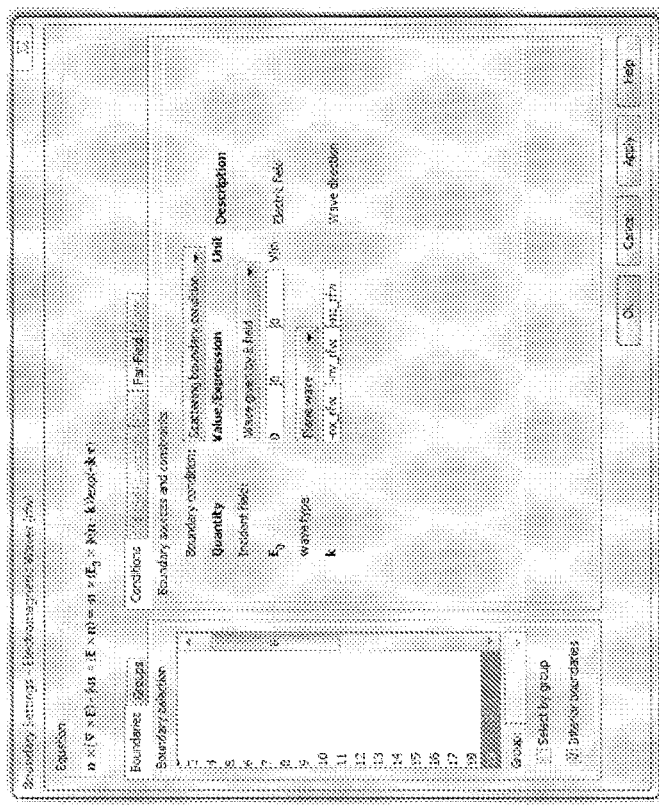

FIG. 45

STEP 8: Define density of nodes for numerical computation

*Define the maximum element size and other factors that control the density of the mesh.*

*The shorter the optical wavelengths are, the higher the frequency of the spatial variations will be, and the denser the mesh should be.*

*If the mesh is too coarse, a self consistent solution can never be reached or the solution is not accurate enough.*

*If mesh is too dense, there will be too many computations and too much required memory.*

*Optimum density* *is determined by trial and error.*

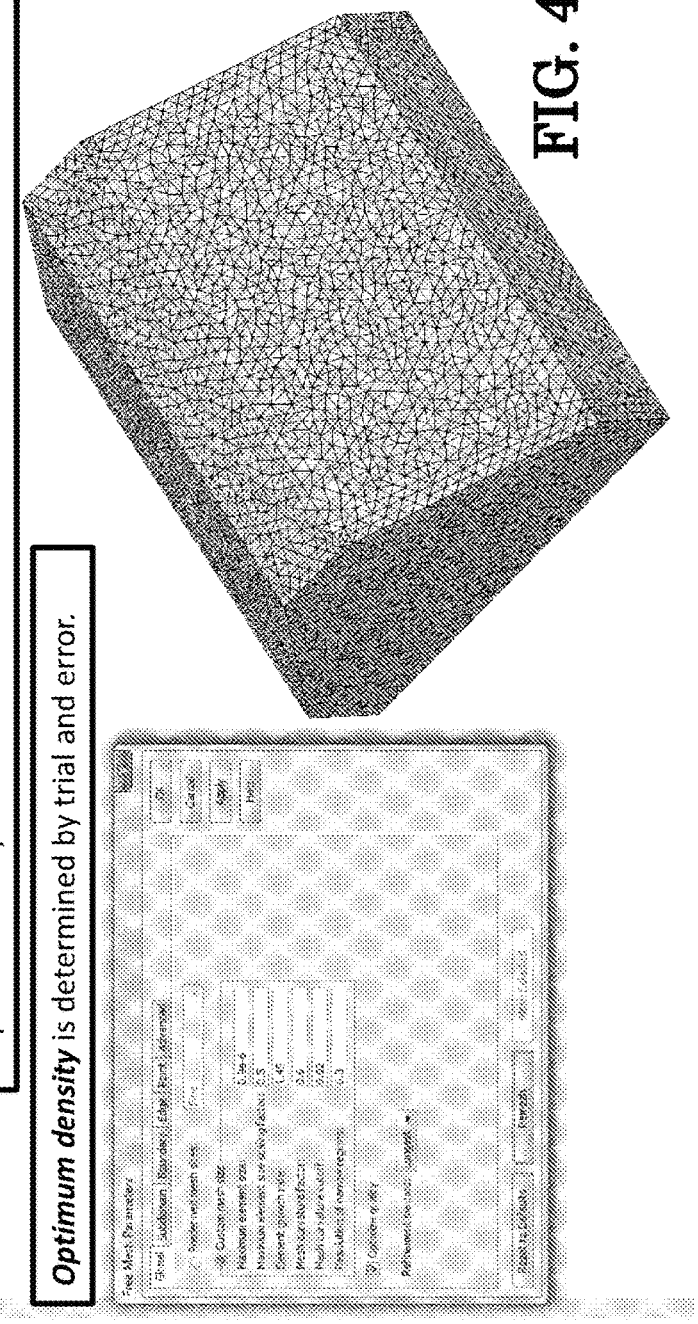

FIG. 46

FIG. 47 STEP 9: Define EM wave incident condition
At the bottom air layer, define the incident wave to be traveling normally to that surface.
$E_x$ and $E_y$ are defined as 377 V/m
$E_z$ is defined as 0 V/m.
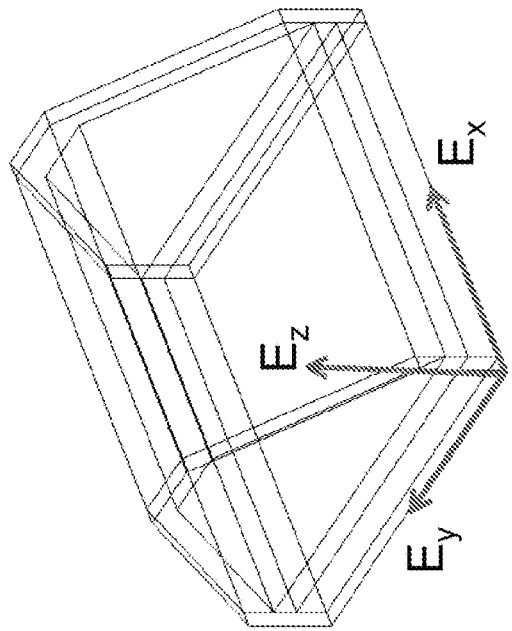

FIG. 48  STEP 10: Define numerical solver

DEFINE SOLVER PARAMETERS

EXAMPLE: IF harmonic propagating wave, using wavelength as a parameter in the range of 8 to 10.8 μm in the step of 0.2 μm. It also contains several other pages of settings related to how the numerical computation is proceeded, such as using progressing multi-grids to improve accuracy in each iteration, the maximum number of iterations and the maximum accuracy tolerance, etc.

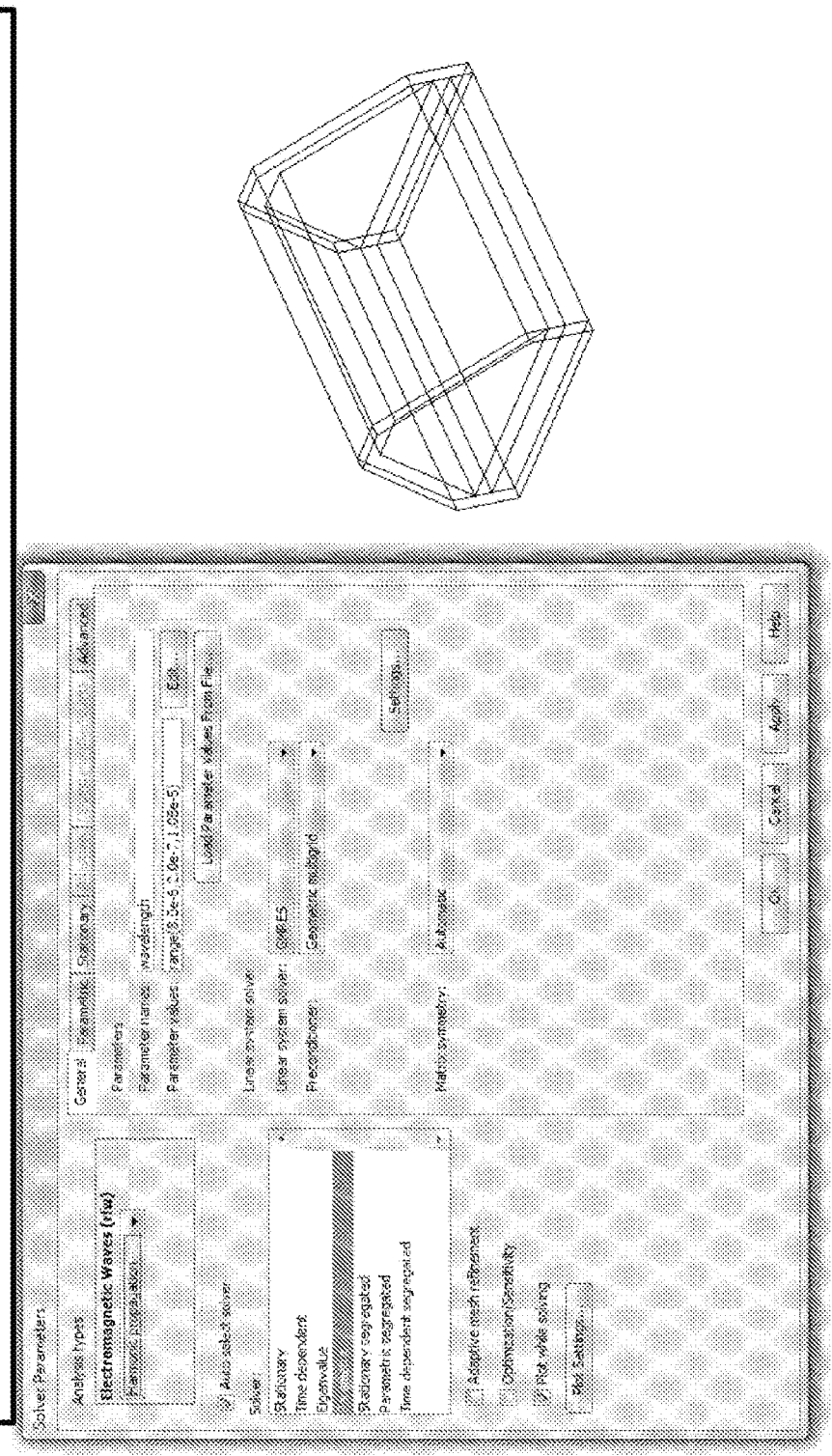

FIG. 49
STEP 11: Based on the output $E_z$ distribution, compute QE
Integration of the scattered $E_z$ expression within the detector material subdomain according to the formula
$$\eta = \frac{n\alpha}{AE_0^2} \int\int\int_V \left| E_z(\vec{r}) \right|^2 d^3r$$
EQUATION 1
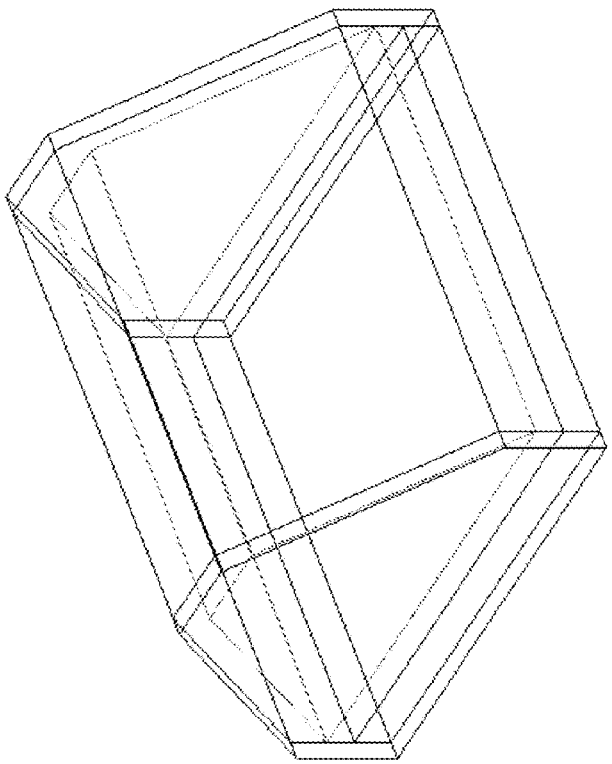
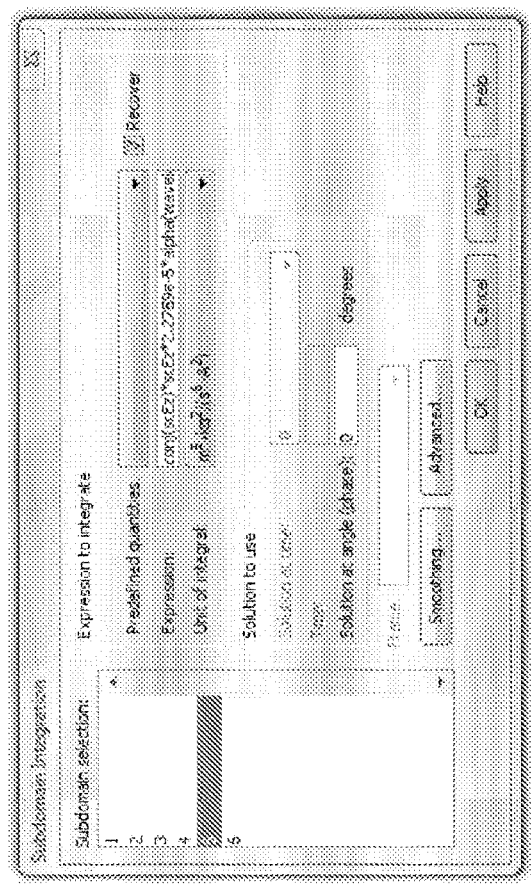

EXAMPLES OF PATTERNS OF DIFFRACTIVE ELEMENTS

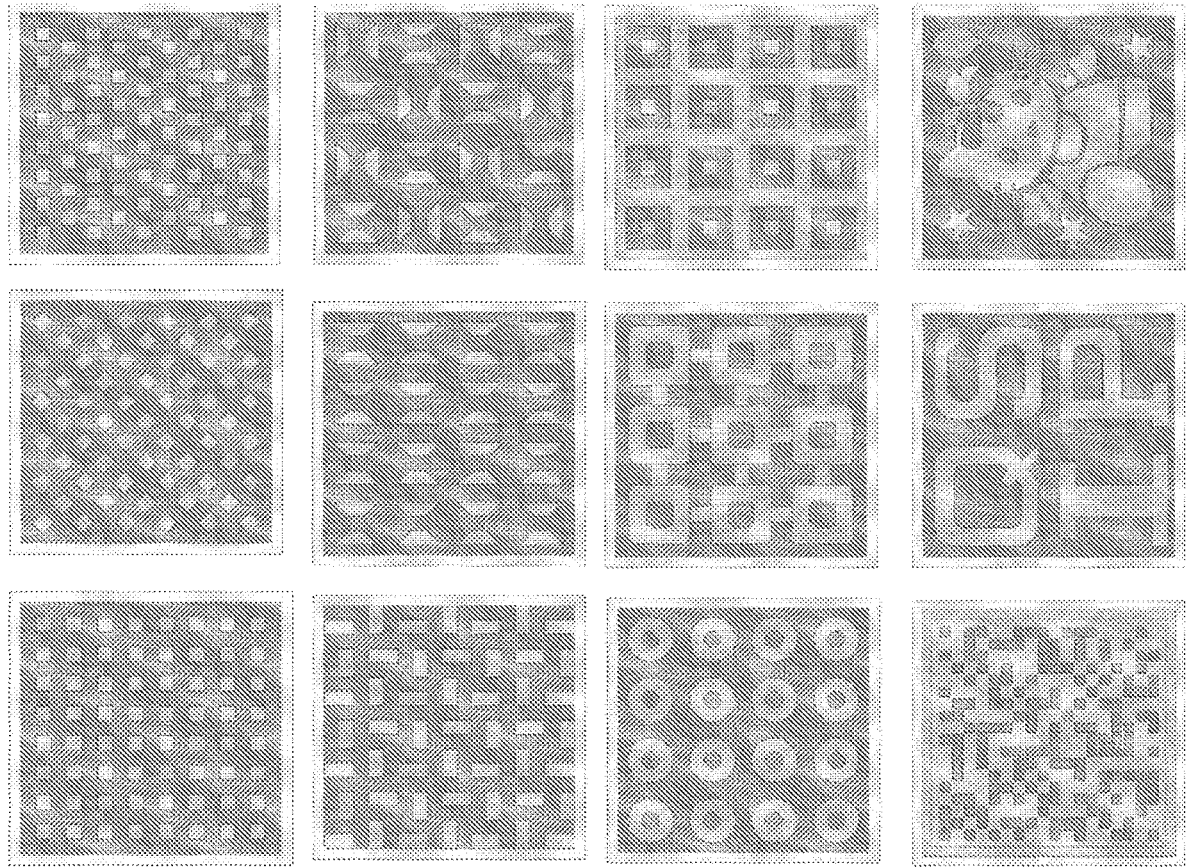
FIG. 50B EXAMPLES OF ADDITIONAL PATTERNS OF DIFFRACTIVE ELEMENTS

Illustrates the calculated quantum efficiency of several R-QWIPS with different patterns and layer thicknesses. Also shown is typical quantum efficiency (QE) of gratings without properly designed resonant cavity.

FIG. 53 illustrates the R-Quip design #1 studied in an experiment. FIG 53C illustrates the measured DC current (curve) under 18°C background with F/2 antireflection coated optics. The circles are those calculated from the observed QE spectrum and 18°C black body, revealing good consistency.

Shows the measured QE (solid curves with circles) and the calculated QE(dashed curve), which are in reasonable agreement.

FIG. 54A Illustration showing a second R-QWIP design studied experimentally.
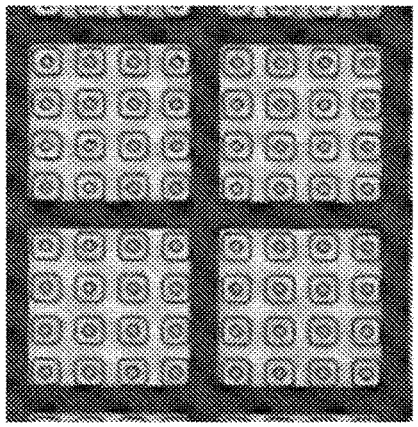
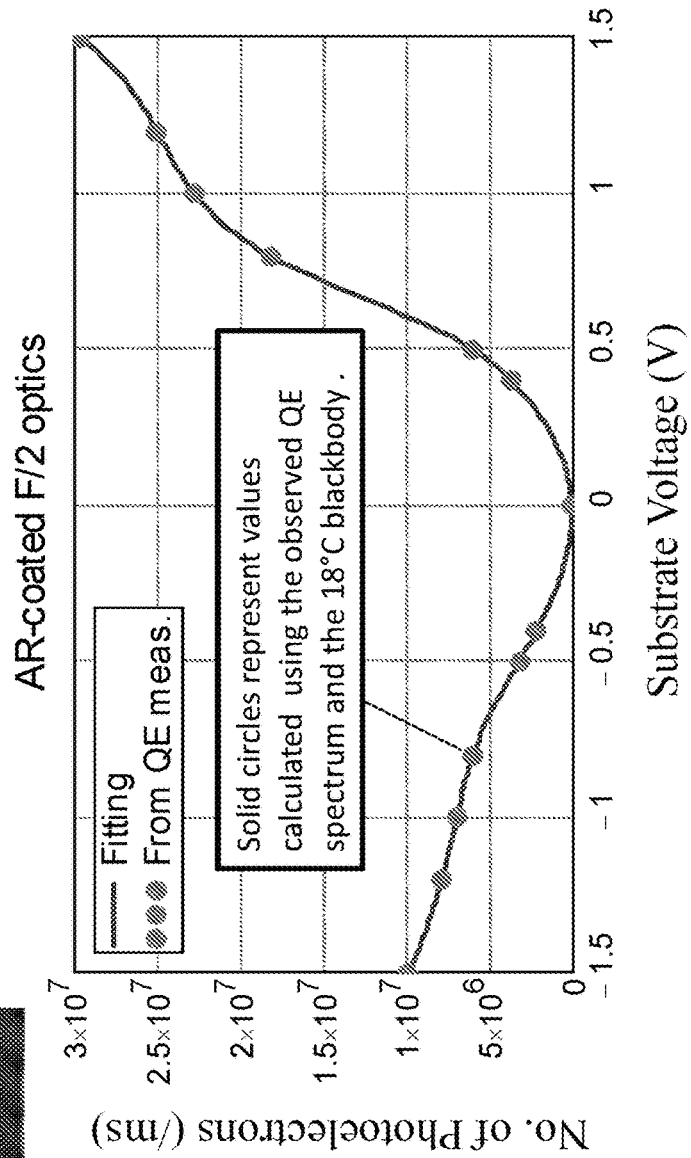
FIG. 54C shows the calculated DC current (solid circles) under 18°C background with F/2 antireflection coated optics.

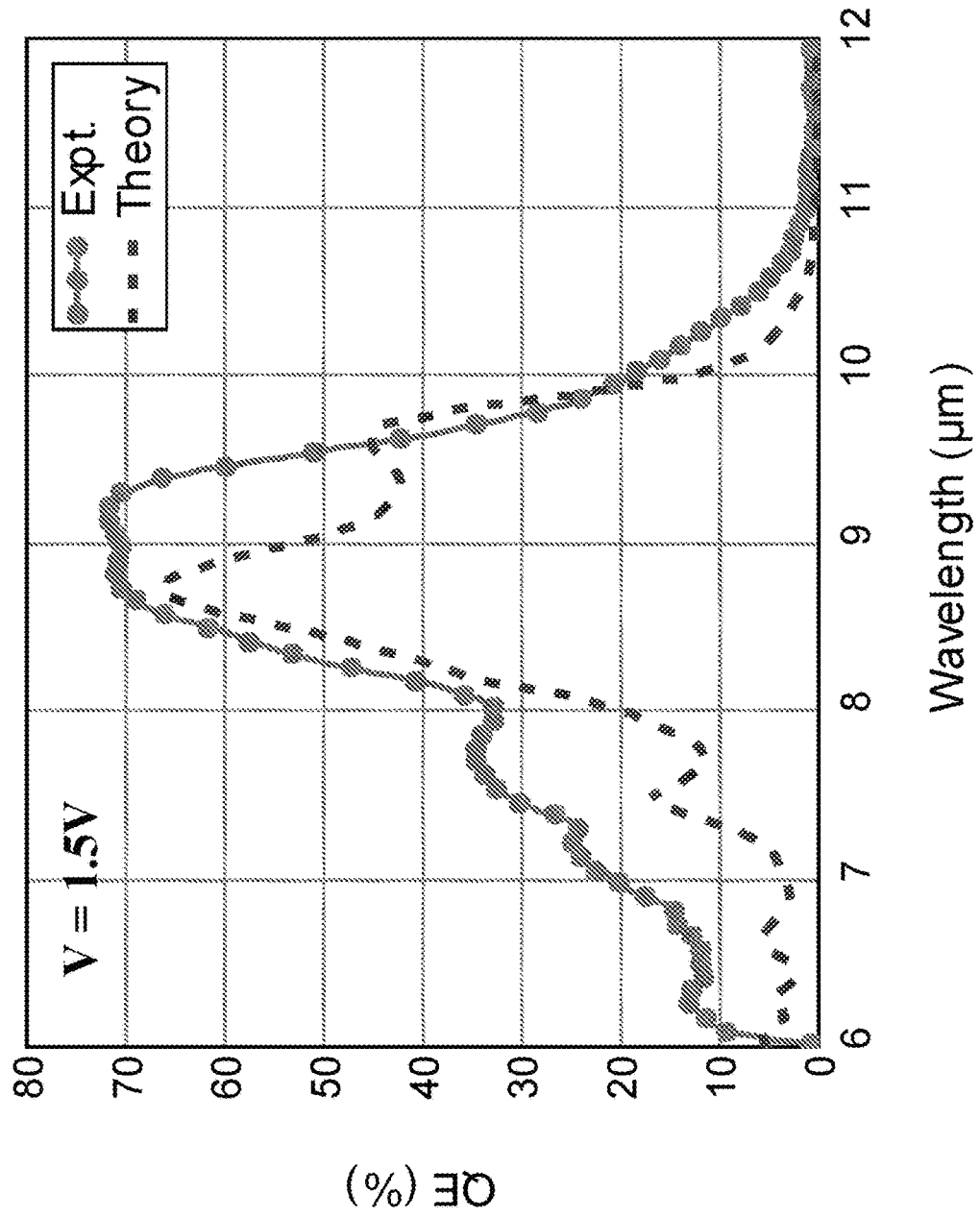
FIG. 54B   Illustrates the measured QE (curved line) and the calculated QE (dashed curve).

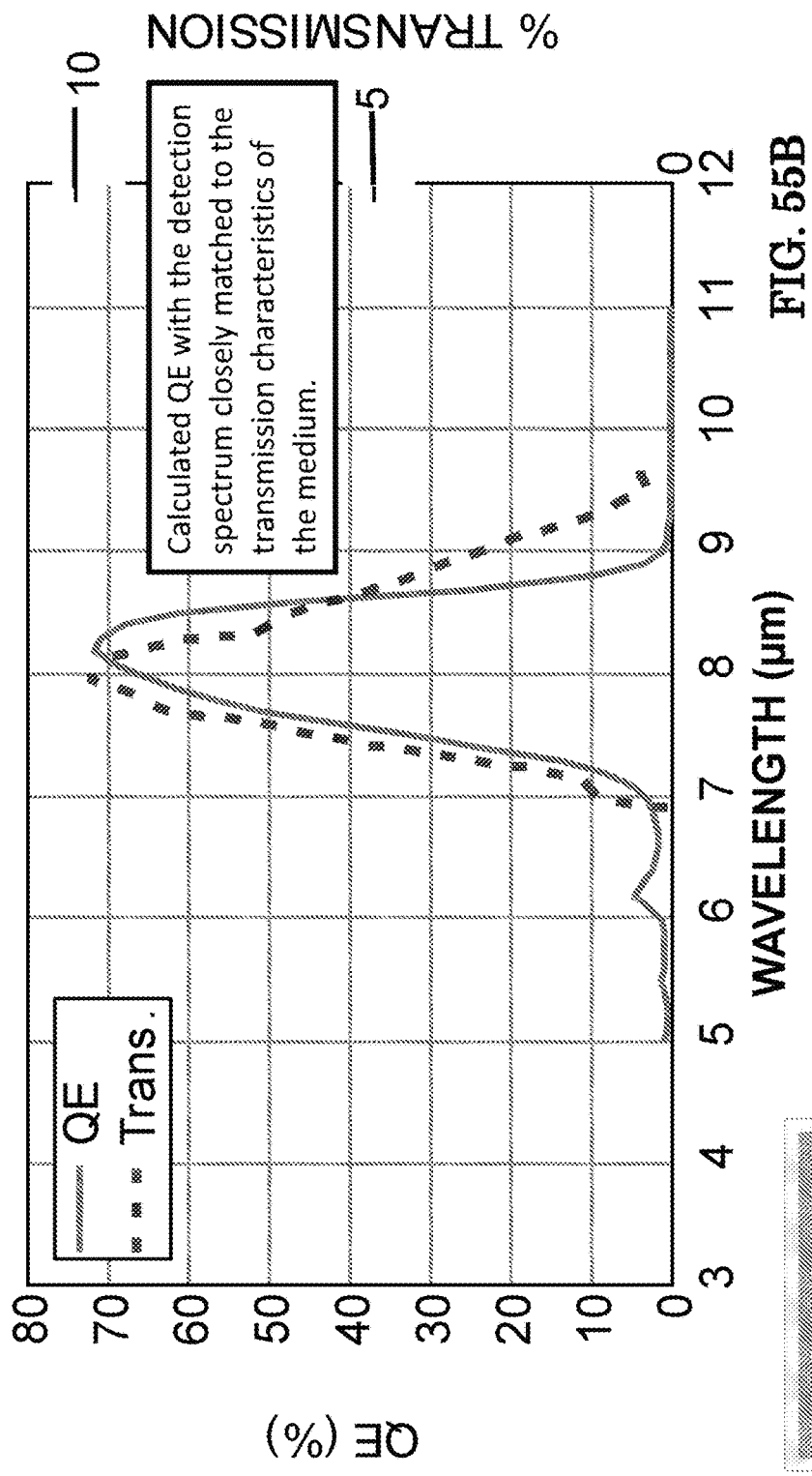
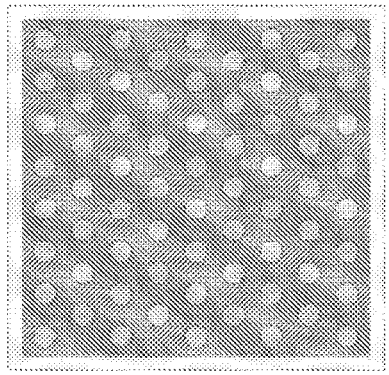
FIG. 55B
FIG. 55A

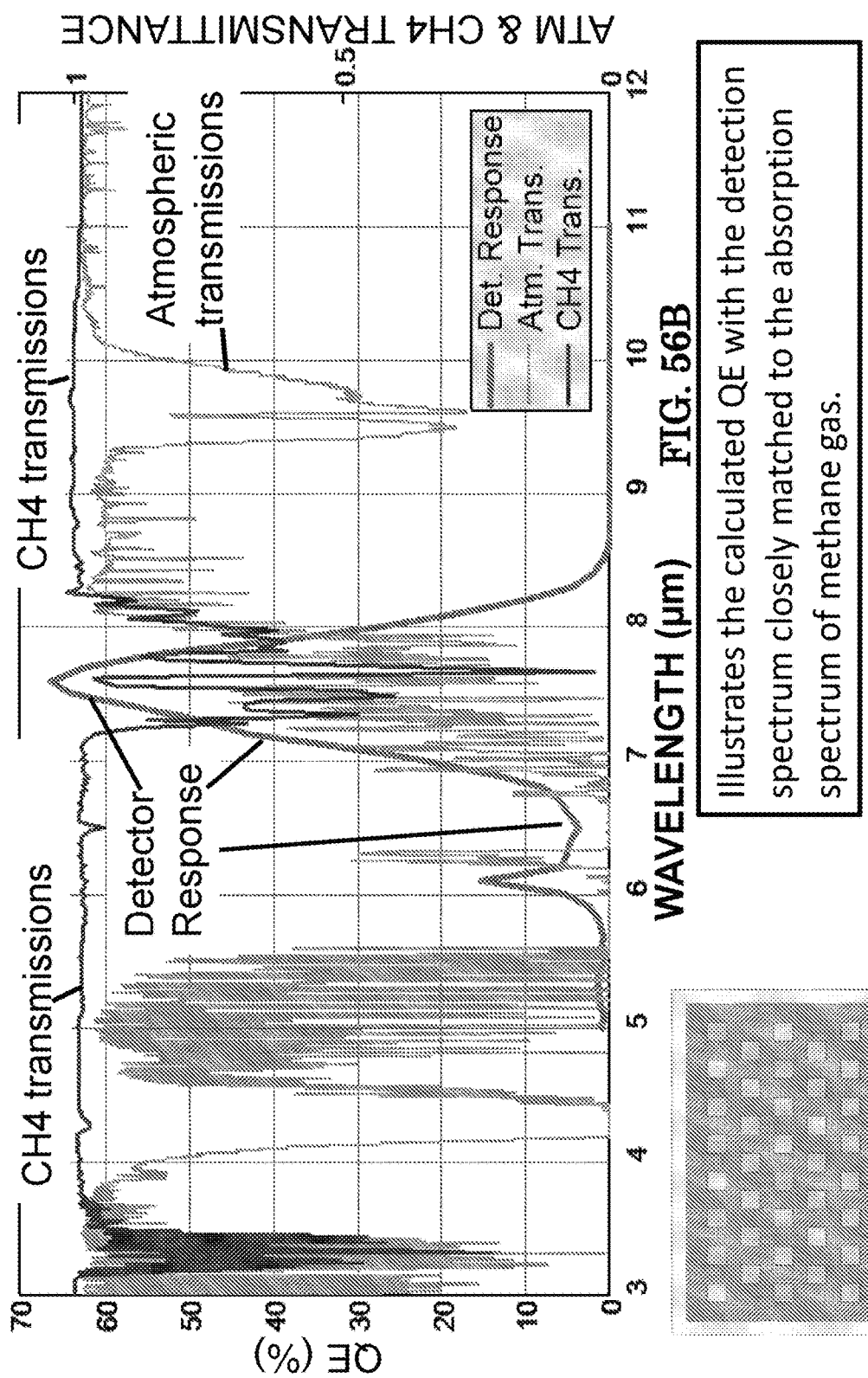

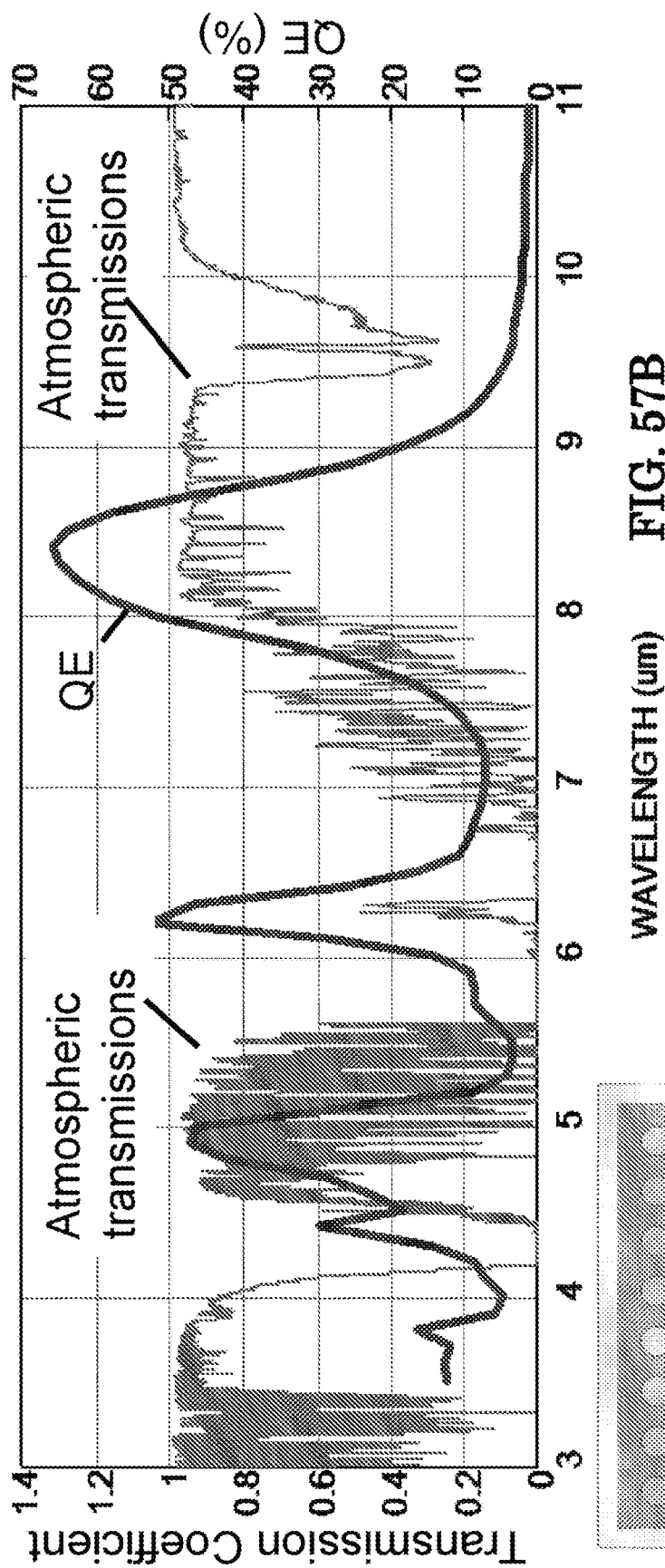
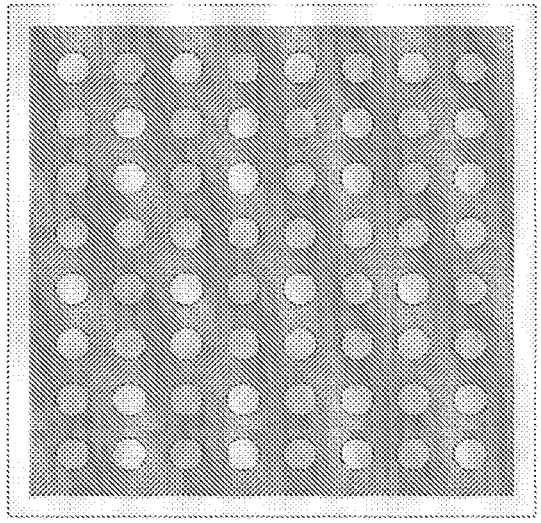
FIG. 57B
FIG. 57A

Top view of the R-HgCdTe with a pattern of rings as its diffractive element and also the absolute E field pattern.

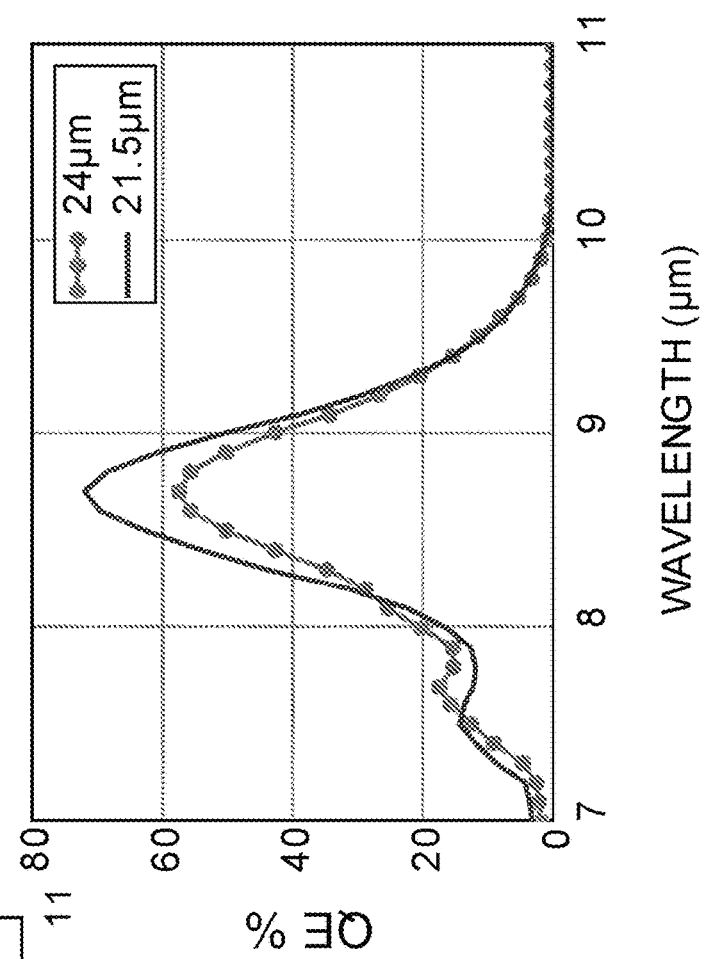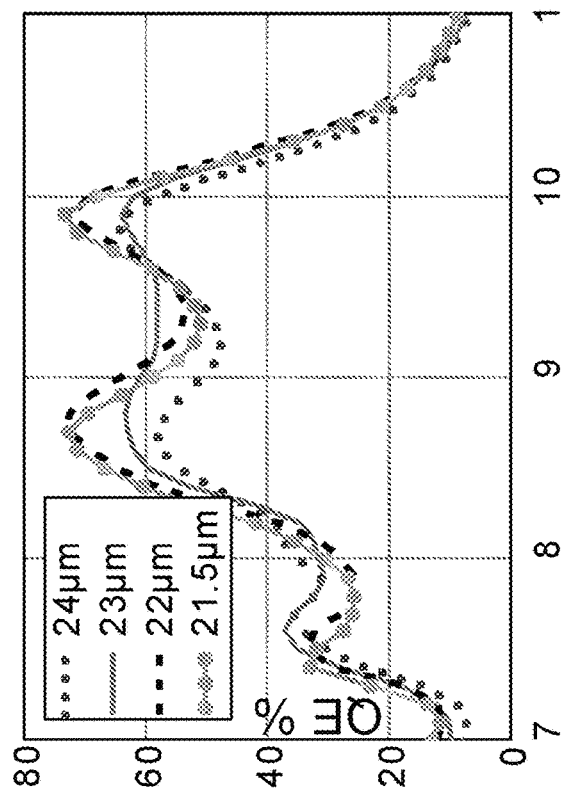
FIG. 61B
FIG. 61A

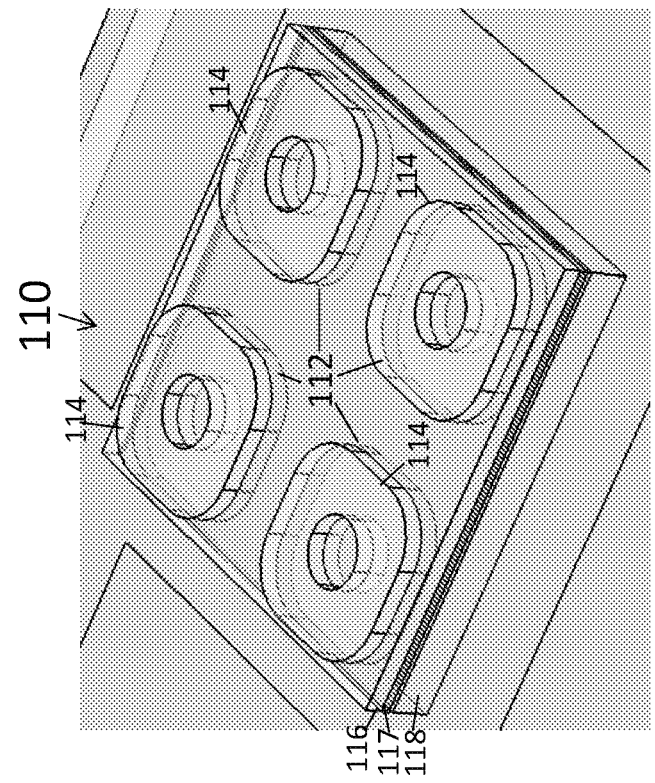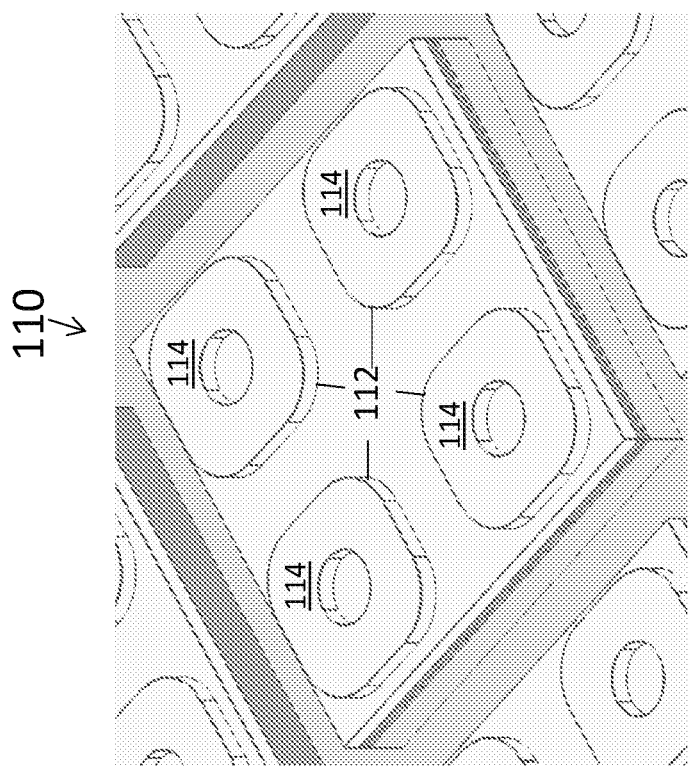
FIG. 64 Preferred Embodiment Resonant Detector Design

Top view

Side view

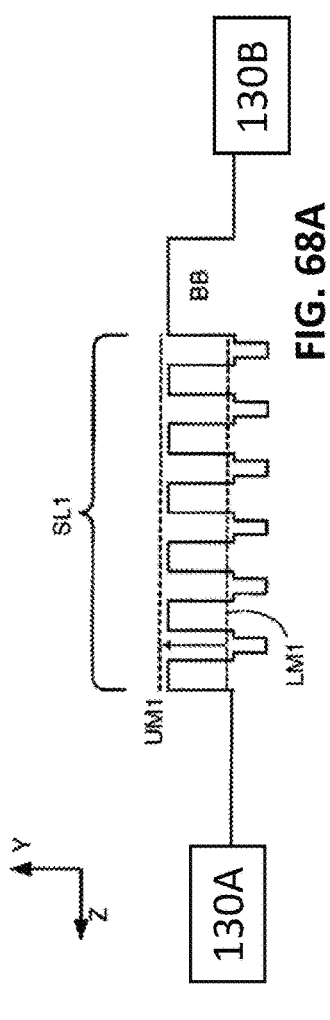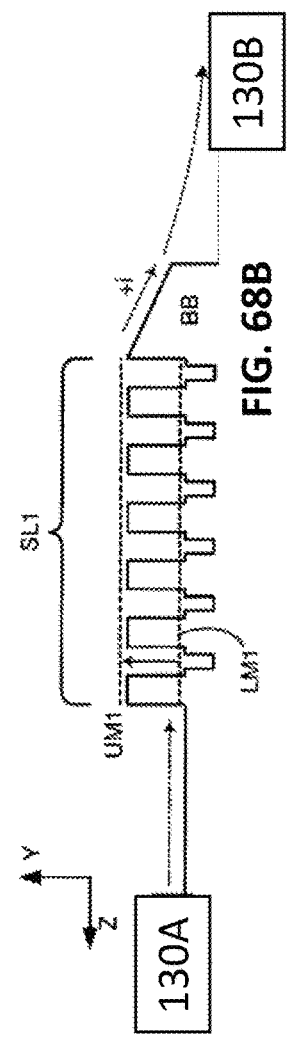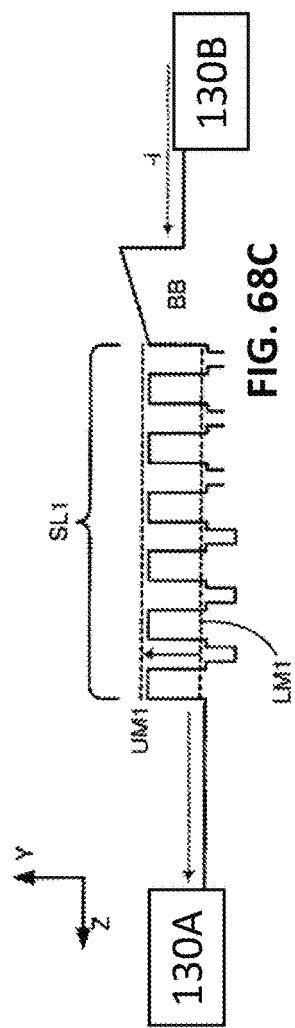

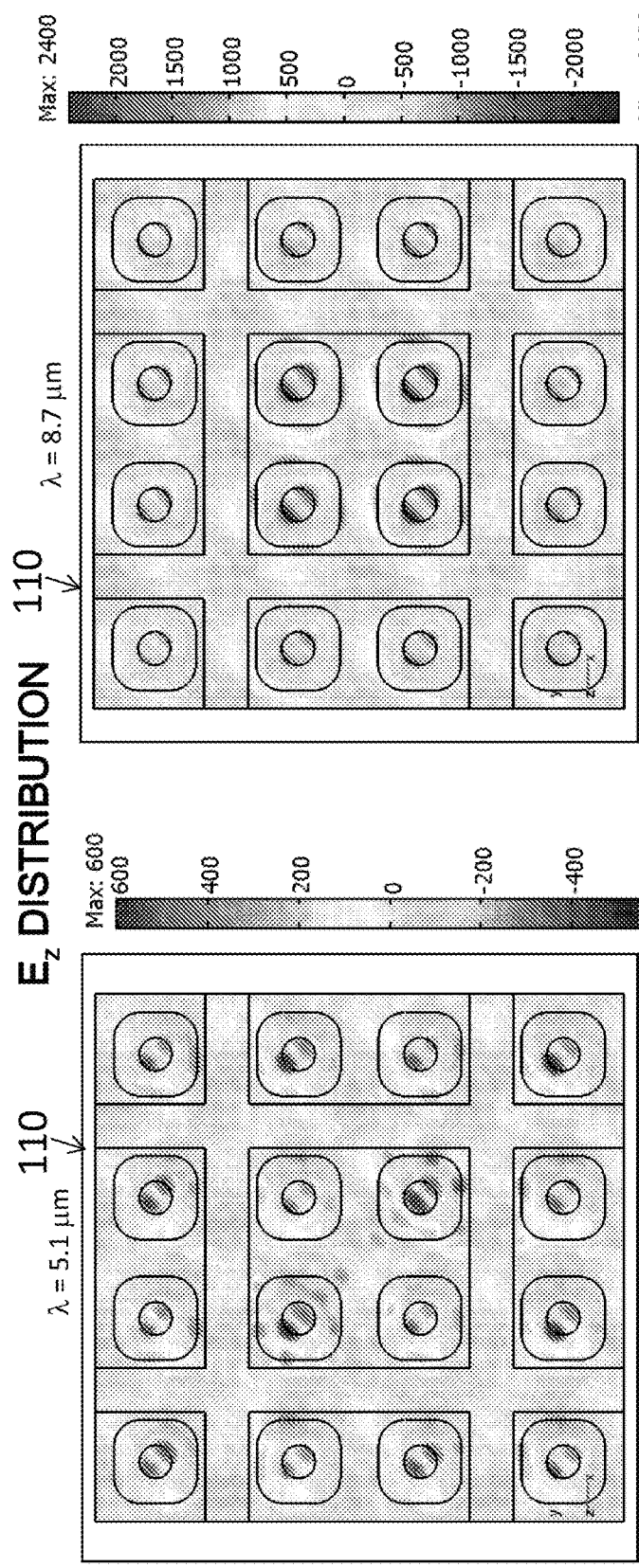
FIG. 69A Midplane MW Layer AT λ = 5.1 μm
FIG. 69C mid plane of LW layer at λ = 8.7 μm
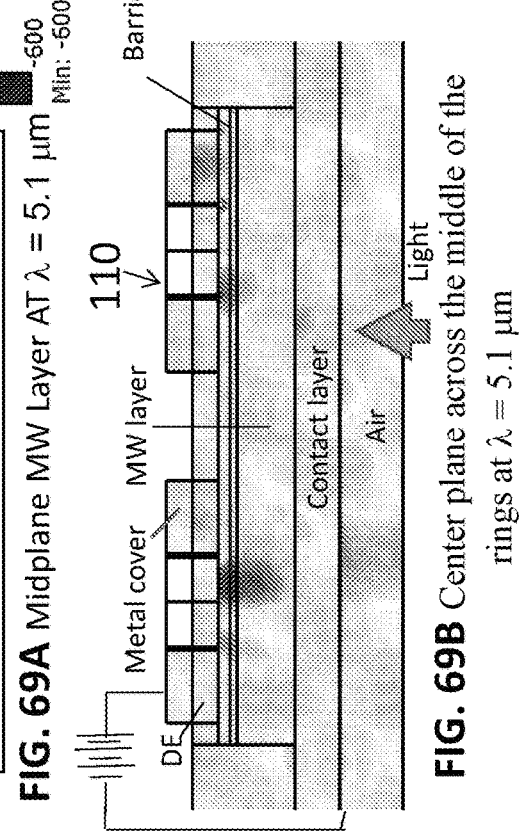
FIG. 69B Center plane across the middle of the rings at λ =5.1 μm
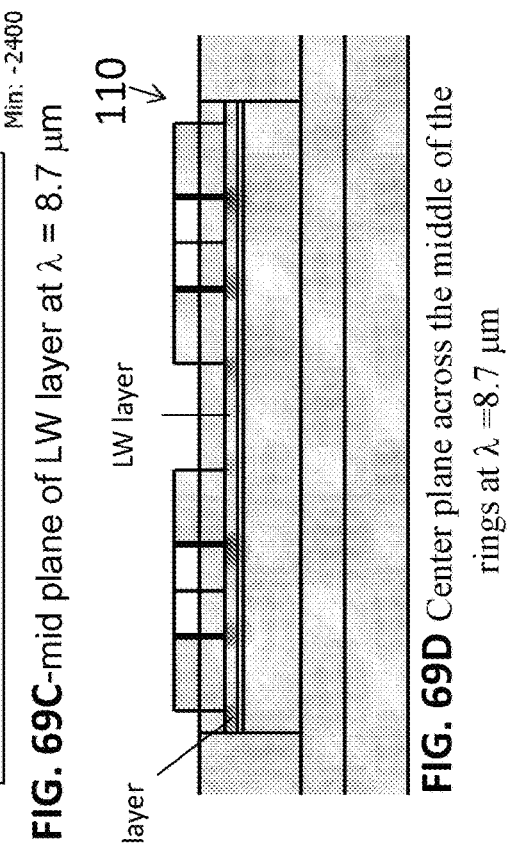
FIG. 69D Center plane across the middle of the rings at λ =8.7 μm

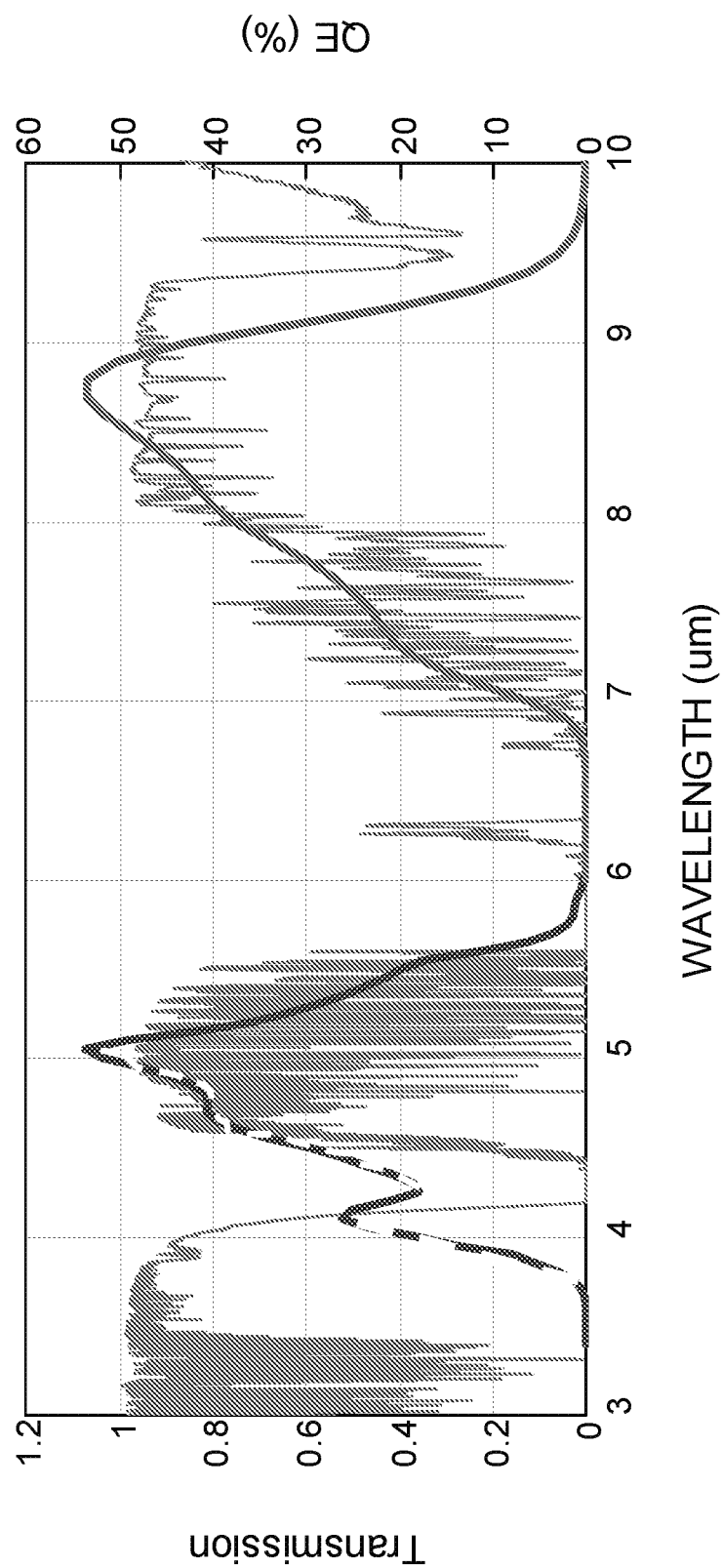
FIG. 70 The calculated QE spectrum in each absorbing layer of a dual band QWIP. The thin purple curve shows the radiation transmission in the atmosphere.

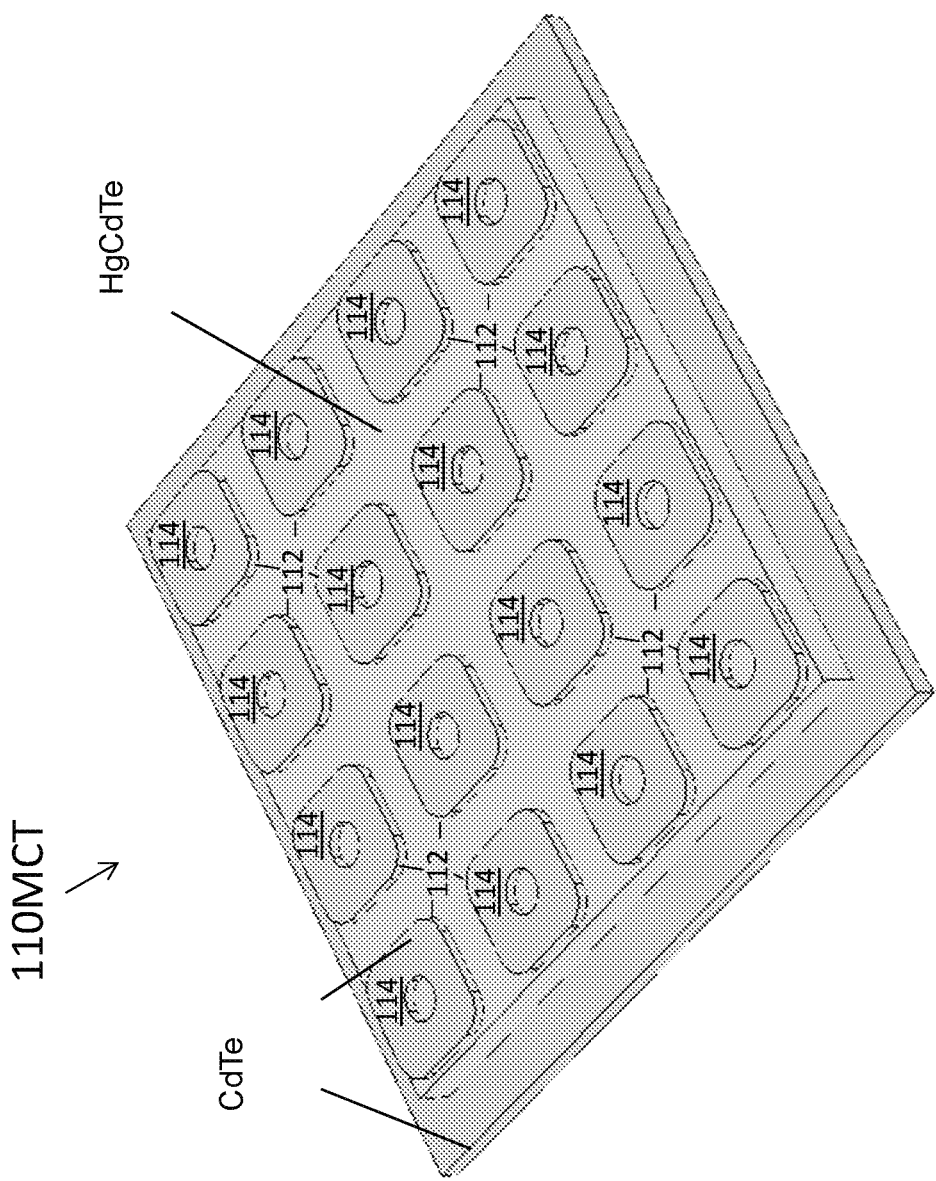
FIG. 71 Alternate preferred embodiment resonant Mercury Cadium T detector structure.

FIG. 73  R-MCT, Diagonal

Diagonal cross section of the |E| distribution at the resonant peak wavelength of 8.7 μm.

COMPARISON

Graph shows the calculated QE for a classical material without mesa sidewalls, a detector with a plain mesa, and a detector with the resonant structure shown in FIG. 67.

FIG. 75  Graph showing Quantum Efficiency versus wavelength of Preferred Embodiment Resonant detector structure (pixel size 21.5 x 21.5) having a broad resonant enhancement.

FIG. 76 FABRICATED RESONANT SLS DETECTOR STRUCTURE

FIG. 77  The measured QE of a plain SLS detector and a resonant SLS detector.

5.0/9.2 μm Cutoff Design

FIG. 79 Calculated QE for Embodiment of FIG. 78
Assuming no IR absorption in ground contact layer and barrier layer 5.5/10.8 μm Cutoff Design FIG. 80  Calculated QE for Embodiment of FIG. 80

The material layer structure of a typical GaAs solar cell with an anti-reflection coating.

SOLAR CELL

Illustrates the calculated photocurrent density under sun exposure and the corresponding experimental spectrum. The modeled, integrated total photocurrent of 16.51 mA/cm² is in general agreement with measured value of 16.38 mA/cm².

Source: PbS Colloidal Quantum Dot Photodiodes for Low-cost SWIR Sensing, by Ethan J. D. Klem, Proc. of SPIE Vol. 9451 945104-5.

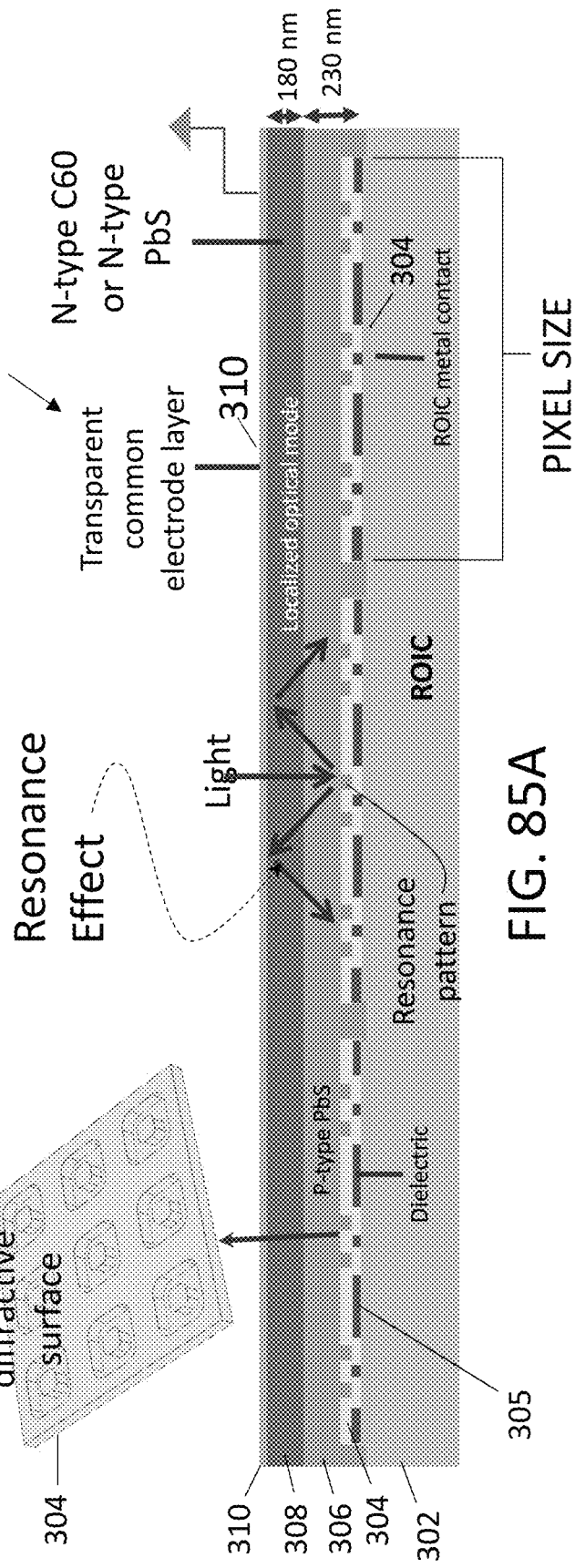
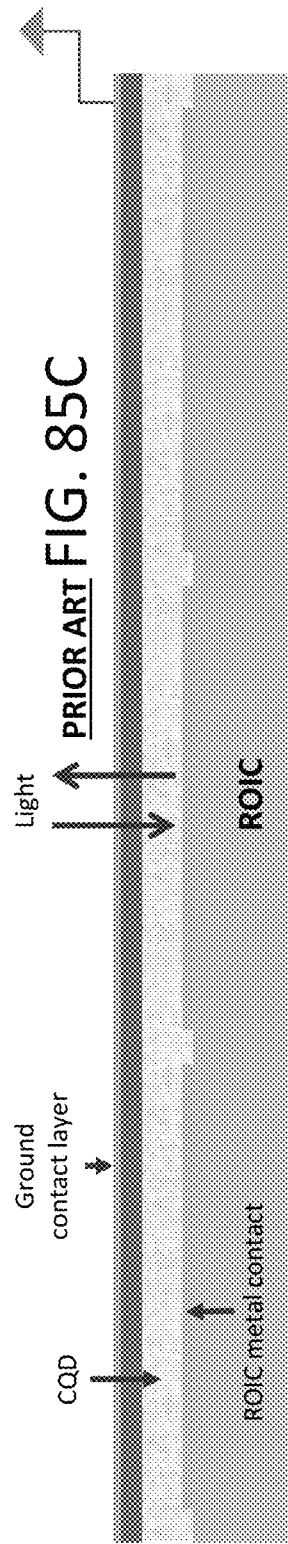
FIG. 85B
FIG. 85A
PRIOR ART FIG. 85C

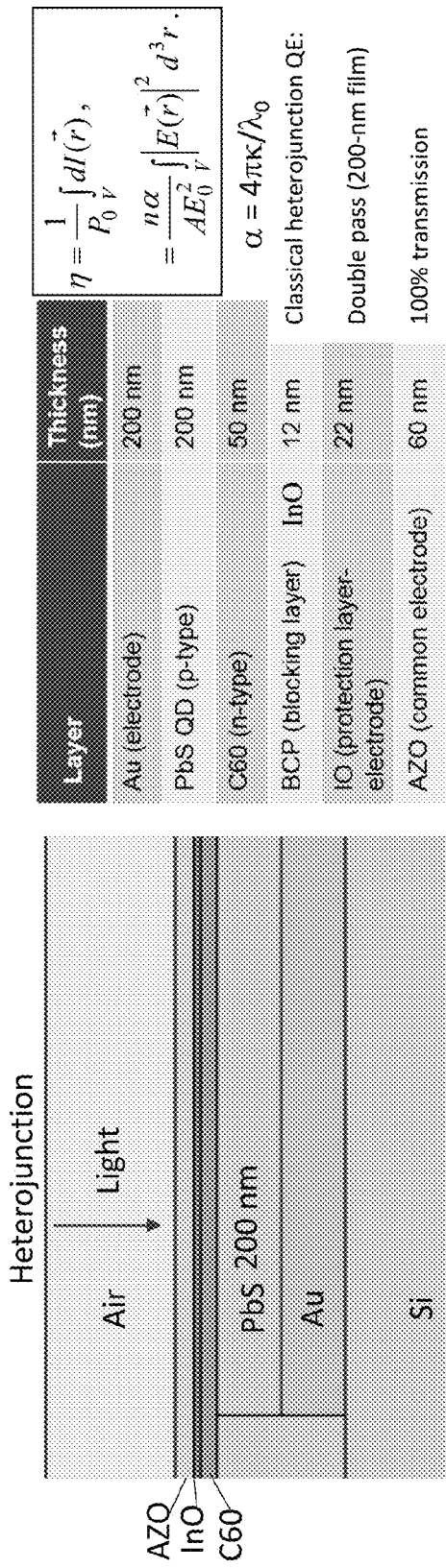
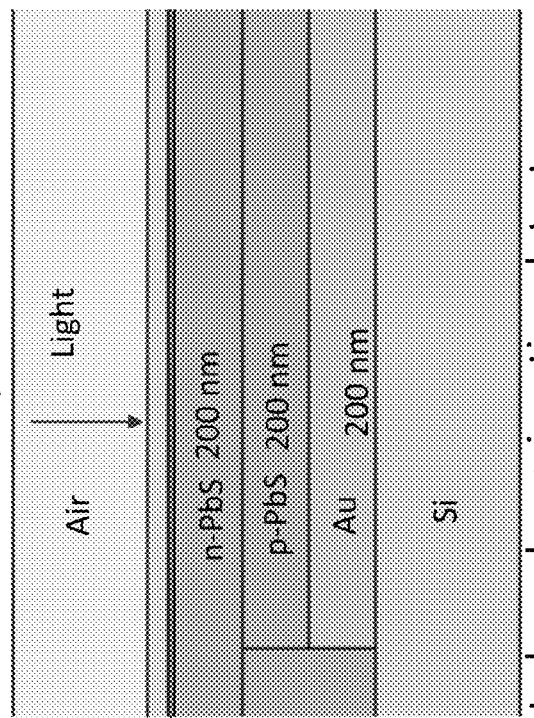
FIG. 86A PRIOR ART
Prior art planar (86A) heterojuncton heterojunction detector with 200 nm p-PbS . Alternate embodiment- C60 layer replaced by 200 nm n-type PbS QD film.
AZO - Al doped Zinc Oxide
InO – Indium Oxide
C60 – Carbon 60
PbS – Lead Sulfide
Au – Gold
Si - Silicon
FIG. 86B PRIOR ART
Prior art planar homojunction detector with 200 nm p-PbS/ 200 nm n-PbS Modeled QE of the two detectors shown in FIGS. 86A and 86B based on EM modeling. The classical QE of the heterojunction detector is also shown and it is consistent with the EM modeling.

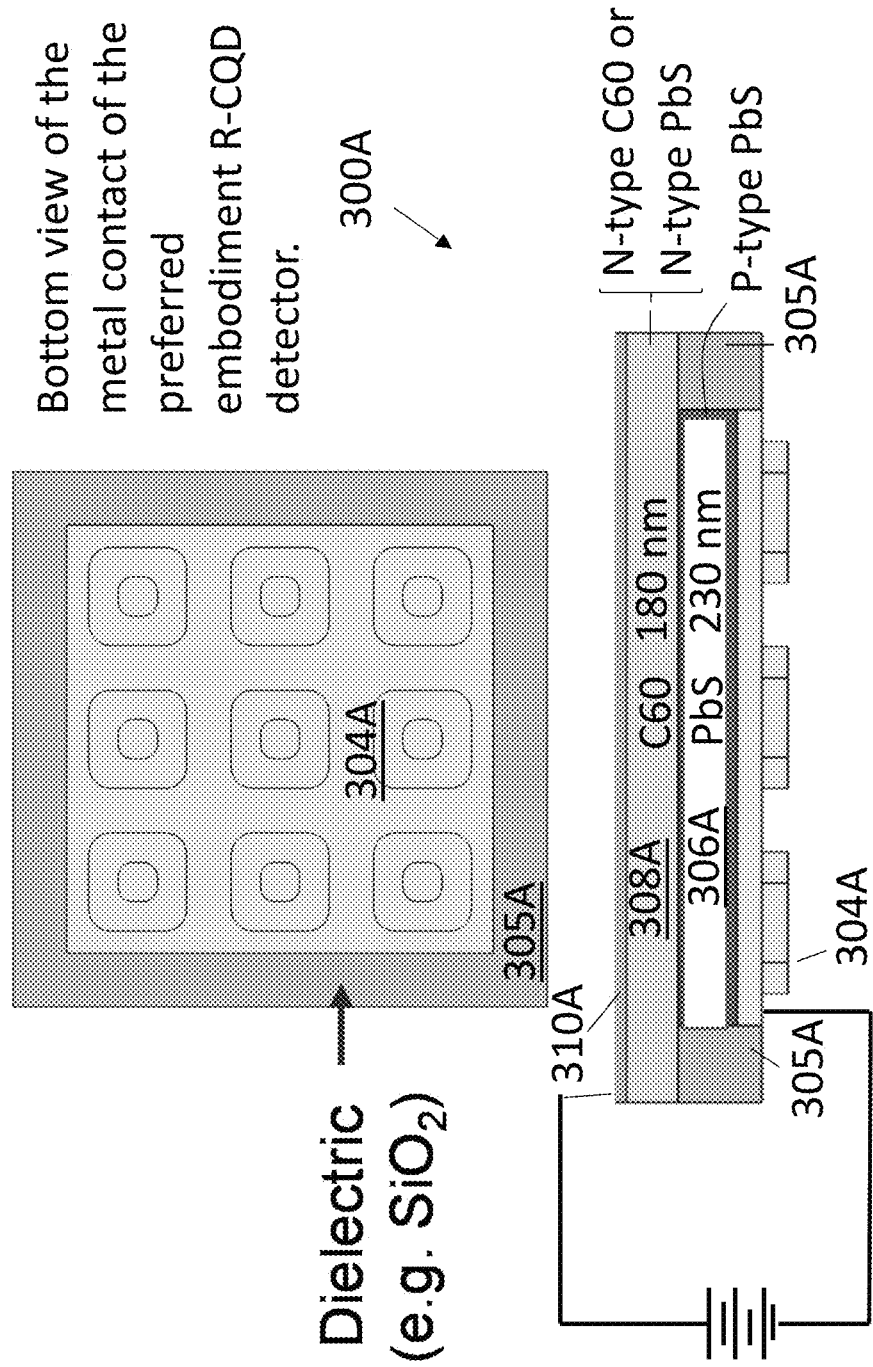

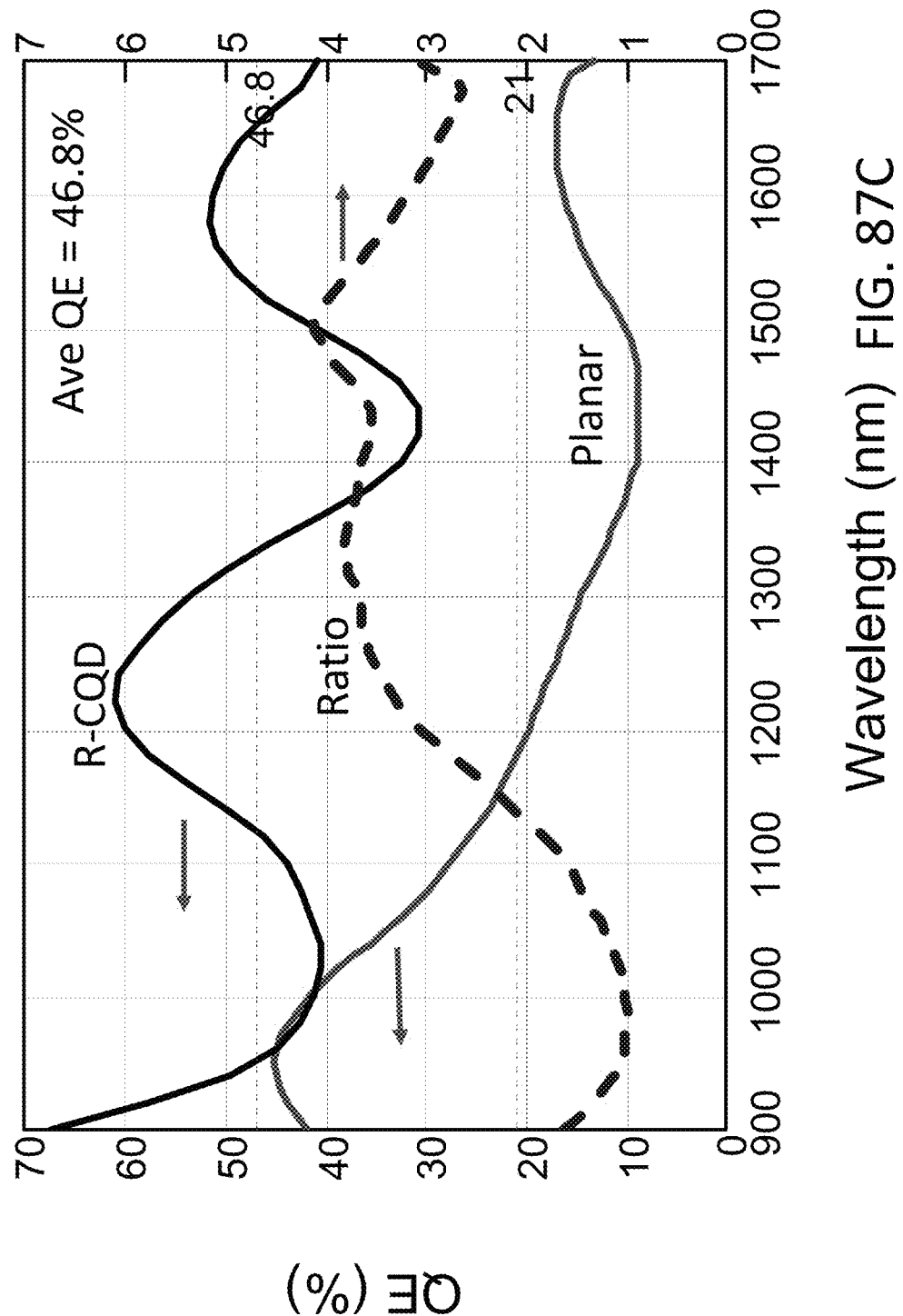
FIG. 87C illustrates the modeled QE of the R-CQD detector in comparison with the planar detector

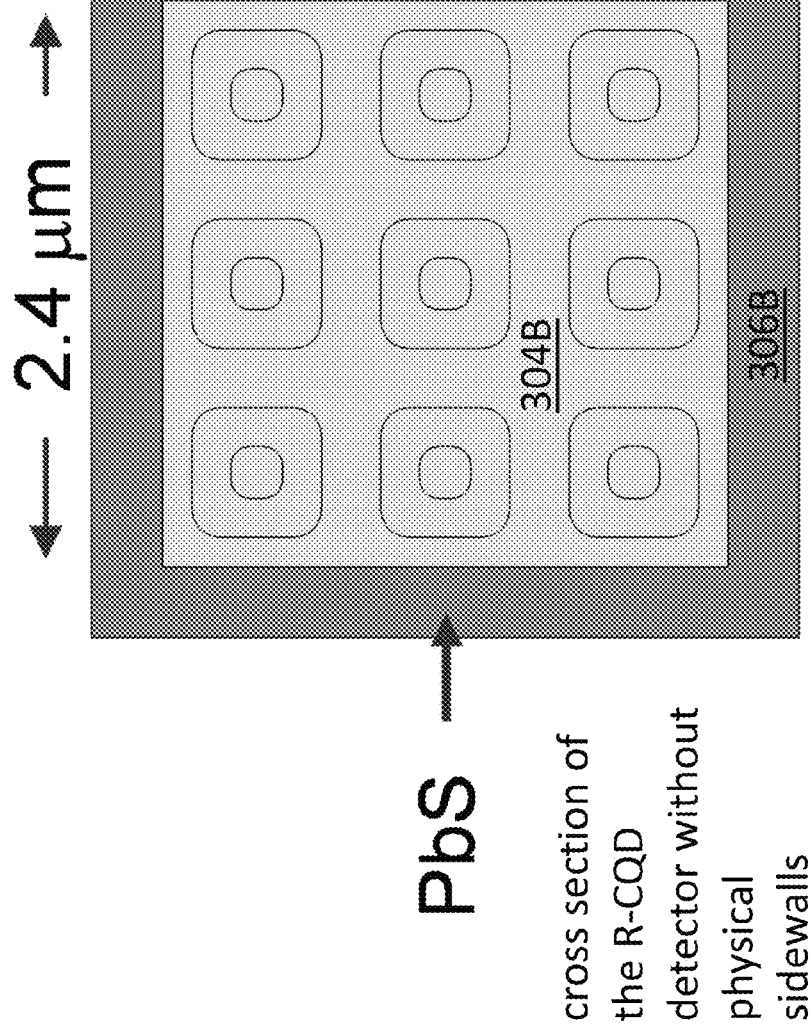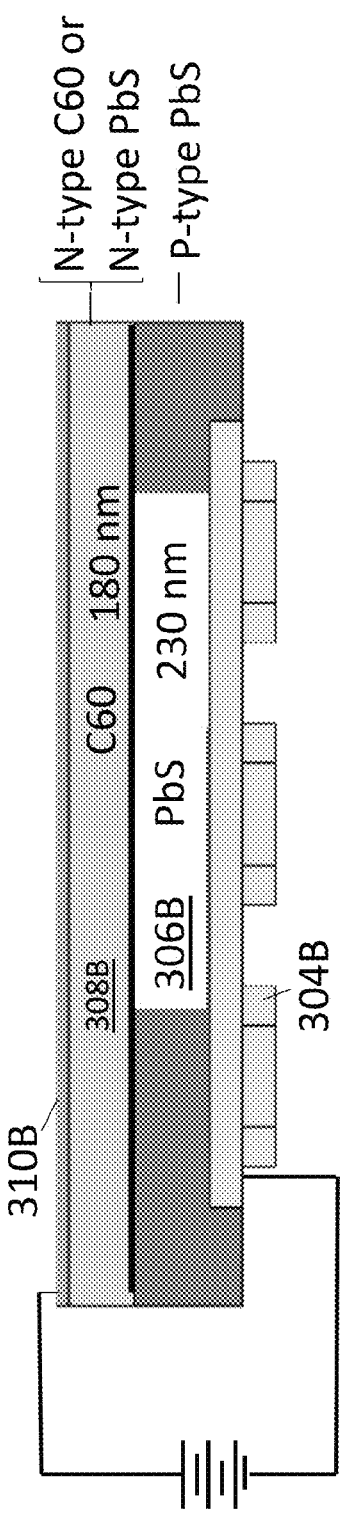
FIG. 88A bottom view of the metal contact.
FIG. 88B cross section of the R-CQD detector without physical sidewalls The modeled QE of the R-CQD detector in comparison with the planar detector.

Cross-section of a heterojunction R-CQD detector with physical sidewalls, which has a 100-nm PbS CQD layer.

(a)

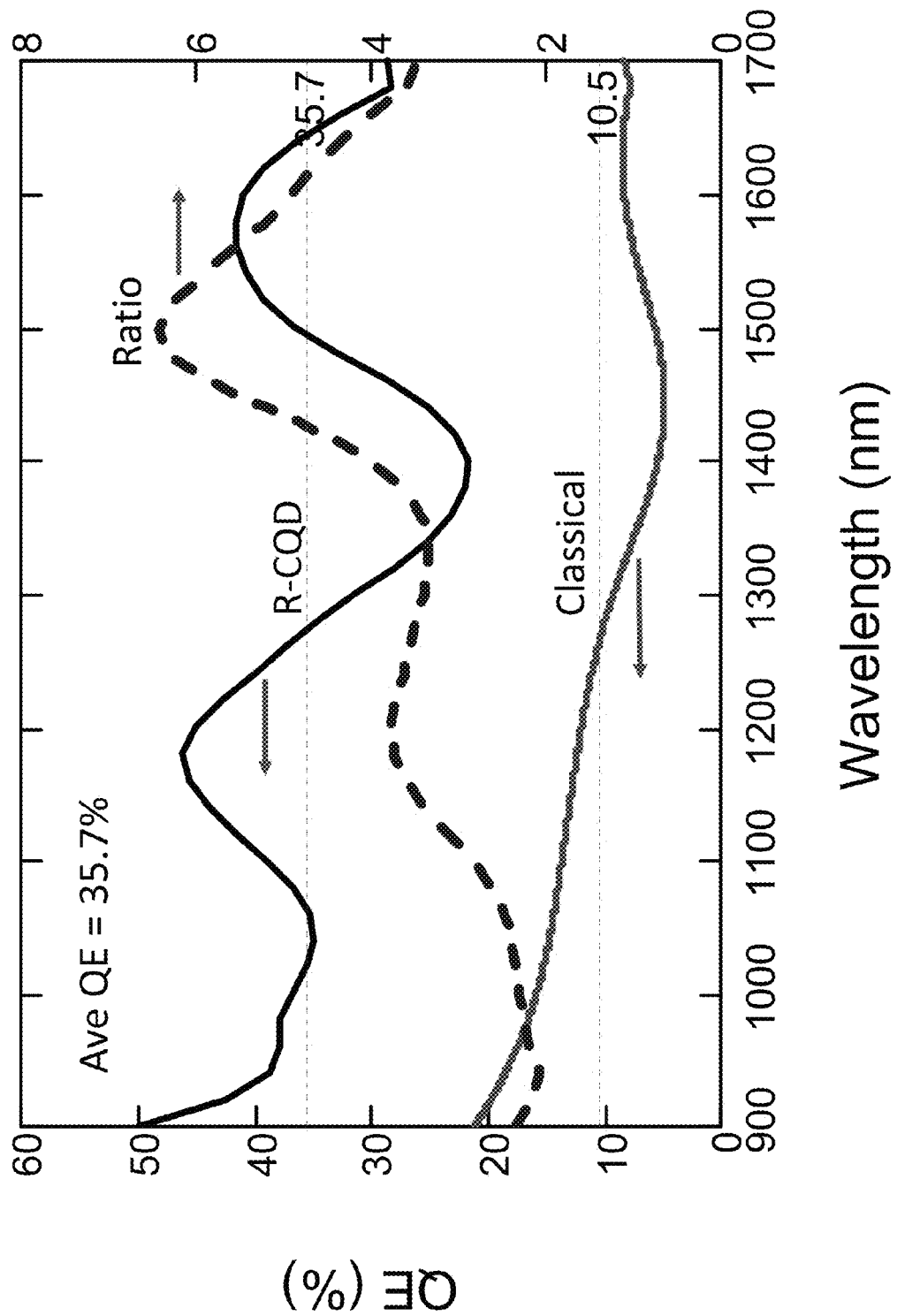
FIG. 89B - modeled QE of the R-CQD detector in comparison with the 100-nm thick planar detector.

Cross-section of a heterojunction R-CQD detector without physical sidewalls, which has a thinner 100-nm PbS CQD layer.

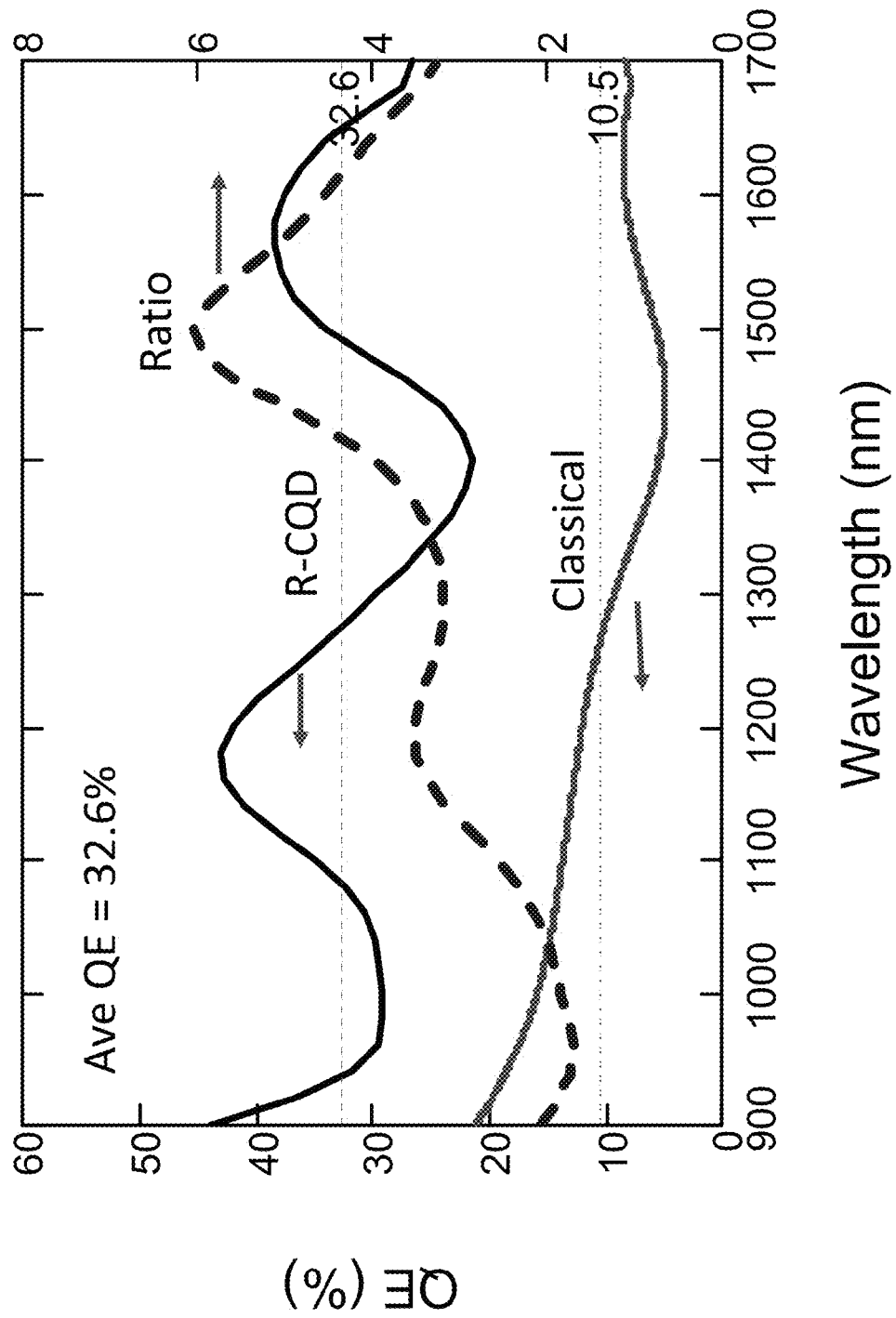
FIG. 90B - modeled QE of the R-CQD detector in comparison with the 100-nm thick planar detector.

Structural Optimization at 3μm Pitch initial parameters are inner ring diameter (INd) = 220 nm, ring height (Det)=100 nm, PbS layer thickness (PBSt) =230 nm, C60 layer thickness (C60t)=200 nm.

Structural Optimization at 3μm Pitch

Based on a common set of initial parameters of (inner ring diameter, ring height, PbS layer thickness, C60 layer thickness) = (INd, DEt, PBSt, C60t) = (220 nm, 100 nm, 230 nm, 200 nm), each parameter was changed individually while keeping others constant. Similarly, the QE of other PbS parameter sweep is shown.

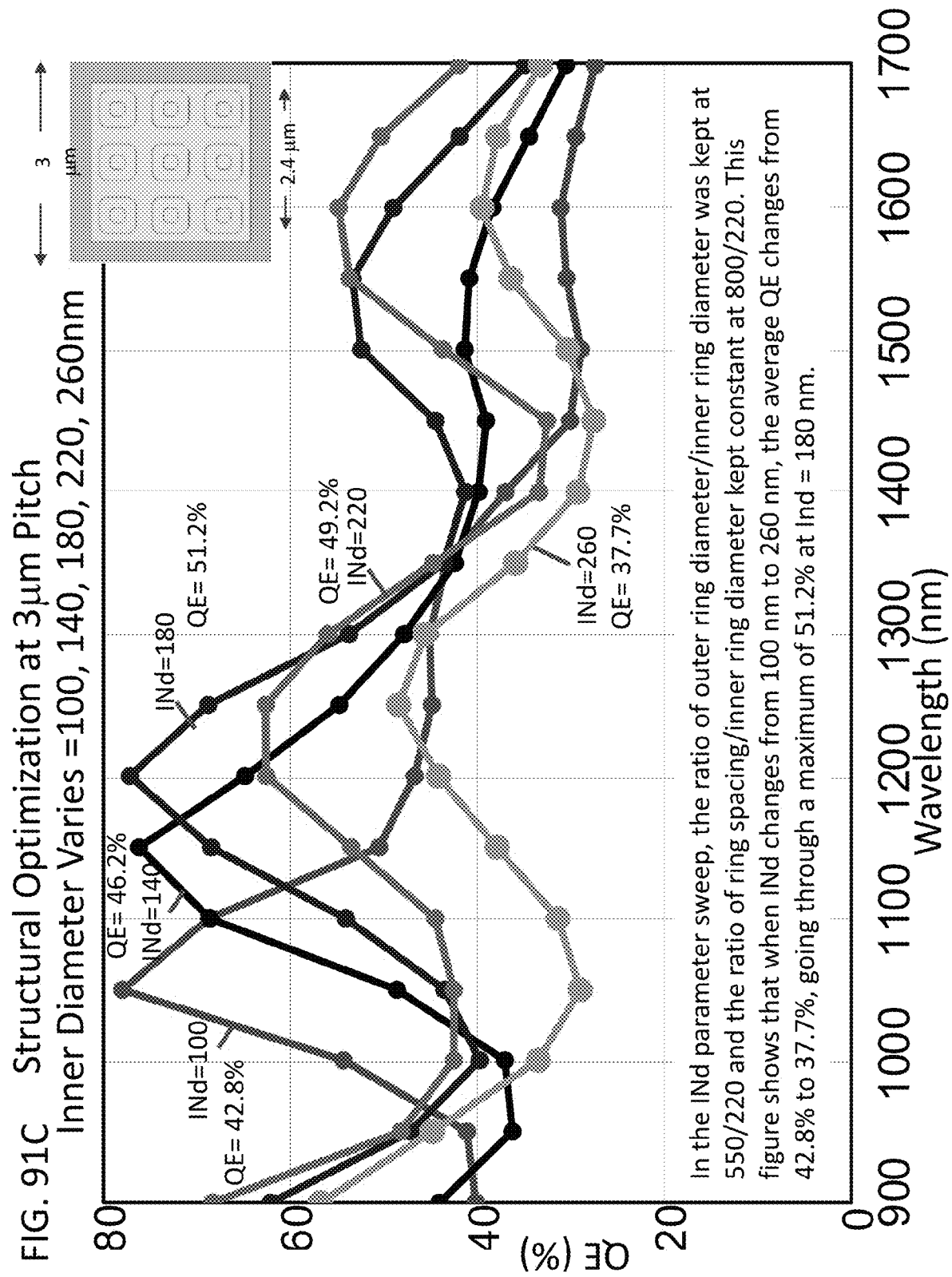

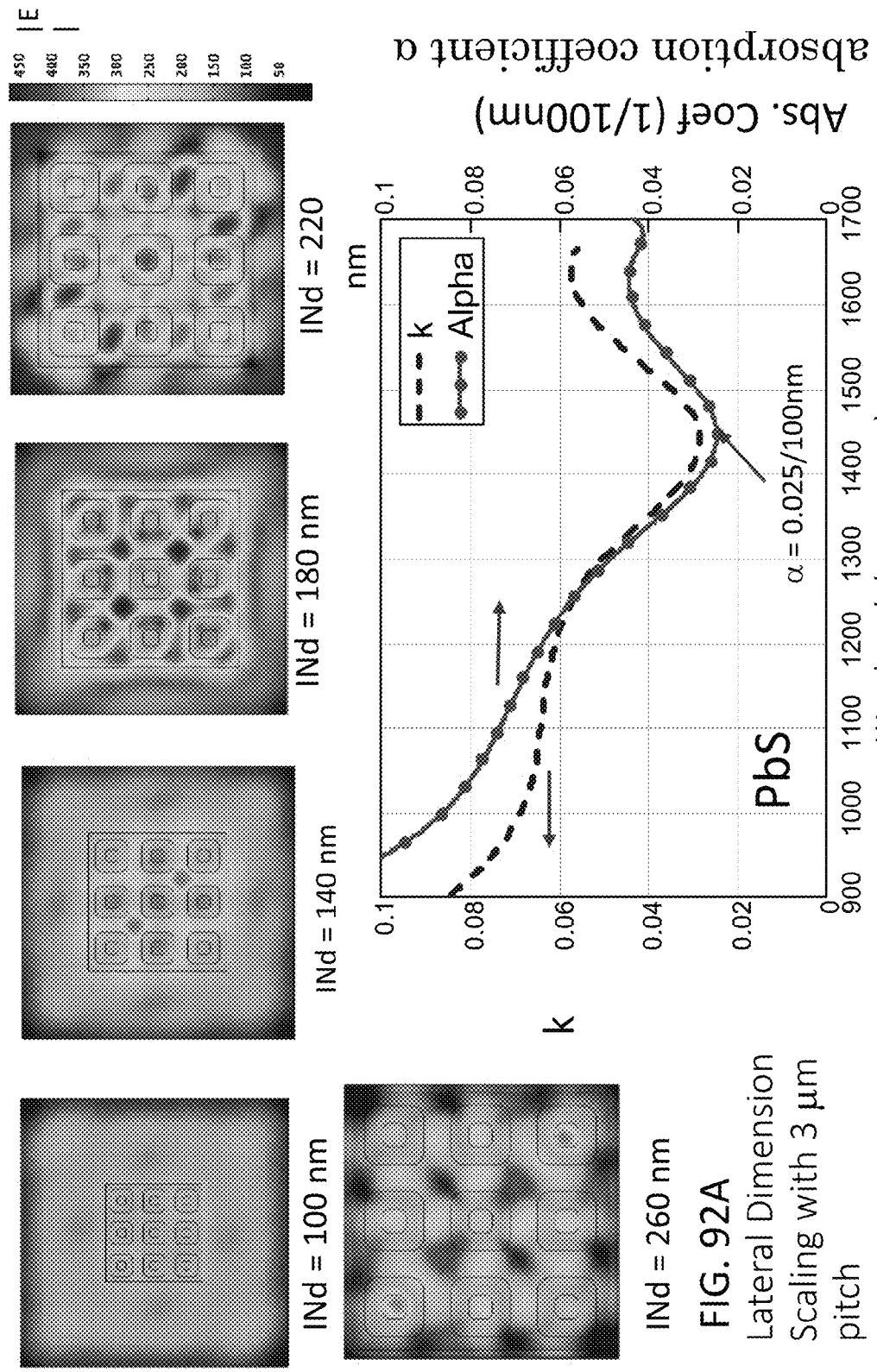

$$I = I_0 e^{-\alpha \cdot x}$$

and $$I = \frac{n\varepsilon_0 c}{2}|E|^2$$

$$= \frac{n\varepsilon_0 c}{2}E_0^2 \left|e^{i(\omega t - K \cdot x)}\right|^2$$

$$= \frac{n\varepsilon_0 c}{2}E_0^2 \left|e^{i(\omega t - \frac{2\pi}{\lambda}(n+ik)\cdot x)}\right|^2$$

$$= \frac{n\varepsilon_0 c}{2}E_0^2 \left|e^{i(\omega t - \frac{2\pi n}{\lambda}\cdot x)}\right|^2 e^{-\frac{4\pi k}{\lambda}x}$$

$$= \frac{n\varepsilon_0 c}{2}E_0^2 e^{-\frac{4\pi k}{\lambda}x}$$

$$= I_0 e^{-\frac{4\pi k}{\lambda}x}$$

$$\Rightarrow \alpha = \frac{4\pi k}{\lambda}$$

For the purposes of the graph in FIG. 92A, the relationship between the intensity (*I*) and the absorption coefficient α and k is shown by the adjacent equations where *I* is the intensity in the material, $I_0$ is the incident intensity, x is the traveling distance, E is the electric field, $\varepsilon_0$ is the vacuum permittivity, c is the velocity of light, n is the real part of the complex refractive index, *ik* is the imaginary part, ω is the angular frequency, K is the complex wave vector.

FIG. 92B

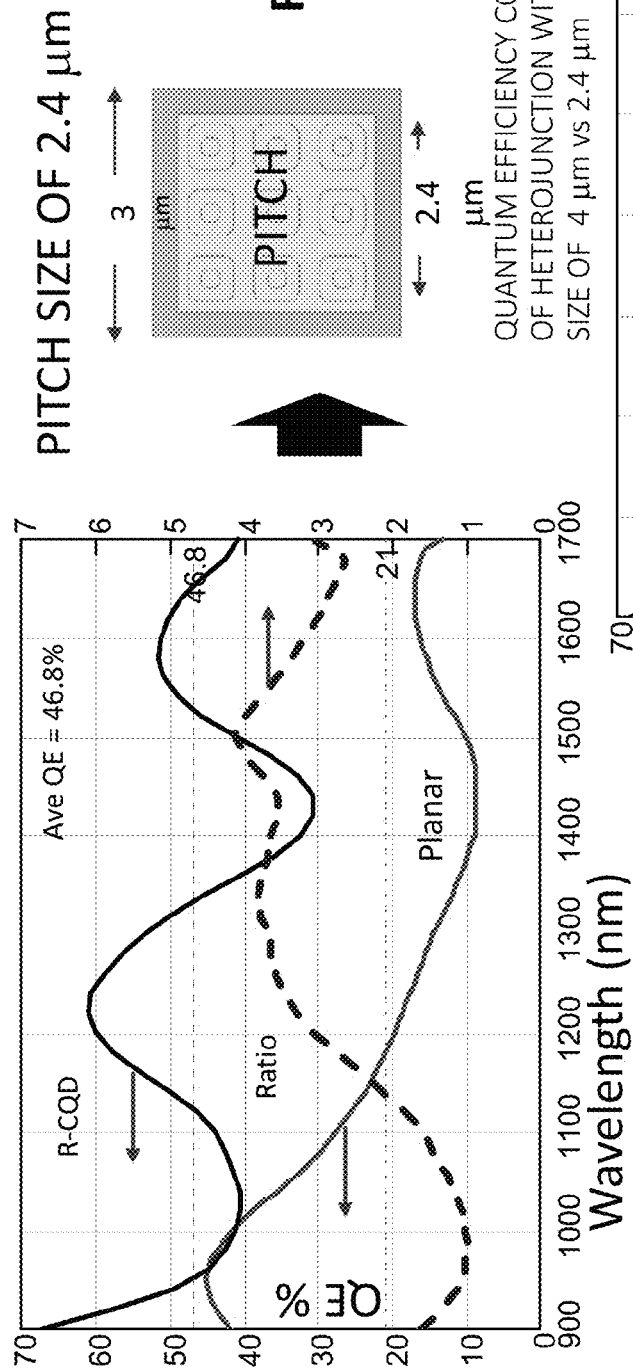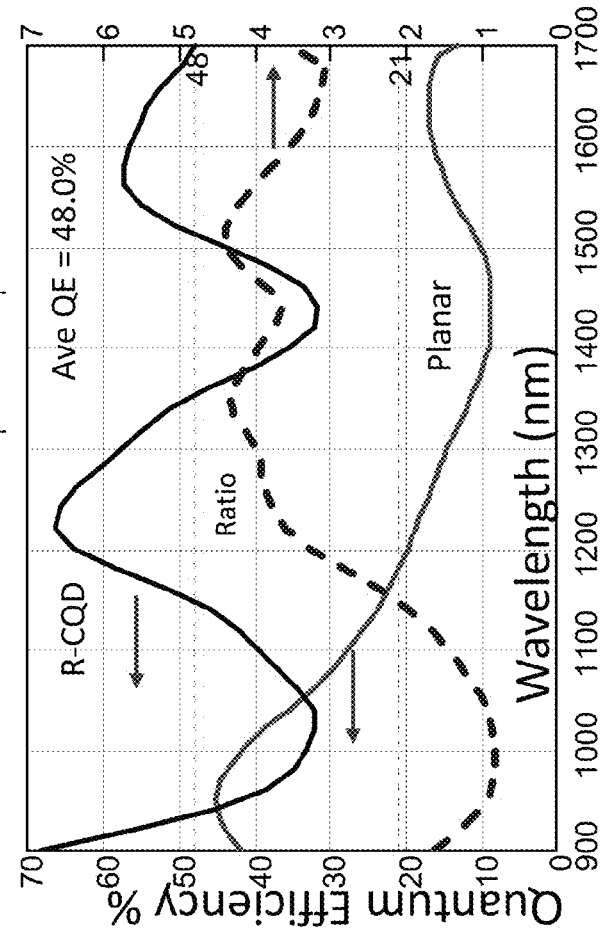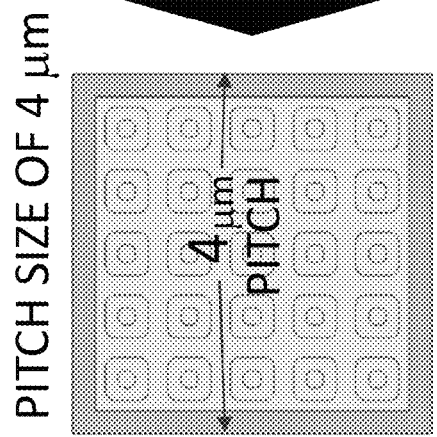
FIG. 93A

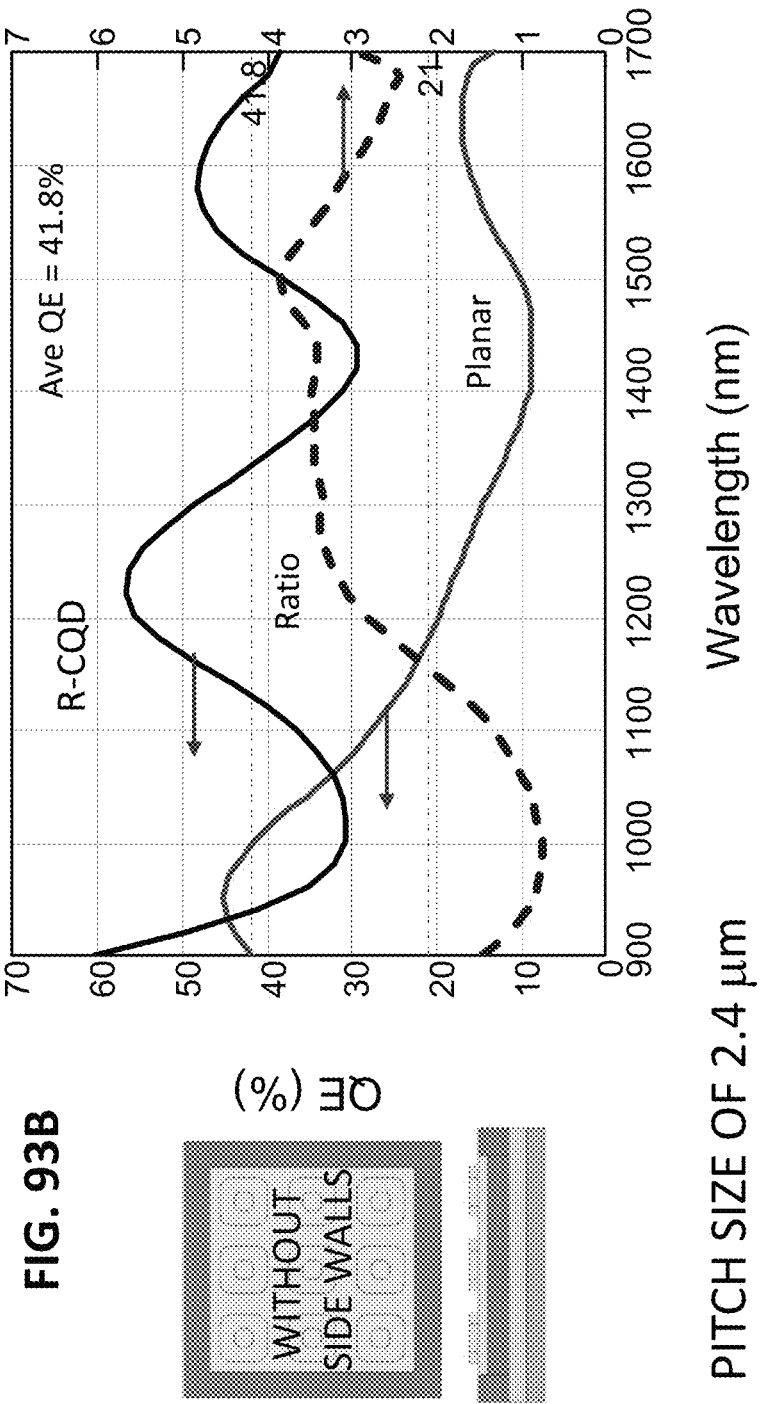

The complex refractive index (n, k) of different material layers in a CQD detector as measured by ellipsometry.

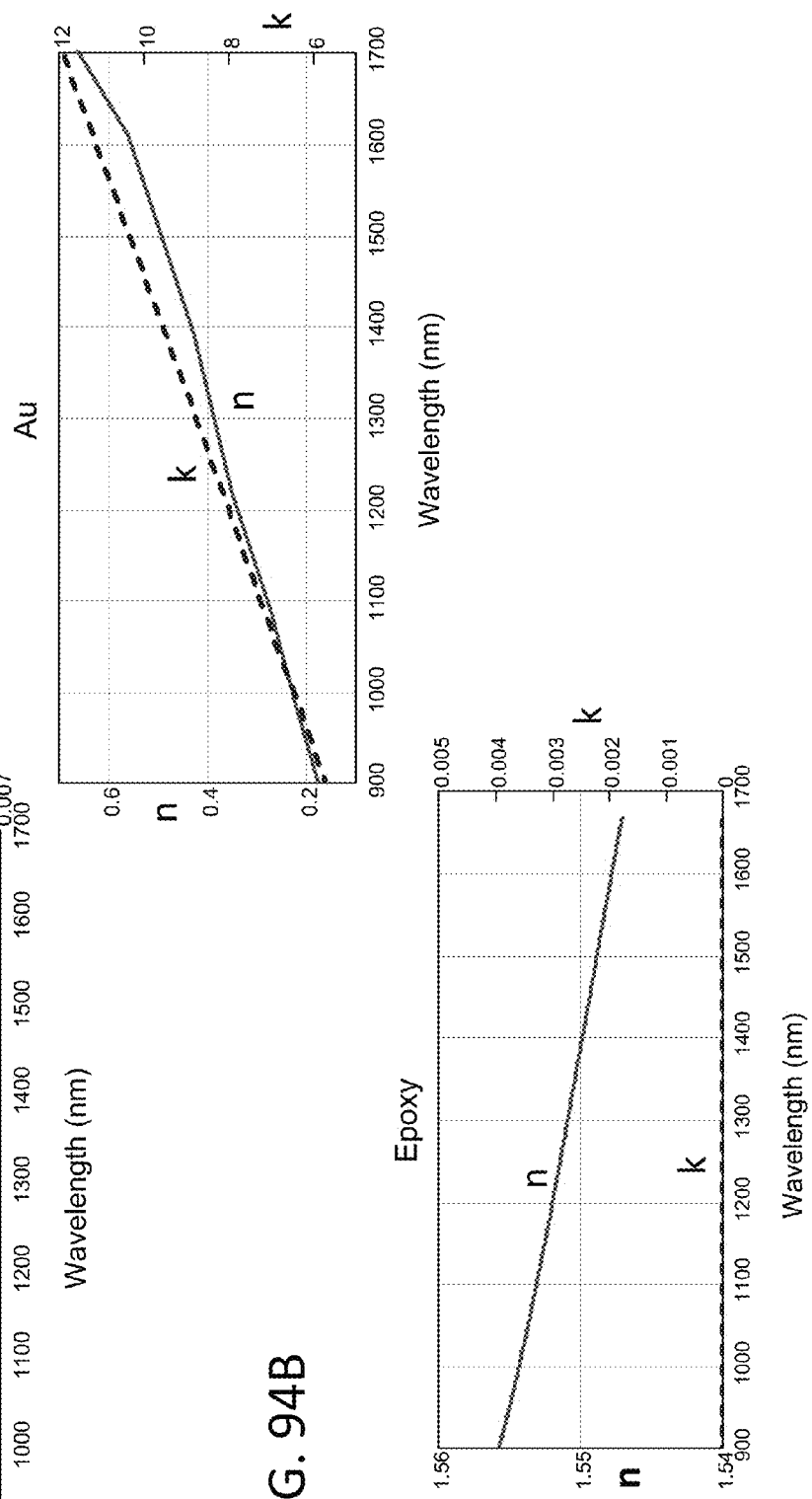
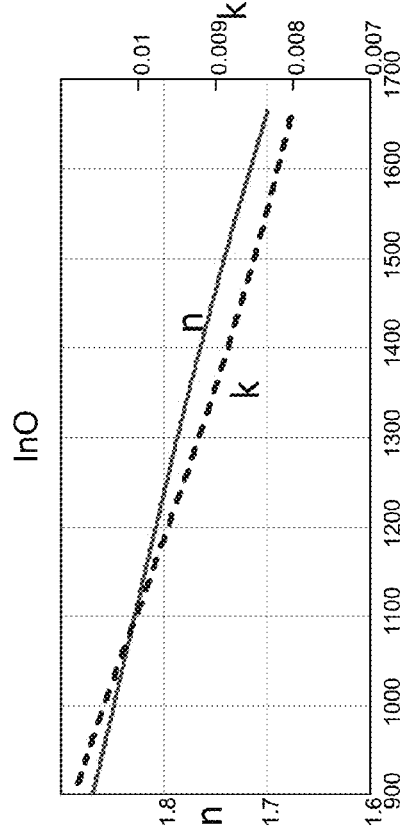
FIG. 94B

PHOTO DETECTION DEVICE USING RESONANCE AND RELATED METHOD

CROSS REFERENCE TO RELATED APPLICATIONS

This application is a continuation-in-part of and claims priority to U.S. application Ser. No. 15/612,675, entitled "Photodetector Using Resonance and Related Method," filed Jun. 2, 2017, by Dr. Kwong-kit Choi, which is a continuation-in-part of U.S. patent application Ser. No. 13/745,338, entitled "Computer Designed Resonant Photodetectors and Method of Making," filed Jan. 18, 2013, now U.S. Pat. No. 9,679,091, which is a continuation in part of and claims priority to U.S. patent application Ser. No. 13/240,125, entitled "Photodetectors Using Resonance and Method of Making," filed Sep. 22, 2011, now U.S. Pat. No. 8,704,209, issued Apr. 22, 2014, which is a continuation-in-part of and claims priority to U.S. application Ser. No. 13/082,945 entitled "Photodetectors Using Resonance and Method of Making" filed Apr. 8, 2011, which is a continuation-in-part of and claims priority to U.S. application Ser. No. 12/543,121 entitled "Corrugated-Quantum Well Infrared Photodetector with Reflective Sidewall and Method," published as U.S. Pub. Appl. 20110042647 A1, now abandoned, all of which are hereby incorporated by reference.

GOVERNMENT INTEREST

The invention described herein may be manufactured, used, and/or licensed by or for the United States Government.

BACKGROUND OF THE INVENTION

As reported in Wikipedia, in a conventional solar cell or a photodiode, light is absorbed by a semiconductor, producing an electron-hole (e-h) pair; the pair may be bound and is referred to as an exciton. This pair is separated by an internal electric field (present in p-n junctions or Schottky diodes) and the resulting flow of electrons and holes creates electric current. The internal electric field is created by doping one part of semiconductor interface with atoms that act as electron donors (n-type doping) and another with electron acceptors (p-type doping) that results in a p-n junction. Generation of an electron-hole pair requires that the photons have energy exceeding the bandgap of the material. Effectively, photons with energies lower than the bandgap do not get absorbed, while those that are higher can quickly (within about $10^{-13}$ thermalize to the band edges, reducing output. The former limitation reduces current, while the thermalization reduces the voltage. As a result, semiconductor cells suffer a trade-off between voltage and current (which can be in part alleviated by using multiple junction implementations).

Quantum dots exhibit properties that are intermediate between those of bulk semiconductors and those of discrete molecules. Their optoelectronic properties change as a function of both size and shape. Larger QDs (radius of 5-6 nm, for example) emit longer wavelengths resulting in emission colors such as orange or red. Smaller QDs (radius of 2-3 nm, for example) emit shorter wavelengths resulting in colors like blue and green, although the specific colors and sizes vary depending on the exact composition of the QD.

The ability to tune the bandgap makes quantum dots desirable for solar cells or photodiodes. Single junction implementations using lead-sulfide (PbS) colloidal quantum dots (CQD) have bandgaps that can be tuned into the far infrared, frequencies that are typically difficult to achieve with traditional solar cells. Half of the solar energy reaching the Earth is in the infrared, most in the near infrared region. A quantum dot solar cell makes infrared energy as accessible as any other.

For the last several years semiconductor particles with radii less than roughly 10 nm, also referred to as colloidal quantum dots (CQD) or semiconductor nanocrystals, have become the focus of considerable attention by researchers. Because of the effects of quantum confinement, the optical and/or electronic characteristics of colloidal quantum dots (CQDs) are largely size dependent and can be tuned during fabrication to span a broad range of energies. The effective bandgap of a quantum dot is defined by the lowest energy transition or first excitonic transition. As reported in the publication "PbS Colloidal Quantum Dot Photodiodes for Low-cost SWIR Sensing," by E. J. D. Klem, et al., Proc. of SPIE Vol. 9451, 945104 (2015), doi: 10.1117/12.2178532 (hereinafter Klem reference), one suitable material for a colloidal quantum dot diode is lead-sulfide (PbS), which has a bulk bandgap of 0.41 eV (3100 nm) and the PbS CDQs can be tuned to have bandgaps across the spectral region of 700-2400 nm, which makes them suitable for Vis-SWIR emitters, detectors, modulators, and photovoltaics. In addition, such materials continue to absorb through UV and even x-ray energies. The CQDs may be synthesized in solution through straightforward chemical techniques and subsequently processed from solution to form thin films for use in electronic devices. More specifically, as shown in FIG. 84, a colloidal quantum dot (CQD) detector 211 comprises a layer of p-type lead-sulfide (PbS) material 216 (used for forming quantum dots in a colloidal suspension) is deposited directly on top of a metal contact pad 214 of a readout integrated circuit (ROIC) 212. A layer 218 of n-type carbon-60 (C60) nanoparticle is then deposited on top of the PbS layer 216 to form a PN heterojunction photodiode. Alternatively, the layer 218 may comprise n-type PbS so as to form a homojunction photodiode. A layer 220 of conducting, transparent material then covers the photodiode to serve as a common conducting layer. This conventional planar detector architecture is shown in FIG. 84. The quantum efficiency (QE) of the detector shown in FIG. 84 however is too low to be competitive with the incumbent InGaAs detectors although the CQDs are of relatively low cost and can be made in much higher resolution.

Certain optical techniques have been applied to increase the quantum efficiency of colloidal quantum dots detectors in the past. For example, the reference by F. P. Garcr 'a de Arquer, et al., entitled "Plasmonic light trapping leads to responsivity increase in colloidal quantum dot photodetectors," Appl. Phys. Lett. 100, 043101 (2012), https://doi.org/10.1063/1.3678039, discloses the usage of silver nanoparticles dispersed in the PbS layer to create a stronger optical electric field in the PbS layer. The publication by F. J. Beck, et al., entitled "Surface Plasmon Polariton Couplers for Light Trapping in Thin-Film Absorbers and Their Application to Colloidal Quantum Dot Optoelectronics," ACS Photonics, 2014, 1 (11), pp 1197-1205, discloses usage of a surface grating in the form of an array of metallic circles to scatter light inside the layer to produce a longer optical path length. However, these approaches did not consider the thickness and the size of the detector volume to achieve optical resonances. As a result, their improvement is far less effective than the resonant approach of the present invention. It is believed that the silver nanoparticles can only increase QE by a factor of 1.2 in a small wavelength range between 700 nm and 1100 nm. The surface grating on a 100-nm thick PbS detector shows improvement only in a narrow band between 900 nm and 1100 nm, where the average improvement is a factor of 2.

SUMMARY OF THE INVENTION

A preferred embodiment of the present invention comprises a contact layer through which light enters; an absorbing region positioned such that light admitted through the contact layer passes into the absorbing region; at least one diffractive element operatively associated with the absorbing region operating to diffract light into the absorbing region; the configuration of the at least one diffractive element being determined by computer simulation to determine an optimal diffractive element and absorbing region configuration for optimal quantum efficiency for at least one predetermined wavelength detection range, the at least one diffractive element operating to diffract light entering through the contact layer such that phases of diffracted waves from locations within the photo detection device or waves reflected by sidewalls and waves reflected by the at least one diffractive element form a constructive interference pattern inside the absorbing region.

Although not necessary for the practice of the invention, a preferred embodiment photo detection device may be used for detection of quantum dots; wherein the quantum dots comprise as few as 100 to 100,000 atoms within the quantum dot volume, with a diameter of approximately 10 to 50 atoms. Alternatively, the absorbing region may comprise at least one of lead sulfide, fullerene (C60), lead selenide, cadmium selenide, cadmium sulfide, cadmium telluride, indium arsenide, indium phosphide, cadmium selenide sulfide. The at least one diffractive element may be positioned such that light is reflected back into the absorbing region and a resonant cavity is formed in the photo detection device. Although not required, the absorbing region may comprise sidewalls such that light diffracted from the at least one diffractive element strikes the sidewalls at an incident angle larger than the critical angle for total internal reflection. A preferred embodiment of the present invention may comprise a reflective layer positioned such that light is reflected back into the absorbing region such that a resonant cavity is formed in the photo detection device; such that resonance is achieved through experimentation by using the intrinsic material optical properties as determined by ellipsometry measurements. In addition, the at least one diffractive element may be positioned within the photo detection device in accordance with resonant field patterns developed by computer simulation. In addition, the at least one diffractive element may have a configuration determined by design parameters that are varied individually to determine the optimal configuration. In at least one preferred embodiment, the absorbing region comprises a p-type layer having a first thickness parameter and an n-type layer having a second thickness parameter. Such design parameters and first and second thicknesses may be changed individually while keeping the other parameters constant. In order to measure the quantum efficiency for the design parameters and/or thicknesses, a computer simulation may be performed in order to determine and compare the quantum efficiency for each parameter.

A preferred embodiment may be formed in the configuration of a plurality of pixels having sidewalls. The phases of the reflected waves from the contact layer, the diffracted waves from the at least one diffractive element and the waves reflected from the sidewalls may form a constructive interference pattern inside the absorbing region. The determination of the at least one optimal diffractive element and absorbing region configuration may comprise selecting at least one diffractive element pattern, while adjusting detector pixel volume thickness and the pixel area. An alternate preferred embodiment of the present invention may comprise a plurality of regions defined by sidewalls such that incident light of a plurality of wavelength ranges entering between the sidewalls and diffracted at multiple angles is reflected by the sidewalls to form a constructive interference pattern. Detection of a plurality of wavelengths may be achieved through different orders of diffraction in a single common resonant volume between the sidewalls. The regions may be the size of quantum dots and the absorbing region may be formed by a p-type and n-type material constructed to produce carriers in response to quantum dot radiation. Alternatively, the absorbing layer may comprise multiple layers of quantum dot responsive semi-conductor material; and the at least one diffractive element may comprise three-dimensional reflection surfaces constructed to spread the incident light in a plurality of different directions back into the absorbing layer to optimize quantum well absorption of the incident light.

An alternate preferred embodiment photo detection device comprises a contact layer through which light enters; an absorbing region positioned such that light admitted through the contact layer passes into the absorbing region; at least one diffractive element comprising at least one protuberance operatively associated with the absorbing region operating to diffract light into the absorbing region; the configuration of the photo detection device being determined by computer simulation to determine at least one optimal diffractive element and absorbing region configuration for optimal quantum efficiency for at least one predetermined wavelength range, the at least one diffractive element operating to diffract light entering through the contact layer such that phases of diffracted waves from locations within the photodetector including waves reflected by sidewalls and waves reflected by the at least one diffractive element form a constructive interference pattern inside the absorbing region that produces resonance and increases the quantum efficiency. The absorbing region is not limited to but may be formed of at least one of lead sulfide, fullerene (C60), lead selenide, cadmium selenide, cadmium sulfide, cadmium telluride, indium arsenide, indium phosphide, cadmium selenide sulfide. The configuration of the photo detection device may comprise a plurality of reflective walls, the configuration of plurality of the reflective walls within the absorbing region being determined using computer simulation to determine optimal diffraction occurring when light entering the contact layer is diffracted such that the phrase of the diffracted wave at one location and the phrases of waves returning back to the same location, by reflection and diffraction, from all other locations within the detector volume form a constructive interference pattern inside the active region to thereby achieve resonance. In addition, although not necessary to the practice of the invention, the configuration of the diffractive element may be determined by three-dimensional computer simulation that operates to simulate the light absorption within the photodetector; the computer simulation comprising the steps of:

inputting the composition of the at least one material;
inputting the configuration of the absorption region and the diffractive element;
calculating the electromagnetic field distributions using the three-dimensional computer simulation;

calculating the eigen functions and energies of the at least one material; and using three-dimensional computer simulation, changing the size and shape of the diffractive element such that a different set of eigen modes are created and the excitation of these eigen modes, and their superpositions if they are degenerate, by the incident light determine the detector quantum efficiency spectrum which is used to calculate the quantum efficiency of the detector configuration geometry.

A preferred method of the present invention comprises:

selecting a material composition for the absorbing region comprising an n-type material and a p-type material;

providing at least one diffractive element; and determining an optimal configuration of the absorption region and the at least one diffractive element using a computer simulation comprising varying the configuration of the absorbing region and the configuration of the diffractive element, the computer simulation operating to process different configurations to determine an optimal configuration for at least one predetermined wavelength or wavelength range occurring when waves reflected by the diffractive element form a constructive interference pattern inside the absorbing region to thereby increase the quantum efficiency of the photodetector. In addition, although not required, the varying the configuration of the at least one diffractive element may comprise varying the size of at least one protuberance on the diffractive element. In addition, the step of varying of the configuration of the absorbing region may comprise varying the parameters of the absorbing region such that the parameters are varied individually to determine the optimal configuration. The absorbing region may comprise a p-type layer having a first thickness parameter and an n-type layer having a second thickness parameter. The parameters and first and second thicknesses may be changed individually while keeping the other parameters constant, and a computer simulation may be performed in order to determine and compare the quantum efficiency for each parameter. Such a computer simulation may be utilized to select a configuration based on the constructive interference pattern becoming resonant at least one predetermined wavelength or wavelength range. As an additional feature of the present invention, the light incident normally at the photo detection device/air interface may enter the photo detection device and be reflected by the interfaces within the at least one diffractive element, and by matching the phase of the light waves reflected within the photo detection device a constructive interference pattern may be formed inside the absorbing region to produce a resonant effect to thereby increase the quantum efficiency of the photodetector at the predetermined wavelength or wavelength range. The method may further comprise the steps of calculating the electromagnetic field distributions using a three-dimensional electromagnetic field simulation;

calculating the eigen functions and energies of the at least one material to determine the material absorption coefficient;

using computer simulation, designing the physical geometry of a photo detection device including changing the cavity's size and shape such that a different set of cavity eigen modes are created and the excitation of these eigen modes, and their superpositions if they are degenerate, by the incident light determine the detector quantum efficiency spectrum which is used to calculate the quantum efficiency of the detector configuration geometry;

selecting the configuration geometry based on the computer simulation.

BRIEF DESCRIPTION OF THE DRAWINGS

The patent or application file contains at least one drawing executed in color. Copies of this patent or patent application publication with color drawing(s) will be provided by the Office upon request and payment of the necessary fee.

The present invention can best be understood when reading the following specification with reference to the accompanying drawings, which are incorporated in and form a part of the specification, illustrate alternate embodiments of the present invention, and together with the description, serve to explain the principles of the invention. In the drawings:

FIG. 1 is a schematic illustration of grating coupled QWIPs adopted in commercial QWIP cameras, having a grating period of a+b, and grating groove height is h. The values of a, b and h determine the diffraction angle θ of a particular wavelength.

FIG. 6B schematically illustrates the cross-section of $E_z$ distribution at λ=9.0 μm for a PR-QWIP with air cover and AR substrate coating.

FIG. 8 illustrates the calculated $E_z$ in PR-QWIPs with air cover where, in place of the conventional substrate, the pixel has an extra thin film coating beneath the common contact layer (single layer thin film; thickness=1.4 μm and n=1.8) at $\lambda$=8.4 μm.

FIG. 13 illustrates in cross-section $E_z$ distribution at $\lambda$=9.0 μm of the embodiment of FIG. 12.

FIG. 14B graphically illustrates the QE of a PY-QWIP with a 9 μm AR-coating.

FIG. 15 B illustrates in cross section of FIG. 15A illustrating the $E_z$ distribution at $\lambda$=9.0 μm.

FIG. 17A illustrates the 3D geometry of a GR-QWIP with the $E_z$ distribution shown at $\lambda$=9.7 μm.

FIG. 17B illustrates the $E_z$ distribution at $\lambda$=9.7 μm at the center plane of the active material of the embodiment of FIG. 17A.

FIG. 22A graphically illustrates the calculated and measured external QE of PR-QWIP FPA#1.

FIG. 24 graphically illustrates the measured noise gain of FPA#2.

FIG. 25A graphically illustrates the calculated and measured external QE of PR-QWIP FPA#2.

FIG. 28A illustrates the calculated and measured external QE of PR-QWIP FPA#3.

FIG. 30 illustrates the projected gain and the measured CE of the GR-QWIP FPA.

FIG. 31B illustrates the experimental grating structure.

FIG. 33A illustrates the calculated and measured external QE spectra of a PY-QWIP FPA. The absolute QE value of the FPA has not been determined.

FIG. 33B shows the infrared image taken by the 1-mega-pixel PY-QWIP FPA.

FIG. 36C illustrates the $E_z$ distribution at the center plane of the active layer at $\lambda$=8.8 μm.

FIG. 39 illustrates step 1 of the method depicted in the flow chart of FIG. 38.

FIG. 40 illustrates step 2 of the method depicted in the flow chart of FIG. 38.

FIG. 41 illustrates step 3 of the method depicted in the flow chart of FIG. 38.

FIG. 43 illustrates step 5 of the method depicted in the flow chart of FIG. 38.

FIG. 44 illustrates step 6 of the method depicted in the flow chart of FIG. 38.

FIG. 45 illustrates step 7 of the method depicted in the flow chart of FIG. 38.

FIG. 46 illustrates step 8 of the method depicted in the flow chart of FIG. 38.

FIG. 47 illustrates step 9 of the method depicted in the flow chart of FIG. 38.

FIG. 48 illustrates step 10 of the method depicted in the flow chart of FIG. 38.

FIG. 49 illustrates step 11 of the method depicted in the flow chart of FIG. 38.

FIG. 50B is an illustration showing additional exemplified patterns of diffractive elements (DEs) (shown by light shading) that are usually formed by patterning and etching away part of the top contact material layer until the active layer (shown by darker shading) is nearly exposed. The top three rows of patterns consist of regular arrays with one step height, while the rest have irregular patterns.

FIG. 52 also indicates the typical QE of gratings without properly designed resonant cavity.

FIG. 54A illustrates an embodiment of an R-QWIP design which was experimentally tested.

FIG. 54B illustrates the embodiment of FIG. 54A measured QE (solid curve with circles) and the calculated QE (dashed curve) for the design illustrated in FIG. 54A

FIG. 54 C illustrates the calculated dc current (solid circles) based on the measured QE spectrum under 18° C. background with F/2 anti-reflection coated optics. The solid curve is the fitting to the data.

FIG. 55A illustrates an alternate embodiment of an R-QWIP design.

FIG. 55B illustrates the calculated QE of the FIG. 55A embodiment with the detection spectrum closely matched the transmission characteristics of a medium.

FIG. 56 A illustrates an alternate preferred embodiment of an R-QWIP design with a specific absorption spectrum.

FIG. 56B illustrates the calculated QE with the detection spectrum closely matching the absorption spectrum of methane gas; so as to be useful in an application of the invention directed to the detection of methane gas. The figure also shows the atmospheric transmission.

FIG. 57A illustrates an alternate embodiment of an R-QWIP design.

FIG. 57B illustrates the calculated QE of the FIG. 57A embodiment with the detection spectrum closely matching the atmospheric transmissions.

FIG. 61A is an illustration showing results obtained using an array of square rings as the DE; thereby widening the coupling bandwidth. In this structure, the outer dimension of each ring is 4 μm and the inner dimension is 1.4 μm.

FIG. 61B illustrates that the wider bandwidth is beneficial even for a narrow band material. It reduces the spectral variations with different p and preserves the absorption line shape of the material.

As shown in FIG. 62, the detector can have 57% QE for 13-μm pixels and 40% QE for 8-μm pixels.

FIG. 64 is an illustration of a preferred embodiment dual band resonant QWIP structure.

FIGS. 68A through 68C are diagrams illustrating an embodiment of a stand-alone superlattice structure (SL1) together with a blocking barrier (BB). The stand-alone superlattice structure (SL1) comprises a number of quantum wells (QWs) that are strongly coupled such that the ground states of the QWs share energy across SL1 and, also, the excited states of the QWs share energy across SL1. The ground states evolve into the lower miniband 1 (LM1) and the excited states evolve into the upper miniband 1 (UM1).

FIG. 68A is an illustration showing the energy levels and band diagram at zero bias.

FIG. 68B is an illustration under positive bias showing the presence of light with energy matching the energy difference between the upper miniband 1 (UM1) and the lower miniband 1 (LM1) that allows the electrons in LM1 be promoted to UM1. The higher energy photoelectrons are able to pass through the blocking barrier (BB), resulting in a large current +i. Therefore, SL1 is able to detect the presence of light under positive bias.

FIG. 68C is an illustration showing the effect when a negative bias is applied, low-energy electrons enter from the bottom contact 130B but are blocked by the blocking barrier. There is no current flow even in the presence of light with matching energy between UM1 and LM1. Therefore, SL1 produces no photocurrent and thus is unable to detect light under negative bias.

FIG. 69A is an illustration depicting the effect when light is incident from the bottom of the detector as shown in FIG. 64, an interference pattern is established in the detector. FIG. 69A illustrates the $E_z$ distribution in the mid plane of the MW layer 116 at $\lambda$=5.1 µm.

FIG. 69B illustrates the $E_z$ distribution in the center plane across the middle of the rings at $\lambda$=5.1 µm.

FIG. 69C illustrates the mid plane of the LW layer at $\lambda$=8.7 µm.

FIG. 69D illustrates the center plane across the middle of the rings at $\lambda$=8.7 µm.

FIG. 70 is a further example of a graph having two resonant peaks representing the calculated quantum efficiency (QE) in each absorbing layer of a dual band Quantum Well Infrared Detector (QWIP).

FIG. 71 is an illustration of an alternate preferred embodiment resonant mercury cadmium telluride MCT structure comprising an active HgCdTe infrared absorbing material sandwiched between a top CdTe contact layer, which is fabricated into diffractive elements, and a bottom CdTe contact layer.

FIG. 76 illustrates a preferred embodiment a strained layer superlattice (SLS) detector structure, having indium bumps for the top contact.

FIG. 77 is an illustration showing the measured QE of a resonant SLS detector in comparison to a plain SLS detector.

FIG. 78 is an illustration of an alternate preferred embodiment with a dual wavelength range having a short wavelength of 5.0 and a long wavelength of 9.2 µm.

FIG. 79 is a graphical illustration showing, inter alia, the calculated quantum efficiency for the embodiment of FIG. 78

FIG. 80 is an illustration of an alternate preferred embodiment with a dual wavelength range having a short wavelength 5.5 µm and a long wavelength of 10.8 µm.

FIG. 81 is a graphical illustration showing, inter alia, the calculated quantum efficiency for the embodiment of FIG. 80.

FIG. 82 is an illustration of a preferred embodiment solar cell in which the concepts of the present invention can be used to increase the quantum efficiency of the photodetector.

FIG. 83 is a graphical illustration showing the calculated photocurrent density under one-sun condition and the corresponding experimental spectrum.

FIG. 84 is an illustration of a prior art PbS colloidal quantum dot photodiode.

FIG. 85A is an illustration showing a cross-sectional view of a preferred embodiment Resonant Colloidal Quantum Dot detector.

FIG. 85B is an illustration showing a 3-D perspective of the metallic diffraction surface of the embodiment of FIG. 85A.

FIG. 86A is an illustration showing the prior art planar heterojunction detectors with nominal 200 nm p-PbS.

FIG. 86B is an illustration showing the prior art planar homojunction detectors with nominal 200 nm p-PbS/200 nm n-PbS.

Figure 86C:
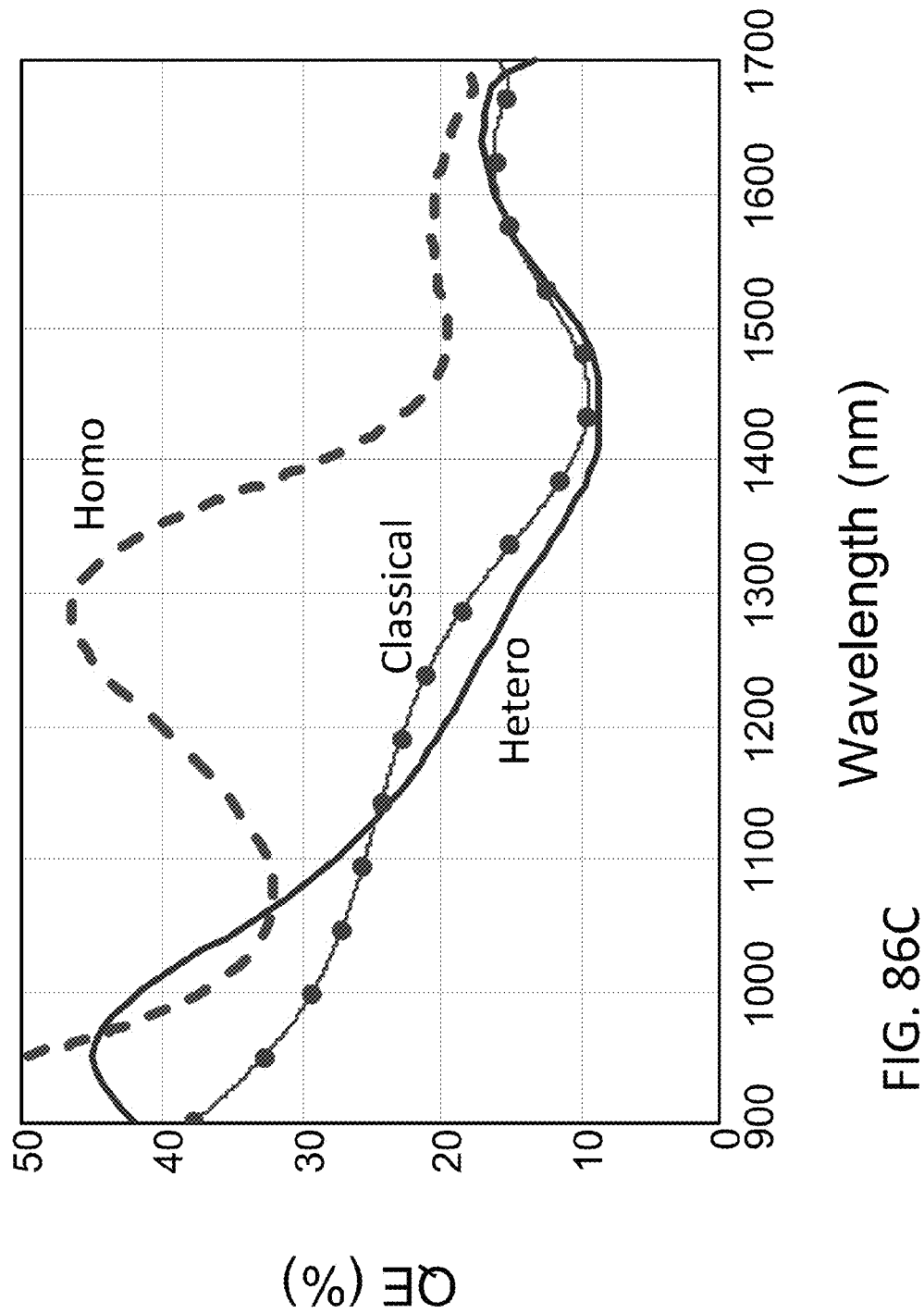

FIG. 86C is an illustration showing the modeled QE of the detectors shown in FIGS. 86A and 86B based on EM modeling. The classical QE of the heterojunction detector is also shown and it is consistent with the EM modeling.

FIG. 87A is an illustration showing a bottom view of the metal contact of the preferred embodiment Resonant Colloidal Quantum Dot detector (R-CQD) detector.

FIG. 87B is an illustration showing a cross-sectional view of a preferred embodiment Resonant Colloidal Quantum Dot detector.

FIG. 87C is a graphical illustration showing the modeled QE of a preferred embodiment Resonant Colloidal Quantum Dot detector of FIGS. 87A and 87B in comparison with the planar detector.

FIG. 88A is an illustration showing the bottom view of the metal contact and the cross section of a preferred embodiment Resonant Colloidal Quantum Dot detector without physical sidewalls.

FIG. 88B is an illustration showing a cross-sectional view of the preferred embodiment resonant detector of FIG. 88A.

FIG. 88B is a graphical illustration showing the modeled QE of a preferred embodiment Resonant Colloidal Quantum Dot detector in comparison with the planar detector.

Figure 89A:
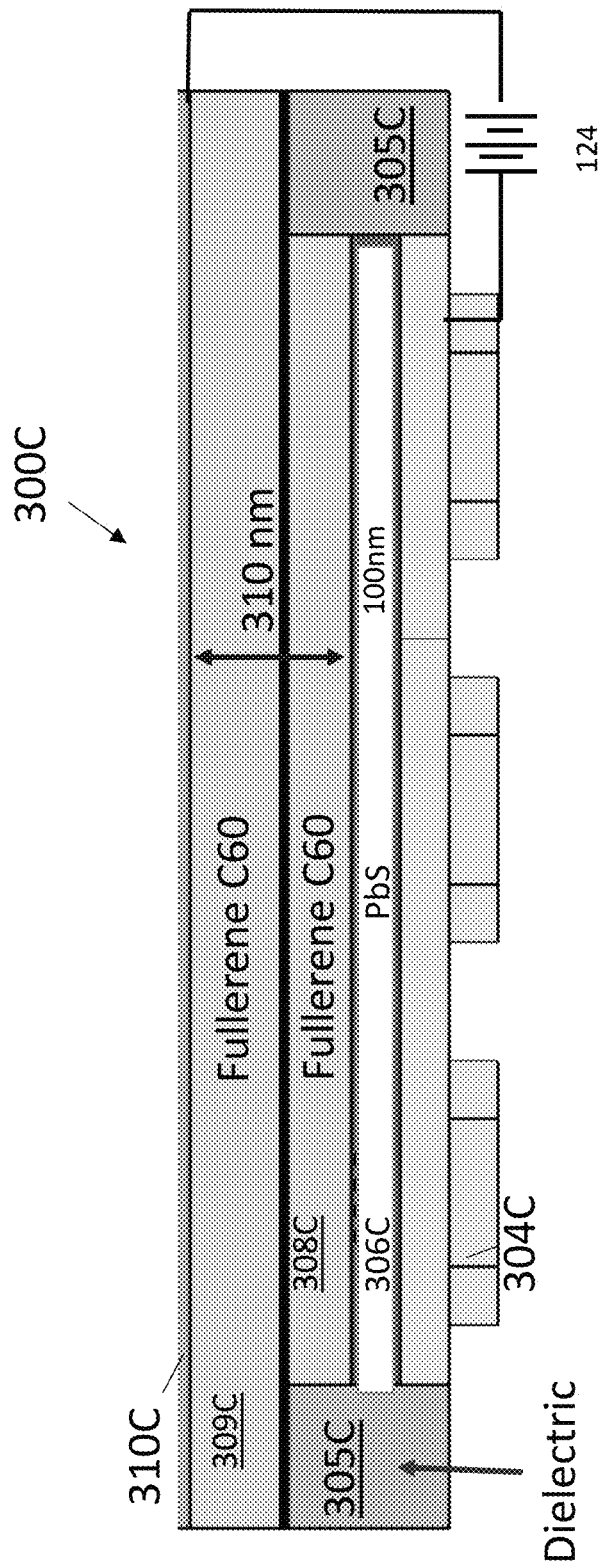

FIG. 89A is an illustration showing the cross-section of a preferred embodiment heterojunction Resonant Colloidal Quantum Dot detector with physical sidewalls, which has a thinner 100-nm PbS CQD layer.

FIG. 89B is a graphical illustration showing the modeled QE of the preferred embodiment heterojunction Resonant Colloidal Quantum Dot detector with physical sidewalls detector of FIG. 89A in comparison with the 100-nm thick planar detector.

Figure 90A:
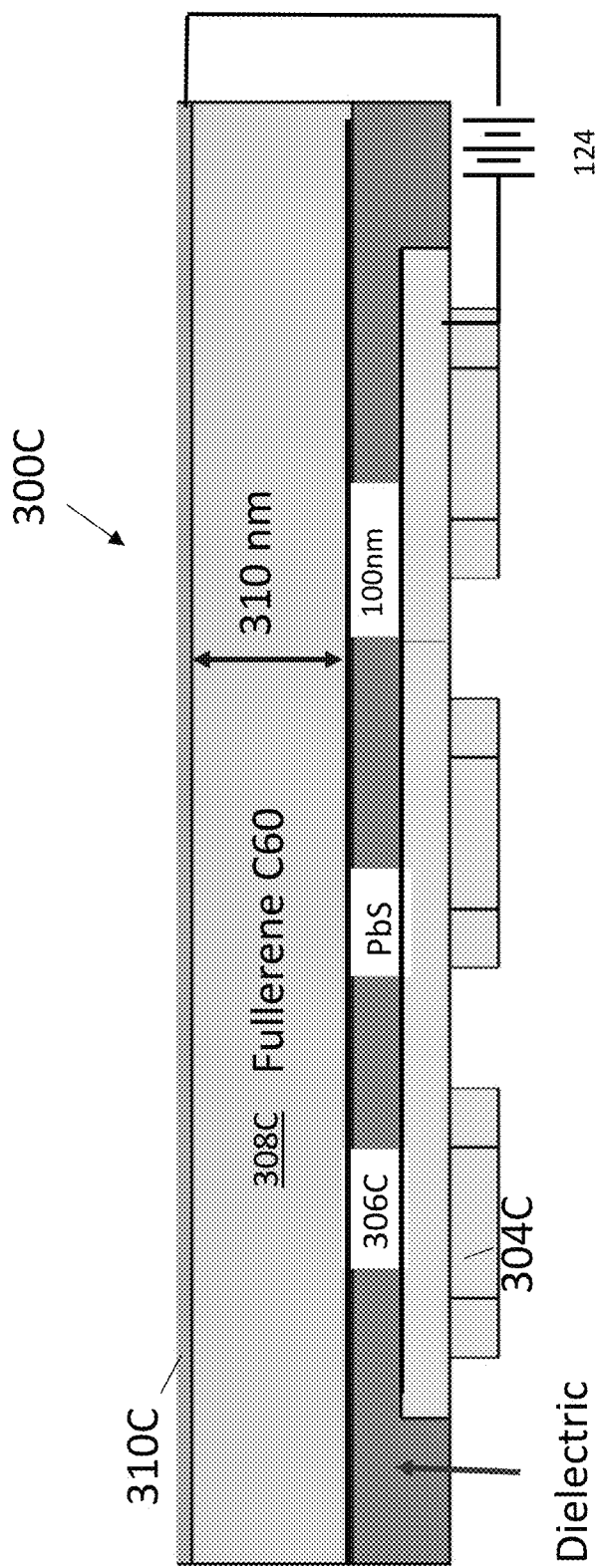

FIG. 90A is an illustration showing the cross-section of a heterojunction R-CQD detector without physical sidewalls and which has a thinner 100-nm PbS CQD layer.

FIG. 90B is an illustration showing the modeled QE of the R-CQD detector in comparison with the 100-nm thick planar detector.

Figure 91A:
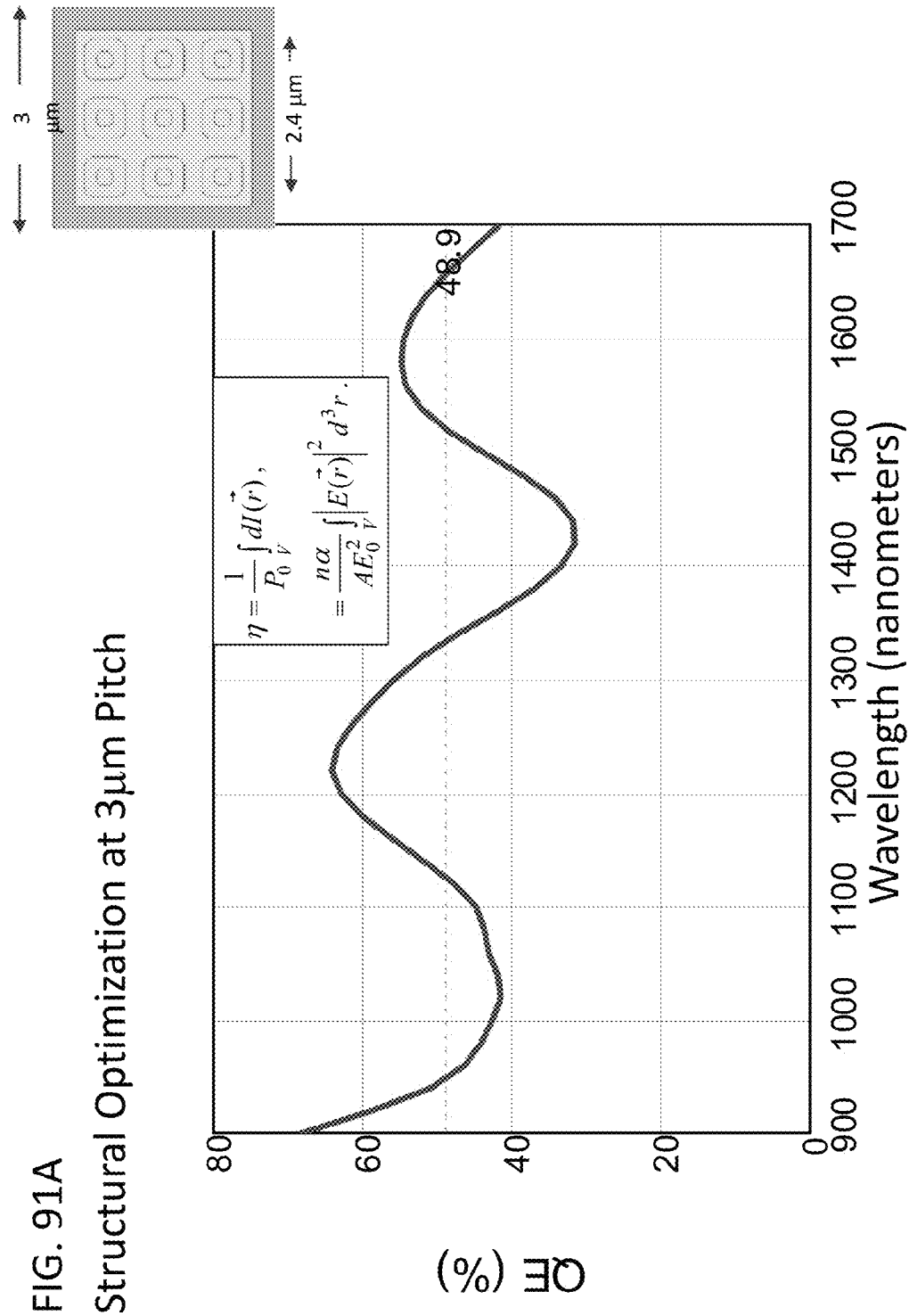

FIG. 91A is the beginning illustration of a series of illustrations showing the structural optimization at 3 μm pitch where the initial parameters are inner ring diameter (INd)=220 nm, ring height (Det)=100 nm, PbS layer thickness (PBSt)=230 nm, C60 layer thickness (C60t)=200 nm.

Figure 91B:
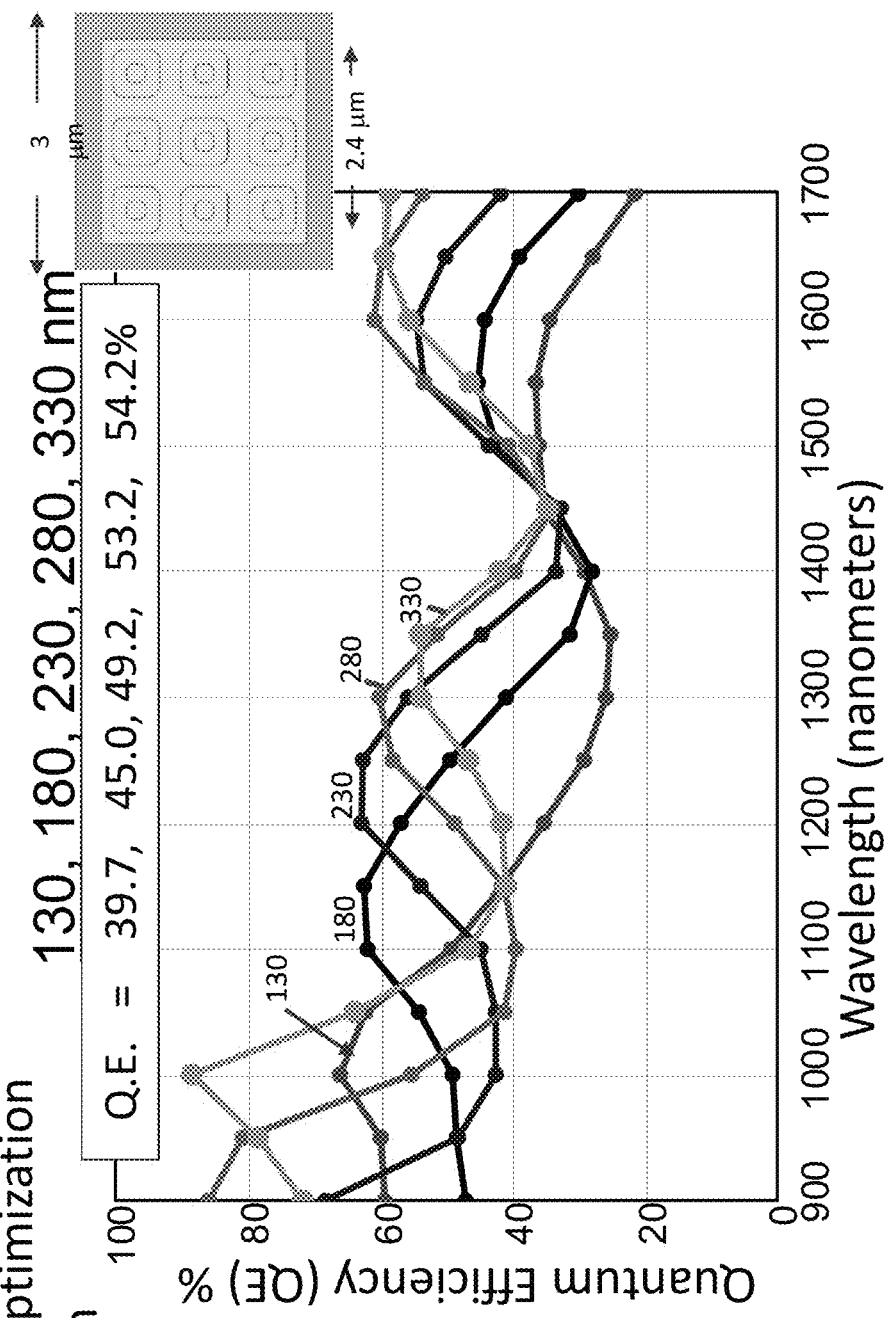

FIG. 91B is the next illustration in a series of illustrations showing the structural optimization at 3 μm pitch where the PbS layer thickness was varied. The quantum efficiency of the PbS parameter sweep is shown.

FIG. 91C is the next illustration in a series of illustrations showing the structural optimization at 3 μm pitch where the inner diameter of the rings of the diffractive element was varied. The quantum efficiency of the inner diameter of the rings sweep is shown.

Figure 91D:
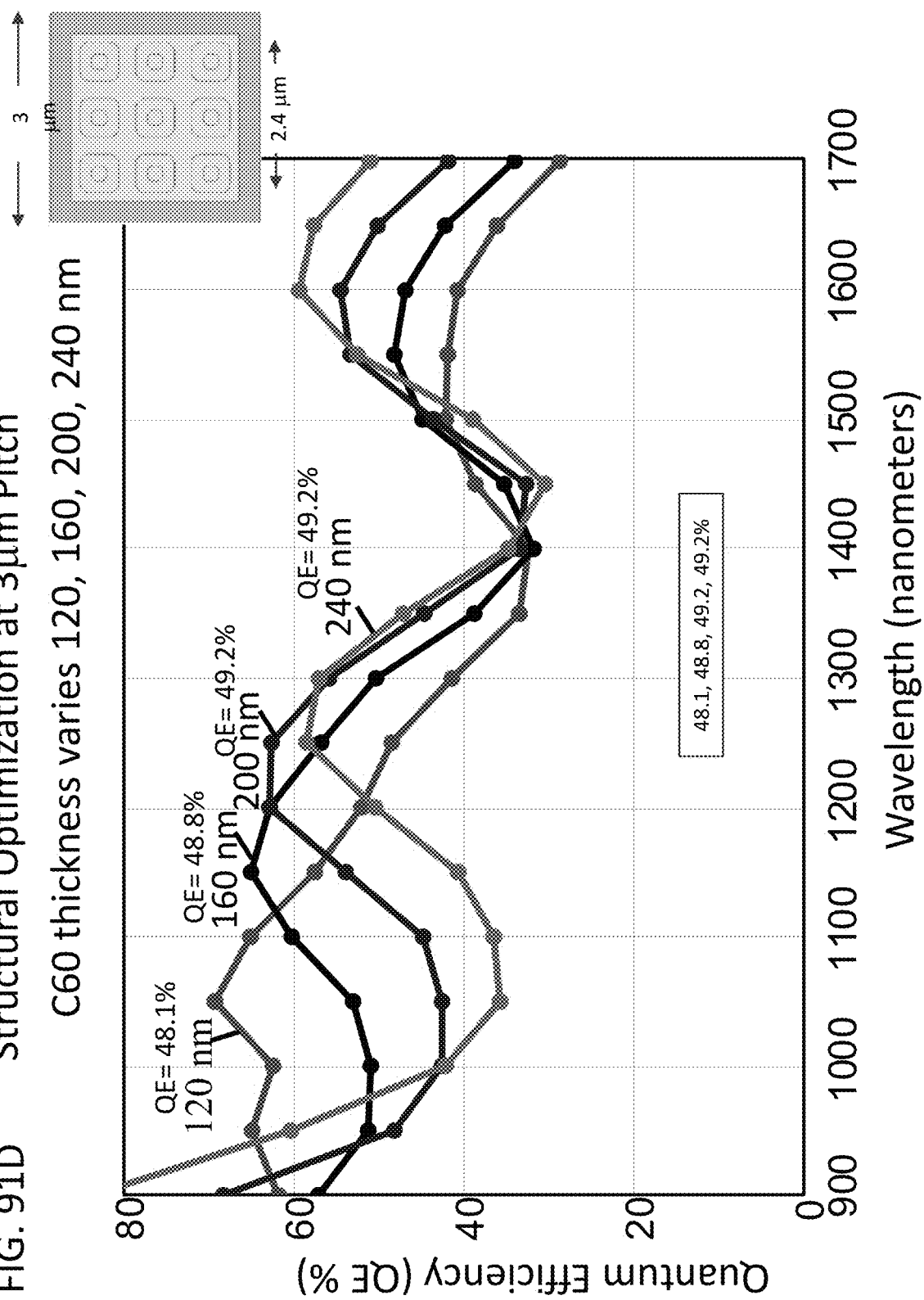

FIG. 91D is the next illustration in a series of illustrations showing the structural optimization at 3 μm pitch where the C60 thickness varies through the thicknesses variance sweep is also shown.

Figure 91E:
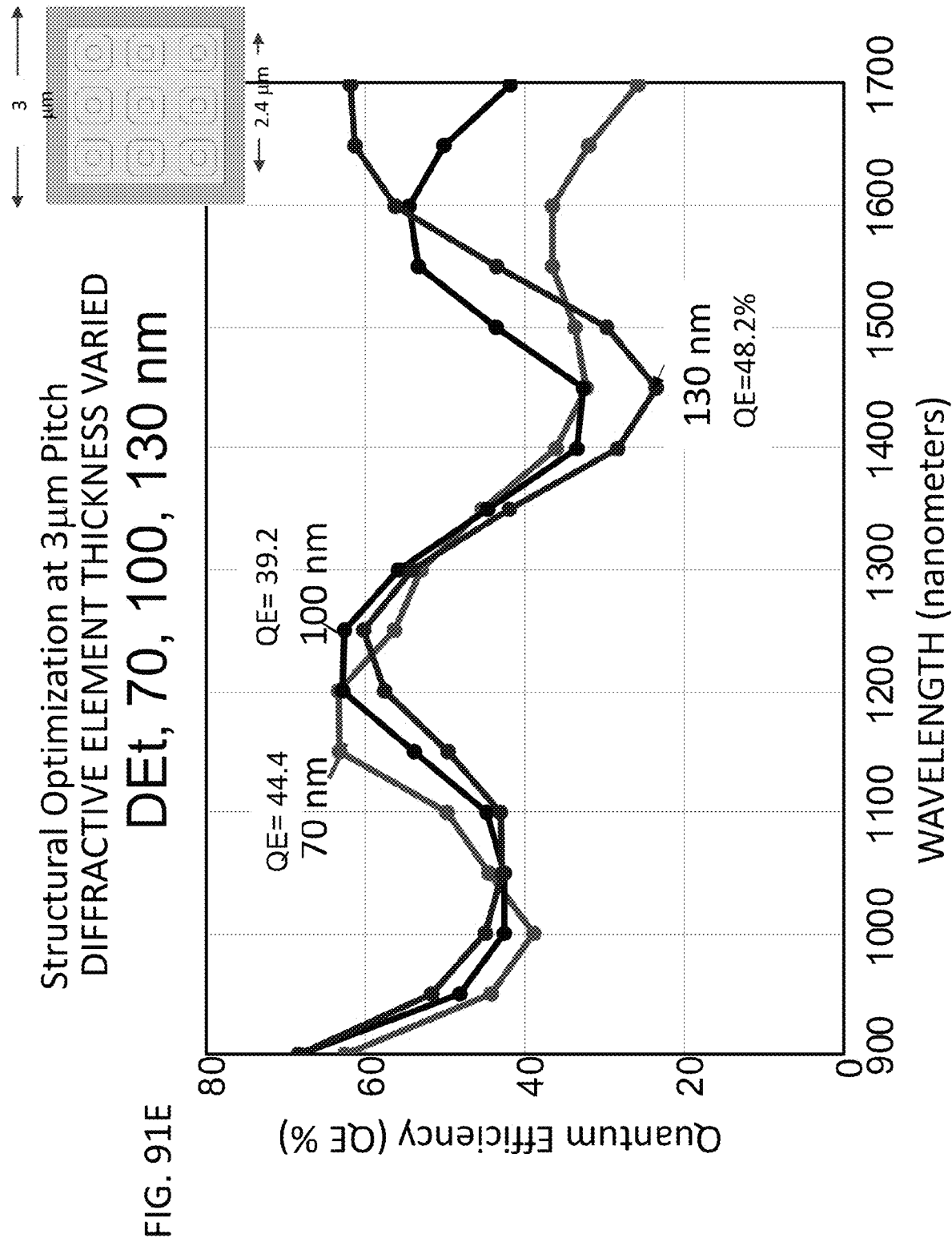

FIG. 91E is an illustration showing structural optimization at 3 μm pitch when the diffractive element (ring) thickness was varied from 70 nm (QE=48.1%), 160 nm (QE=48.8%), 200 nm (QE=49.2%), 240 nm (QE=49.2%), the average QE changes from 48.1% to 49.2%, going through a maximum of 49.2% at diffractive element (ring) thicknesses of 200 and 240 nanometers.

FIG. 92A is an illustration showing color illustrations of the detector when the inner ring diameter, outer ring diameter, and ring spacing are scaled up proportionally in the INd sweep. The QE maximum is obtained at INd=180 nm. However, the corresponding pixel size is too small for the 3 um pixel pitch as it leaves a lot of empty space (i.e. a small fill factor). Therefore, INd=220 nm with average QE of 49.2% is chosen to be the optimum INd value at a 3 um pitch array.

FIG. 92B is an illustration showing via equations, for the purposes of the graph in FIG. 92A, the relationship between the intensity (I) and the absorption coefficient α and k is shown by the adjacent equations where I is the intensity in the material, $I_0$ is the incident intensity, x is the traveling distance, E is the electric field, $\varepsilon_0$ is the vacuum permittivity, c is the velocity of light, n is the real part of the complex refractive index, ik this the imaginary part, ω is the angular frequency, K is the complex wave vector.

FIG. 93A is a graphical illustration showing a comparison of preferred embodiments where the pitch size is varied between 3 and 4 nanometers. The upper part of the illustration showing a preferred embodiment having a pitch size of 3 nanometers and the upper graph showing quantum efficiency results of a preferred embodiment having a pitch size of 3 nanometers with an average quantum efficiency of 46.8%. The lower part of the illustration shows a preferred embodiment having a pitch size of 4 nanometers with the lower graph showing its quantum efficiency with an average quantum efficiency of 46.8%.

FIG. 93B is a graphical illustration showing, for a preferred embodiment having a pitch size of 3 nanometers without sidewalls wherein the quantum efficiency results are shown with an average quantum efficiency of 41.8%.

Figure 94A:
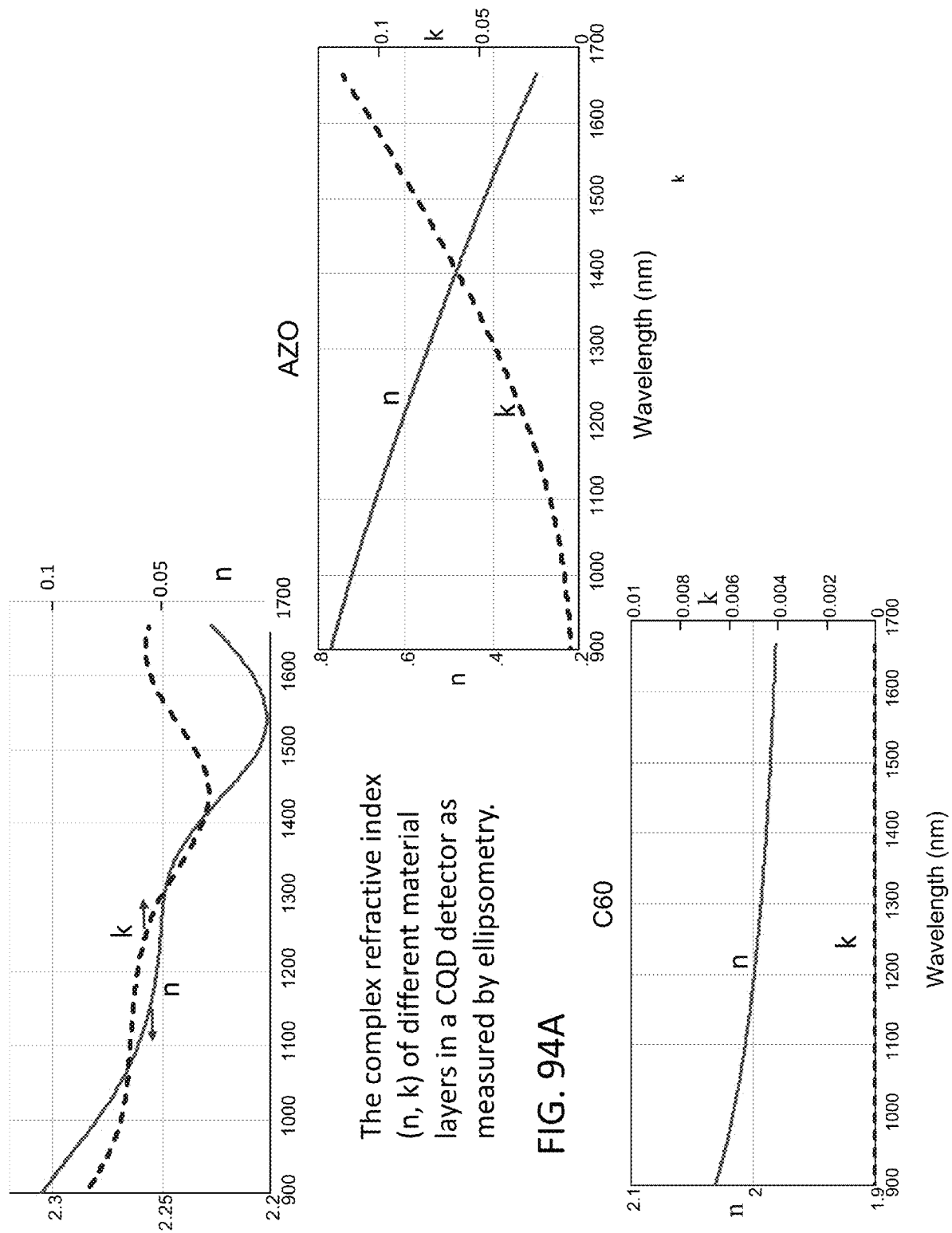

FIG. 94 A is a series of graphical illustrations showing the complex refractive index (n, k) of different material layers in a CQD detector as measured by ellipsometry.

FIG. 94 B is an additional series of graphical illustrations showing the complex refractive index (n, k) of different material layers in a CQD detector as measured by ellipsometry.

A more complete appreciation of the invention will be readily obtained by reference to the following Description of the Preferred Embodiments and the accompanying drawings in which like numerals in different figures represent the same structures or elements. The representations in each of the figures are diagrammatic and no attempt is made to indicate actual scales or precise ratios. Proportional relationships are shown as approximates.

DETAILED DESCRIPTION OF THE PREFERRED EMBODIMENTS

The present invention now will be described more fully hereinafter with reference to the accompanying drawings, in which embodiments of the invention are shown. However, this invention should not be construed as limited to the embodiments set forth herein. Rather, these embodiments are provided so that this disclosure will be thorough and complete, and will fully convey the scope of the invention to those skilled in the art. In the drawings, the thickness of layers and regions may be exaggerated for clarity. Like numbers refer to like elements throughout. As used herein the term "and/or" includes any and all combinations of one or more of the associated listed items.

The terminology used herein is for the purpose of describing particular embodiments only and is not intended to limit the full scope of the invention. As used herein, the singular forms "a", "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

It will be understood that when an element such as a layer, region or substrate is referred to as being "on" or extending "onto" another element, it can be directly on or extend directly onto the other element or intervening elements may also be present. In contrast, when an element is referred to as being "directly on" or extending "directly onto" another element, there are no intervening elements present. It will also be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present.

It will be understood that, although the terms first, second, etc. may be used herein to describe various elements, components, regions, layers and/or sections, these elements, components, regions, layers and/or sections should not be limited by these terms. These terms are only used to distinguish one element, component, region, layer or section from another region, layer or section. Thus, a first element, component, region, layer or section discussed below could be termed a second element, component, region, layer or section without departing from the teachings of the present invention.

Furthermore, relative terms, such as "lower" or "bottom" and "upper" or "top," may be used herein to describe one element's relationship to other elements as illustrated in the Figures. It will be understood that relative terms are intended to encompass different orientations of the device in addition to the orientation depicted in the Figures. For example, if the device in the Figures is turned over, elements described as being on the "lower" side of other elements would then be oriented on "upper" sides of the other elements. The exemplary term "lower", can therefore, encompass both an orientation of "lower" and "upper," depending of the particular orientation of the figure. Similarly, if the device in one of the figures is turned over, elements described as "below" or "beneath" other elements would then be oriented "above" the other elements. The exemplary terms "below" or "beneath" can, therefore, encompass both an orientation of above and below. Furthermore, the term "outer" may be used to refer to a surface and/or layer that are farthest away from a substrate.

Embodiments of the present invention are described herein with reference to cross-section illustrations that are schematic illustrations of idealized embodiments of the present invention. As such, variations from the shapes of the illustrations as a result, for example, of manufacturing techniques and/or tolerances, are to be expected. Thus, embodiments of the present invention should not be construed as limited to the particular shapes of regions illustrated herein but are to include deviations in shapes that result, for example, from manufacturing. For example, an etched region illustrated as a rectangle will, typically, have tapered, rounded or curved features. Thus, the regions illustrated in the figures are schematic in nature and their shapes are not intended to illustrate the precise shape of a region of a device and are not intended to limit the scope of the present invention.

As may be used herein, the terms "substantially" and "approximately" provide an industry-accepted tolerance for its corresponding term and/or relativity between items. Such an industry-accepted tolerance ranges from less than one percent to ten percent and corresponds to, but is not limited to, component values, angles, et cetera. Such relativity between items ranges between less than one percent to ten percent. As may be used herein, the term "substantially negligible" means there is little relative difference, the little difference ranging between less than one percent to ten percent.

As may be used herein, the term "significantly" means of a size and/or effect that is large or important enough to be noticed or have an important effect.

As used herein the terminology "substantially all" means for the most part; essentially all.

This description and the accompanying drawings that illustrate inventive aspects and embodiments should not be taken as limiting—the claims define the protected invention. Various changes may be made without departing from the spirit and scope of this description and the claims. In some instances, well-known structures and techniques have not been shown or described in detail in order not to obscure the invention. Additionally, the drawings are not to scale. Relative sizes of components are for illustrative purposes only and do not reflect the actual sizes that may occur in any actual embodiment of the invention. Like numbers in two or more figures represent the same or similar elements. Elements and their associated aspects that are described in detail with reference to one embodiment may, whenever practical, be included in other embodiments in which they are not specifically shown or described. For example, if an element is described in detail with reference to one embodiment and is not described with reference to a second embodiment, the element may nevertheless be claimed as included in the second embodiment.

Unless otherwise defined, all terms (including technical and scientific terms) used herein have the same meaning as commonly understood by one of ordinary skill in the art to which this invention belongs. It will be further understood that terms, such as those defined in commonly used dictionaries, should be interpreted as having a meaning that is consistent with their meaning in the context of the relevant art and will not be interpreted in an idealized or overly formal sense unless expressly so defined herein.

It will also be appreciated by those of skill in the art that references to a structure or feature that is disposed "adjacent" another feature may have portions that overlap or underlie the adjacent feature.

In U.S. Pat. No. 8,704,209 "Photodetectors Using Resonance and Method of Making" a mathematical method for designing a resonant structure is disclosed for a specific type of infrared detectors, the quantum well infrared photodetectors (QWIPs). A special feature of the QWIPs is that they rely on a specific optical electric polarization (Ez) for infrared absorption. The resonant structure thus serves an additional purpose that is to convert the horizontal polarization in the x-y plane into the z direction. In U.S. Pub. Appl. No. 2013/0145330 A1, entitled "Computer Designed Resonant Photodetectors and Method of Making" specific resonant structures were described that increase the quantum efficiency of a QWIP. In accordance with a preferred embodiment of the present invention, the resonant approach is extended to QWIPs that detect at least two wavelength bands, extend the resonant approach to all types of radiation sensing materials irrespective to their polarization dependence or sensing wavelengths, and extend the approach to radiation power conversion devices in addition to radiation detection devices. More specifically, the resonance approach may be applied to voltage tunable QWIP materials as well as other materials such as mercury cadmium telluride and superlattice structures whose detection wavelength can be switched by reversing the applied voltage polarity. Other radiation sensing materials include all bulk and bandgap engineered sensors such as Silicon near infrared detectors, mercury cadmium telluride infrared detectors, InAs/GaSb and InAs/InAsSb strained layer superlattice infrared detectors, GaN Tera Hertz and UV detectors, etc. The energy conversion devices include silicon and GaAs visible solar cells and thermophotovoltaic cells.

Resonance(s)

Figure 4:
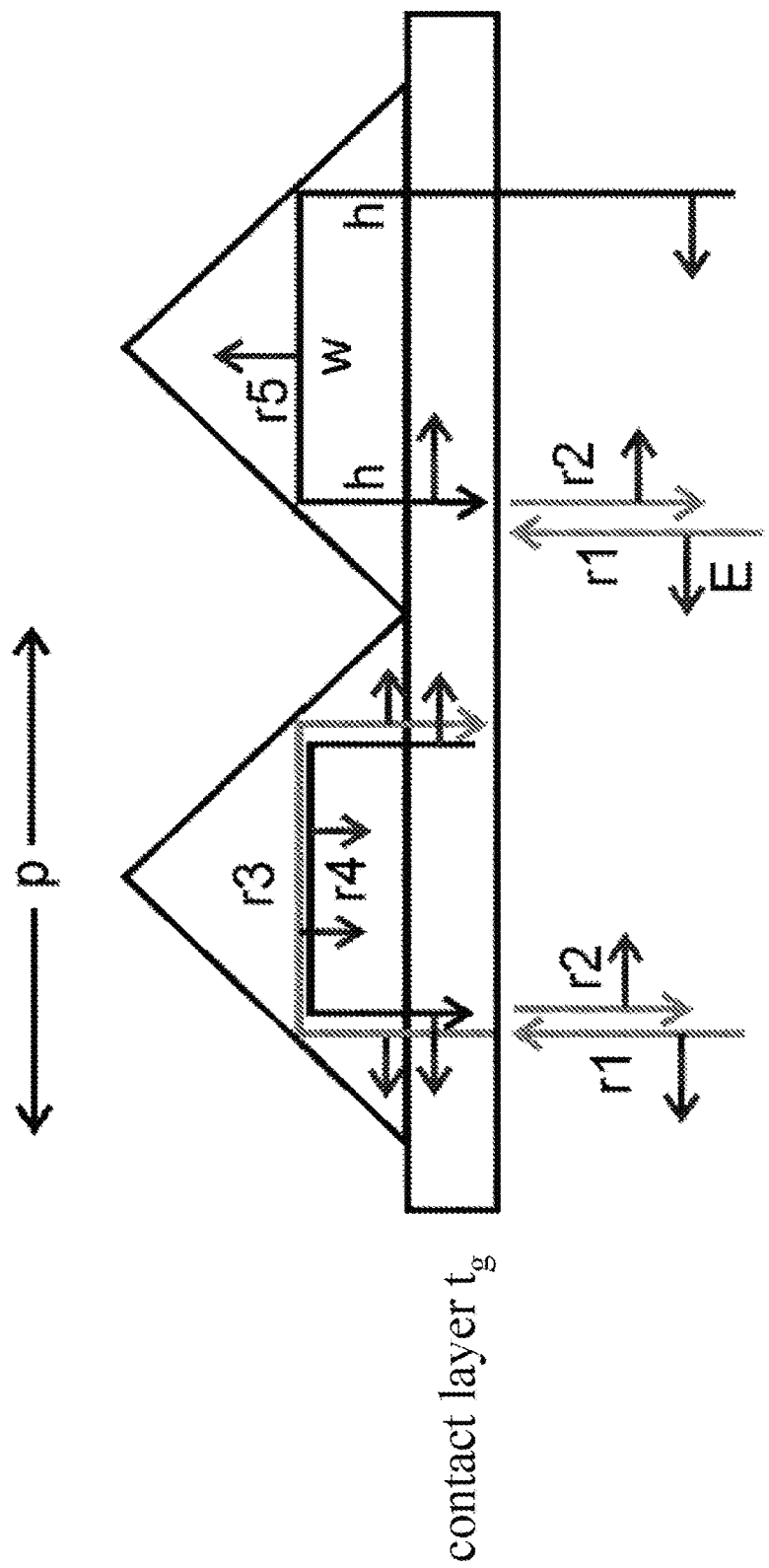
FIG. 4 schematically depicts wave interference for two C-QWIP pixels shown in cross-section.

The terminology "resonance," as used in this patent application and claims, means phase coherent superposition of light within a confined geometrical object that gives rise to a large optical intensity in that object. The terminology "resonance" or "resonances" is mentioned in various places in the following description. Fabry-Perot resonances are referenced in modulating the substrate transmission of the C-QWIP, and resonances associated with Fabry-Perot (FB) mechanism. Normally, FB resonances refer to the situation when the light bounces back and forth between two parallel plates. For example, if the "left-going" light is in-phase with the "right-going" light, the light intensities add. If they are out of phase, the intensities interfere or subtract. In C-QWIPs, because of the 45 degree sidewalls, (FIG. 4) the light incident on the left side of the corrugation will be reflected back by the substrate on the right after two 90 degree sidewall reflections. Therefore, the substrate on the left and right are analogous to the two parallel plates in the standard FB mechanism. Resonances do not need two parallel plates in general. As long as the light can return to the original place after a number of reflections inside a geometry, it can set up a resonance, and in this case, a standing wave is established (a wave just goes back and forth). Whenever the incident power can reinforce the later incident power and the process repeats, the energy or intensity in that localized region can build up to a large value; analogous to riding on a swing. A detector such as the R-QWIP has many reflecting surfaces and due to diffraction effects, the angle of incident and the angle of reflection on any plane need not be the same. For many wavelengths, the light bouncing along the discs can trace out a circular path. Therefore, in complicated geometries, there are many standing wave patterns and it is hard to analyze these patterns analytically. FB resonances or the acoustic waves in flutes are standing waves in simple geometries. In general, a numerical method is needed to discover/explore these resonance(s).

Resonant Infrared Detectors

A preferred embodiment of the present invention comprises a resonant infrared detector comprising two main components: a detector pixel volume and a diffractive element. The detector pixel volume may further comprise of a bottom contact layer common to all pixels in an array, an active infrared absorbing volume (or region) with arbitrary sidewall profiles, and a top contact layer. The diffractive element (DE) may be placed on top of the top contact layer. The diffractive element may comprise a collection of geometrical objects (GO) placed on specific locations within the top contact area. These GOs can be made of the same top contact material or a new material. The top contact together with the GOs is then covered by a metal layer for ohmic contact and for light reflection and confinement. The pattern of the GOs can appear in any form. They can either be arranged in a regular array or be distributed randomly. The individual GOs can be of any size and shape in 3 dimensions, and they can also be voids in otherwise a solid layer of material. Some examples of the DEs are shown in FIG. 50. This detector structure is used to detect light incident from the bottom of the detector. The design of the detector begins with the size and shape of the GOs and their distribution. They may give rise to strong optical scattering in the wavelength range of interest. However, a strong scattering does not always produce a strong absorption in a confined space. Since light is an electromagnetic (EM) wave, it may be subjected to interference with the lights from other optical paths within the detector volume. In general, only a detector with certain size and shape can yield a phase matching condition such that the interference is constructive. Generally, under such condition, the light can circulate back to the same location with the same phase as the later incident light so that their electric fields superpose to produce a stronger optical intensity. In other words, certain detector sizes can resonate with the incident light of particular wavelengths, and the detector volume in this case is used as a resonator. One such detector design is known as a resonator-QWIP or R-QWIP, and the design involves both the scattering elements on top and the pixel dimensions.

EM Modeling

To optimize an existing detector structure and to search for a new detector configuration, it is desirable to know the QE theoretically before expensive experimental resources are committed. However, there have been very few known attempts to construct a rigorous and flexible approach that can yield $E_z$ quantitatively under any arbitrary detector configurations and even fewer attempts to compare it with experiment. In this application, a rigorous three-dimensional finite element electromagnetic (EM) approach is used in obtaining QE quantitatively and explicitly and compared the model with experiments. The experimental results tend to agree with the theoretical modeling to within experimental uncertainty. After creating a reliable approach, other more complicated and unconventional optical coupling schemes were explored, with which a new type of detector geometry is proposed.

To illustrate the coherent optical effects, an example of a 3-dimensional (3D) finite element electromagnetic (EM) simulation is carried out to calculate the quantum efficiency (labeled as QE or η) of any detector geometry using Equation (1). For a given optical power $P_0$ incident normally on a detector area A, the absorption quantum efficiency, labeled as QE or η, is given by $$\eta = \frac{1}{P_0} \int_V dI(\vec{r}), \qquad (1)$$

$$= \frac{1}{P_0} \int_V \alpha I(\vec{r}) d^3 r,$$

$$= \frac{\alpha}{A \frac{c\varepsilon_0}{2} E_0^2} \int_V \frac{nc\varepsilon_0}{2} |E_z(\vec{r})|^2 d^3 r,$$

$$= \frac{n\alpha}{A E_0^2} \int_V |E_z(\vec{r})|^2 d^3 r,$$

where V is the detector active volume, I is the optical intensity associated with $E_z$, α is the absorption coefficient, and n is the material refractive index. In step 2 of Eqn. (1), use is made of the fact that the optical absorption at a particular location is linearly proportional to the light intensity at that location, and there is no need to rely on the assumption of exponentially decaying light. Equation (1) is thus applicable to both coherent and incoherent distribution of light intensity. Equation (1) reveals that the QE of any QWIP detector can be calculated from the volume integral of $|E_z|^2$ in the presence of a finite α. If $E_z$ in Eqn. (1) is replaced by the total E, it will be applicable to other detectors with isotropic absorption as well. Therefore, Eqn. (1) is extremely useful to any detector research.

Since $E_0$ (the incident electric field in free space) and $E_z$ are linearly proportional to each other in Equation (1), $E_0$ can be set arbitrarily, and the only input parameter in Equation (1) is the wavelength-dependent α(λ).

In parts of this application, the x and y components of the incident E field may be set to be the same to represent unpolarized light, and they are equal to 377 units. The value of $E_0$ in (1) is thus equal to 377√2 units, and it is polarized diagonal to the pixel. The α spectrum can be calculated from the material structure by Choi K. K., "The Physics of Quantum Well Infrared Photodetectors," World Scientific, New Jersey, 122-125 (1997), hereby incorporated by reference. For a known α(λ), there may be no more free parameters and the value of η(λ) is uniquely and unambiguously determined. To solve for $E_z$ numerically, commercial software can be used, such as COMSOL Multi-physics. After the detector geometry is constructed in this software, the only input parameter in the program is α. The α spectrum can be calculated from the material structure by $$\alpha(\lambda) = \sum_n \frac{N_D W}{L} \frac{\pi e^2 \eta}{2\sqrt{\varepsilon_h}\, \varepsilon_0 m * c} f_n \rho_n(\lambda), \qquad (2)$$

where $N_D$ is the doping density in the well, W is well width, L is the QW period length, $f_n$ is the oscillator strength from the ground state to the $n^{th}$ excited state, and $\rho_n$ is the normalized Gaussian broadening for each optical transition. The values of $f_n$ are obtained after solving the eigen energies and eigen functions of the structure. Except for a weakly adjustable line broadening parameter for ρ, the α spectrum of a given material is fixed, and thus the QE of any detector is calculable from Equations (1) and (2) without any empirical input parameters.

In some special detector geometries such as the corrugated-QWIPs (C-QWIPs), the classical $|E_z|^2$ may be determined using ray-tracing techniques. In this case, the classical QE, which does not take the optical interference into account, can be evaluated and be used as a gauge for the rigorous EM model. The C-QWIP pixel geometry uses 48° angled sidewalls to reflect light into parallel propagation. Using an approximation of 45°, the classical solution for Equation (1) is $$\eta = t_s \eta_{int} = t_s \frac{1}{p}\left[t + \frac{e^{-\alpha p}}{2\alpha}(1 - e^{2\alpha t})\right], \quad (3)$$

for the prism-shaped C-QWIPs. In Equation (3), $t_s$ is the substrate transmission, $\eta_{int}$ is the internal quantum efficiency, p is the pixel linear dimension, and t is the corrugation height. Without an AR-coating, $t_s$=0.72. Likewise, the classical η of a pyramidal C-QWIP, which has four inclined sidewalls, is $$\eta = \qquad (4)$$
$$t_s \frac{\exp(-\alpha p)}{\alpha^2 p^2}\{1 + \alpha p + 2\alpha^2 t(p-t)\exp(\alpha p) + [\alpha(2t-p)-1]\exp(2\alpha t)\}.$$

As used herein, the terminology AR-coating refers to a type of optical coating applied to the surface to reduce reflection. An anti-reflective coating (AR coating) may comprise metal oxides, for example, operating to block reflected light.

Color Significance in Quantum Well Infrared Photodetectors

Certain of the drawings contain colors (or shades of grey) inside of the quantum well infrared photodetectors. The color represents the magnitude of the vertical optical electric field $E_z$. Scales appearing to the right of the figures reveal that the blue represents a very large negative value and the red represents a very large positive value. Since the intensity depends on $E_z^2$, the magnitude or intensity, rather than the sign, is important. Both the red and blue regions represent high intensity regions. Since light is a wave, it has both positive and negative components, depending on the phase at a particular instant (like the peaks and valleys in water or sine wave). For this reason, the areas of high intensity red are accompanied by areas of high intensity blue. If the $E_z$ is plotted in another time instant, the color will reverse, but the intensity does not change.

In search of an efficient structure, it is desirable to have a lot of red and blue in the distribution. The integral of $E_z$ square gives the quantum efficiency (QE).

For the resonantly enhanced Quantum Well Infrared Photodetectors, such as the embodiment comprising square ring protrusions, the concern is not the color intensity appearing on the square rings, which is not the active material. Instead, it is desirable to maximize is the intensity inside the QWIP active layer beneath the 4 square ring protrusions; i.e., the $E_z$ distribution inside the QWIP active layer. As an example of the relative values of $E_z$ and $E_0$, for an incident electric field $E_0$ of 377√2 V/m in free space, the resulting $E_z$ inside the QWIP material can be as high as 2600 V/m, which means the light intensity ($E^2$) is intensified in some regions in the active layer(s).

Reflective Inclined Sidewalls

A sidewall reflector is disclosed in U.S. application Ser. No. 12/543,121 entitled "Corrugated-Quantum Well Infrared Photodetector with Reflective Sidewall and Method." Under this type of light coupling approach, the sidewalls of a detector pixel are etched at an angle to produce inclined sidewalls, which reflect the incoming light into parallel propagation through total internal reflection. When used in focal plane array (FPA) production, the pixels may be covered with infrared absorbing materials, such as epoxy glue, which can affect the optical reflectivity of the sidewalls. In such cases, a composite reflector may be deposited onto the pixels to ensure maximum sidewall reflectivity.

A pixel structure is shown in FIG. 5 of U.S. application Ser. No. 12/543,121. Each detector pixel in this preferred embodiment may comprise an active material with thickness $t_a$, a top contact layer 1 having a thickness $t_c$, and a bottom contact layer 4 having a thickness $t_b$. The total thickness $t=t_a+t_b+t_c$. The top contact layer 1 may have a different sidewall angle. The active layer 2 sidewall is preferably inclined at 45°, making the average mesa sidewall angle of 50° in the embodiment shown in FIG. 5 of U.S. application Ser. No. 12/543,121. The mesa sidewall may be covered by a protective layer. Underneath the structure, there may be a common contact layer connecting all the detectors. The corrugation period p is designed to be the same as the pixel pitch in the one-corrugation-per-pixel design. This design is preferred in high definition arrays in which pixel size is small. As shown in FIG. 5 of U.S. application Ser. No. 12/543,121, a cover layer 7 may be deposited on the sidewalls to isolate the detector material from the epoxy and provide reflectivity. Preferably, the reflectivity provided is close to the original total internal reflection and the cover layer 7 does not short out the electrical contacts that are located on top and bottom of the QWIP material.

Figure 2B:
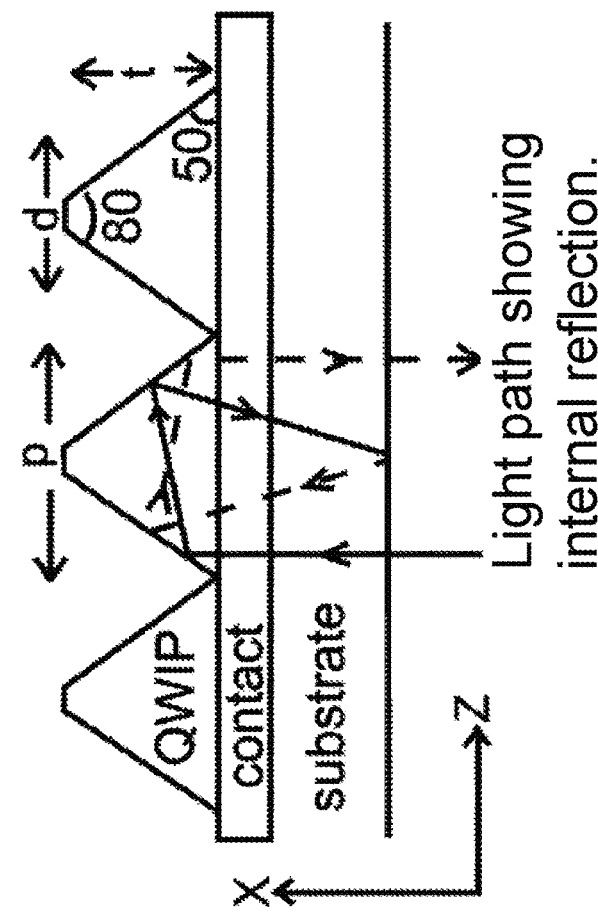
FIG. 2B shows a partial cross-section of the C-QWIP detector of FIG. 2A containing three corrugations and a light path showing internal reflection.
Figure 2A:
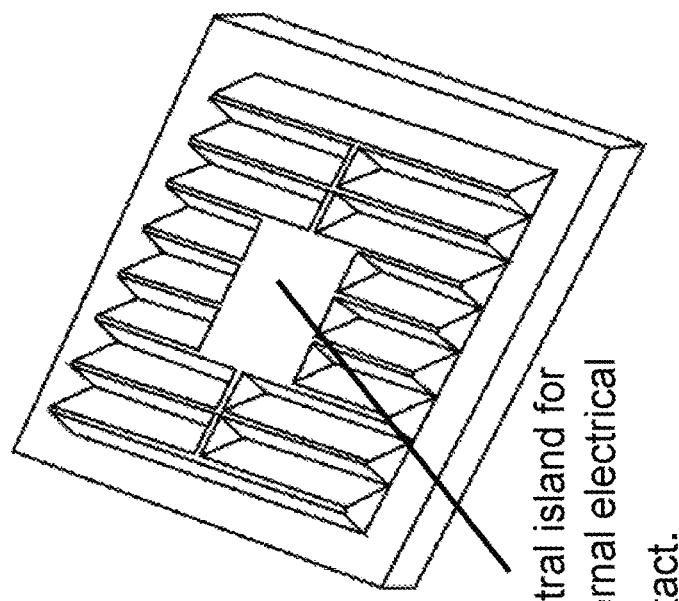
FIG. 2A is a schematically illustration from a 3-dimensional perspective of a C-QWIP detector pixel, which contains a number of corrugations and a central island for external electrical contact.
Figure 3A:
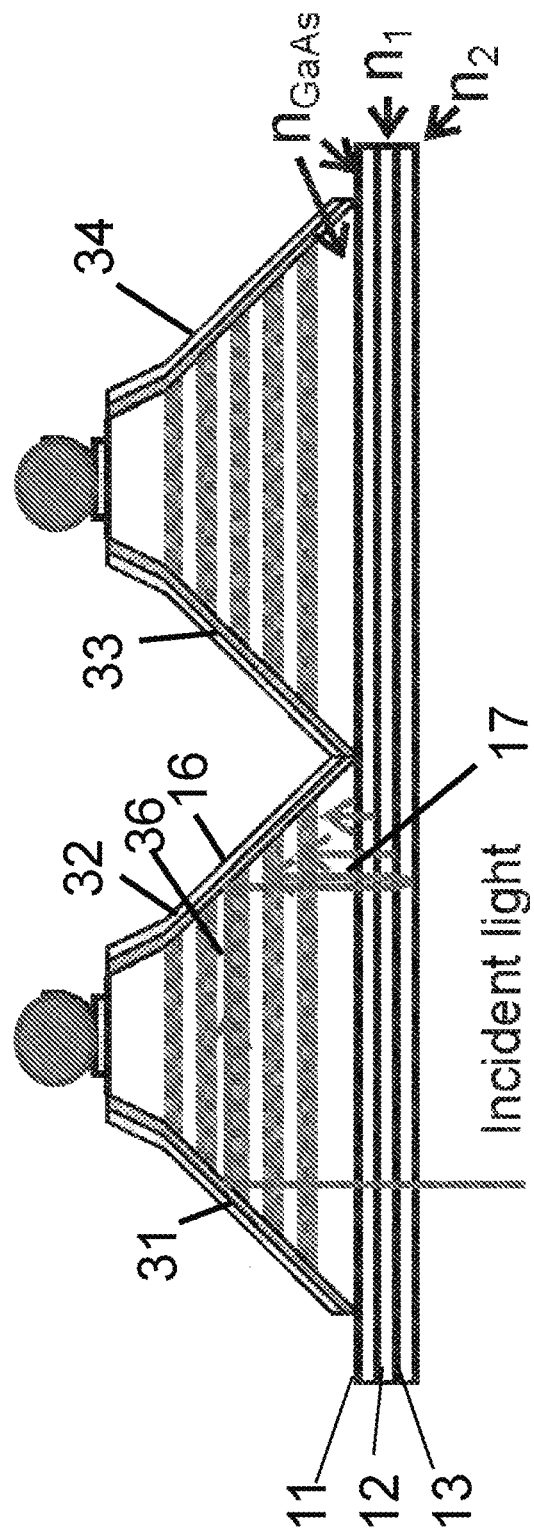
FIG. 3A schematically illustrates an example of two C-QWIP pixels (shown in cross-section in the x-z plane) comprising a thin common contact layer 11 and two material composite (thin film) reflecting layers 12, 13, one with refractive index n1 and the other n2, whereby, due to different optical properties, light is reflected at three interfaces, namely at the interfaces between GaAs/n1, n1/n2, and n2/air.

FIG. 3A schematically illustrates a preferred embodiment comprising two C-QWIP pixels (shown in cross-section in the x-z plane) having inclined sidewalls with reflecting layers. The incident light reflects at the pixel sidewall 30 and travels parallel to one of the QWIP active layers (36). One of the concepts is to eliminate or limit the thickness of the substrate to increase efficiency. An increase in the quantum efficiency is provided when the substrate layer is either substantially or totally removed to produce optical resonance effects. In addition, a thin composite film may be deposited external to the common contact layer to further alter these effects, as shown by elements 12 and 13 in FIG. 3. Without a thick substrate, the light reflected back from the bottom of the material surface will be coherent with the incoming light. The resulting optical resonances will intensify the light intensity at certain wavelengths within the detector volume, thereby increasing quantum efficiency (QE) at these wavelengths. The C-QWIP of FIG. 3B contains a substrate whose thickness is determined by the limits of mechanical thinning. With this substrate thickness, the unabsorbed light scattered back from the substrate, depicted by the arrow 17, is not coherent with the light in the active region. The composite thin film, which consists of a number of infrared transparent materials of different refractive indexes $n_i$, can increase the number of reflecting interfaces as a means to control the resonant wavelengths. Shown in FIG. 3A is a common contact layer 11 and a composite thin film layers 12, 13, one with refractive index n1 and the other n2, respectively. Due to different optical properties, light is reflected at three interfaces, namely at the interfaces between nGaAs/n1, n1/n2, and n2/air.

Figure 3B:
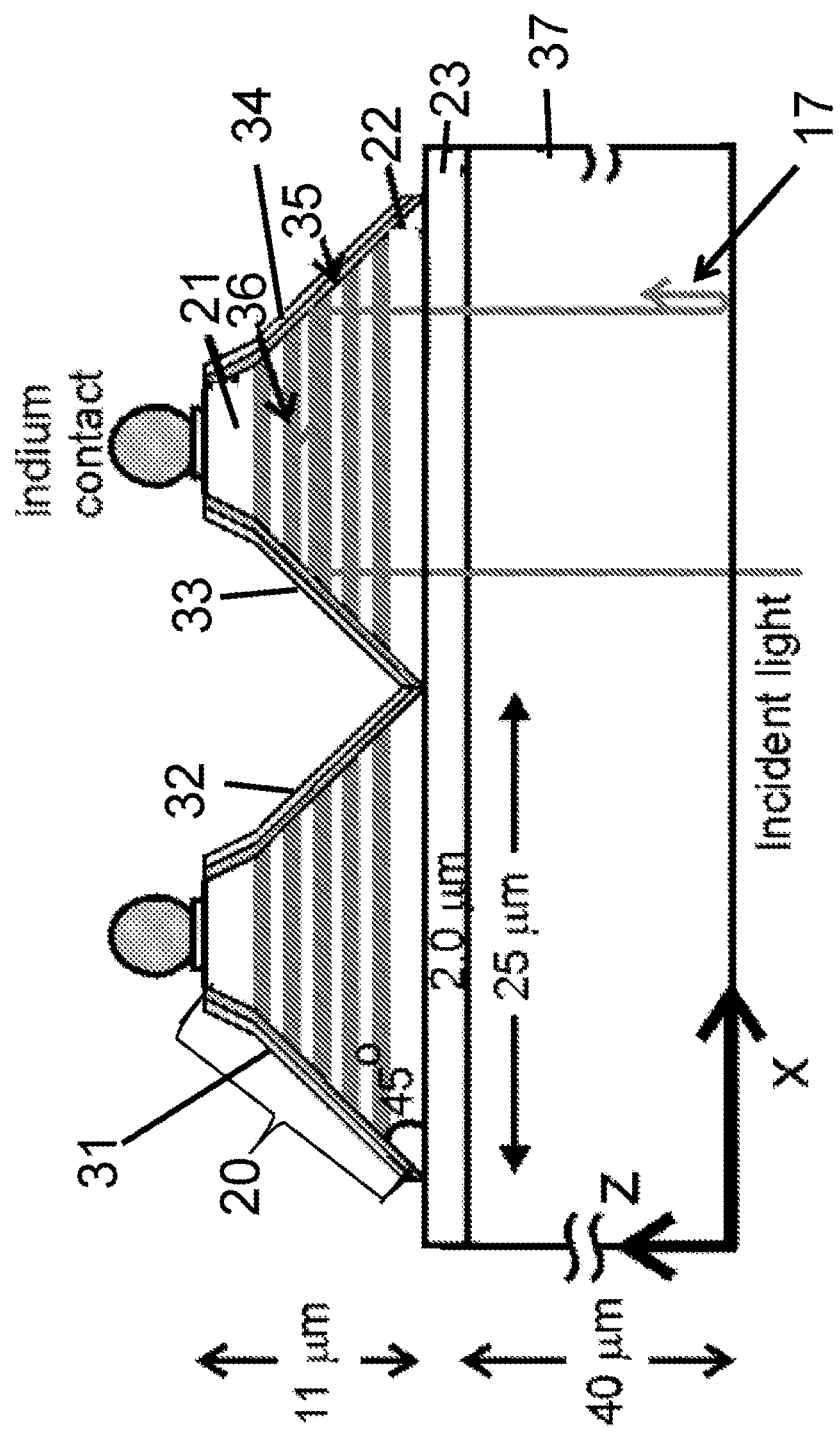
FIG. 3B schematically illustrates an example of a detector pixel approximately 25 μm across with a detector material (referenced as 20) thickness of 11 μm, which includes an active layer sandwiched between two contact layers 21, 22. Below the bottom contact layer 22, there is a common contact layer 23 connecting all the pixels and a substrate 37.

FIG. 3B schematically illustrates an example where each detector pixel is 25 μm across. The total detector material (referenced as 20) is 11 μm thick, which consists of an active layer, sandwiched between two contact layers 21, 22 at top and bottom, respectively. Below the bottom contact layer 22, there is a common contact layer 23 connecting all the pixels. The common contact layer 23 can be as thin as 0.5 μm for reliable contacting, but it is chosen to be 2.0 μm thick in this example. In the preferred geometry, the sidewalls covered by layers 31, 32, 33, and 34 are inclined at 45° with respect to the active layer as shown in one of the cross-sections (the x-z plane) in FIG. 3B. The angle of the top contact layer 21 can be made steeper to yield a wider contact surface at the top. Although only one reference numeral appears, dielectric insulation layers 35 are positioned between each of the reflective surfaces or layers 31, 32, 33, and 34 and the detector material 20. The dielectric layers 35 are formed of Magnesium Fluoride, $MgF_2$, and used in separating the C-QWIP material and the gold reflecting surface. $MgF_2$ is just one preferred example, and other dielectric materials can be used.

Although 45° is the preferred sidewall angle, each of the four sidewalls can have different arbitrary angles. A more symmetrical geometry will be that of a pyramid (as shown in FIG. 6), which consists of four equally inclined sidewalls, or a prism (as shown in FIG. 5), which consists of two inclined sidewalls and two more vertical sidewalls A C-QWIP can also be a cone-shaped object.

In the preferred embodiment depicted in FIG. 3B, a substrate layer 37 is shown beneath the common contact layer 23. This substrate layer 37 is part of the detector material upon which the active QWIP layers are deposited. After flip-chip bonding to a readout integrated circuit (ROIC), substrate 37 is usually thinned to improve the mechanical stability upon thermal cycling. With various mechanical thinning techniques, such as lapping or diamond turning, the thinnest substrate one can obtain is about 40 μm.

For infrared imaging within the two atmospheric windows, which span from 3 to 5 μm and 8 to 12 μm respectively, the optical wavelength inside the QWIP material is shorter than 4 μm because of the large refractive index (n~3.24) of the GaAs substrate. The roundtrip optical path length of the unabsorbed light reflecting from the substrate will therefore be larger than 20 wavelengths for a 40 μm substrate. Because of the fact that the coherence length of thermal radiation is no longer than a few wavelengths, almost all reflected light from the substrate (an example of which is depicted by the arrow 17 in FIG. 3B) will not be coherent with the light inside the active material. As such, optical interference effects are negligible in the C-QWIP cameras, and the quantum efficiency (labeled as QE or η) of a C-QWIP is well described by the classical ray-optics.

By tracing the infrared absorption of a light beam along its optical path, η is given by (as described further in "Light coupling characteristics of corrugated quantum-well infrared photodetectors," K. K. Choi, K. M. Leung, T. Tamir and C. Monroy, IEEE J. Quant. Elect. vol 40, pp. 130-142, (2004), hereby incorporated by reference):

$$\eta = t_s \eta_{int} = t_s \frac{1}{p}\left[t + \frac{e^{-\alpha p}}{2\alpha}(1 - e^{2\alpha t})\right], \quad (3)$$

where $t_s$ is the substrate transmission coefficient, p is the pixel pitch, α is the absorption coefficient, t is the QWIP material thickness. For a GaAs substrate with n=3.24, $t_s$=0.72.

Figure 7A:
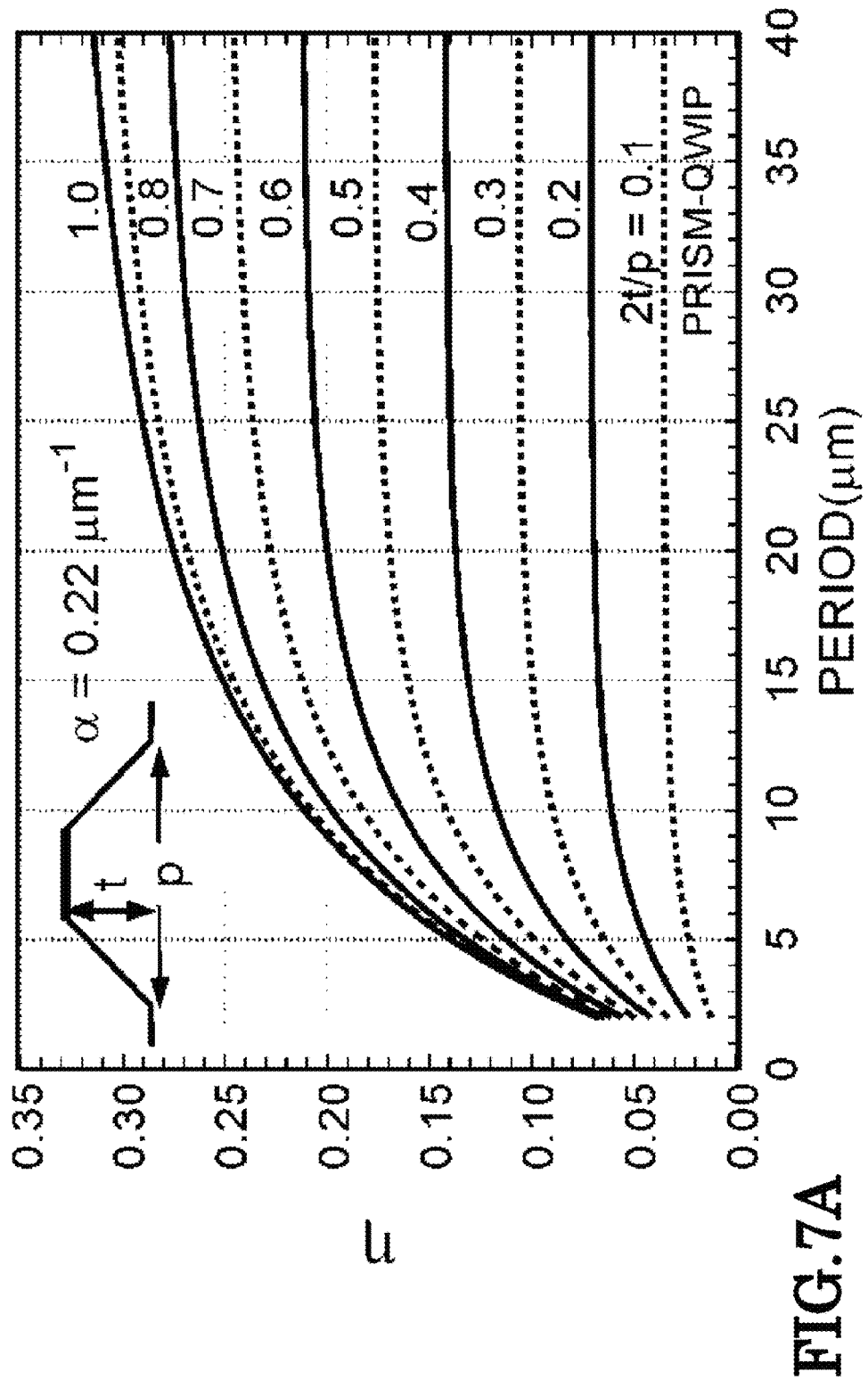
FIG. 7A graphically illustrates the external unpolarized QE (for unity pixel fill factor) of a PR-QWIP (PRISM) for different pixel geometries.
Figure 7B:
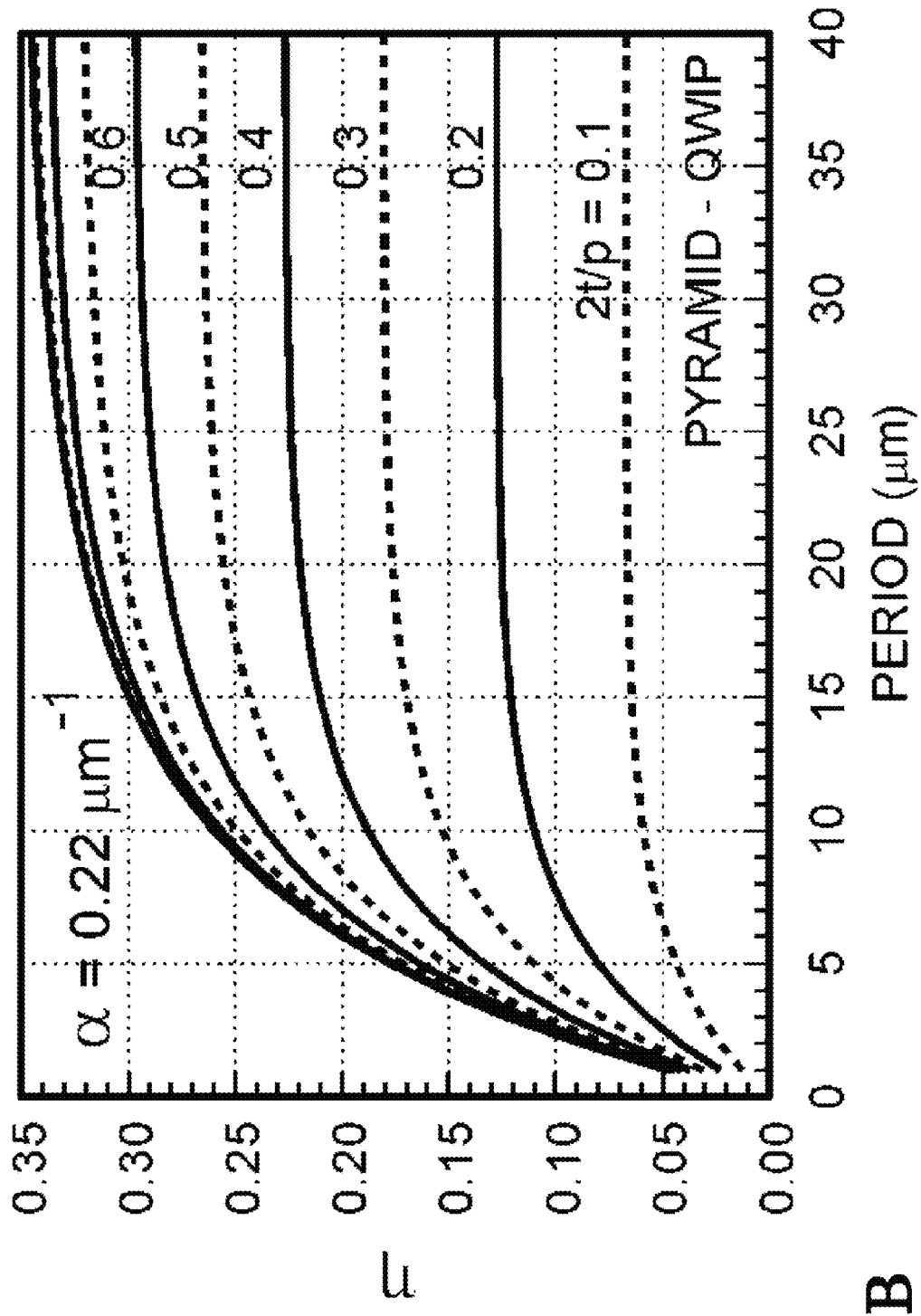
FIG. 7B illustrated graphically the External unpolarized QE (for unity pixel fill factor) of a PY-QWIP (Pyramid) for different pixel geometries.

With an exemplified α of 0.22 μm$^{-1}$, FIGS. 7A and 7B graphically illustrate the external unpolarized QE (for unity pixel fill factor) of a PR-QWIP (PRISM) and pyramid-shaped C-QWIP (labeled as PY-QWIPs) for different 2t/p ratios (pixel geometries). Shown are the theoretical quantum efficiency (QE) for QWIPs under ray-optics analysis with different detector geometries when the substrate is thick with an assumed pixel pitch of 25 μm (dash lines indicate classical quantum efficiency (QE) with thick substrates). For a typical p=25 μm and t=11 μm, the theoretical QE is 27% for PR-QWIPS and 32% for PY-QWIPS.

In order to further increase the quantum efficiency of a C-QWIP, the present patent describes a new C-QWIP detector structure in which the substrate layer is either substantially or totally removed to produce optical resonance effects. In addition, a thin composite film may deposit external to the common contact layer to alter these effects. Without a thick substrate, the light reflected back from the bottom of the material surface will be coherent with the incoming light. The resulting optical resonances will intensify the light intensity at certain wavelengths within the detector volume, thereby increasing QE at these wavelengths.

Resonance

To gain physical insights into the resonant mechanism and thus the pixel design rules, a simplified C-QWIP structure may be considered in FIG. 4A, which schematically illustrates C-QWIP geometry with period p and common contact layer $t_g$. FIG. 4A shows the ray diagrams of the two sets of optical interferences. It does not have a reflector cover or a thin film coating so that the number of reflecting interfaces is limited to three: two at the sidewalls and one at the common contact layer. They are all in contact with air. The pixel period is p and the common contact layer thickness is $t_g$.

In FIG. 4A, one can identify two sets of coherent interference, which are labeled as interference 1 and interference 2. In interference 1, the incident beam $r_1$ partially transmits into the substrate as $r_3$. Through partial reflection at the other bottom side of the corrugation, the light makes a round trip inside the corrugation and interferes with the reflected beam $r_2$. If $r_4$ and $r_2$ interfere destructively, the substrate reflection will be reduced and $r_3$ will be strengthened. Upon more round trip interferences, the substrate reflection will be completely suppressed and the internal intensity is greatly enhanced, analogous to the usual Fabry-Perot resonances in parallel planes. The analogy exists because all the incident light has the same path length of $(2t_g+2h+w)=(2t_g+p)$ in the corrugation between the two substrate reflections, independent of the incident location. They differ only in that the corrugated structure possesses another interference set (#2), in which $r_1$ interferes with another beam $r_5$ incident on the opposite sidewall.

Since there is a phase shift of π upon 45° internal reflection for the transverse magnetic (TM) mode, the optical E vector switches direction at the inclined surfaces as depicted in FIG. 4A. Therefore resonance for interference 1 occurs when the sum of the phase shift of $r_3$ and $r_4$ is 2 Nπ, where N is an integer. Hence, $$2\left(\frac{2\pi n_q p}{\lambda} + 2\frac{2\pi n_g t_g}{\lambda}\right) = 2N\pi, \Rightarrow \lambda = \frac{2n_q p + 4n_g t_g}{N}, \quad (5)$$

where λ is the wavelength in free space, $n_g$ is the contact layer refractive index, and $n_q$ is the QWIP refractive index.

For interference 2, following again the change of the E direction, the resonance condition is:

$$\frac{2\pi n_q p}{\lambda} + 2\frac{2\pi n_g t_g}{\lambda} = (2N+1)\pi, \Rightarrow \lambda = \frac{2n_q p + 4n_g t_g}{2N+1}. \quad (6)$$

Since the electric fields of the two resonant series are out of phase, they tend to cancel each other when the wavelength multiples are odd. The remaining strong resonances are at even multiple of $\lambda$ where $$\lambda = \frac{2n_q p + 4n_g t_g}{N}. \quad (7)$$

Figure 9A:
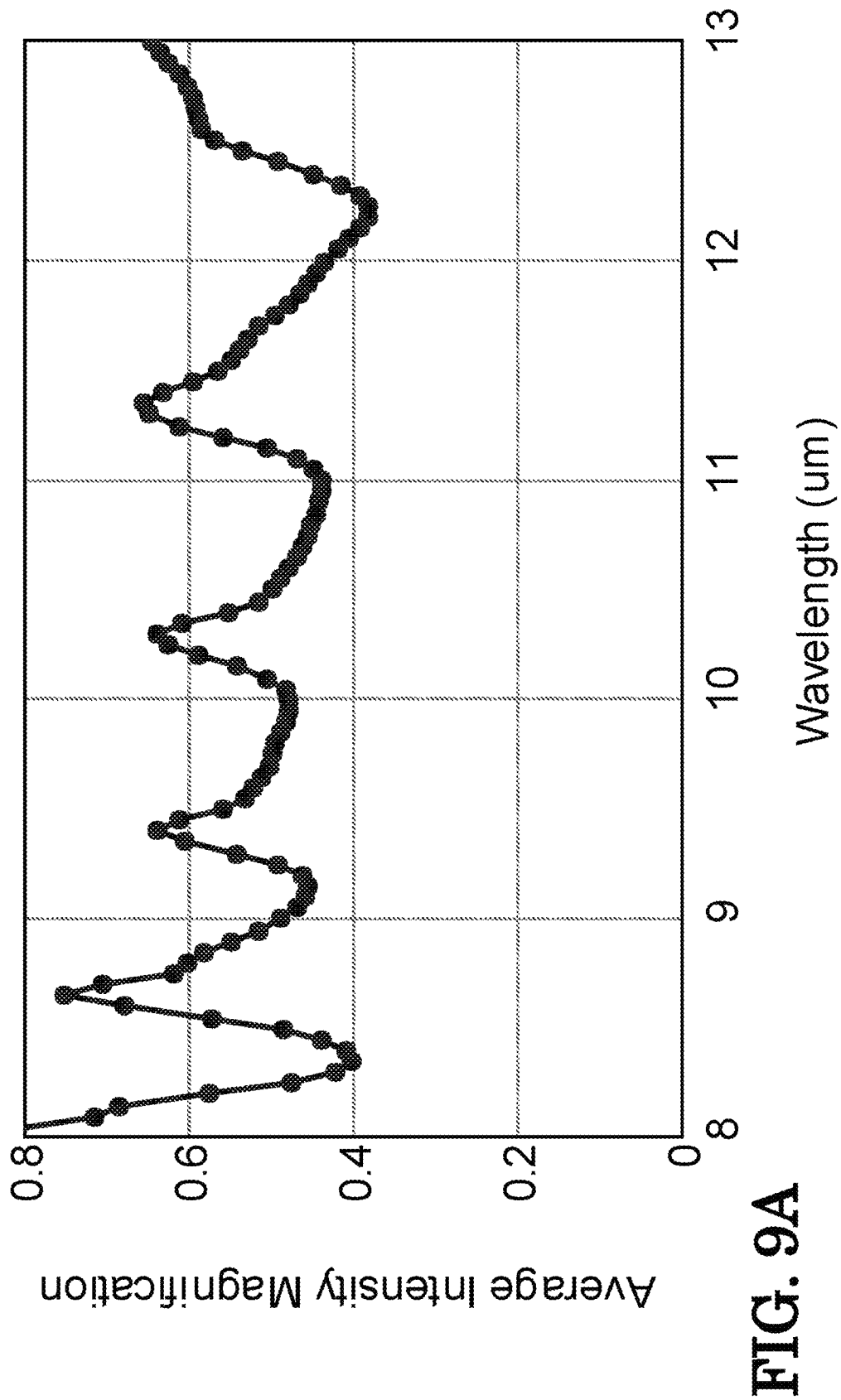
FIG. 9A graphically illustrates the average magnification factor M $I_z/I_{inc}$ inside the C-QWIP with a thin film coating as a function of $\lambda$.
Figure 9B:
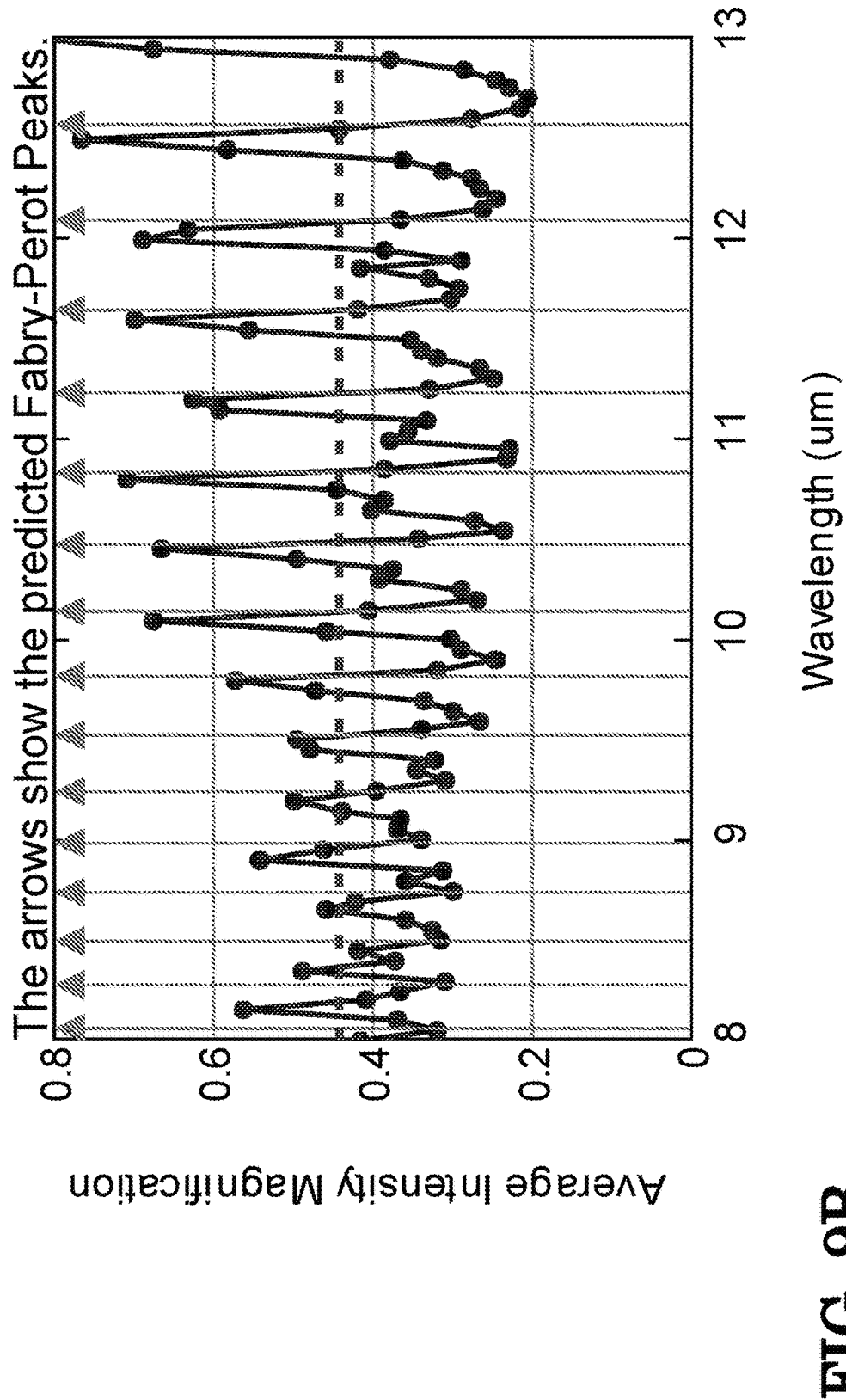
FIG. 9B graphically illustrates the average magnification factor M=$I_z/I_{inc}$ inside the PR-QWIP with reflecting layers and 36 μm common contact layer. The arrows show the predicted Fabry-Perot Peaks.

To yield a large number of resonant wavelengths for comparison, a structure with $t_g=36$ µm is considered in FIG. 9B, and optical coherence is assumed in this hypothetical case. The straight arrows indicate the $\lambda$ values given by Eqn. (7). FIG. 9B also shows the calculated result using finite element EM simulation with $t_g=36$ µm. The peak positions between the two calculations are in agreement, thus validating the underlying physical principle of Fabry-Perot oscillations. The small discrepancy between the peak locations at shorter wavelengths is due to the fact that the structure under electromagnetic (EM) simulation has 48° sidewalls, while that for the Fabry-Perot peak analysis assumes 45°. The small resonant peaks in the EM simulation are those resonances with odd multiple wavelengths.

FIG. 9B shows the magnification factor $M=I_y/I_{inc}$ averaged across the center cross section inside the PR-QWIP with reflecting layers and 36 µm common contact layer. The straight lines indicate the even wavelength multiple resonances for the simplified PR-QWIP with the same 36 µm common contact layer.

The above analysis shows that the C-QWIP resonances are originated from the light bouncing back and forth between the common contact layer. In the presence of extra interfaces in the actual C-QWIP pixels, which include the interfaces between QWIP/MgF$_2$, MgF$_2$/Au, QWIP/thin film, and thin film/Air, the exact resonant wavelengths will be more complicated and can only be obtained from finite element EM simulation. Nevertheless, Eqn. (7) is shown to provide a good estimate on these wavelengths and suggested that one can change either the common contact thickness or the remaining substrate thickness for a fixed p to design different resonant wavelengths.

Resonance also occurs in grating coupled detectors, but it has been overlooked generally. For example, FIG. 17A shows a grating coupled QWIP (GR-QWIP) geometry and FIG. 17B shows the associated $E_z$ distribution. The pixel area is 23×23 µm². The material active layer is 1.5 µm-thick, and the common contact layer is 1.0 µm-thick. On top of the active layer, there is a reflective grating with period d of 3.0 µm and height h of 0.75 µm. The grating is covered entirely with a highly conductive metal such as gold. These period and height are optimized for an incident light with $\lambda=9.72$ µm in free space. According to the standard grating formula, which is d sin $\theta=\lambda/n$, d should be chosen such that $\theta=90°$ for a given $\lambda$. To eliminate the zeroth diffraction that reflects the light directly backward, h is chosen to satisfy $h=\lambda/(4n)$.

Figure 18:
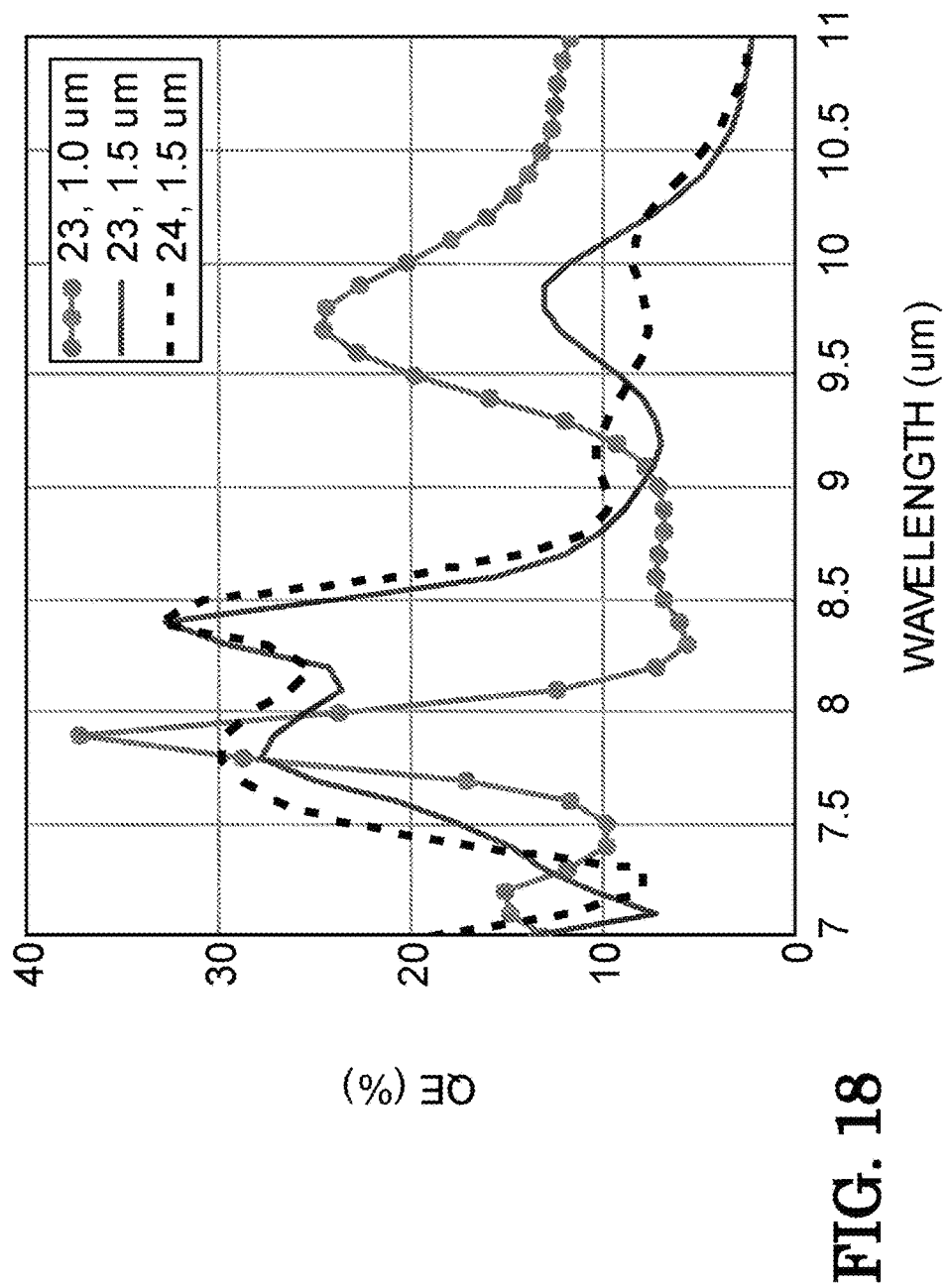
FIG. 18 illustrates the QE of three GR-QWIPs having different pixel size and common contact layer thickness. The grating period is 3.0 μm, the grating height is 0.75 μm, and the active layer thickness is 1.5 μm.
Figure 35:
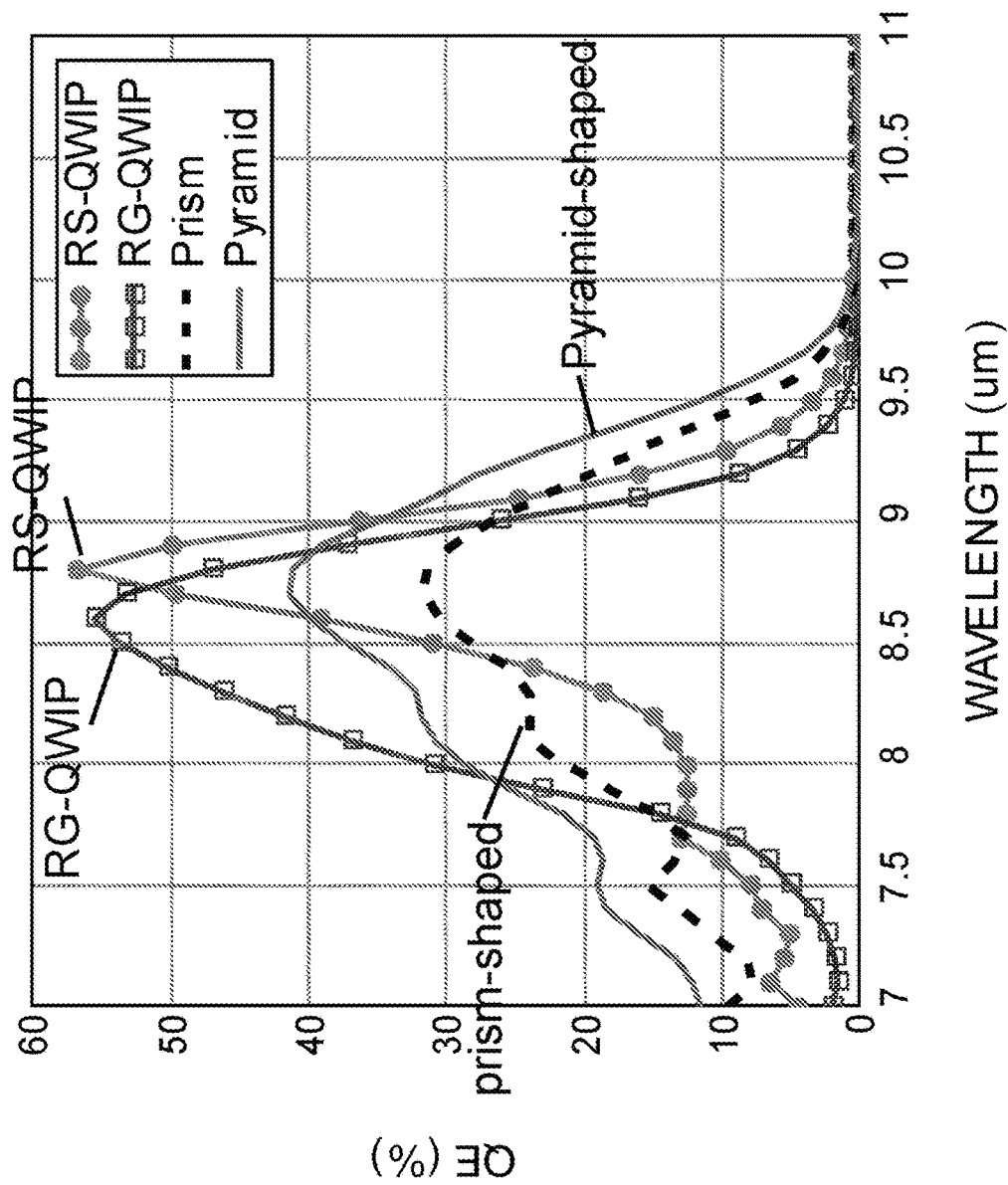
FIG. 35 illustrates the calculated QE of the prism-shaped and pyramid-shaped C-QWIPs for a material with a spectrum shown in FIG. 20 and the R-QWIPs with the same α spectral line shape but with a peak value of 0.20 $\mu m^{-1}$.

In practice, such a grating structure may be placed on a material with the same peak absorption $\lambda$ but otherwise arbitrarily selected active layer thickness $t_a$, common contact layer thickness $t_c$ and pixel size p. These material thicknesses and pixel dimensions are considered separately from that of the grating's based on factors such as material cost and readout circuit dimensions. However, based on the present EM modeling, the solid curve with circles in FIG. 18 shows that for the prescribed material thickness and pixel size, a significant peak indeed appears at ~9.7 µm as the grating formula predicts. However, the magnitude of this peak varies with p and $t_c$ for the same $t_a$, and there are larger peaks at the shorter wavelengths that correspond to smaller values of $\theta$. Therefore, there are factors other than d and h affecting the grating efficiency, and the grating formula alone cannot provide a complete prescription for the detector design. With a finite pixel size, the detector volume is in fact a resonant cavity. When the incident light of a particular $\lambda$ enters into the detector pixel, it will be diffracted by the grating at a specific $\theta$. The diffracted light rays will reflect at the pixel sidewalls and substrate, and form an interference pattern. If this interference pattern constitutes to a large integrated intensity, the cavity is said to be in resonance. For a particular set of pixel dimensions, there will be a set of $\theta$ and a set of corresponding $\lambda$ that result in large intensities. However, for QWIPs, only the vertical component of the intensity results in absorption. Therefore, in order to obtain the absolute maximum QE, the dimensions of the pixel have to be adjusted such that one of the resonances occurs when $\theta$ is near 90°. Such an optimized structure will be referred to as one member of the resonator-QWIPs (R-QWIPs), and it will be labeled as RG-QWIP. After such an optimization procedure, the QE of a RG-QWIP can be very large, reaching 55% as shown in FIG. 35. The detector parameters are: p=23 µm, d=2.7 µm, h=0.62 µm, $t_a=1.0$ µm, and $t_c=0.8$ µm.

Figure 34:
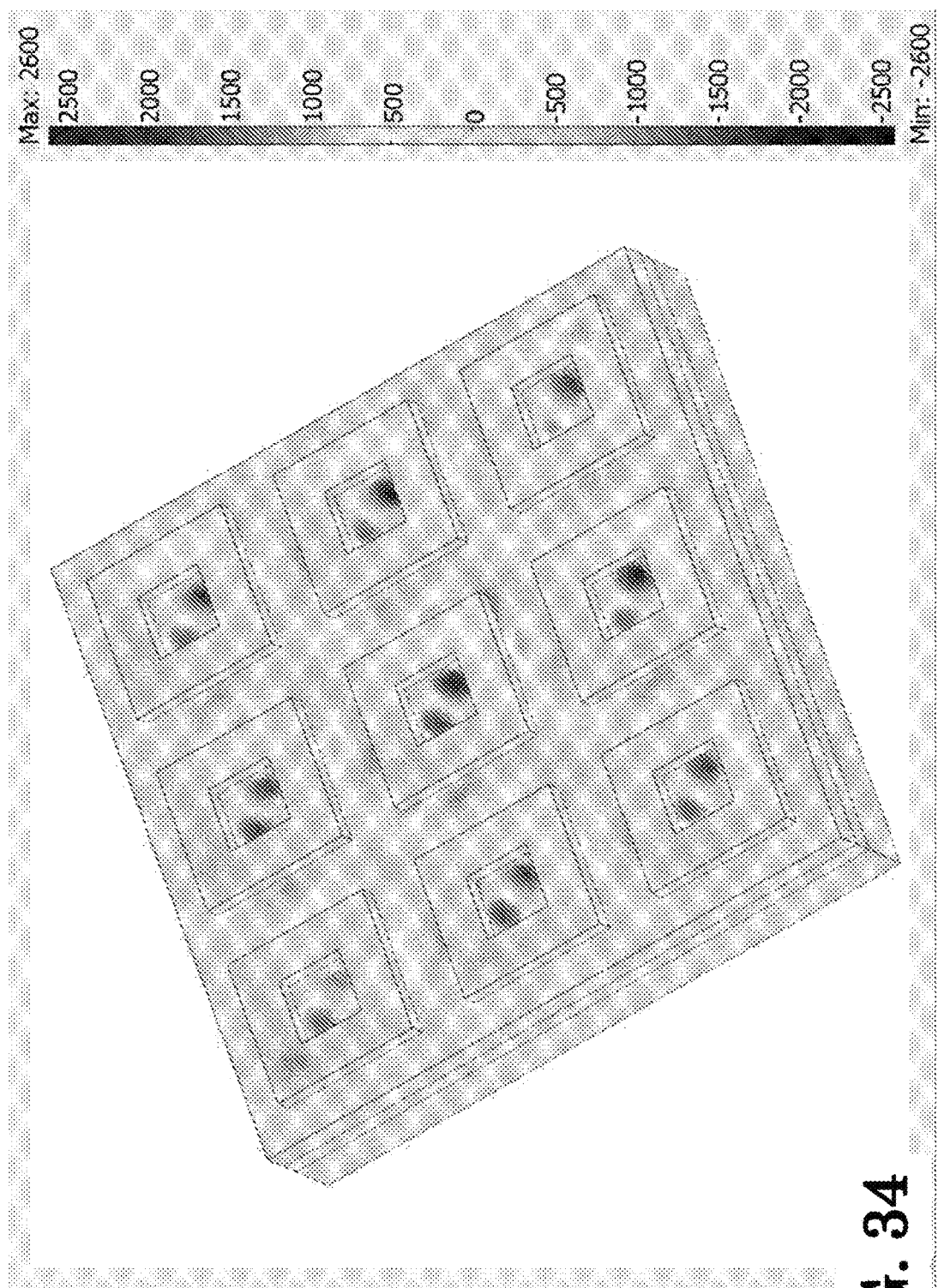
FIG. 34 illustrates the 3D geometry of a resonator-QWIP with square ring unit cells.

FIG. 34 shows another example of a resonator-QWIP design, which will be referred as the RS-QWIP. It may have nine square ring units on a 23 µm×23 µm pixel area with inner square size of 2.4 µm×2.4 µm, and outer square size of 5.4 µm×5.4 µm. The center-to-center spacing of the units may be 7.5 µm. Other parameters are: h=0.62 µm, $t_a=1.0$ µm and $t_c=0.8$ µm. With resonances provided by the six square protuberances, the detector shows a large QE of 57% centered at 8.8 µm with a 0.6 µm bandwidth in FIG. 35. These coupling characteristics are highly desirable for a long wavelength detector having a cutoff between 9-10 µm. Since these R-QWIPs only needs a 1.0 µm-thick active material, it will have the same large gain as the usual grating QWIPs, but now with 10 times higher QE since the commercial un-optimized grating cameras have demonstrated roughly only 5% QE so far. Therefore, these innovative R-QWIPs will have 10 times high signal as the commercial grating coupled camera, and thus can operate a 10 times higher speed.

Figure 5A:
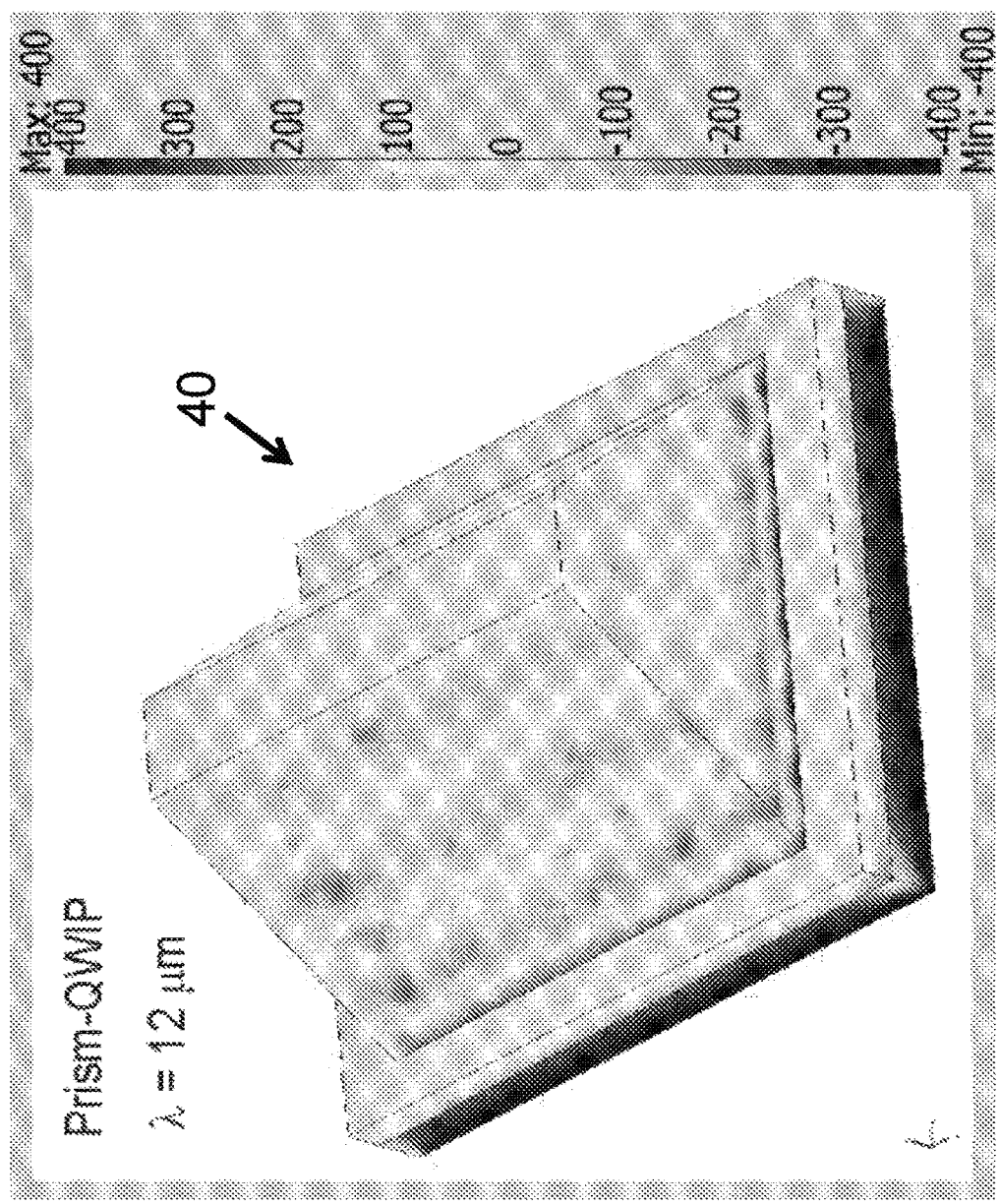
FIG. 5A schematically illustrates the prism-QWIP geometry or the PR-QWIP, used in the electromagnetic (EM) field simulation. The contour pattern shows the $E_z$ distribution of the optical field.
Figure 5B:
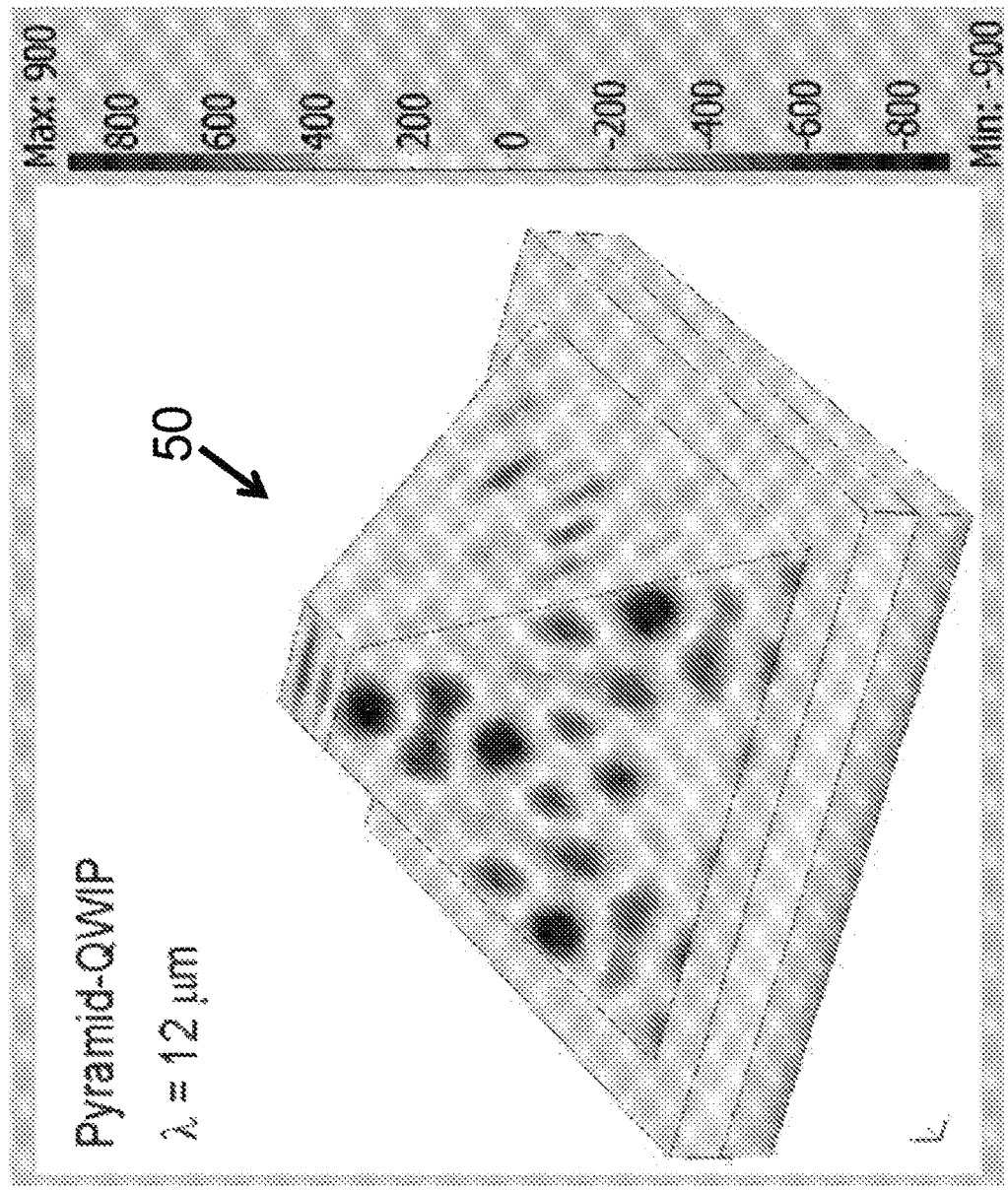
FIG. 5B schematically illustrates the pyramid-QWIP geometry or the PY-QWIP, used in the EM field simulation. The contour pattern shows the $E_z$ distribution of the optical field.

The resonator or resonance concept can be applied to the C-QWIP structures to further improve their QE. To turn the existing C-QWIPs into resonant cavities, the thick substrate that the detector is rested on will be completely removed, and an optional composite thin film will be deposited underneath the common contact layer. To illustrate the coherent optical effects, a 3-dimensional (3D) finite element electromagnetic (EM) simulation is carried out to calculate the quantum efficiency (QE) of PR- and PY-QWIPs without the optional composite reflectors or thin films. The detectors may be assumed to be surrounded by air. FIGS. 5A and 5B illustrate the detector geometry used in the EM field simulation. FIG. 5A schematically illustrates the prism-QWIP geometry or the PR-QWIP, used in the electromagnetic (EM) field simulation. The contour pattern shows the $E_z$ distribution of the optical field. FIG. 5B schematically illustrates the pyramid-QWIP geometry or the PY-QWIP, used in the EM field simulation. The contour pattern shows the $E_z$ distribution of the optical field.

Figure 5C:
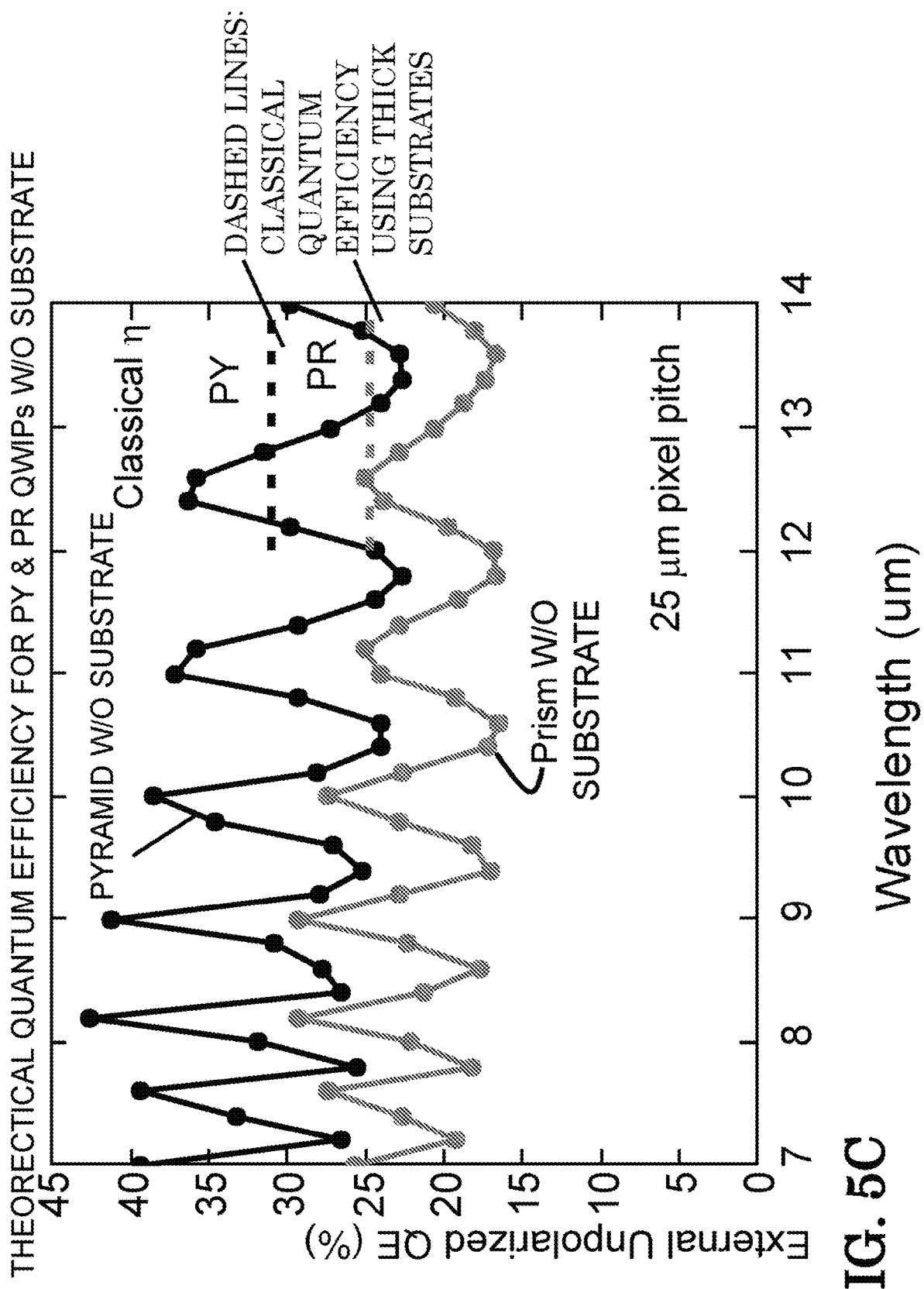
FIG. 5C graphically illustrates the theoretical quantum efficiency for QWIPs with different geometries when the substrate is removed or absent wherein, for comparison purposes, the dashed lines (- - - -) illustrate the "classical" quantum efficiency using thick substrates (the assumed pixel pitch is 25 μm).

FIG. 5C graphically illustrates the theoretical quantum efficiency for QWIPs with different geometries when the substrate is absent. The dashed lines illustrate the "classical" quantum efficiency using thick substrates. In FIG. 5C, the assumed pixel pitch is 25 µm. For a 25 µm pixel pitch FPAs, the following values are assumed: 25×25×11 µm$^{-3}$ PR-QWIP and 25×25×11 µm$^{-3}$ PY-QWIP. The common contact layer is 1.5 µm. The absorption coefficient α is assumed to be 0.15 µm$^{-1}$.

FIG. 5C shows that optical interference causes the quantum efficiency (QE) of a PR-QWIP to oscillate about its classical value of ~25% obtained from ray-tracing technique. At 8.4 µm, a narrowly peaked value can reach 30%. For PY-QWIPs, the QE oscillates above its classical value of 32% and can reach 43% at 8.4 µm.

Figure 5D:
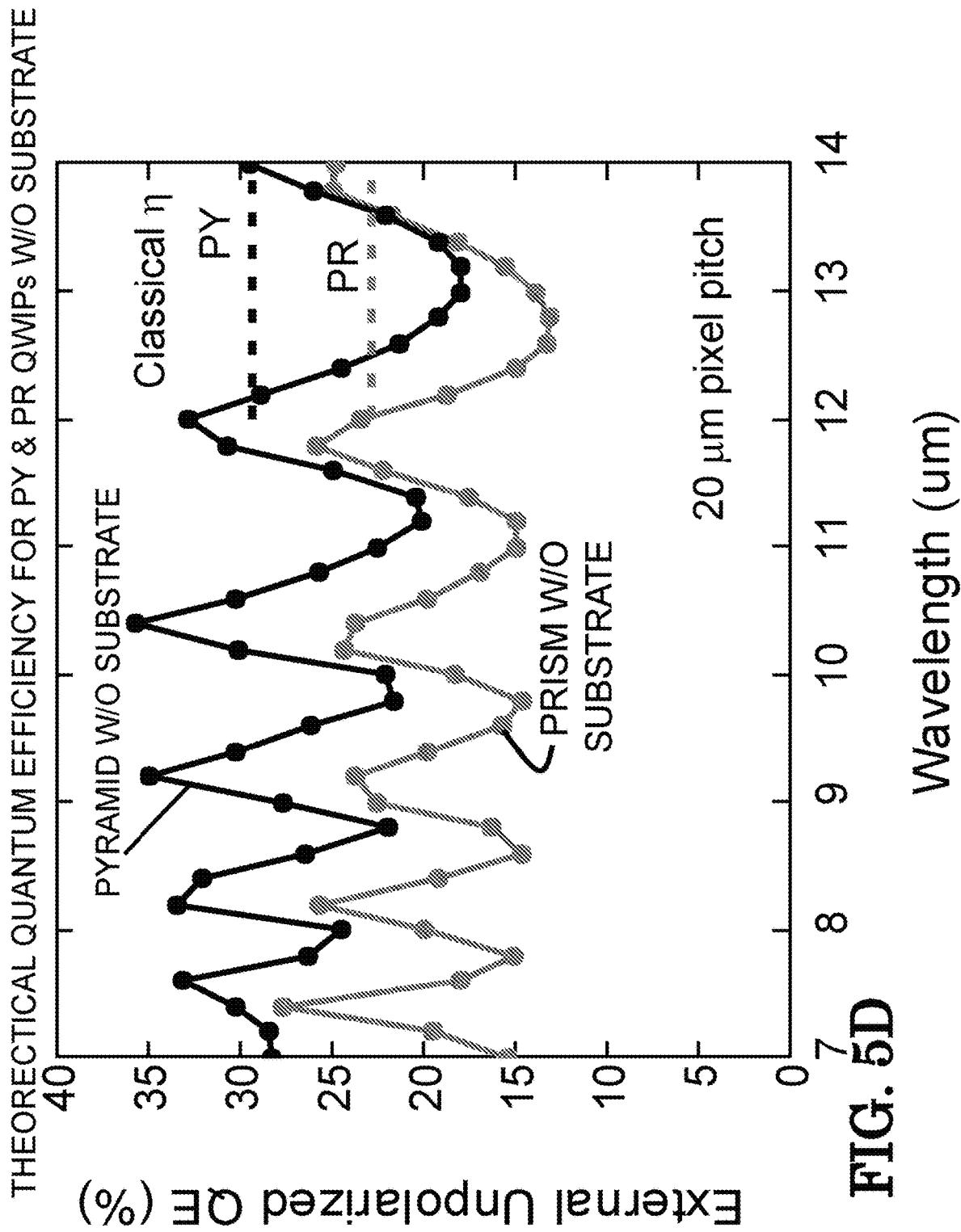
FIG. 5D illustrated graphically the theoretical QE for QWIPs with different detector geometry when the substrate is removed (or absent) (with an assumed pixel pitch of 20 μm).

FIG. 5D illustrated graphically the theoretical QE for QWIPs with different detector geometry when the substrate is removed (with an assumed pixel pitch of 20 µm). The straight lines are the classical QE obtained using thick substrates. In FIG. 5D the QE for a 20 µm pixel pitch FPA is examined, with which 20×20×8.8 µm$^{-3}$ PR-QWIP and 20×20×9.1 µm$^{-3}$ PY-QWIP The average QEs of the PR- and PY-QWIPs are about 20% and 30%, respectively, in this wavelength regime in the 20 µm pitch FPA. Therefore, the resonantly enhanced C-QWIP structures can greatly improve the QE of the existing grating-QWIP FPAs and also the unthinned C-QWIP FPAs.

FIGS. 5C and 5D show that with optical resonances, a large optical intensity enhancement can be obtained at certain wavelengths λ with which a large QE can be achieved. To obtain a more uniformly large QE, a composite thin film can be added to the common contact layer. An example for a single layer thin film (thickness=1.4 µm and n=1.8) is shown in FIG. 8. This layer introduces an extra material interface for light reflection and thus creates more resonances. Typical infrared materials with similar refractive indexes such as AgCl (n=1.98) and BaF$_2$ (n=1.51) etc. can be used albeit with different resonant wavelengths.

FIG. 8 shows the $E_z$ distribution with this thin film coating (single layer thin film; thickness=1.4 µm and n=1.8) at λ=8.4 µm in PR-QWIPs with air cover. The pixel has an extra thin film coating beneath the common contact layer. To appreciate the optical effects of this coating, the detector material is assumed to have no absorption in FIG. 9. Since the detector QE is dependent on the average intensity in the detector volume, one can define the average intensity magnification factor M as average($I_z$)/$I_{inc}$=average ($|E_z|^2$)/$|E^{inc}|^2$, where $I_z$ is the optical intensity associated with the vertical $E_z$, and $I_{inc}$ is the incident intensity with $E_x$ polarized along the x-direction. As seen in FIG. 9A, large M values ~0.52 are now more uniformly distributed across the 8-13 µm range with an optical thin film in comparison with the large oscillation of M about an average value of 0.44 without the thin film in FIG. 9B. Uniform broadband detection is then possible. When comparing the number of resonances between FIGS. 9A and 9B, one should keep in mind that the number of resonances is dependent on the common contact layer thickness $t_g$. For the same $t_g$, the one with an additional optical thin film will have more resonances than the one without. Different resonant characteristics can be obtained with different composite thin film coatings.

FIG. 9A shows the magnification factor M=$I_z$/$I_{inc}$ inside the C-QWIP with a thin film coating as a function of λ. For incoherent transmission, the transmitted intensity ratio $I_x$/$I_{inc}$ would have been equal to $T_r$=0.44.

Figure 11:
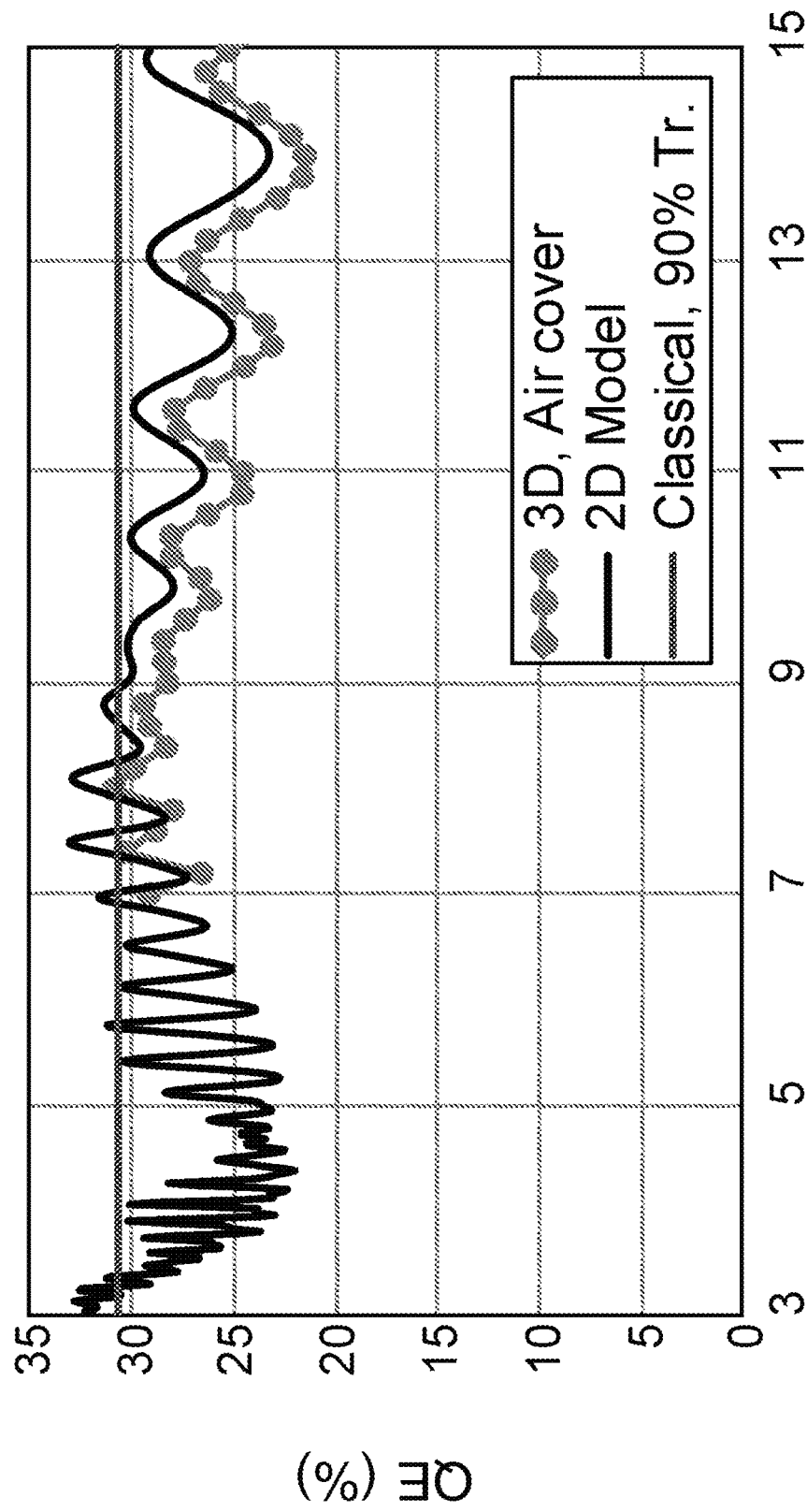
FIG. 11 illustrates the QE of a PR-QWIP with a 9 μm AR-coating.
Figure 16:
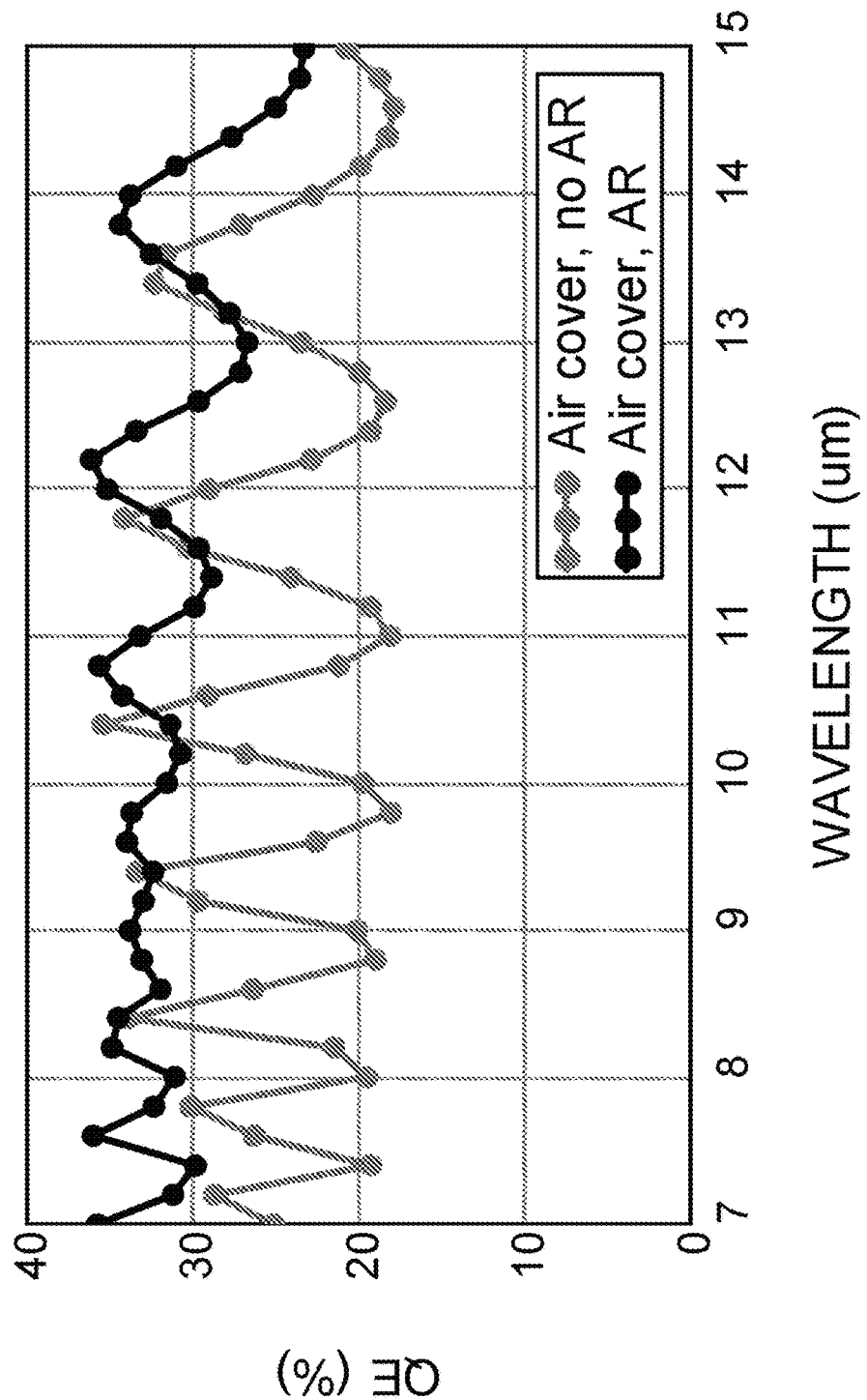
FIG. 16 illustrates the QE of a CC-QWIP with and without a 9 μm AR-coating.

As an explicit illustration of the advantages of a composite thin film, the QEs of the PR-QWIP, the PY-QWIP and also a conical QWIP with air cover having a single thin film coating are calculated based on Equation (2). This coating has a thickness of 1.25 µm and a refractive index of 1.8. FIGS. 11, 14B and 16 show the larger number of Fabry-Perot resonances around 9 µm generally increases the QE at this wavelength regime.

To gain a perspective on various light coupling schemes discussed in this patent, the QE of different detectors used for a 25-µm pixel pitch array are plotted in FIG. 35. The C-QWIPs (prisms and pyramids) are assumed to have an 11 µm thick active material with a peak α of 0.15 µm$^{-1}$ and have a thin film coating. The resonator-QWIPs (RG and RS) may be assumed to have a 1.0 µm-thick active material with a peak α of 0.20 µm$^{-1}$ and no thin film coating. The C-QWIPs rely more on the use of a large active volume to achieve a high QE at all wavelengths, while the resonator-QWIPs make use of the intensified light under resonances to achieve the same at selected wavelengths. They have their own advantages. For example, the present R-QWIP uses a thinner material (and thus be cheaper) and has a larger gain and thus more tolerant to the readout noise, but its QE is only about 5.8% in the 3-5 µm band and therefore it is generally not suitable for two-color detection. The C-QWIPs, on the other hand, may be suitable for all general applications but need a thicker (and thus more expansive) material, and a high voltage and low noise readout circuit to complement its smaller gain and thus lower noise characteristics.

The inclined sidewalls on the C-QWIP can be produced either by wet chemical etching (e.g. with 1H$_3$PO$_4$:1H$_2$O$_2$:3H$_2$O) or plasma etching (e.g. BCl$_3$/Ar). To completely remove the substrate, plasma etching can be used on a mechanically thinned substrate. It requires the insertion of an etch stop layer before growing the detector material on the GaAs substrate. An example of a C-QWIP material with an etch stop layer is shown in Box A. This example of C-QWIP material contains a 3.0 µm top contact layer made of GaAs, a 4.6 µm GaAs/Al$_{0.17}$Ga$_{0.83}$As active QWIP material, a 2.4 µm bottom GaAs contact layer, a 2.6 µm common contact layer, and a 0.1 µm Al$_{0.3}$Ga$_{0.7}$As layer, which are grown on top of a 650 µm GaAs wafer substrate. All three contact layers are doped with N$_D$=1×10$^{18}$ cm$^{-3}$ Si donors, and the GaAs layers in the active region is doped at 0.6×10$^{18}$ cm$^{-3}$. The active region contains 60 periods of QWs, each containing 6 nm GaAs and 70 nm AlGaAs.

BOX A—A typical C-QWIP material containing an etch stop layer on a GaAs substrate.

| Top contact layer, | 3.0 µm | GaAs |
| Active QWIP layer, | 4.6 µm | GaAs/Al$_{0.17}$Ga$_{0.83}$As |
| Bottom contact layer, | 2.4 µm | GaAs |
| Common contact layer, | 2.6 µm | GaAs |
| Etch stop layer, | 0.1 µm | Al$_{0.3}$Ga$_{0.7}$As |
| GaAs Substrate, | 650 µm | GaAs |

The plasma process was investigated and established by J. W. Lee, M. W. Devre, B. H. Reelfs, D. Johnson, J. N. Sasserath, F. Clayton, D. Hays, and S. J. Pearton, J. Vac. Sci. Technol. A 18(4), pp. 1220-1224 (2000), herby incorporated by reference. After the substrate is mechanically thinned to 40 µm, it can be loaded into an inductively coupled plasma (ICP) etcher for selective etching. The gases flow into the etcher consists of 5 sccm (standard cubic centimeter per minute) $BCl_3$, 5 sccm $SF_6$, and 10 sccm helium. The ICP source power, which controls the plasma density, is set at 300 W and 2 MHz, and the rf chuck power, which controls the plasma collision energy and thus the etching rate, is set at 10 W and 13.56 MHz. The chamber pressure is set at 10 mTorr. Under such etching condition, the etching rate for GaAs is 0.37 μm/min and the etching rate for $Al_{0.2}Ga_{0.8}As$ is $9.2\times10^{-4}$ μm/min. The selectivity is thus 400:1. This selectivity will also be further increased by increasing the Al content. In this process, $BCl_3$ serves as an etchant to GaAs, and once the AlGaAs stop etch layer is exposed, the reaction of aluminum with $SF_6$ forms the nonvolatile $AlF_3$ compounds and prevents further etching. The role of helium in the plasma is to assist the removal of chemical by-products on the material surface so that the GaAs etching rate is increased and the surface is smoother. As such, other inert gases can be used as a substitute for helium.

A PR-QWIP FPA based on the detector material in Box A has been characterized before and after the GaAs substrate was removed by the dry plasma etching process. No composite thin film was used. Preliminary data shows that the detector QE varies with wavelengths according to that shown in FIG. 5C after the substrate is removed. A preferred embodiment resonantly enhanced corrugated quantum well infrared photodetector (RE C-QWIP) has thus been shown to operate as the modeling predicted. A preferred embodiment RE C-QWIP provides a large QE for the FPA.

The preferred embodiment resonantly enhanced corrugated quantum well infrared photodetector (RE C-QWIP) will further increase the detector QE through coherent resonance effects. These can be achieved by removing the substrate and, subsequently, by adding an optional layer of composite thin film. The RE C-QWIP preserves the broadband advantages of a C-QWIP through multiple resonances, and yet intensified the light at those wavelengths. With the resulting higher QE, the target acquisition time will be shorter, which allows the cameras to track faster objects. With higher photocurrent, it allows the camera operating at higher temperatures with the same sensitivity. Higher temperature operation can reduce the readiness time and the cooling power consumption.

Grating coupled QWIP FPAs are expensive due to the low yield in grating fabrication, less sensitive due to inefficient, narrow band light coupling, lower in definition due to the larger pixel size. In contrast, C-QWIP FPAs are inexpensive due to the standard batch processing, higher in sensitive due to efficient broadband light coupling, and higher in definition due to the smaller pixel size in the one corrugation per pixel geometry. C-QWIP coupling is also suitable for multi-color detection due to its wavelength-independent light coupling mechanism.

RE C-QWIP FPAs further increases the C-QWIP quantum efficiency by several times and thus make the camera more sensitive.

A RE C-QWIP FPA camera can be used as an upgrade replacement for all grating coupled or C-QWIP cameras. In the past, a C-QWIP FPA was found to have the best performance in detecting unmanned aerial vehicles in a detection contest, which consisted of 12 sensing teams using different technologies. The cameras are also used in ballistic missile intercept observations, ground based mid-course defense and terminal high altitude air defense. C-QWIP cameras obtained the best and most detailed video missile intercept footages to date. In view of the broadband characteristics of C-QWIPs, NASA has revised the technology roadmap for its Landsat program. On board of the upcoming earth observing satellite, there will be a Thermal Imaging Infrared Sensor that requires broadband infrared detectors. NASA has designated C-QWIP FPAs to be the technology for this mission and proposed the structure for other planetary missions such as the Jupiter-Europa mission. The RE C-QWIPs will further improve this technology. Because of its ability in generating even larger photocurrent needed for high speed imaging, Army Night Vision Lab and L3, Inc. will be interested in developing RE C-QWIPs for the Objective Pilotage for Utility and Lift program.

RE C-QWIP FPAs can also be made in high resolutions such as 4 megapixels or 16 megapixels and into two- or multi-color FPAs. They will be the unique choice for many long wavelength applications in terms of availability, sensitivity, stability, reliability, resolution and cost. The applications include night vision, all weather navigation, infrared astronomy, space exploration, earth resources exploration, environmental protection, geological survey, homeland security, industrial quality control, maintenance and diagnostics, and medical imaging etc.

Certain embodiments of the present invention utilize the insight into the resonant mechanism, the Fabry-Perot oscillations, in conjunction with the inclined detector sidewalls, in producing intense optical fields polarized in the vertical direction. This insight devises a simple and cost effective solution in achieving high quantum efficiency and broadband infrared detection in QWIP materials. It is the first time for one to show that Fabry-Perot resonances exist in trapezoidal resonators, which include prisms, pyramids, and cones, in addition to the usual parallel plate etalon, and to utilize these resonances to produce large infrared absorption across a wide spectrum.

EM Modeling Solutions

With an exemplified α of 0.22 $μm^{-1}$, FIGS. 7A and 7B show the QE of prism-shaped C-QWIPs (FIG. 5A)(labeled as PR-QWIPs) and pyramid-shaped C-QWIP (FIG. 5B) (labeled as PY-QWIPs) for different 2t/p ratios. For a typical p=25 μm and t=11 μm, the classical theoretical QE is 25% for PR-QWIPs and 31% for PY-QWIPs.

Referring now to FIG. 6, assuming a constant α=0.15 $μm^{-1}$ (independent of wavelengths), where typically α is the typical peak value for a QWIP material with $1\times10^{18}$ $cm^{-3}$ doping and 1.5 μm absorption bandwidth. In the following, four different pixel geometries are examined: prism-shaped C-QWIPs (PR-QWIPs), pyramidal C-QWIPs (PY-QWIPs), conical C-QWIPs (CC-QWIPs), and cross-grating QWIPs (GR-QWIPs). The physical dimensions (L, W, H) in microns are (25, 25, 11) for the PR- and PY-QWIPs and (20, 20, 1.5) for GR-QWIPs, and 25 μm in diameter and 11 μm in height for CC-QWIPs. All C-QWIP sidewall angles are 48°, and all detectors have the same common contact layer thickness of 1.5 μm. Also modeled are the effects of an AR-coating deposited underneath the common contact layer. For 9 μm detection, the coating is made of a 1.25 μm-thick, n=1.8 optical material. The entire pixel volume may be filled with active materials.

Figure 6A:
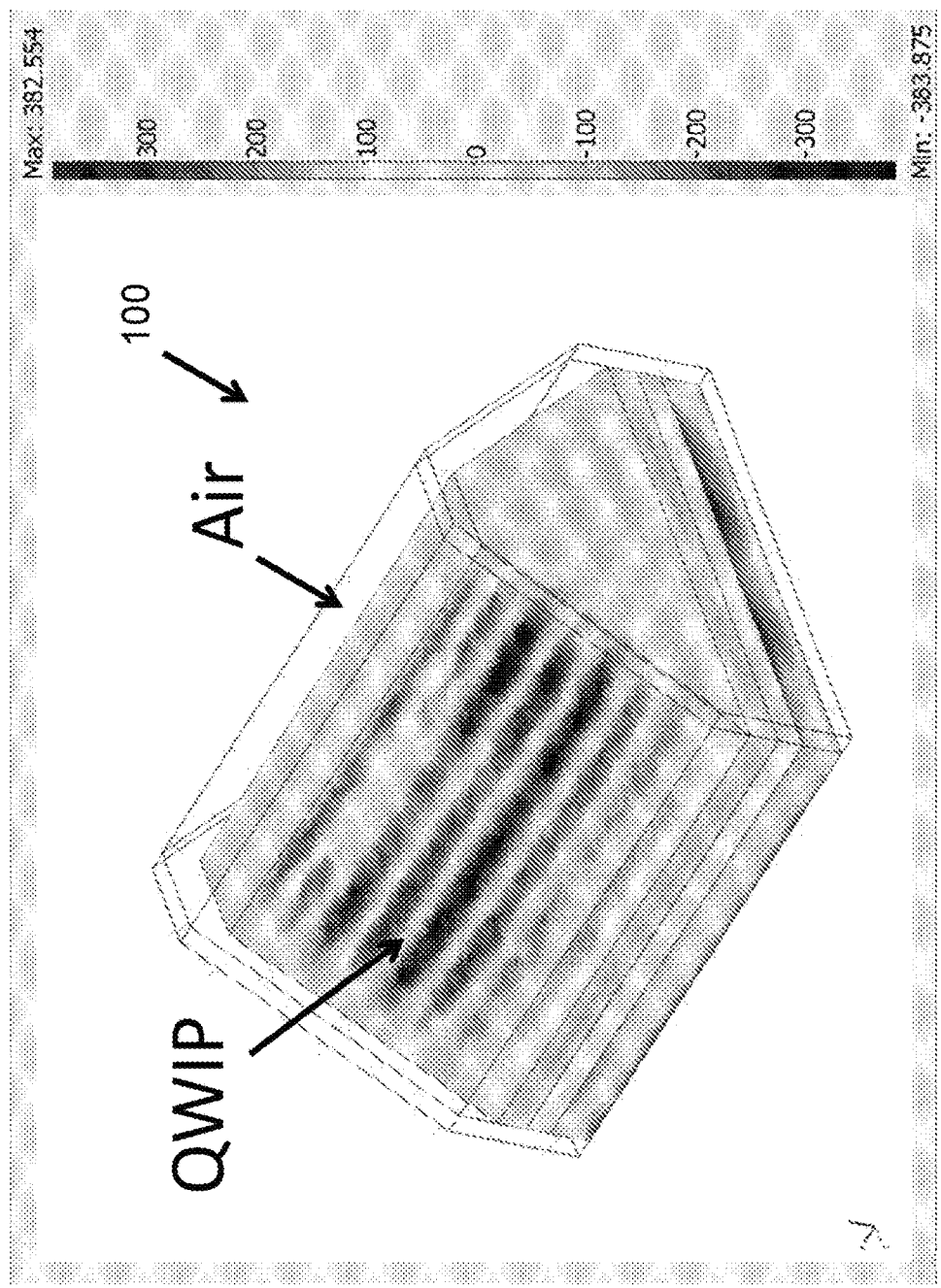
FIG. 6A schematically illustrates the geometry of a PR-QWIP with an air cover and AR substrate coating. The $E_z$ distribution is shown at λ=9.0 μm.

FIGS. 6A and 6B show the 3-dimensional geometry of a PR-QWIP surrounded by air, as well as the $E_z$ distribution on the surfaces and in the cross-section, respectively.

Figure 10:
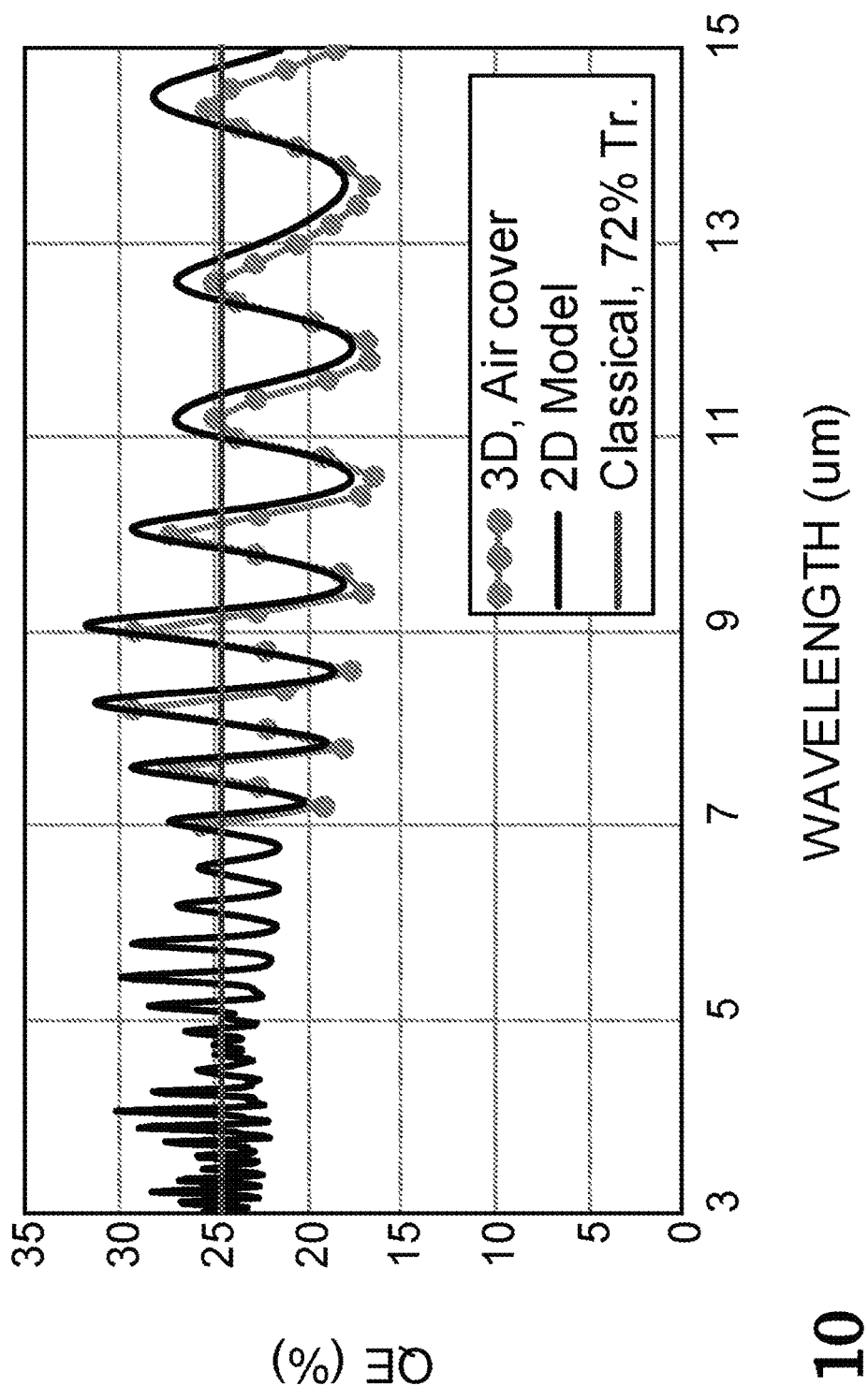
FIG. 10 illustrates the QE of a PR-QWIP without a 9 μm AR-coating.

FIG. 10 shows the QE without an AR-coating. For this detector geometry, one can use either a 2D EM model or a 3D EM model. Both models show the same oscillatory behavior due to optical interference and they agree with each other. The similar results between these two models show that there are compensating effects at the ends of the prism. The weaker sidewall reflections towards the ends as seen in FIG. 6A are compensated by the diffraction effects of the two vertical sidewalls. Towards the shorter λ, the EM QE is centered about the classical value of 24.6% calculated from Equation (3) using $t_s$=0.72 for n=3.239. The agreement between EM and classical models lends credibility to the present EM modeling. The present result shows that the PR-QWIP provides relatively constant coupling efficiency in the calculated λ range from 3 to 15 μm. With a 9 μm AR-coating, the QE rises up to ~30.6% in a broad λ range as FIG. 11 shows, and it corresponds to a $t_s$ of 90% in the classical model. This situation is the same when the coating is designed for MWIR detection.

Figure 12:
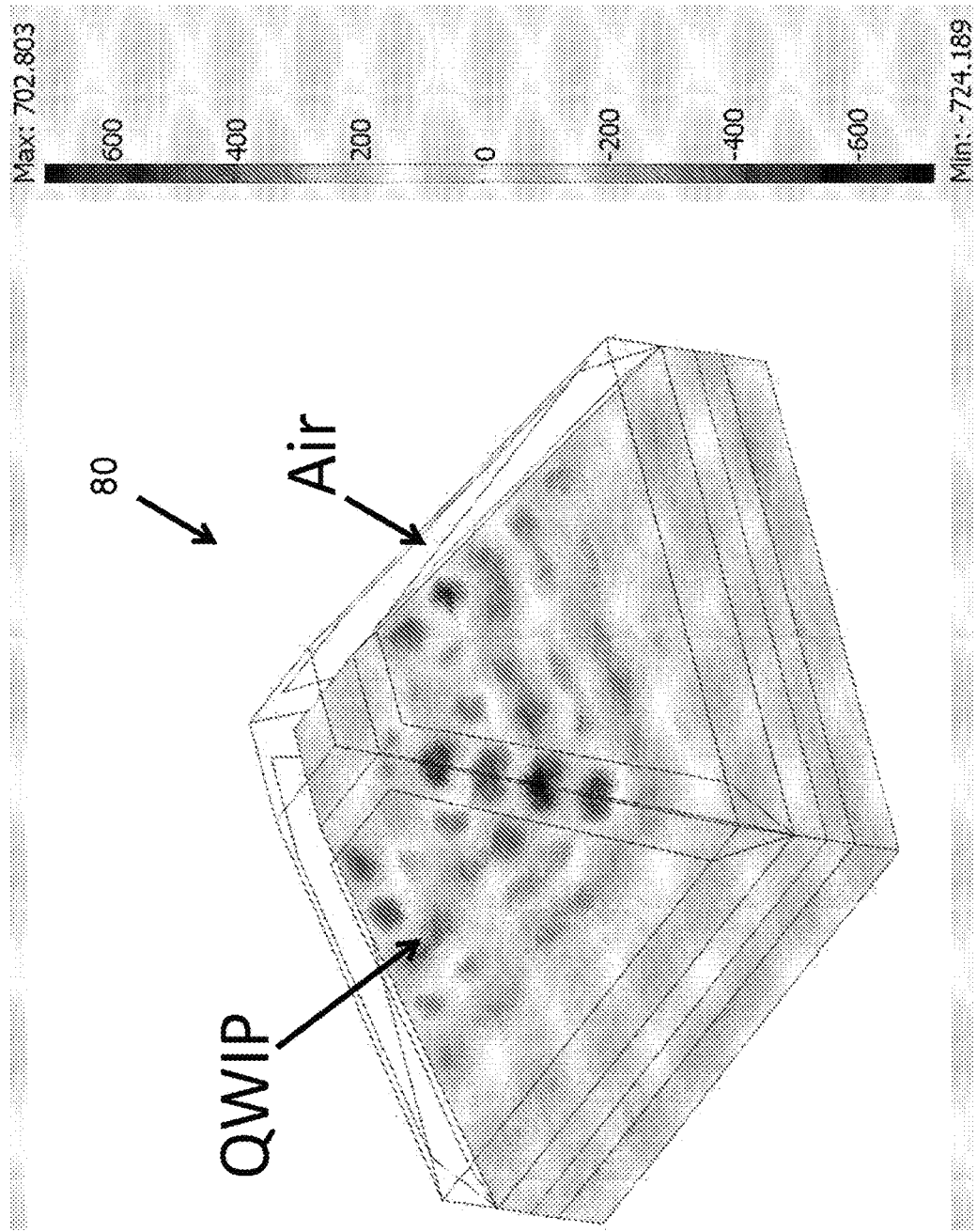
FIG. 12 illustrates the geometry of a PY-QWIP with air cover and AR substrate coating. The $E_z$ distribution is shown at $\lambda$=9.0 μm.
Figure 14A:
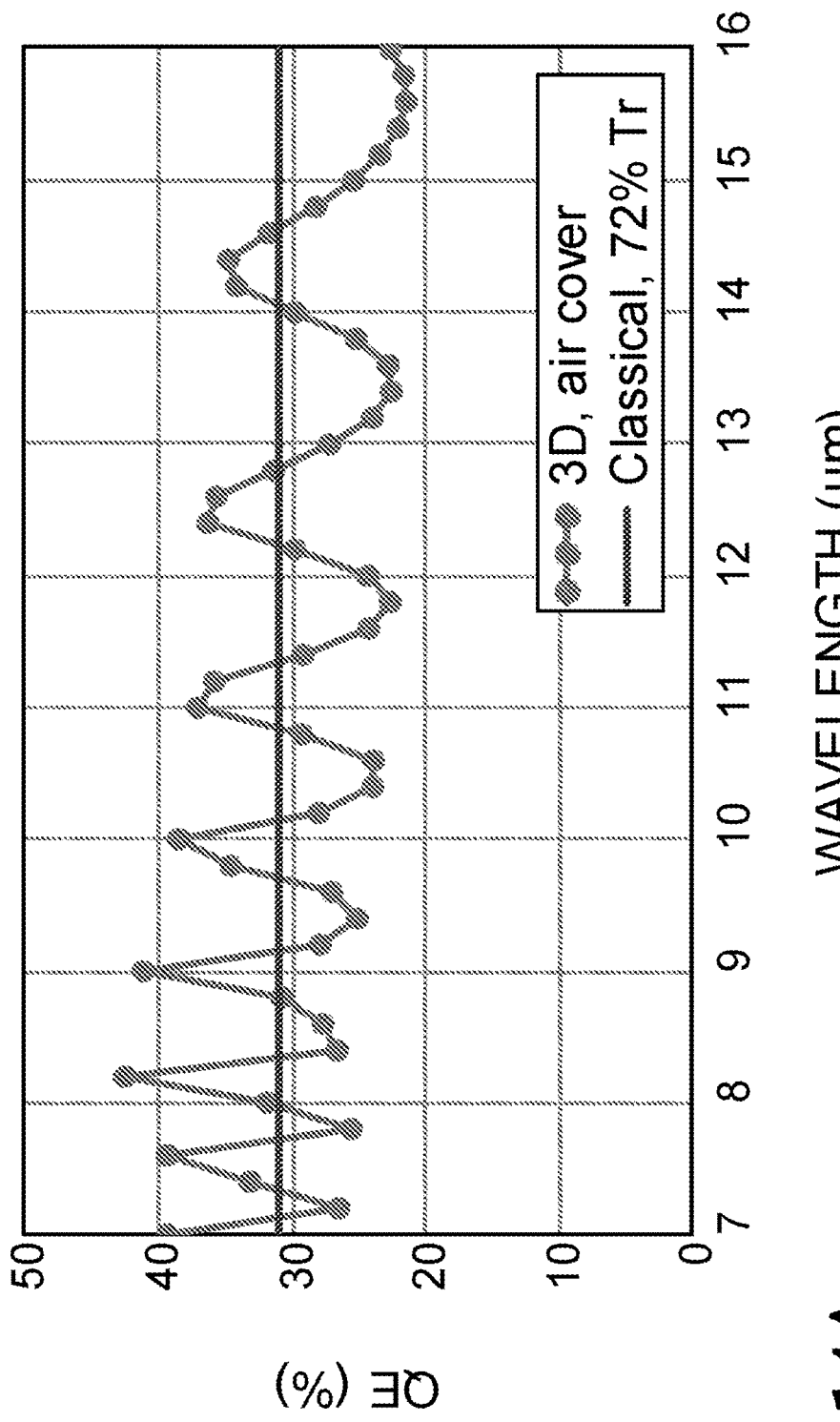
FIG. 14A graphically illustrates the QE of a PY-QWIP without an AR-coating.

FIGS. 12 and 13 show the geometry for the PY-QWIP and FIG. 14 shows the 3D modeling result. There is no 2D analog for this detector geometry. The non-anti-reflective (AR) coated and AR coated classical QE are 30.9% and 38.6%, respectively. The EM solutions are shown to oscillate about these classical values and are higher than that of a PR-QWIP. FIG. 14A graphically illustrates the QE of a PY-QWIP without an AR-coating, and FIG. 14B graphically shows the QE with a 9 μm AR-coating.

Figure 15A:
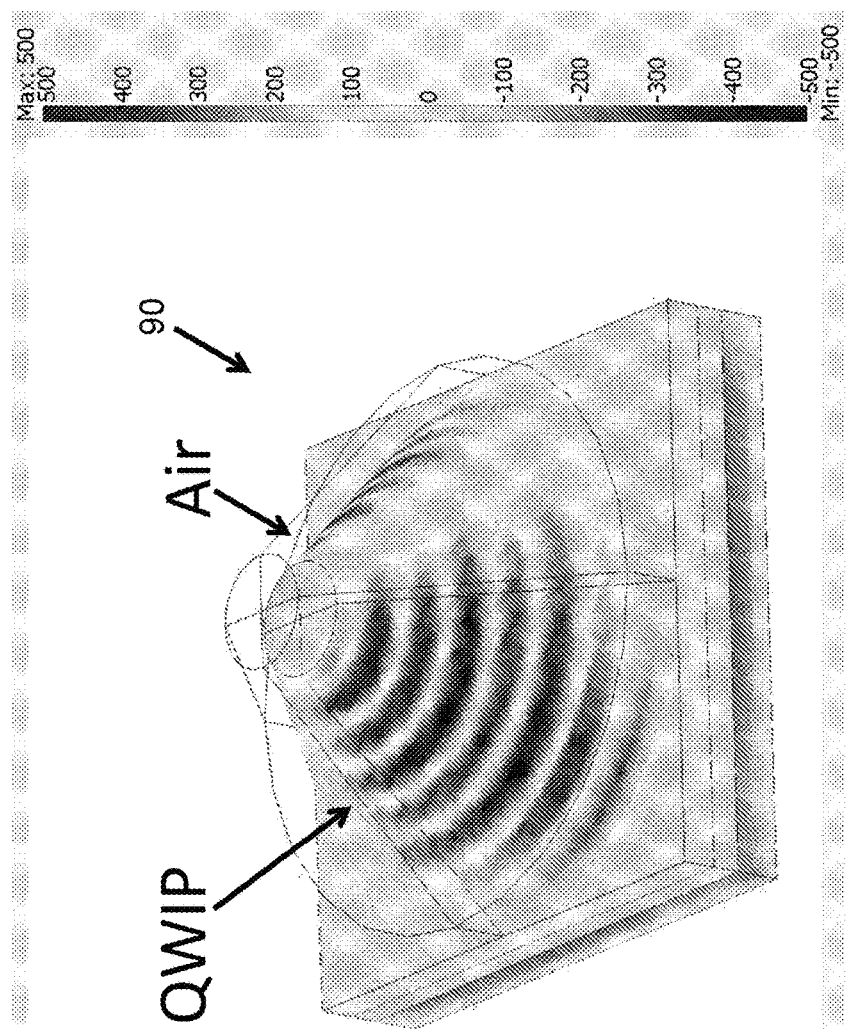
FIG. 15 A illustrates the 3-D geometry of a CC-QWIP with air cover and AR substrate coating. The $E_z$ distribution is shown at $\lambda$=9.0 μm.
Figure 15B:
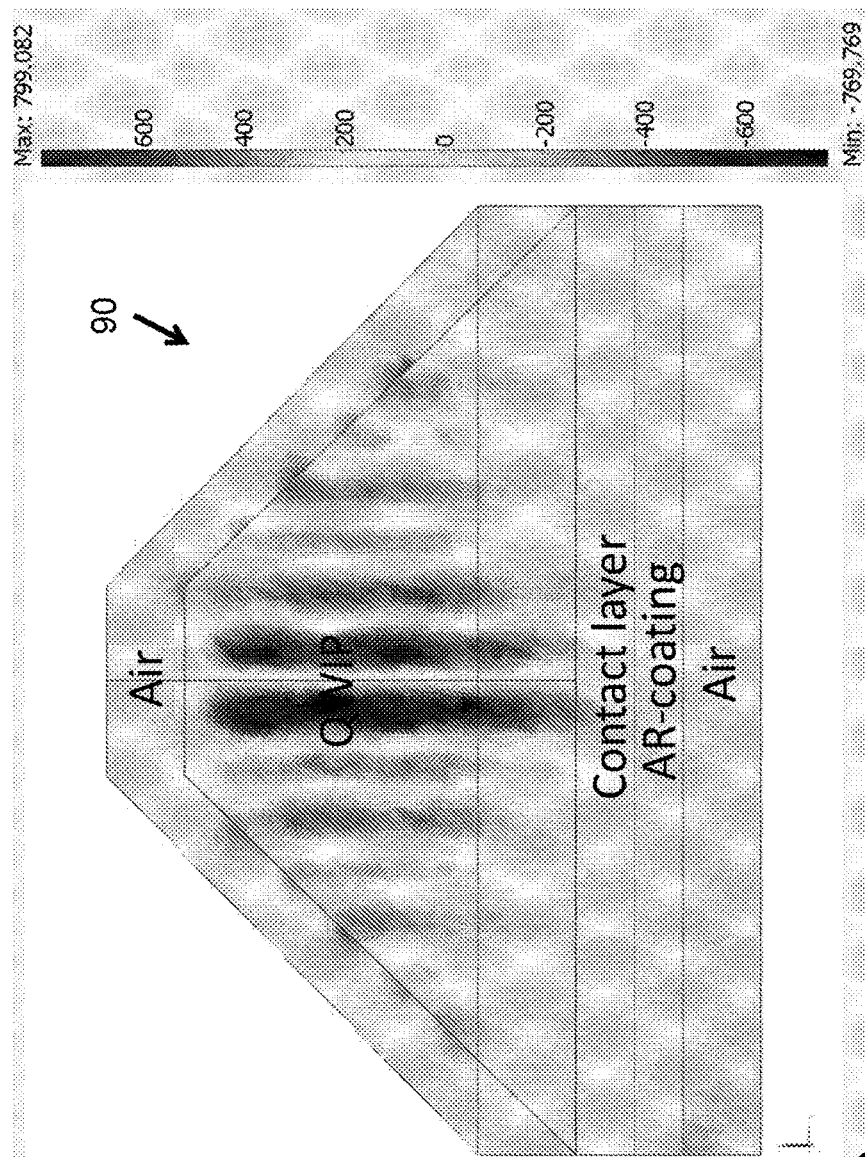

FIG. 15A schematically illustrates the 3-D geometry of a conical CC-QWIP with air cover and AR substrate coating. The $E_z$ distribution is shown at λ=9.0 μm. FIG. 15B schematically illustrates the cross-section of the $E_z$ distribution at λ=9.0 μm. FIG. 16 shows the 3D modeling result. As seen in FIGS. 11, 14B and 16, when an AR-coating is applied, the QE generally rises to the peak values of the oscillations and the broadband nature prescribed by the classical model is restored. This effect can be understood by the fact that the oscillations in the C-QWIPs are due to Fabry-Perot modulation of the substrate transmission. The AR-coating increases the substrate transmission in general and hence suppresses the oscillation amplitudes.

With the AR-coating, the QEs of the PR-QWIP, PY-QWIP and CC-QWIP are about 31%, 39% and 34%, respectively. Therefore, the PY-QWIP has the highest QE. On the other hand, the detector dark current is directly proportional to the detector volume for the same detector height, and hence their dark currents are in the ratio of 1:0.67:0.53. The $I_p/I_d$ ratio is therefore 1:1.88:2.07. The cone-shaped C-QWIP will thus provide the lowest noise equivalent temperature difference.

FIG. 16 graphically illustrates the QE of a CC-QWIP with and without a 9 μm AR-coating.

FIG. 17A schematically depicts the 3D geometry of a GR-QWIP 60 with a specially configured cover having polygonal protrusions 61 (or nodules). The $E_z$ distribution is shown at λ=9.7 μm, where the first order diffraction occur at θ=90°. FIG. 17B illustrates the cross-section of the $E_z$ distribution at the same λ in the center plane of the active layer. FIG. 18 graphically illustrates the increase or decrease of the 9.7 μm peak with a small change of pixel size p from 23 μm to 24 μm or a small change of common contact thickness $t_c$ from 1.0 μm to 1.5 μm. Evidently, the QE of 24% at p=23 μm and $t_c$=1.0 μm will drastically reduce to 8% at p=24 μm and $t_c$=1.5 μm for the same active layer thickness and grating structure. Therefore, this example shows the benefits of combining a grating and a detector material together using EM optimization.

When each pixel is treated as a resonator, by changing the resonator's size and shape a different set of cavity eigen modes are created. The excitation of these eigen modes (and their superpositions if they are degenerate) by the incident light will determine the detector QE spectrum.

Experimental Comparison

The EM model may be compared with experimental results. By applying the EM model to actual detectors, there are several additional factors. Firstly, the absorption coefficient α will not be a constant but varies according to $$\alpha(\lambda) = \sum_n \frac{N_D W}{L} \frac{\pi e^2 \eta}{2\sqrt{\varepsilon_h}\, \varepsilon_0 m * c} f_n \rho_n(\lambda),$$

Figure 19:
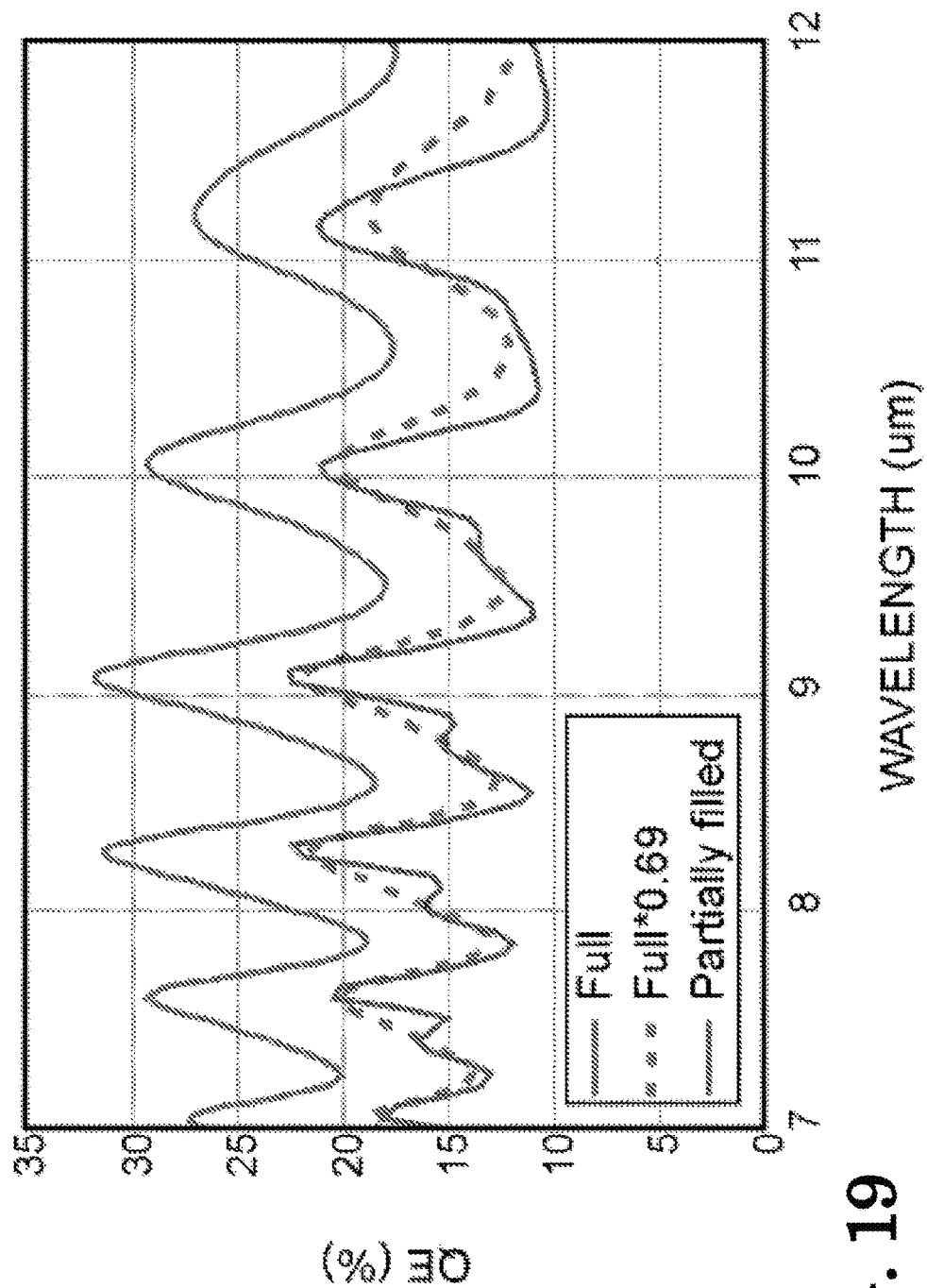
FIG. 19 graphically illustrates difference between a fully occupied C-QWIP and a partially filled 60 QW C-QWIP.

Secondly, the actual detector area is necessarily smaller than the pixel pitch area, characterized by the pixel fill factor $f_p$. The value of $f_p$ is taken to be 0.8 for C-QWIPs and 0.64 for gratings based on the grating geometry in FIG. 31B. Thirdly, the C-QWIP may cover with materials other than air. For PR-QWIPs, a layer of 2000 Å MgF$_2$/700 Å Au is usually applied on the sidewalls for epoxy isolation. It was found that the EM result with MgF$_2$/epoxy (without the Au) is almost the same as that with air. The solution with MgF$_2$/Au/epoxy still has the same QE magnitude but oscillates at a different phase. In practice, the oscillation phase matches better with that without Au. One can hypothesize that the 700 Å Au deposited on the inclined sidewalls has lower electrical conductivity than the solid gold, and thus it cannot enforce the perfect electric conductor boundary condition adopted in the EM model. Therefore, the air cover solution will be used for experimental comparison. Finally, the experimental C-QWIPs are usually only partially occupied with active material due to the bias limitations of the available readout circuits. There will be a corrugation fill factor κ, which accounts for the thinner active material. For example, FIG. 19 shows the EM results of a fully occupied PR-QWIP and a partially occupied PR-QWIP, which contains a 60 QW structure used in this experiment. This example shows that one can use κ=0.69 if the full structure solution is adopted. In summary, the external QE of a C-QWIP for experimental comparison is given by $$\eta_{ext} = f_p \kappa \eta_{full}, \tag{8}$$

where $f_p$=0.8, κ=0.69, and $\eta_{full}$ is the QE for a fully occupied C-QWIP calculated from the following equations (repeat of Equation 1):

$$\eta = \frac{1}{P_0} \int_V dI(\vec{r}), \tag{1}$$

$$= \frac{1}{P_0} \int_V \alpha I(\vec{r}) d^3 r,$$

$$= \frac{\alpha}{A \frac{c\varepsilon_0}{2} E_0^2} \int_V \frac{nc\varepsilon_0}{2} |E_z(\vec{r})|^2 d^3 r,$$

$$= \frac{n\alpha}{A E_0^2} \int_V |E_z(\vec{r})|^2 d^3 r,$$

$$\alpha(\lambda) = \sum_n \frac{N_D W}{L} \frac{\pi e^2 \eta}{2\sqrt{\varepsilon_h}\, \varepsilon_0 m * c} f_n \rho_n(\lambda),$$

The same κ is used for the classical model. For PR-QWIPs where 2D model is applicable, it is used for comparison since it is more efficient and more accurate because of the use of finer meshes in the computation.

PR-QWIP FPA#1

Figure 20:
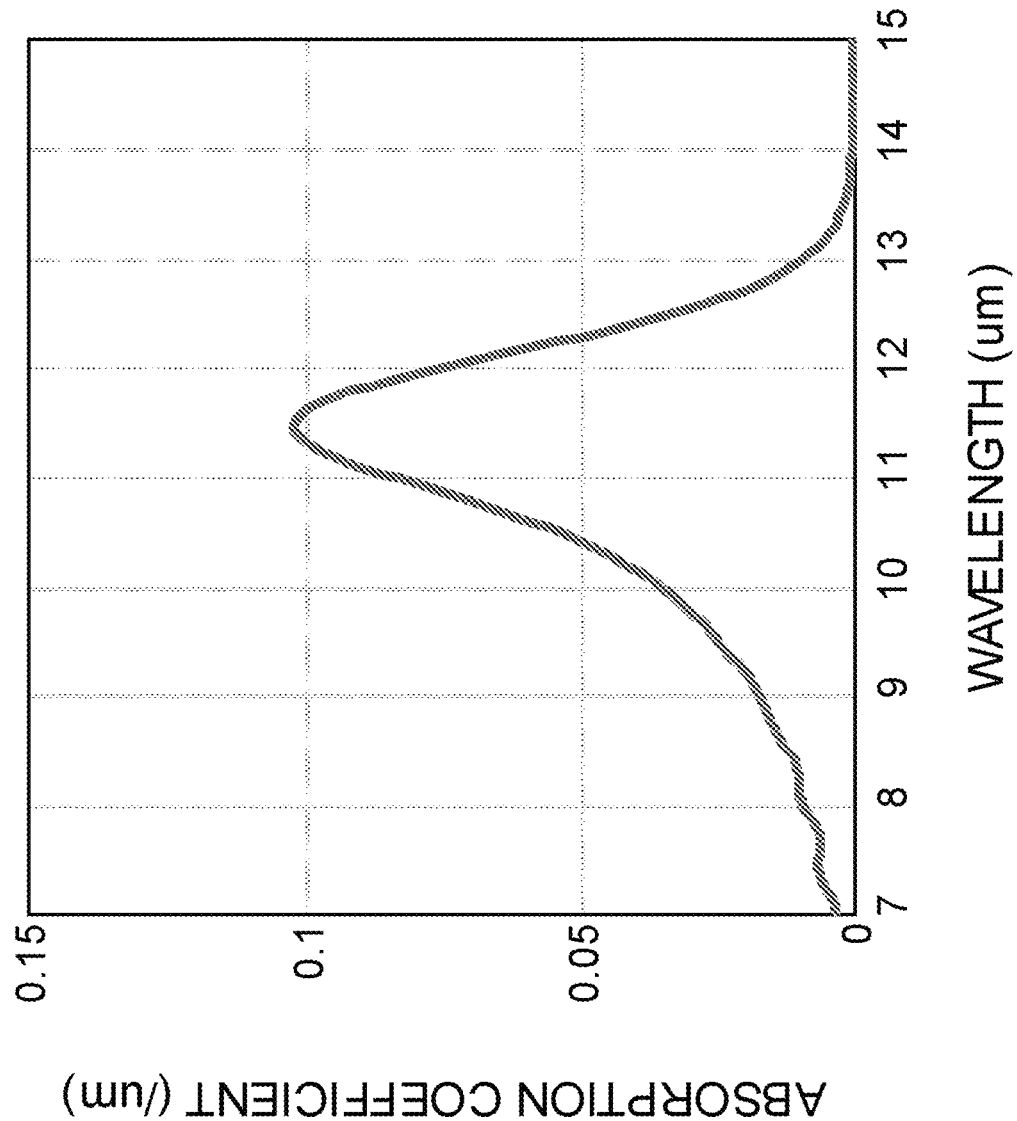
FIG. 20 graphically illustrates the calculated α of focal plane array (FPA) #1.
Figure 21:
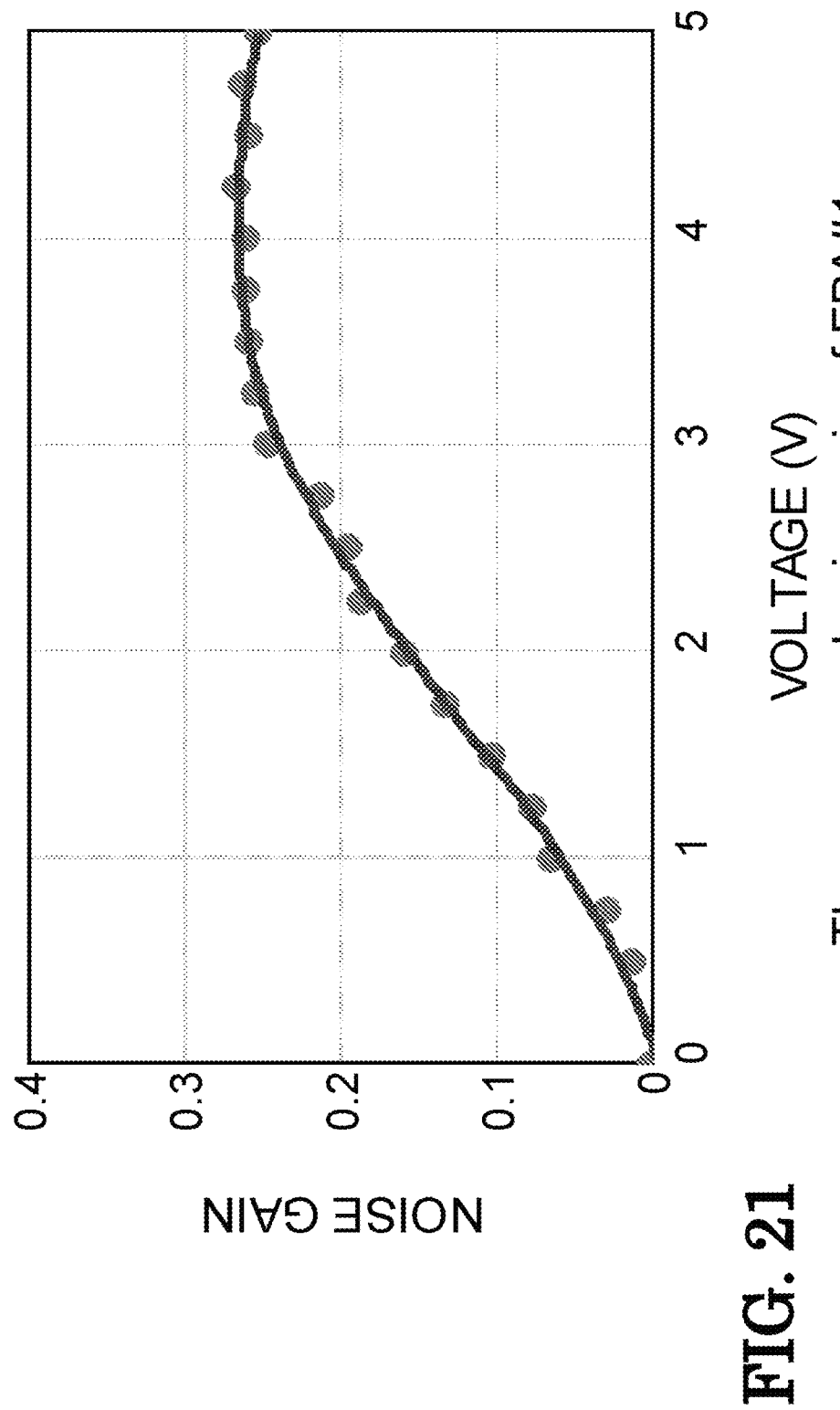
FIG. 21 graphically illustrates the measured noise gain of FPA#1.

The QWIP material is made of 60 periods of 700 Å Al$_{0.166}$Ga$_{0.834}$As and 60 Å GaAs. To avoid dopant migration during the material growth, only the center part of the well is doped such that the equivalent $N_D$ is 0.62×10$^{18}$ cm$^{-3}$ in the well. The active QW material is sandwiched between two GaAs contact layers. The top layer is 3 µm thick and the bottom layer is 3.4 µm thick. Applying $$\alpha(\lambda) = \sum_n \frac{N_D W}{L} \frac{\pi e^2 \eta}{2\sqrt{\varepsilon_h}\,\varepsilon_0 m \ast c} f_n \rho_n(\lambda),$$

to this material, the α spectrum is shown in FIG. 20 (which illustrates the calculated α of FPA#1) with a peak value of 0.1 µm$^{-1}$. Meanwhile, the noise gain g is measured from a test detector fabricated on the same wafer and is shown in FIG. 21, which illustrates the measured noise gain of FPA#1. The material is fabricated into 640×512 FPAs with Indigo 9803 readout circuit. The detector substrate is completely removed and there is no AR-coating.

Figure 22B:
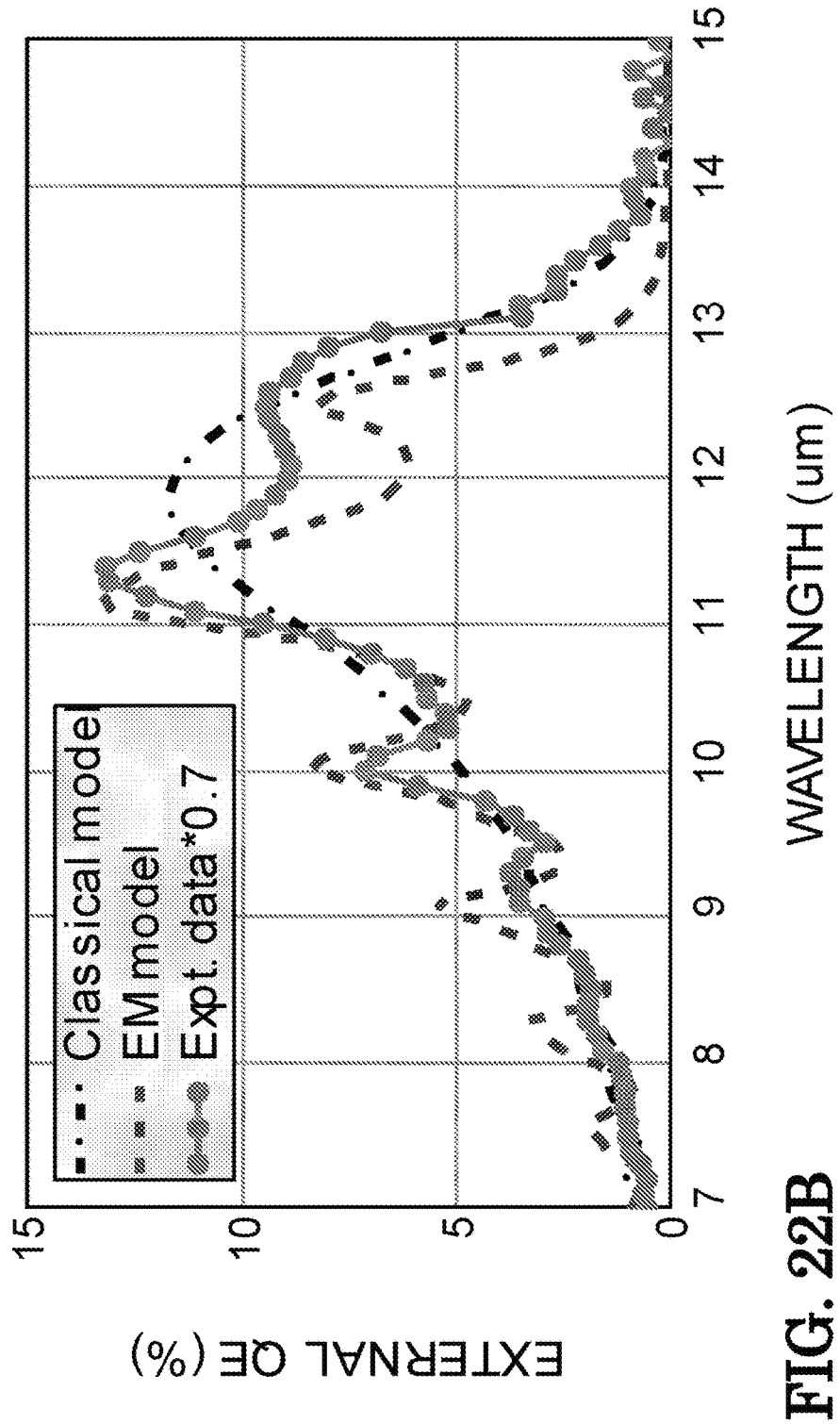
FIG. 22B graphically illustrates the calculated and measured external QE of PR-QWIP FPA#1 multiplied by 0.7 to fit the predicted QE.

The conversion efficiency CE spectrum (=ηg) was measured at a bias of 2.1 V. From FIG. 21, g will then be 0.165. The FPA QE spectrum can thus be converted from the CE spectrum and is displayed in FIG. 22A. The QE spectrum is oscillatory as expected, in contrast to the smooth spectrum shown by the test detector under 45° edge coupling. The experimental peak values for external CE and QE are 3.1% and 18.8%, respectively. The internal QE accounting for both pixel fill factor $f_p$ and substrate transmission $t_s$ will then be 32.6%. FIG. 22A illustrates the calculated and measured external QE of PR-QWIP FPA#1. In FIG. 22A, the predicted QE for both the classical and EM models are shown without adjusting any parameters. The EM model correctly accounts for the positions of the experimental peaks but underestimated the QE magnitude. If the experimental data is multiplied by a factor of 0.7 as shown in FIG. 22B, satisfactory agreement between their line shapes can be obtained. The weaker peaks from the data can be due to pixel nonuniformity, which tends to average out the peaks and makes the spectrum resemble the classical line shape.

PR-QWIP FPA#2

Figure 23:
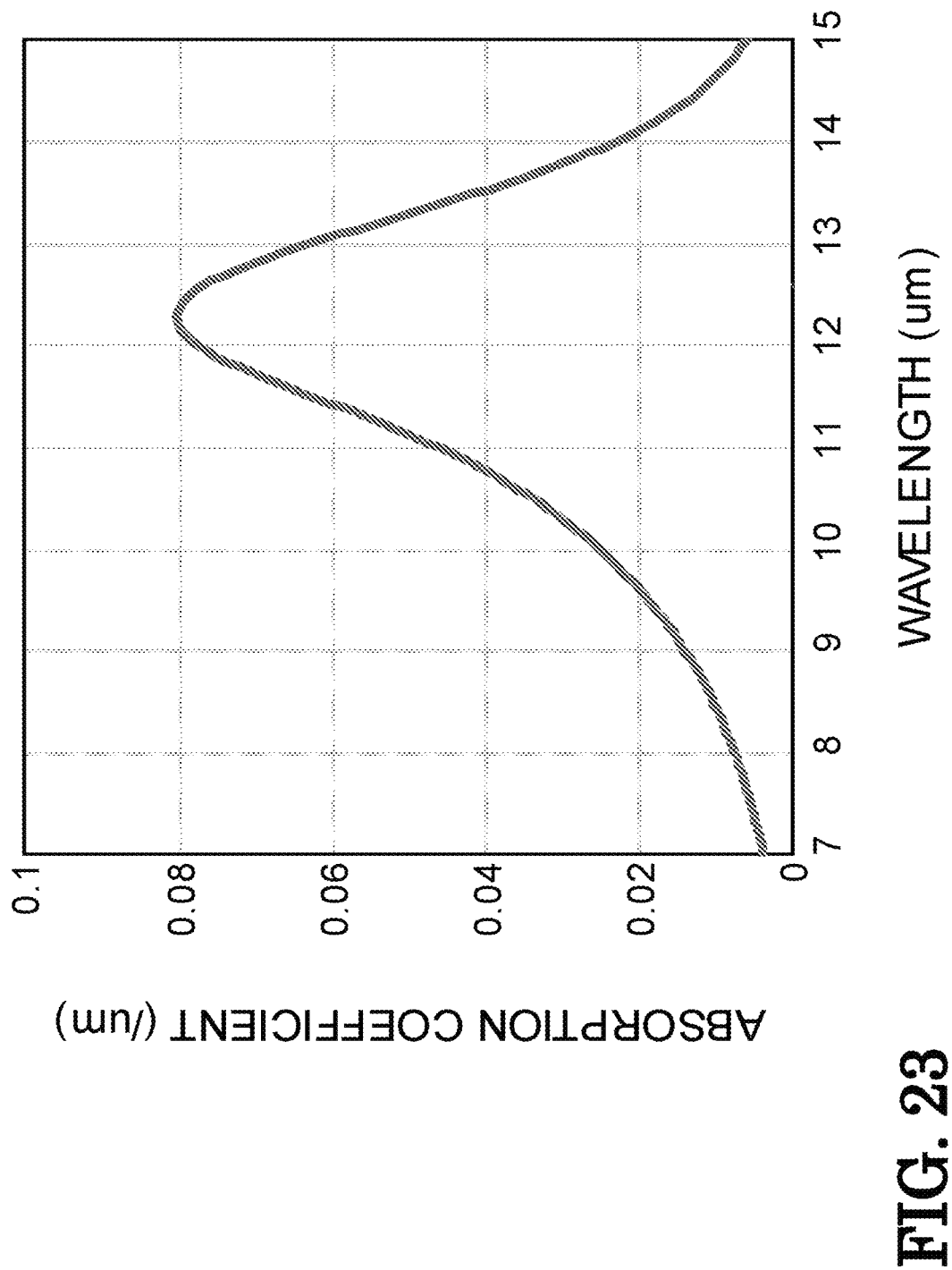
FIG. 23 graphically illustrates the calculated α of focal plane array (FPA) #2.
Figure 25B:
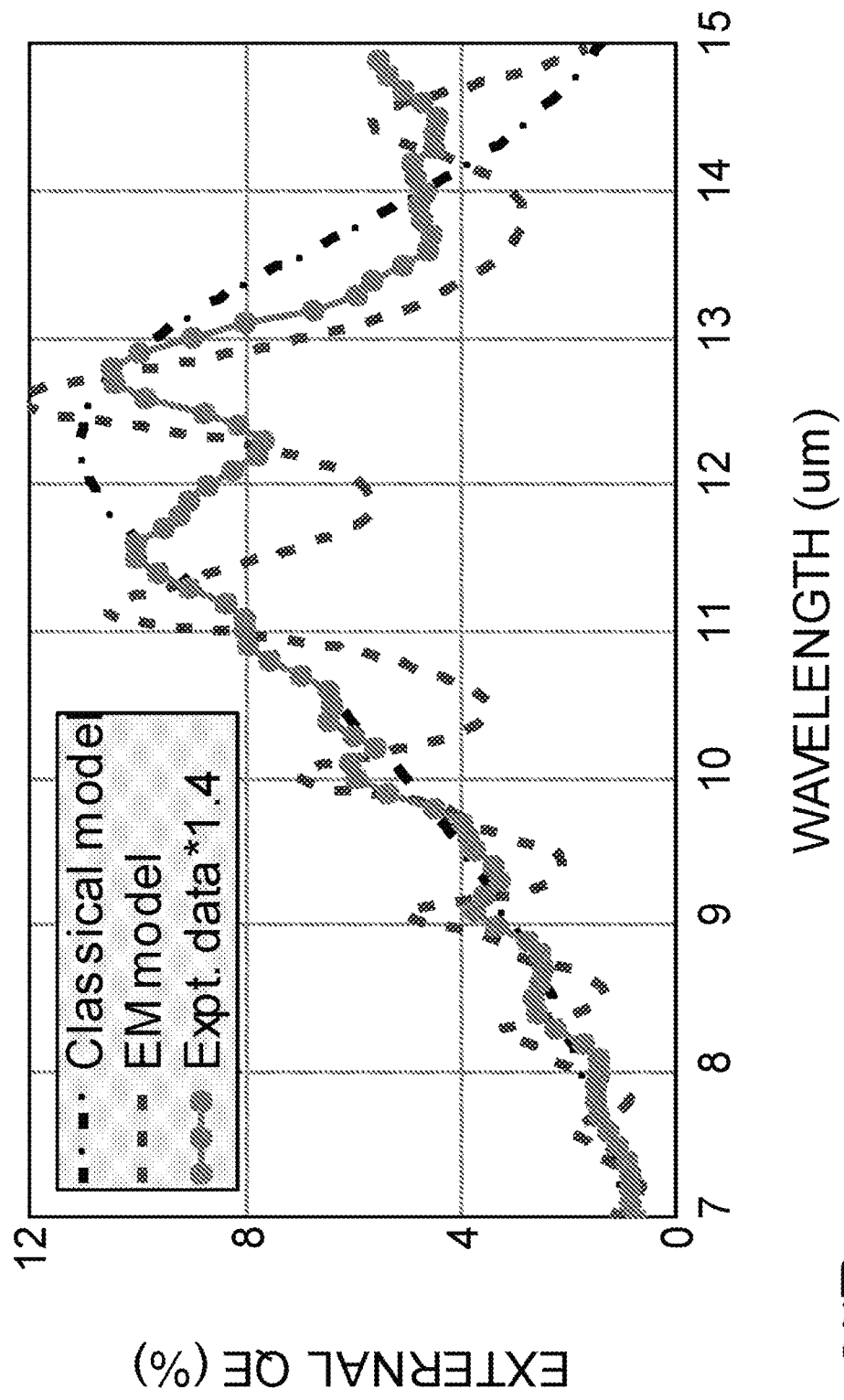
FIG. 25B graphically illustrates the calculated and measured external QE of PR-QWIP FPA#2 multiplied by 1.4 to fit the predicted QE.

FPA#2 has the same material structure as that of FPA#1 but the wafer was grown at a different time. The observed material wavelength was shifted to a longer wavelength, with which a different barrier composition was assumed. The calculated α is shown in FIG. 23 and the measured gain is shown in FIG. 24. Measured at 2.75 V, the peak CE is 2.2%. Together with g=0.29, the deduced external QE is 7.6%, and thus the internal QE is 13.2%. FIG. 25(A) shows the theory and experiment; i.e., the calculated and measured external QE of PR-QWIP FPA#2. In this case, the theory overestimated the measured QE by a factor of 1.4 as indicated in FIG. 25(B); wherein the measured QE is multiplied by 1.4 to fit the predicted QE. The experimental spectrum also shows less pronounced peaks, which may indicate a less uniform array.

PR-QWIP FPA#3

Figure 26:
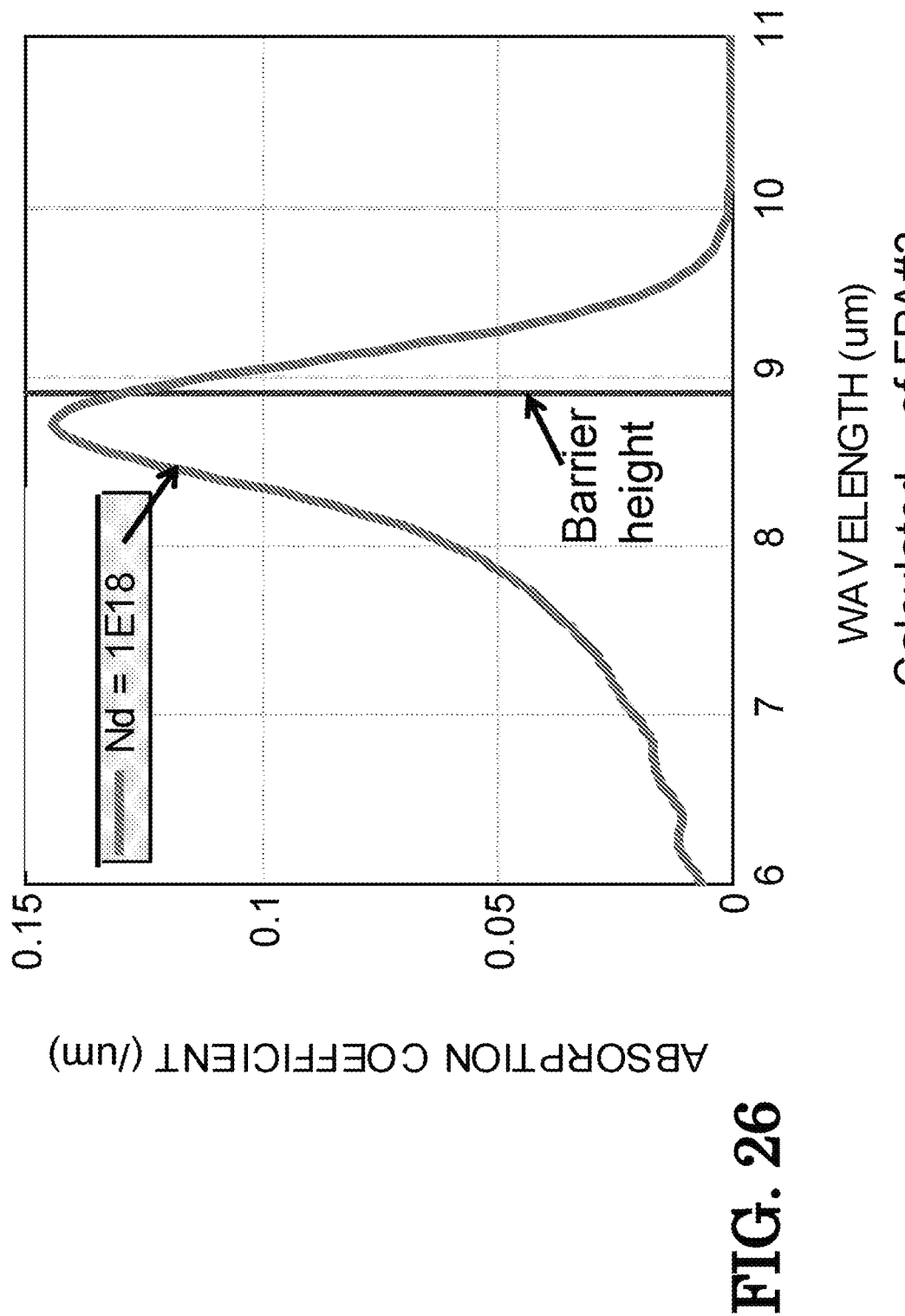
FIG. 26 graphically illustrates the calculated α of FPA#3.
Figure 27:
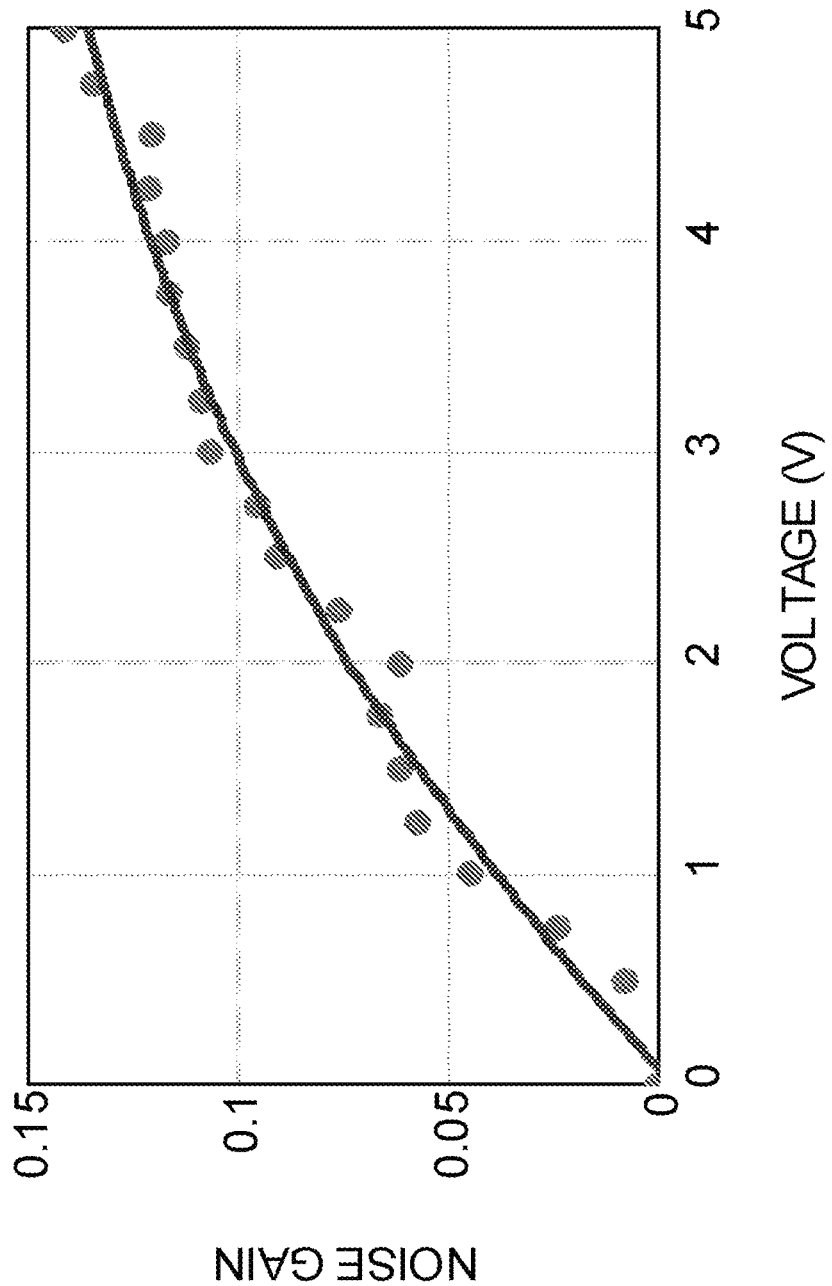
FIG. 27 graphically illustrates the measured noise gain of FPA#3.
Figure 28B:
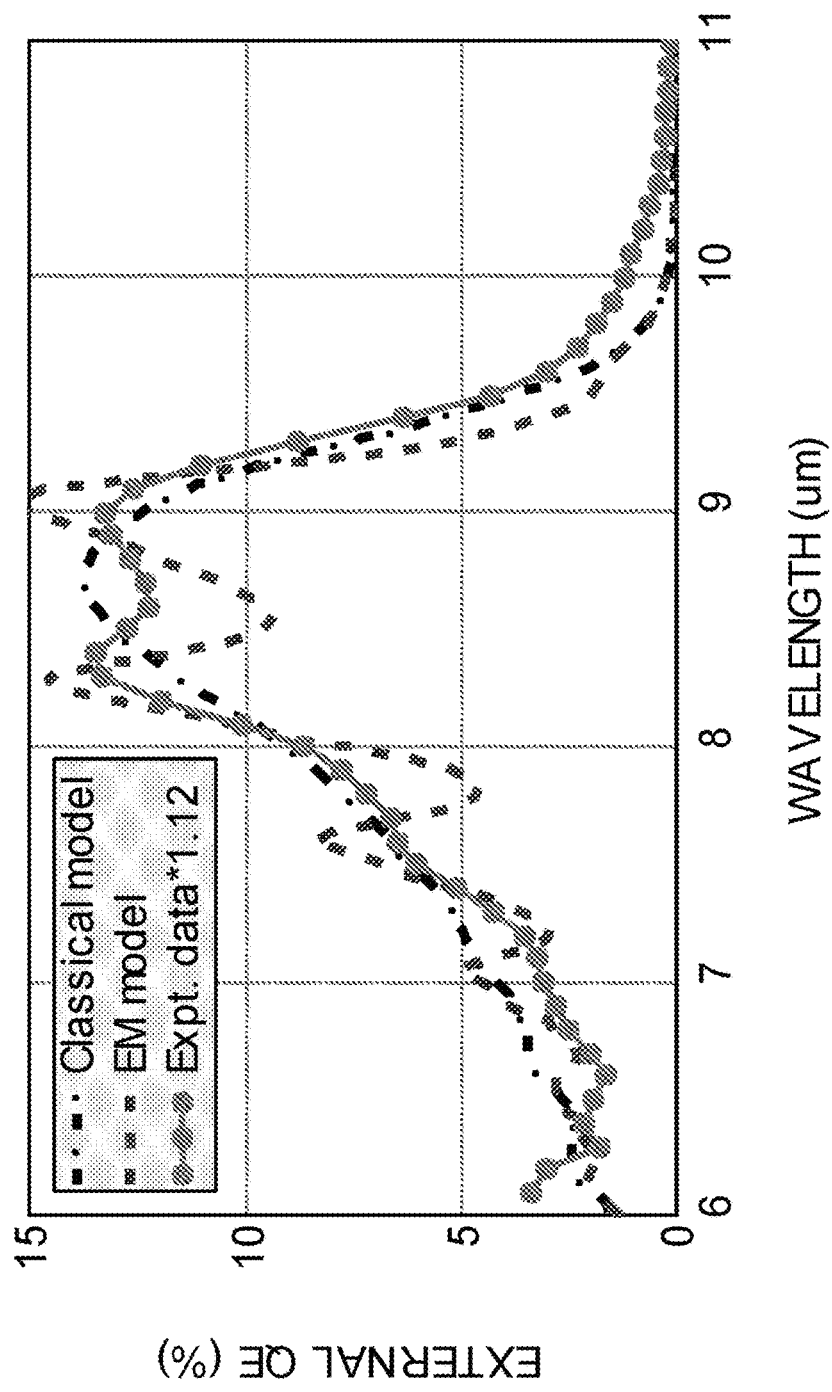
FIG. 28B illustrates the measured QE (of FIG. 28A) multiplied by 1.12 to fit the predicted QE.

FPA#3 is made of 60 periods of 700 Å $Al_{0.23}Ga_{0.73}As$ and 48 Å GaAs, and is doped to 1×10$^{18}$ cm$^{-3}$. The calculated α (of FPA#3) is shown in FIG. 26 with a peak value of ~0.15 cm$^{-1}$. The measured gain (of FPA#3) is shown in FIG. 27. Measured at 2.69 V, the peak CE is 1.1%. Together with g=0.092, the deduced external QE is 12.0% and the internal QE is 20.8%. FIG. 28A shows calculated and measured external QE of PR-QWIP FPA#3. In this case, the QE magnitude between theory and experiment is consistent. One may adjust the data slightly higher (in FIG. 28B, the measured QE is multiplied by 1.12 to fit the predicted QE) to match the theory at the shorter wavelengths as in FIG. 28B. The discrepancy in this case is less than 10%. The oscillatory peaks are again predicted in the correct positions.

GR-QWIP FPA

Figure 31A:
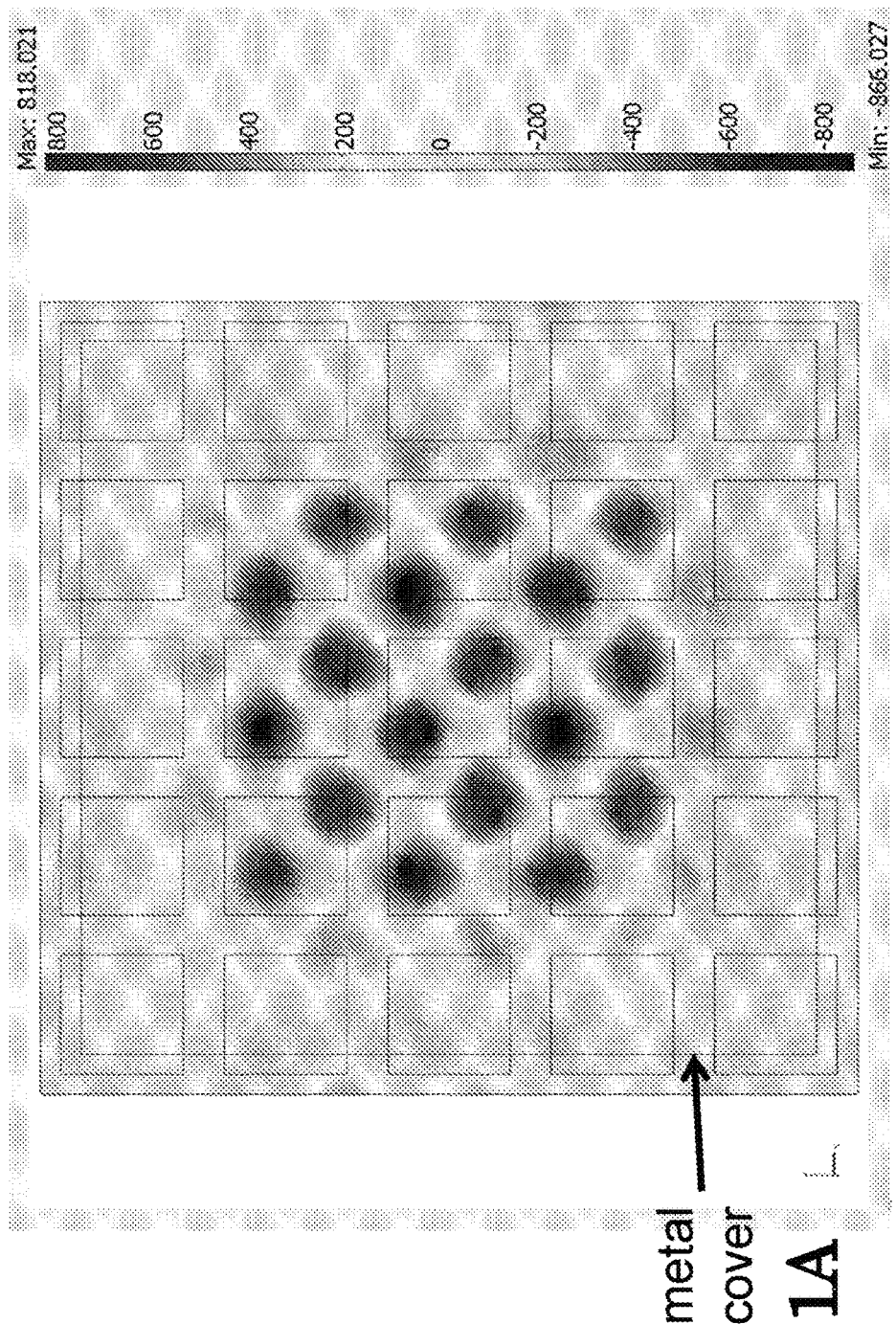
FIG. 31A illustrates the top view of the modeled grating structure and the $E_z$ distribution on the center plane of the active layer at $\lambda$=10.6 μm.

The example of a GR-QWIP is a cross-grating of waffle type. It is fabricated on a material consisting of 20 periods of 700-Å $Al_{0.168}Ga_{0.832}As$ and 55-Å GaAs QWs, a 1.5-µm top contact layer, and a 1.5-µm common contact layer. The top contact layer is also used for the grating structure. FIG. 31A shows the grating structure that is modeled closely to the actual experimental structure in FIG. 31B. It has a pixel size of 20 µm, a grating period of 4 µm, and a grid line width of 1 µm. The grating height is 0.85 µm, and the size of the gold cover on top of the grating is 18×18 µm$^2$.

Figure 29:
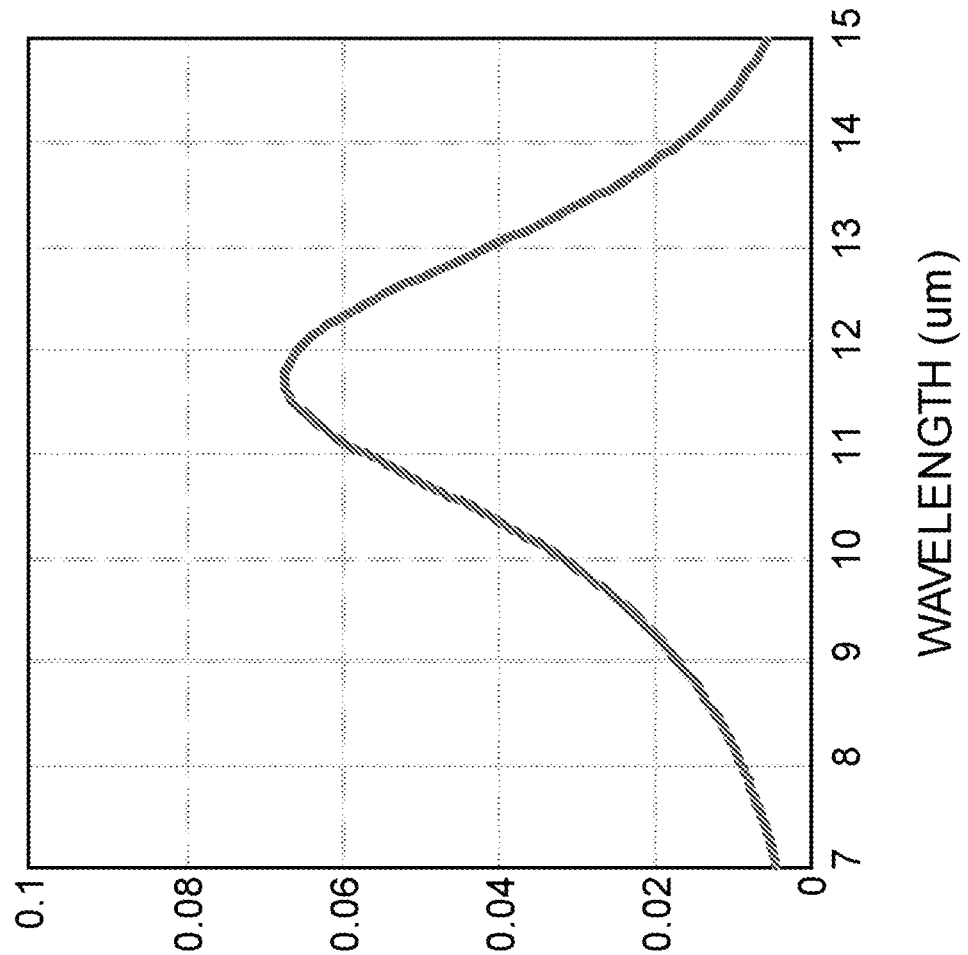
FIG. 29 illustrates the calculated α of the GR-QWIP FPA.

FIG. 29 illustrates the calculated α of the GR-QWIP FPA. FIG. 30 illustrates the projected gain and the measured CE of the GR-QWIP FPA.

Figure 31C:
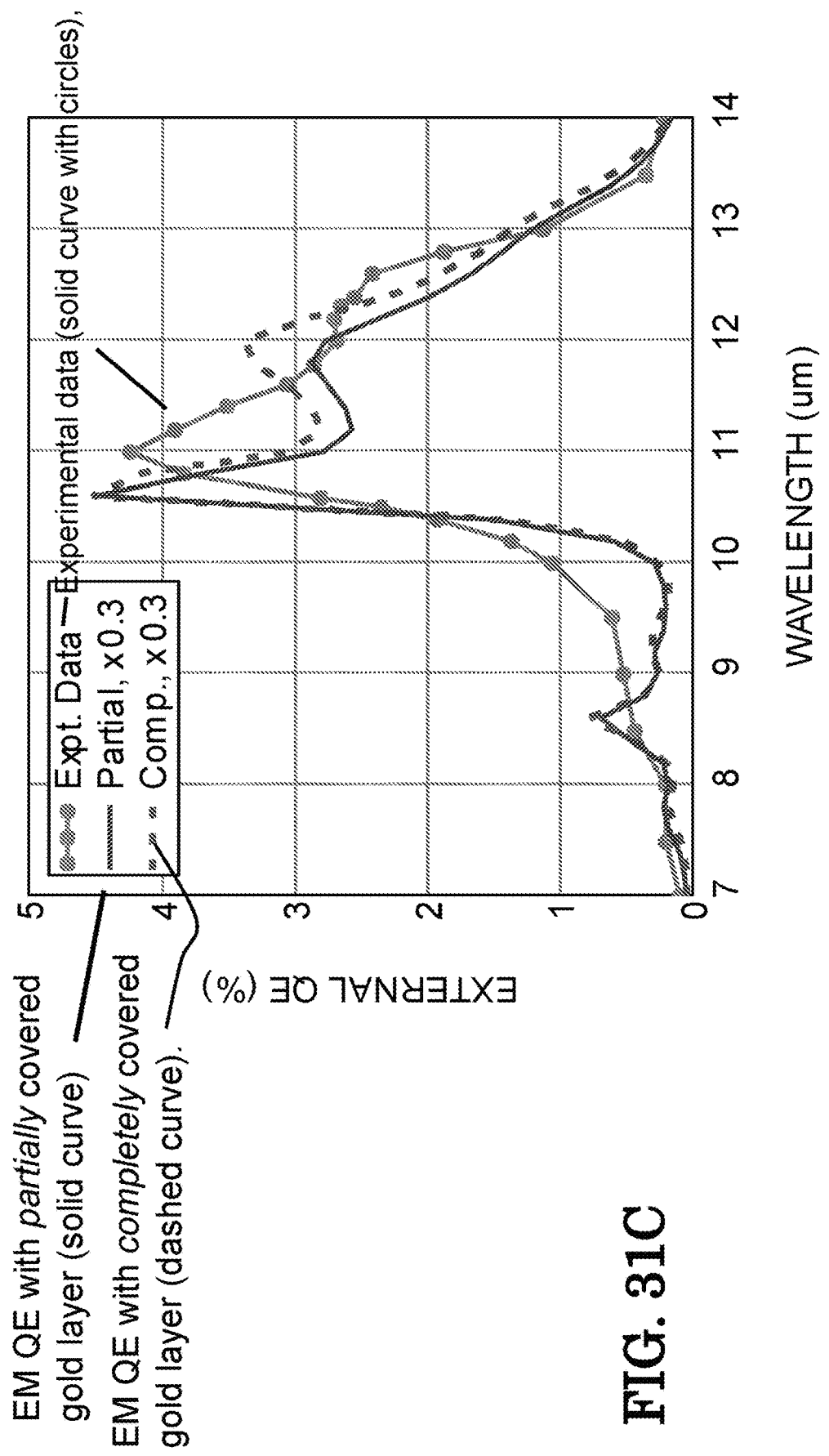
FIG. 31C illustrates the experimental data (solid curve with circles), EM QE with partially covered gold layer (solid curve) and EM QE with completely covered gold layer (dashed curve). The theoretical QE is scaled by a factor of 0.3 to fit the experiment.

At 0.78 V (equivalent to 2.34 V for 60 QWs), the peak CE is 2.41%. Together with g=0.56, the deduced external QE is 4.31% and the internal QE is 7.5%. (Note that the QE of a grating cannot be improved by the usual AR-coating as mentioned before.) FIG. 31C shows the theory and experiment. The theory correctly predicts the three peaks located near 8.5, 11.0, and 12.2 µm. The model with a partial Au cover explains the experimental line shape better than that with a complete cover, showing that a small detail in the grating design can affect QE appreciably. Even though the present model is able to explain the main feature in the spectrum, the experimental QE is smaller than the modeled QE by a factor of 3.3. This discrepancy is attributed to the fact that the actual grating shown in FIG. 31B has a different sidewall profile. Instead of having vertical sidewalls as modeled, the grid lines have a rounded profile and are depressed in regions away from the intersections. These features diminish the overall size of the grid and, thus, reduce its effectiveness.

Comparison Summary

Figure 32:
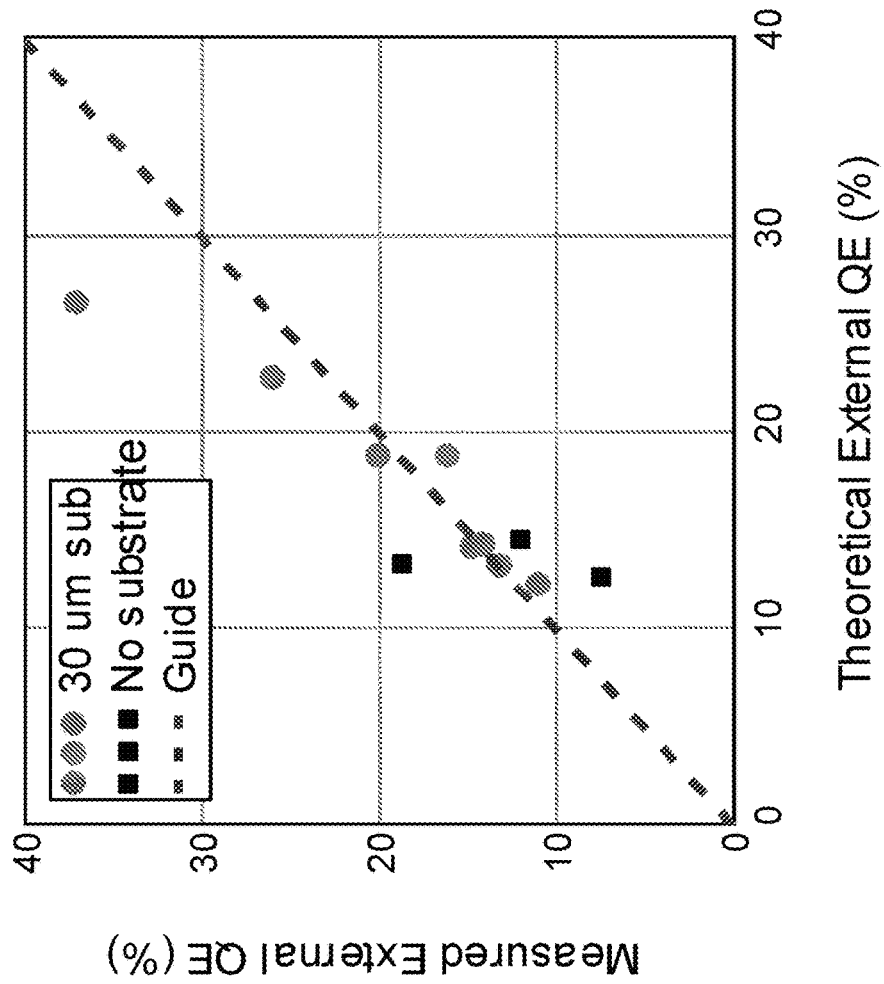
FIG. 32 illustrates a plot of predicted QE versus measured QE for thinned PR-QWIPs (squares) and thick substrate PR-QWIPs (circles).

FIG. 32 summarizes the results of QE comparisons as well as other PR-QWIP FPAs that fabricated with thick substrates, where the classical model applies. Overall, there is general agreement between theory and experiment. In this plot, the ones that have higher QE are those having larger number of QWs (e.g. 108 QWs), higher doping, narrower linewidth, and AR-coating.

FIG. 32 illustrates a plot of predicted QE versus measured QE for thinned PR-QWIPs (squares), thick substrate PR-QWIPs (circles) and GR-QWIPs (diamonds). Several 1-megapixel PY-QWIP FPAs have been fabricated. These FPAs may be glued to thick Si wafers by epoxy for mechanical support, and the Si substrate has an AR-coating deposited. EM modeling was performed for this detector configuration but did not account for the infrared absorption spectrum of the glue. FIG. 33A shows the theoretical models and the experimental QE spectrum (in arbitrary units) of one of the FPAs. The EM model reproduces some of the peaks observed in the FPA. The strong experimental dip at 8.0 µm is known to be due to the strong epoxy absorption line at this wavelength. Although the absolute QE of this FPA has not determined, a similar FPA has shown a QE of ~24%, which is consistent with the model and supports the higher theoretical QE for the PY-QWIP geometry. Therefore, the present EM model is also applicable to the PY-QWIP structure. FIG. 33B shows the infrared image taken by the 1-megapixel FPA.

Resonator QWIPs

In the foregoing, the EM model for various detector geometries to within experimental uncertainties was shown, along with a showing of the consistency of the EM model and the classical model whenever the classical model is available. Accordingly, a reliable approach to calculate QE of a detector with any material structure and pixel geometry has been described. This powerful capability is useful for detector applications. One will be able to design all the detector optical properties, without any empirical parameters, before the production begins. At the same time, the EM modeling is also extremely useful in developing a better optical coupling design. It not only provides an instant answer for each particular design but also calculates the corresponding EM field distributions. The field distribution can lead to important insights into the underlying light coupling mechanisms as in the grating coupling case. By treating each pixel as a resonator, one may be able to change the resonator's size and shape so that a different set of cavity eigen modes is created. The excitation of these eigen modes (and their superpositions if they are degenerate) by the incident light will determine the detector QE spectrum.

Figure 36A:
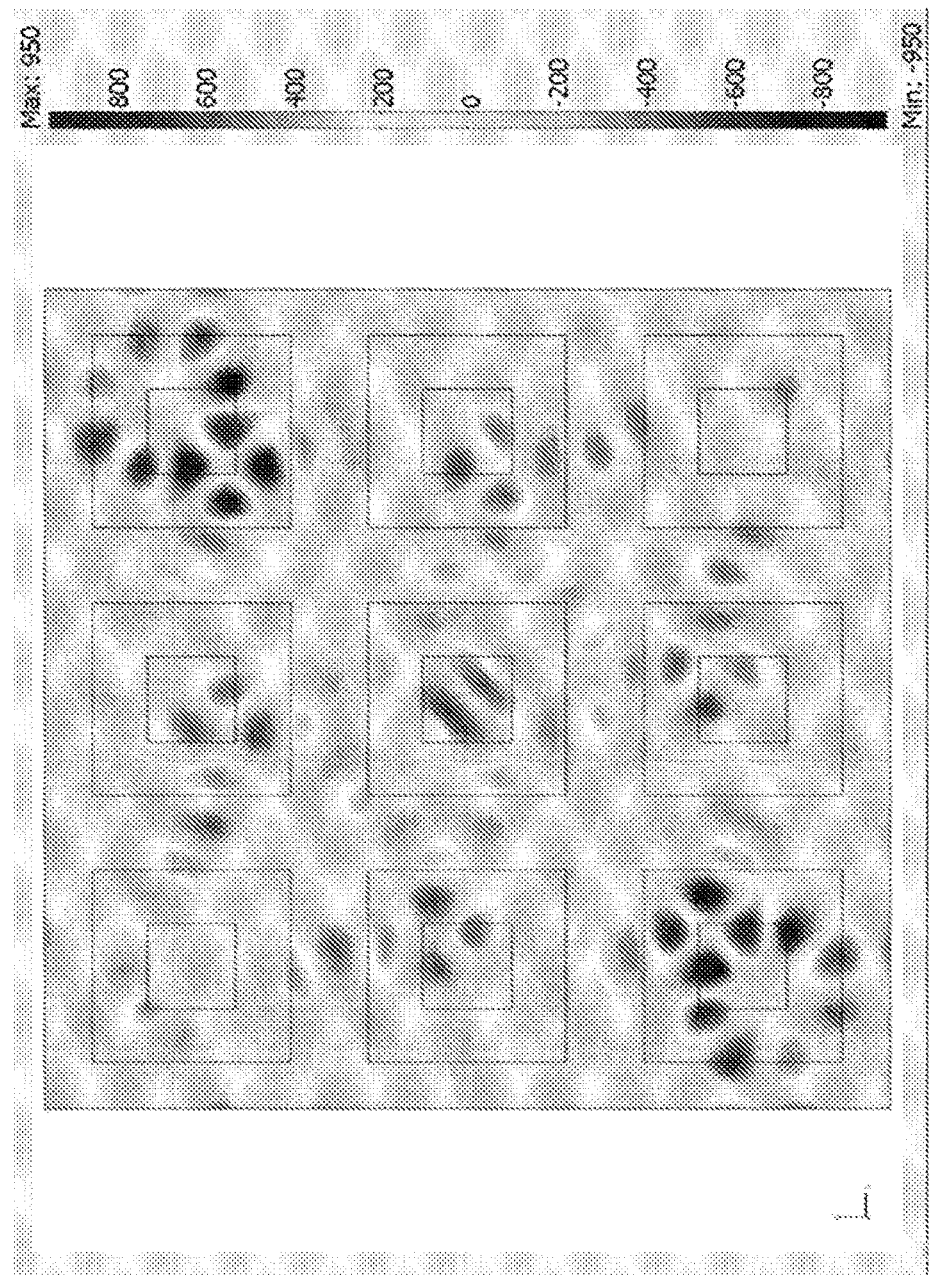
FIG. 36A illustrates the $E_z$ distribution at the center plane of the active layer at $\lambda$=7.0 μm.
Figure 36B:
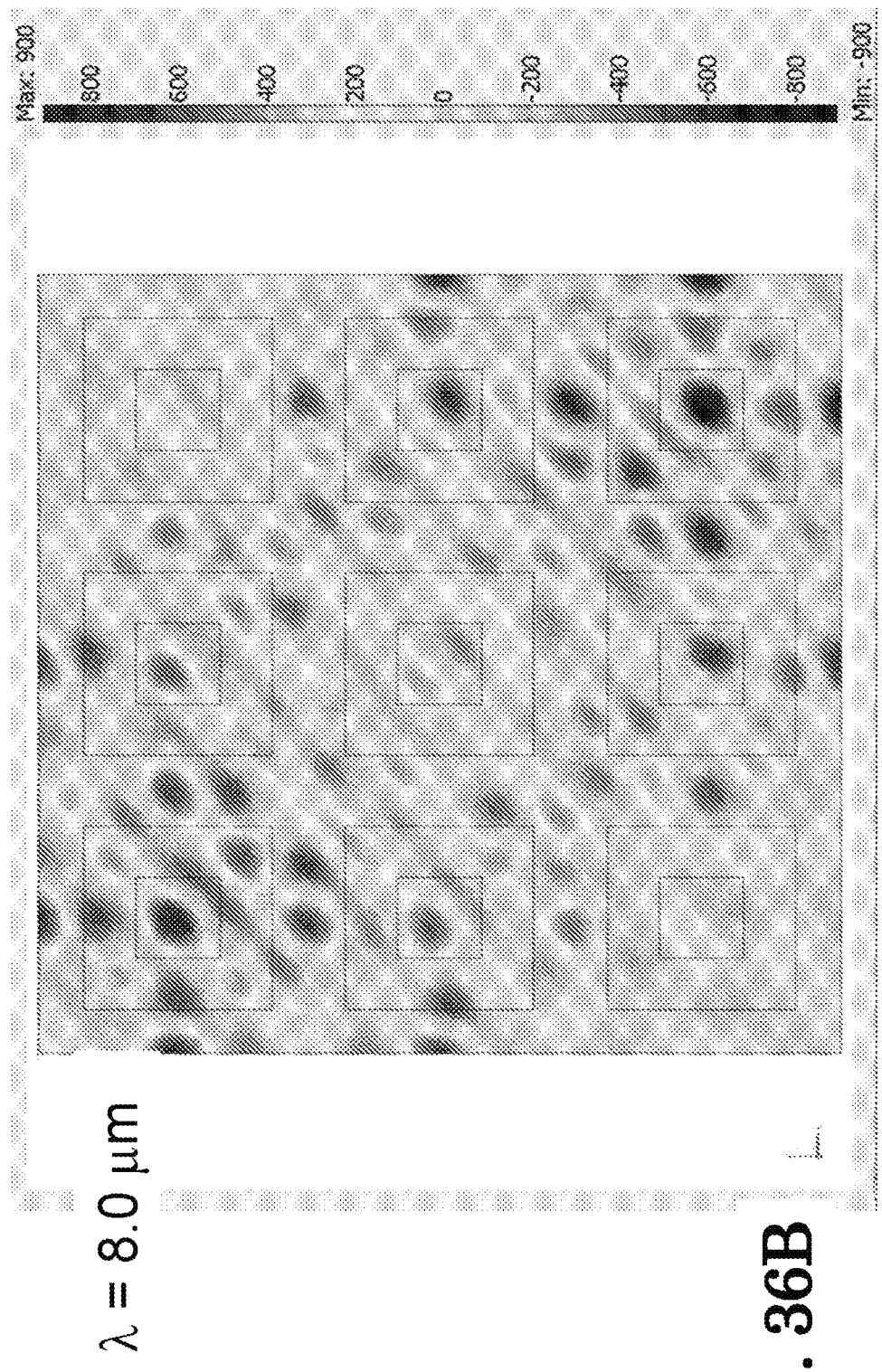
FIG. 36B illustrates the $E_z$ distribution at the center plane of the active layer at $\lambda$=8.0 μm.
Figure 36D:
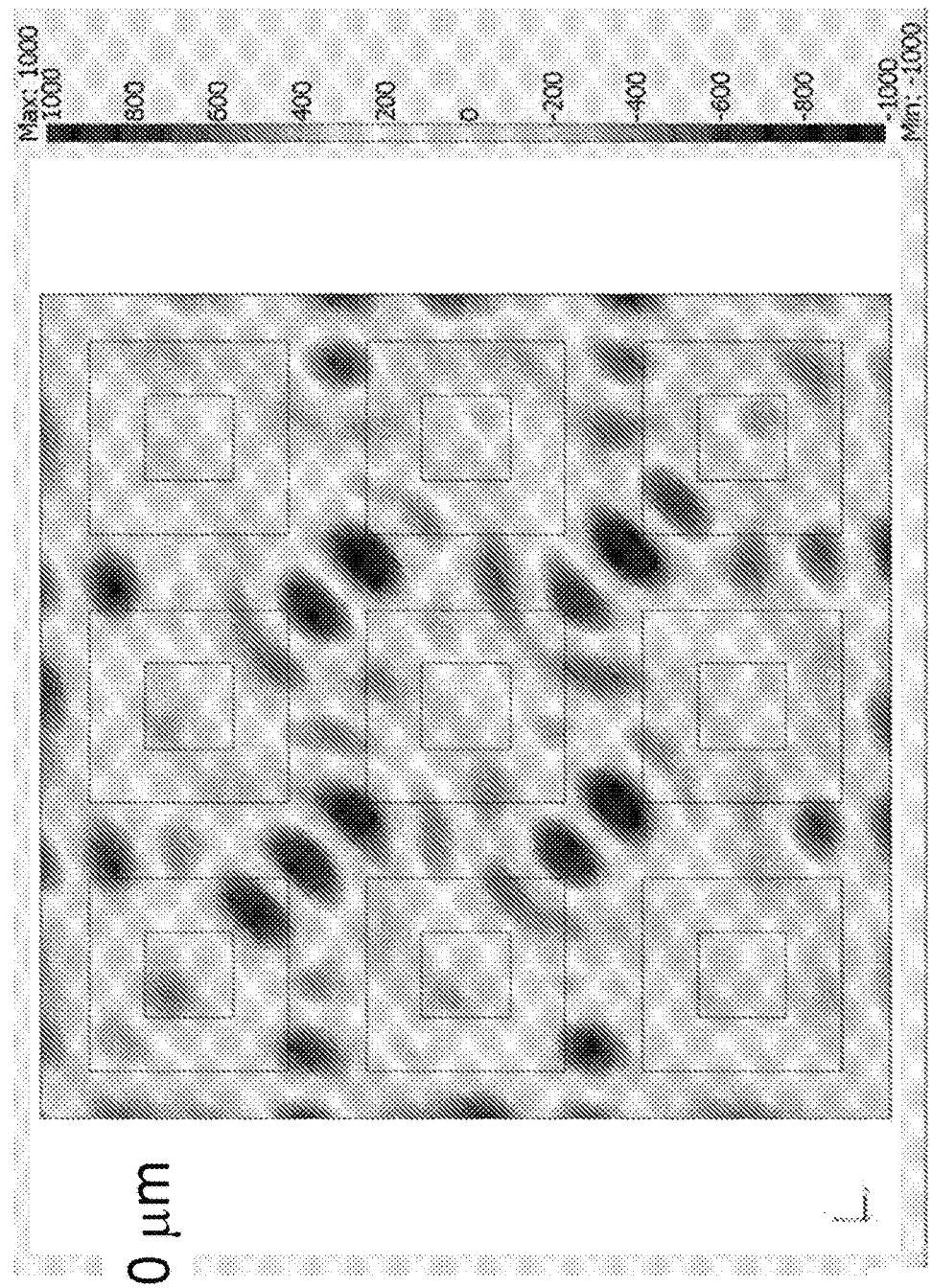
FIG. 36D illustrates the $E_z$ distribution at the center plane of the active layer at $\lambda$=10.0 μm.

For example, to yield a broadband resonator, one approach is to construct an irregular resonator, with which a complex excitation spectrum can be generated. One can also design a narrow band detector using a more regularly shaped resonator. In such a case, the focus may be on designing a strong resonance in a particular wavelength. FIG. 34 shows an example of the resonator-QWIP design, which will be referred as the R-QWIP. Specifically, FIG. 36 illustrates the $E_z$ distribution at the center plane of the QWIP active layer at incident wavelengths of 7.0, 8.0, 8.8 and 10.0 μm. The incident light is polarized along the diagonal of the pixel. The R-QWIP may contain 9 square rings with inner size of 2.4 μm×2.4 μm and outer size of 5.4 μm×5.4 μm and 0.62 μm in height that are made of GaAs. These ring resonators are fabricated on top of the 1.0 μm thick QWIP material with another 0.8 μm common contact layer. Their centers may be 7.5 μm apart. All the top surfaces are covered with metal contact. The pixel size may be, for example, 23 μm×23 μm. The calculated spectrum has a large QE of 57% centered at 8.8 μm with a 0.6 μm bandwidth as shown in FIG. 35. These coupling characteristics are highly desirable for long wavelength detectors having a cutoff between 9-10 μm. Since this R-QWIP only needs a 1.0 μm-thick active material, it will have the same large gain as the typical grating QWIPs, but now with 10 times higher QE. At the same time, it may be operated at a bias lower than the C-QWIPs and thus more compatible with the usual readout circuits.

Figure 37:
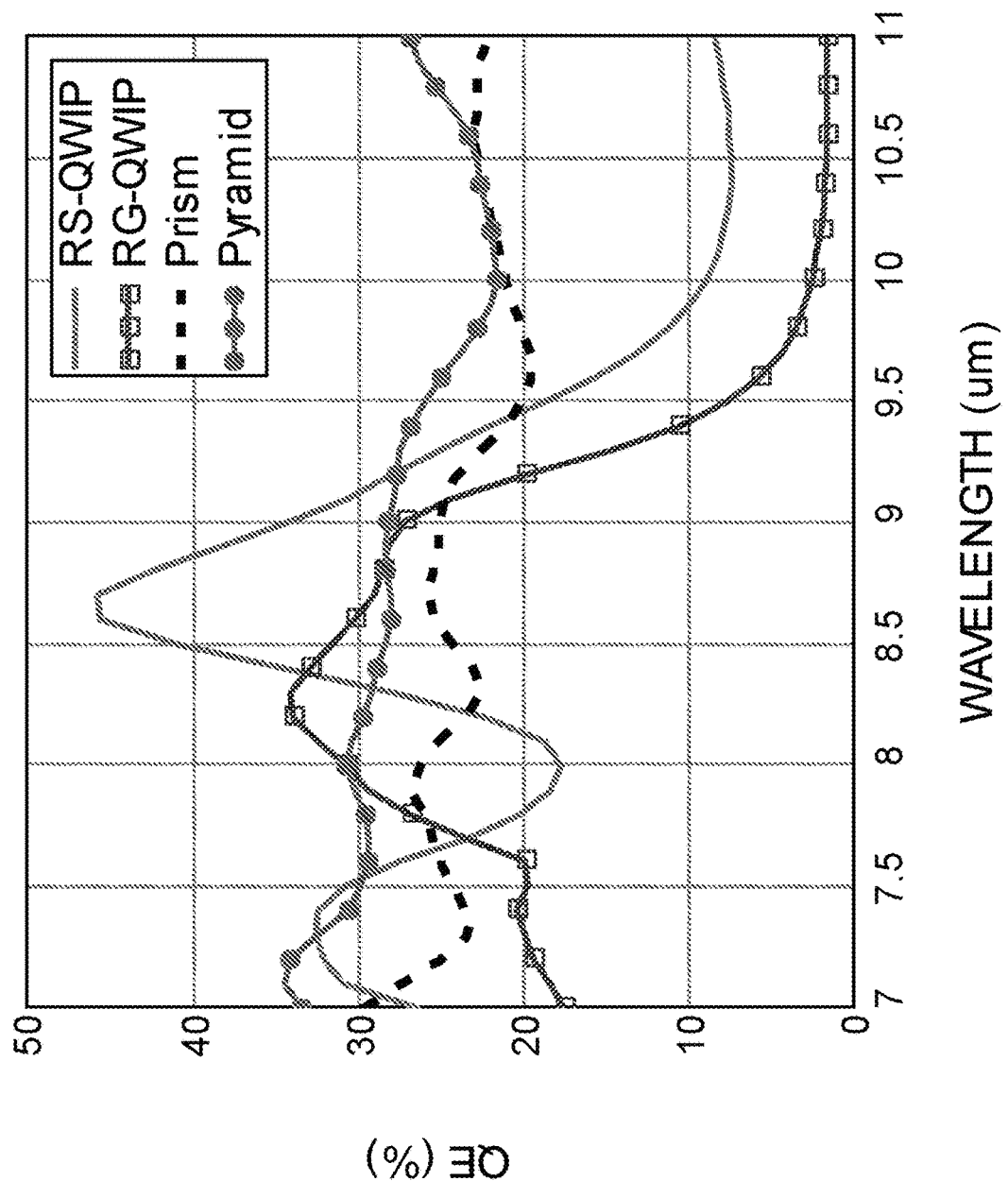
FIG. 37 illustrates the QE of different optimized detectors for 8-9.2 μm detection in a 12-μm pixel pitch array. The α value is assumed to be constant at 0.20 $\mu m^{-1}$.

To provide another example of optimized detector designs, the objective is to optimize the detector design for an array with, for example, 12-μm pixel pitch, and the detection may be in the range of 8-9.2 μm. This pitch may be amenable for very high resolution imaging. The value of α is assumed to be constant at 0.20 μm$^{-1}$. For the RG-QWIP design, the pixel size may be, for example, 10×10 μm$^2$. In order to yield the first order diffraction peak at ~8.7 μm, a grating period d=2.7 μm may be first selected. With p=10 μm, a 4×4 array of posts can be placed on top of the pixel. Other detector parameters, such as h=0.62 μm, $t_a$=1.0 μm, and $t_c$=0.8 μm are adjusted in the EM model to yield the largest QE possible within the detection range. The QE spectrum and its magnitude may be dependent on all of these parameters at the 0.02 μm level. A preferred result is shown in FIG. 37. With the proper choices of h, $t_a$, and $t_c$, a relatively constant QE with a peak value of 34% at 8.3 μm can be obtained in the detection range. This level of QE is similar to that in FIG. 18 despite the grating size is drastically reduced from 23 to 10 μm. This example shows the importance of proper grating design. Based on the same active layer thickness, the QE can be further increased by designing a more efficient resonant structure. For example, if the square post pattern of the grating is replaced by a single square ring with the dimension the same as that of FIG. 34 except h=0.54 μm instead of 0.62 μm, the QE can be increased to 46% at 8.7 μm as shown in FIG. 37. This example shows that EM modeling can open up to new detector designs.

A quantitative EM model in calculating QE of a QWIP pixel has been described in the foregoing, which provides an unambiguous answer to any detector geometry and thus it is highly versatile its accuracy and reliability, which has been verified through experiments and analytical classical solutions. Using this approach, one can now be able to ascertain the detector optical performance before construction. This approach not only yields the QE value but also gives the corresponding EM field distribution. This distribution can be used to determine the underlying coupling mechanism and thus is able to point to more efficient structures. The R-QWIP designed in this work is one example that may have significant advantages over the existing designs. In view of the fact that the R-QWIPs are designed with a computer using a few minutes of run time while the existing detectors are developed over the last two decades mostly through empirical means, the speed of achieving a better detector should be greatly accelerated in the future. It should be pointed out that preferred embodiment designed R-QWIPs are only the first of the many possibilities that been investigated, and its structural parameter space has not been systematically explored. The current theoretical prediction should therefore be considered as the starting point and further improvement is expected. With the present approach, one can also incorporate other more complicated optical structures such as photonic crystals, plasmonic structures, nanomaterials, and meta-materials for QE enhancement. The EM model only requires the input of the appropriate optical constants of the constituent materials and the geometrical design. There are no obstacles in incorporating these and other optical effects into the detector modeling. In addition to advancing the infrared technology, the experimental effort on various optical structures will also shed light on these frontier optical effects and hence contributes to the advancement of basic sciences. The present research is by no means only relevant to QWIP research. By evaluating the total E field integral in Eqn. (1) instead of the $E_z$ integral, one can apply the same formulism to detectors with isotropic absorption.

$$\eta = \frac{1}{P_0} \int_V dI(\vec{r}),$$

$$= \frac{1}{P_0} \int_V \alpha I(\vec{r}) d^3 r,$$

$$= \frac{\alpha}{A \frac{c\varepsilon_0}{2} E_0^2} \int_V \frac{nc\varepsilon_0}{2} |E_z(\vec{r})|^2 d^3 r,$$

$$= \frac{n\alpha}{A E_0^2} \int_V |E_z(\vec{r})|^2 d^3 r.$$

Various resonating structures can then be designed to yield a large QE on thinner detector materials. These thinner materials will benefit all detector technologies especially for those with critical growth thicknesses and those with short carrier recombination lifetimes. To this end, the present advance in EM modeling may open a new chapter not only in the QWIP technology but also in other infrared technologies as well.

It is noted (from U.S. application Ser. No. 12/543,121) that epoxy may be used between the detector and the other wafer. In order that the epoxy not reduce the absorption, a gold layer is utilized to isolate the epoxy from the sidewalls. The thickness of the gold layer may be as thin as 30 Å and may be as thick as 0.1 micron or more. Increasing the thickness of the layer beyond 0.1 micron provides no noticeable effect. Preferably, the gold layer may have a thickness in the range of 500 Å to 1000 Å. When the gold layer is thin, R of the p-polarized light in FIG. 6E can be as low as 20%. A substantial amount of light in this case tunnels through the $MgF_2$/Au layer and into the epoxy layer despite the incident angle is still larger than the critical angle. The small R is a case for the frustrated internal reflection. On the other hand, when the dielectric thickness is small, R reaches a minimum at $\lambda=0.54$ μm due to the excitation of surface plasmon polaritons on the gold surfaces and is the case for the attenuated internal reflection. Between $0.7<\lambda<15$ μm, a small portion of the reflection is lost to ohmic heating in the metal. When $\lambda$ is near 16.2 μm, surface phonon polariton absorption along the dielectric/gold interface is responsible for the R minimum. This surface effect is evident from the increased absorption at a small dielectric thickness.

It is further noted that a one-corrugation-per-pixel geometry may be adopted to increase the active detector volume and incorporate a composite cover layer to preserve the large sidewall reflectivity, which results in a large detector quantum efficiency. Also, the detector material structure may be optimized such as the final state energy, the doping density, and the number of quantum well periods to improve the FPA operation under the existing readout electronics. As a result, high FPA sensitivity has been achieved, having characteristics in agreement with the detector model. Based on the foregoing model, a systematic analysis on the FPA performance was performed with a wide range of detector and system parameters. C-QWIP FPAs are capable of high speed imaging especially for those with longer cutoff wavelengths.

Possible uses for the present invention include a number of focal plane array (FPA) cameras containing, for example, 1024×1024 pixels with uses including detecting unmanned aerial vehicles, ballistic missile intercept observations, thermal imaging infrared sensors that requires broadband infrared detectors, night vision, infrared astronomy, natural resources exploration, industrial quality control, and medical imaging. C-QWIP coupling is also suitable for multi-color detection due to its wavelength-independent light coupling mechanism. As in the case of C-QWIPs, the resonantly enhanced QWIP FPAs may incorporate an epoxy backfill as it is necessary in mating the detector array to the supporting electronic readout circuits. FPAs can also be made into larger formats such as 4 megapixels or 16 megapixels and into two- or multi-color FPAs. Applications include night vision, all weather navigation, infrared astronomy, space exploration, earth resources exploration, environmental protection, geological survey, homeland security, industrial quality control, maintenance and diagnostics, and medical imaging etc. The preferred embodiments increase the quantum efficiency because of the resonance effect for improved performance.

Resonantly enhanced QWIP focal plane arrays (FPAs) are relatively inexpensive due to the standard batch processing, higher in sensitive due to efficient broadband light coupling, and higher in definition due to the smaller pixel size in pixel geometry.

Epoxy Backfill

As reported in U.S. application Ser. No. 12/543,121, the C-QWIP detector is subject to adverse effects from its surroundings. Any material that comes into contact with the detector surfaces will change the sidewall reflectivity and thus the quantum efficiency (QE). In order to achieve high performance irrespective to the production process, a designated cover layer for sidewall encapsulation was invented as described in U.S. application Ser. No. 12/543,121 and K. K. Choi, D. P. Forrai, D. W. Endres and J. Sun, IEEE J. Quant. Elect. vol. 45, No. 10, pp. 1255-1264 (2009), hereby incorporated by reference.

In the foregoing, electromagnetic field modeling was applied to calculate the external quantum efficiency of various QWIP pixel geometries with thinned substrates. It was found that for a 24×24×1.5 $micron^3$ cross grating-QWIP, the QE is peaked at 13.0, 11.0 and 8.4 microns, insensitive to the grating periods. These peaks are identified as the first three harmonic resonances associated with the pixel resonant cavity. For a material absorption coefficient of 0.15 $\mu m^{-1}$, the corresponding QEs are 10.2, 12.2, and 3.6%, respectively. For a regular prism-shaped corrugated-QWIP with a 25 micron pitch, the QE oscillates about its classical value of 24.5% within the calculated wavelength range from 3 to 15 microns. A peaked value of 32% occurred at 9.1 microns. For pyramidal C-QWIPs, the maximum QE is 42% and for cone-shaped C-QWIPs, it was 35%. In the presence of an anti-reflection coating, the oscillation amplitude diminishes and the average values generally rise to near the peaks of the oscillations. The modeling results were compared with the experimental data for grating-QWIP FPAs and prism-shaped C-QWIP FPAs, and satisfactory agreements were achieved for both. After verifying this EM approach, other detector geometries were explored and a new type of resonator-QWIPs (R-QWIPs) was found that can provide 30% QE at certain wavelengths. The R-QWIPs only need a 1.5 μm thick active material and therefore have the same advantages as other thin layer detectors. Combining the high QE of a resonator and the high gain of a thin material layer, the new R-QWIPs will provide a conversion efficiency far higher than conventional QWIP detectors. The principles of this resonator approach may also be used with other detector technologies.

Figure 38:
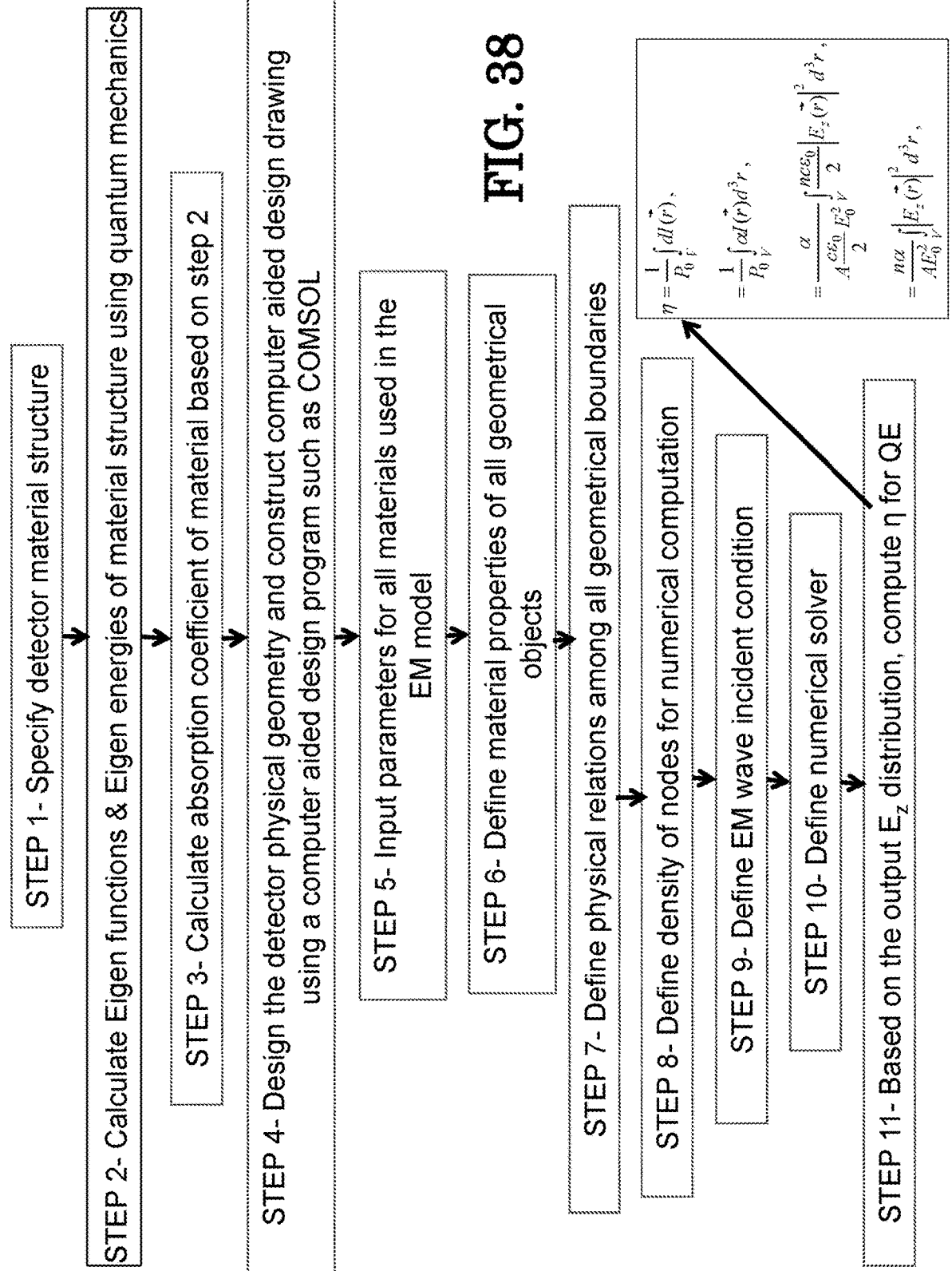
FIG. 38 is a flow chart of a preferred method for determining the efficiency of a photodetector configuration using a three-dimensional finite element electromagnetic computer simulation.

FIG. 38 is a flow chart of a preferred method for determining the efficiency of a photodetector configuration using a three-dimensional finite element electromagnetic computer simulation comprising the following eleven steps.

STEP 1—Specify the detector material structure.
STEP 2—Calculate Eigen functions & Eigen energies of material structure using quantum mechanics.
STEP 3—Calculate absorption coefficient of material based on step 2.
STEP 4—Design the detector physical geometry and construct computer aided design drawing using a computer aided design program such as COMSOL.
STEP 5—Input parameters for all materials used in the EM model.
STEP 6—Define material properties of all geometrical objects.
STEP 7—Define physical relations among all geometrical boundaries.
STEP 8—Define density of nodes for numerical computation.
STEP 9—Define EM wave incident condition.
STEP 10—Define numerical solver.
STEP 11—Based on the output $E_z$ distribution, compute Eq. (1) for QE.

FIG. 39 illustrates step 1 including the following table.

| | | |
|---|---|---|
| 30000 Å | GaAs | $1 \times 10^{18}$ cm$^{-3}$ |
| 50 Å | AlGaAs (x = 0.230) | undoped |
| 19 Å | GaAs | undoped |
| 24 Å | GaAs | $2 \times 10^{18}$ cm$^{-3}$ |
| 5 Å | GaAs | undoped |
| 700 Å | AlGaAs (x = 0.230) | undoped |
| 19 Å | GaAs | undoped |
| 24 Å | GaAs | $2 \times 10^{18}$ cm$^{-3}$ |
| 5 Å | GaAs | undoped |
| 50 Å | AlGaAs (x = 0.230) | undoped |
| 49200 Å | GaAs | $1 \times 10^{18}$ cm$^{-3}$ |
| 1000 Å | AlGaAs (x = 0.3) | undoped |
| 2500 Å | GaAs | undoped |
| | GaAs | S.I. - SUBSTRATE |

FIG. 40 illustrates step 2; calculation of eigen functions and eigen energies of the material structure. Eigen functions in material layer n may be expressed using the equation $$\Psi = A_n e^{ik_n z} + B_n e^{-ik_n z}$$

$A_n$ and $B_n$ of layer n are related to $A_{n+1}$ and $B_{n+1}$ of the next layer by:

$$\begin{bmatrix} A_n \\ B_n \end{bmatrix} = \frac{1}{2} \begin{bmatrix} (1+\gamma_{n,n+1})e^{i(k_{n+1}-k_n)d_{n,n+1}} & (1-\gamma_{n,n+1})e^{-i(k_{n+1}+k_n)d_{n,n+1}} \\ (1-\gamma_{n,n+1})e^{i(k_{n+1}+k_n)d_{n,n+1}} & (1+\gamma_{n,n+1})e^{-i(k_{n+1}-k_n)d_{n,n+1}} \end{bmatrix}$$

$$\begin{bmatrix} A_{n+1} \\ B_{n+1} \end{bmatrix}$$

$$= \frac{1}{2} M_{n,n+1} \begin{bmatrix} A_{n+1} \\ B_{n+1} \end{bmatrix}$$

where $\gamma_{n+n+1} = \frac{m_n^* k_{n+1}}{m_{n+1}^* k_n}$

At an eigen energy, the electron transmission coefficient $T_G(E)$ through all the layers has a local maximum, where $$T_G(E) = \frac{1}{|A_1(E)|^2} \frac{v_p(E)}{v_1(E)} = \frac{2^{2p-2}}{|a_{11}(E)|^2} \frac{m_1^*(E)}{m_p^*(E)} \frac{k_p(E)}{k_1(E)}$$

After identifying all the eigen energies, the corresponding eigen functions can be obtained by putting the energy values back into the second equation.

FIG. 41 illustrates step 3 of the method depicted in the flow chart of FIG. 38; i.e., calculation of absorption coefficient of material based on step 2, including the steps of: Step 3A—Determine $f_n$—After obtaining $\Psi(E_n)$ in terms of A and B for the nth eigen energy $E_n$ (in Step 2) the oscillator strength is $f_n$ given by $$f_n = \frac{2\eta}{m*\omega} \left| \left\langle \Psi_n \left| \frac{\partial}{\partial z} \right| \Psi_1 \right\rangle \right|^2, n = 2, 3 \ldots$$

Step 3B—Determine $\rho_n(\lambda)$

Due to the layer thickness fluctuation in actual material, the eigen energies have finite energy distributions, which lead to finite energy distribution for each optical transition.

$$\rho_n(\lambda) \frac{1}{\sqrt{2\pi} \sigma} \exp\left[ -\frac{1}{2\sigma^2} \left( \frac{hc}{\lambda} - E_n + E_1 \right)^2 \right]$$

Step 3C Determine $\alpha(\lambda)$
After knowing $f_n$ and $\rho_n$, $\alpha(\lambda)$ is given by $$\alpha(\lambda) = \sum_n \frac{N_D W}{L} \frac{\pi e^2 \eta}{2\sqrt{\varepsilon_h} \varepsilon_0 m * c} f_n \rho_n(\lambda),$$

Figure 42:
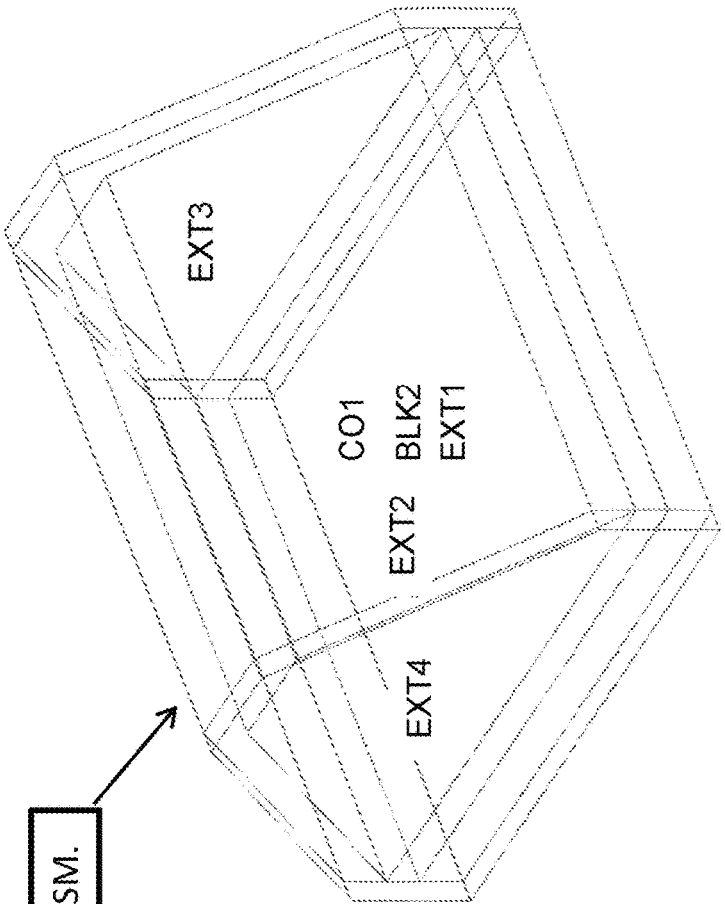
FIG. 42 illustrates step 4 of the method depicted in the flow chart of FIG. 38.

FIG. 42 illustrates step 4 of the method depicted in the flow chart of FIG. 38; the design the detector physical geometry and construct computer aided design drawing using a computer aided design software, such as for example COMSOL.

FIG. 43 illustrates step 5 of the method depicted in the flow chart of FIG. 38; inputting parameters for all materials used in the EM model. The material properties are inputted such as the relative permittivity $\varepsilon_r$, which is related to $\alpha$, the conductivity a and the relative permeability $\mu_r$ of each geometrical subdomain.

FIG. 44 illustrates step 6 of the method depicted in the flow chart of FIG. 38. Other than the absorption properties of the QWIP material, the properties of other geometrical objects, such as the conductivity of the gold metal, can be loaded from a material library in the subdomain setting page.

FIG. 45 illustrates step 7 of the method depicted in the flow chart of FIG. 38, which includes defining all the internal and external boundaries in the geometry based on the known physical principles and symmetries. For example, if the detectors are arranged in a regular array, certain boundaries are in periodic condition. If the wave is expected to propagate out to infinity after leaving the detector material and into top air layer, one should select scattering boundary condition at the top air boundary, which artificially deletes any reflecting waves at that boundary.

FIG. 46 illustrates step 8 of the method depicted in the flow chart of FIG. 38; i.e., defining the maximum element size and other factors that control the density of the mesh. The shorter the optical wavelengths are, the higher the frequency of the spatial variations will be, and the denser the mesh should be. If the mesh is too coarse, a self-consistent solution can never be reached or the solution is not accurate enough. If mesh is too dense, there will be too many computations and too much required memory. Optimum density is determined by trial and error.

FIG. 47 illustrates step 9, defining the EM wave incident condition. At the bottom air layer, the incident wave is defined to be traveling normally to that surface. $E_x$ and $E_y$ are defined as 377 V/m. $E_z$ is defined as 0 V/m.

FIG. 48 illustrates step 10; defining the numerical solver. For example, if using a harmonic propagating wave, using wavelength as a parameter in the range of 8 to 10.8 μm in the step of 0.2 μm. It also contains several other pages of settings related to how the numerical computation proceeds, such as by using progressing multi-grids to improve accuracy in each iteration, the maximum number of iterations and the maximum accuracy tolerance, etc.

FIG. 49 illustrates step 11; based on the output $E_z$ distribution, computing QE using the equation $$\eta = \frac{n\alpha}{AE_0^2} \int_V |E_z(\vec{r})|^2 d^3 r$$

Resonant Infrared Detectors
Resonant infrared detectors may comprise two main components: a detector pixel volume and a diffractive element.

Figure 50A:
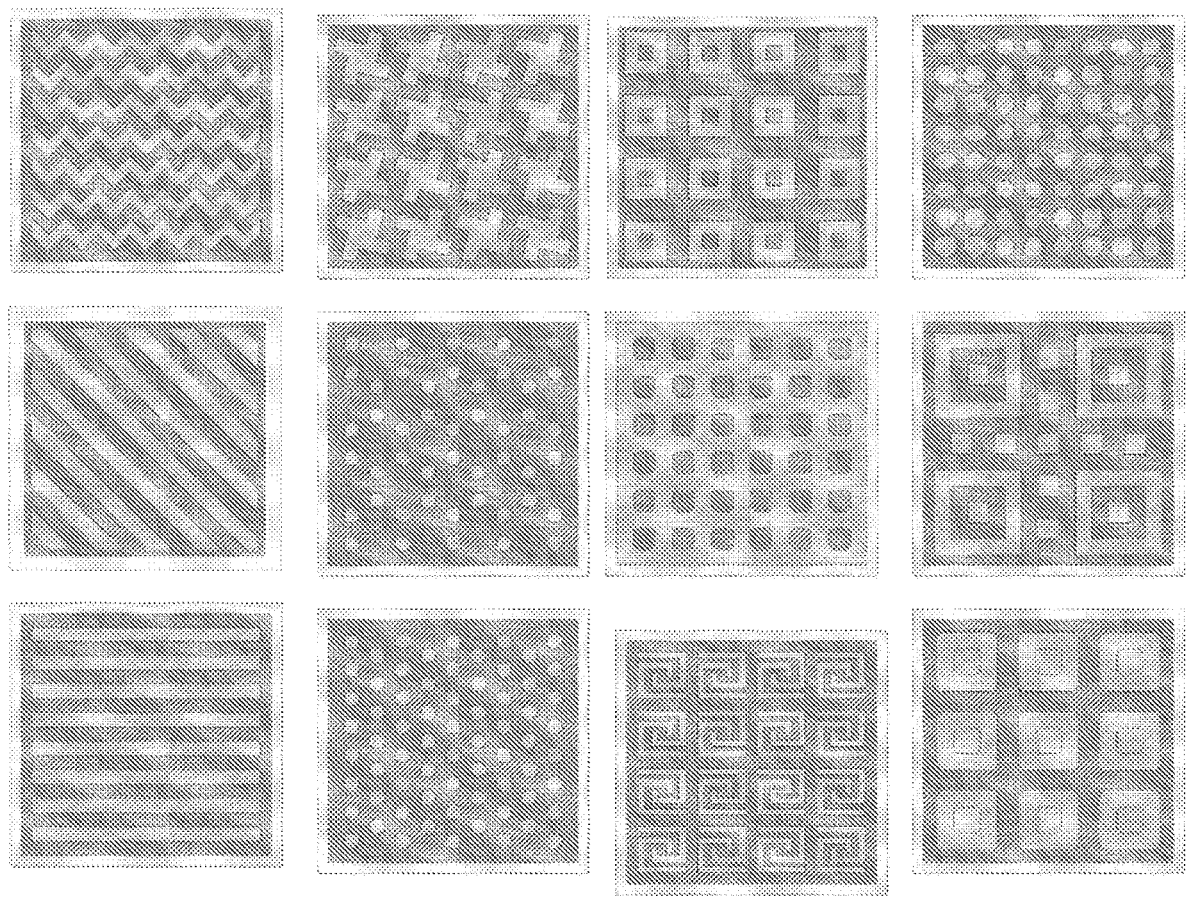
FIG. 50A is an illustration showing exemplified patterns of diffractive elements (DEs) (light colored) that are usually formed by patterning and etching away part of the top contact material layer until the active layer (shown in darker shade) is nearly exposed. The top three rows of patterns consist of regular arrays with one step height and the first in the fourth row has two step heights, with the rest having irregular patterns.

The detector pixel volume further may comprises a bottom contact layer common to all pixels in an array, an active infrared absorbing volume with arbitrary sidewall profiles, and a top contact layer. The diffractive element (DE) may be placed on top of the top contact layer. As disclosed herein, the diffractive element may comprise a collection of geometrical objects (GO) placed on specific locations within the top contact area. These GOs can be made of the same top contact material or a different material. The top contact together with the GOs is generally covered by a metal layer for ohmic contact and for light reflection and confinement. The geometric patterns can appear in many forms and can either be arranged in a regular array or be distributed randomly. The individual GOs can be selected to be of any size and shape in 3 dimensions, such as for example, circles, squares, diagonal lines, letters, pictures, etc., and they can also be voids in otherwise a solid layer of material. Some examples of the DEs are shown in FIGS. 50A and 50B. This detector structure is used to detect light incident from the bottom of the detector.

FIG. 50A is an illustration showing exemplified patterns of diffractive elements (DEs) (light colored) that are usually formed by patterning and etching away part of the top contact material layer until the active layer (shown in darker shade) is nearly exposed. The top three rows of patterns consist of regular arrays with one step height and the first in the fourth row has two step heights, with the rest having irregular patterns.

FIG. 50B is an illustration showing additional exemplified patterns of diffractive elements (Des) (shown by light shading) that are usually formed by patterning and etching away part of the top contact material layer until the active layer (shown by darker shading) is nearly exposed. The top three rows of patterns consist of regular arrays with one step height, while the rest have irregular patterns.

Figure 51A:
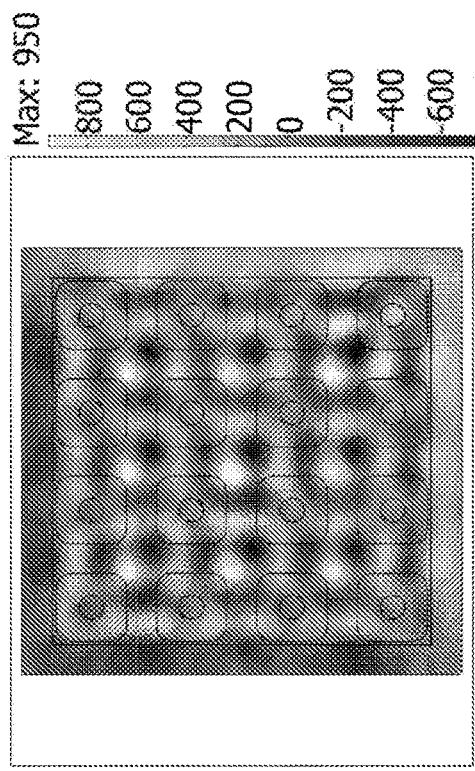
FIG. 51A is an illustration showing an example of resonant infrared detector with rings as its diffractive element.
Figure 51B:
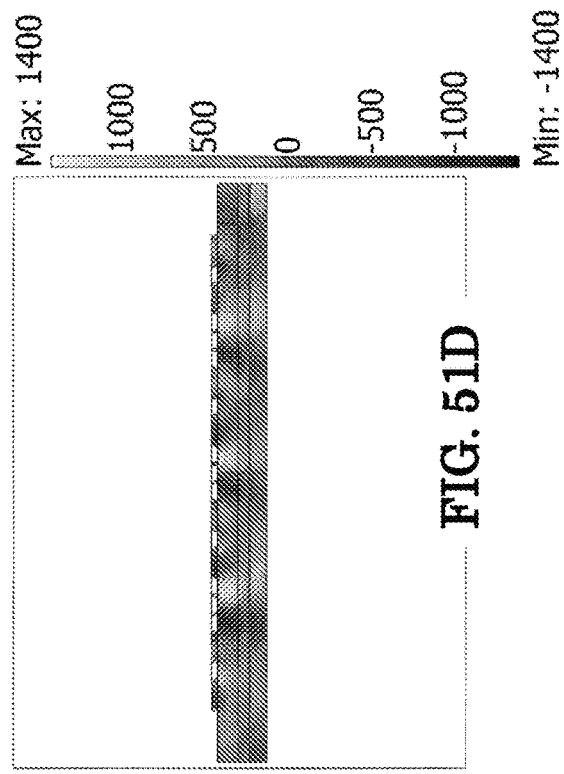
FIG. 51B is a top view of the detector of FIG. 51A with the Ez field distribution. The diffracted light travels nearly in parallel to the layers and is confined by a metal layer on top of the detector and by the detector/air interface in the bottom and sides through total internal reflection.
Figure 51C:
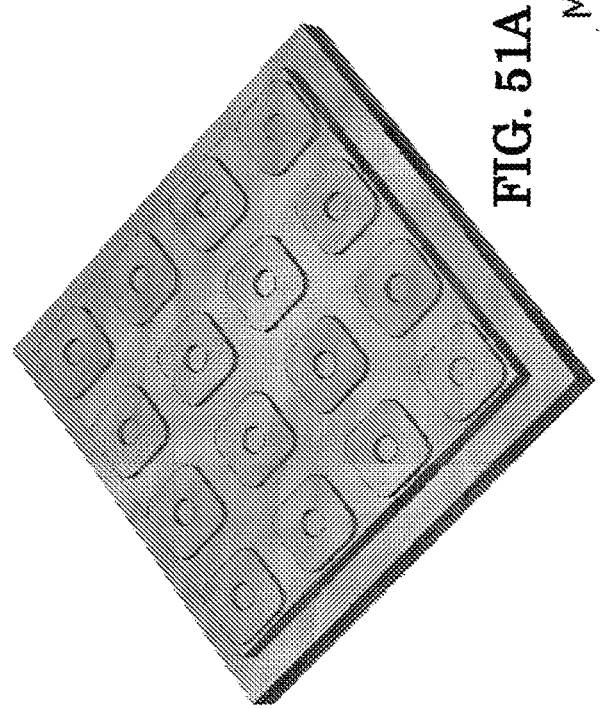
FIG. 51C is a side view of the detector of FIG. 51A.

A resonant infrared detector is designed such that the DE diffracts light incident normally from the bottom side of the detector back into the detector active volume at large diffracted angles, as shown, for example, in FIG. 51C. If the diffracted angles are larger than the critical angle for total internal reflection at the bottom layer/air interface, the light will be reflected at this interface back into the detector material. Since light is an electromagnetic wave, the phases of the reflected wave from the bottom interface, the diffracted waves from other locations and the waves reflected at the pixel sidewalls have to be matched to form a constructive interference pattern inside the active region; i.e., what is referred to herein as resonance. This can be accomplished by adjusting the detector pixel volume thickness and the pixel area. In accordance with the principles of the present invention, when the phase matching condition is reached, the intensity of light will be greatly amplified, and the pixel volume is said to be in resonance with the diffracted light. The pixel volume in this case acts as a resonant cavity. With a greatly increased light intensity, a large quantum efficiency (QE) can be achieved.

Figure 51D:
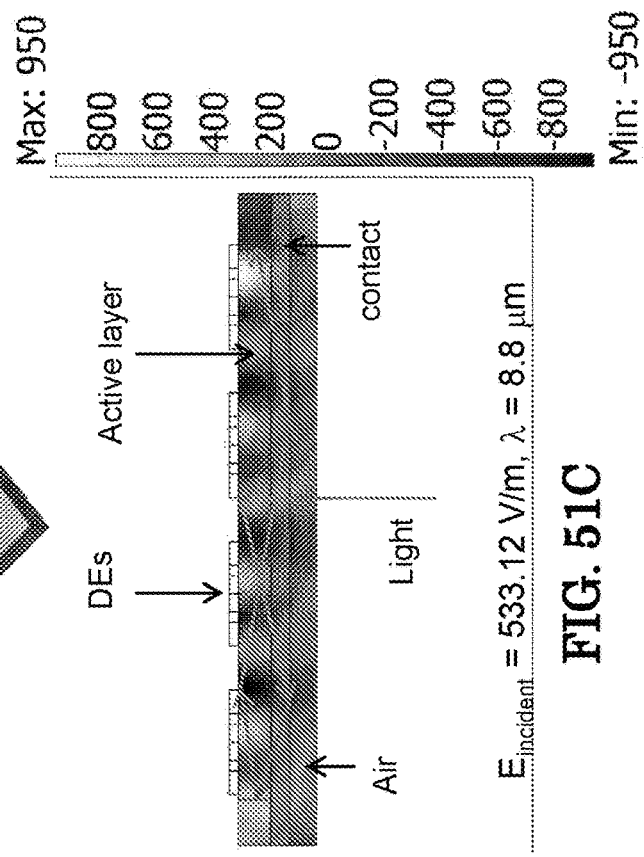
FIG. 51D is a diagonal side view of the detector of FIG. 51A.

FIG. 51A illustrates a preferred embodiment photodetector comprising a geometrical pattern of rings as its diffractive element. FIG. 51B is a top view of the detector of FIG. 51A with the Ez field distribution. The diffracted light travels nearly in parallel to the layers and is confined by a metal layer on top of the detector and by the detector/air interface in the bottom and sides through total internal reflection. FIG. 51C is a side view of the detector of FIG. 51A. FIG. 51D is a diagonal side view of the detector of FIG. 51A.

The resonant infrared detector constructed in accordance with the principles of the present invention may be utilized in conjunction with all types of infrared materials. It enables a thin detector to have a large QE because it, in effect, extends the path length of light inside the detector through light trapping and re-circulation compared to that traveling just normally in and out of the detector. In addition to increasing the photocurrent through larger light absorption, the thinner material also produces less dark current and thus less noise. The sensitivity of the detector, which depends on the ratio of photocurrent to dark current, can thus further increase. Other than sensitivity, the cost of the material, the number of material defects, and the processing complexity will also reduce with detector thickness. Therefore, the resonant infrared detector constructed in accordance with the principles of the present invention improves detector technology in many ways.

While the resonant infrared detector constructed in accordance with the principles of the present invention is beneficial to all types of infrared materials, it may be particularly useful to the quantum well infrared photodetector (QWIP) technology. Since QWIP materials are unable to sense light with electrical polarization E pointing parallel to the layers (referred to as the x-y plane) and they are only sensitive to the E component pointing vertically to the layers (the z direction), the resonant infrared detector structure is uniquely able to increase the QE of a QWIP. In a resonant QWIP detector, which will be referred to herein as the resonator-QWIP or R-QWIP, the DE diffracts the incoming light into large angles, which effectively rotates its polarization from horizontal to nearly vertical. Subsequently, the vertically polarized light is intensified by resonance, thereby creating a large $E_z$ for light absorption.

To design a sensitive R-QWIP structure, the detector structure first adopts a particular DE pattern. The pattern of DE essentially determines the QE spectral "line shape" as a function of wavelength $\lambda$. To increase the QE magnitude, all structural parameters, such as the (a) pixel area, (b) the geometrical object design, shape, size, and thickness, (c) the active volume thickness, (d) the top and bottom thicknesses, (e) the metal cover area, etc. are individually adjusted. By assuming a material absorption coefficient spectrum $\alpha$ and an initial set of structural parameters, the initial value of QE is computed using the unique electromagnetic model disclosed in the previous patent application. The QE is then maximized by varying each parameter in iterations. One example of the $E_z$ distribution of an R-QWIP with rings as GOs is shown in FIG. 51A-D. At the incident $\lambda$ of 8.8 µm, the maximum $E_z$ is approximately 1400 V/m under an incident $E_0$ of 533.12 V/m. Therefore, the $E_z/E_0$ ratio inside the detector is increased by a factor of 2.6 times. The corresponding light intensity, which is proportional to $n|E|^2$ where n is the refractive index, is thus amplified by 22.3 times. With this high level of intensity amplification, the QE of the QWIP can reach 75% for a material absorption coefficient $\alpha$ of 0.2/µm. This example shows the effectiveness of an R-QWIP structure.

Figure 52:
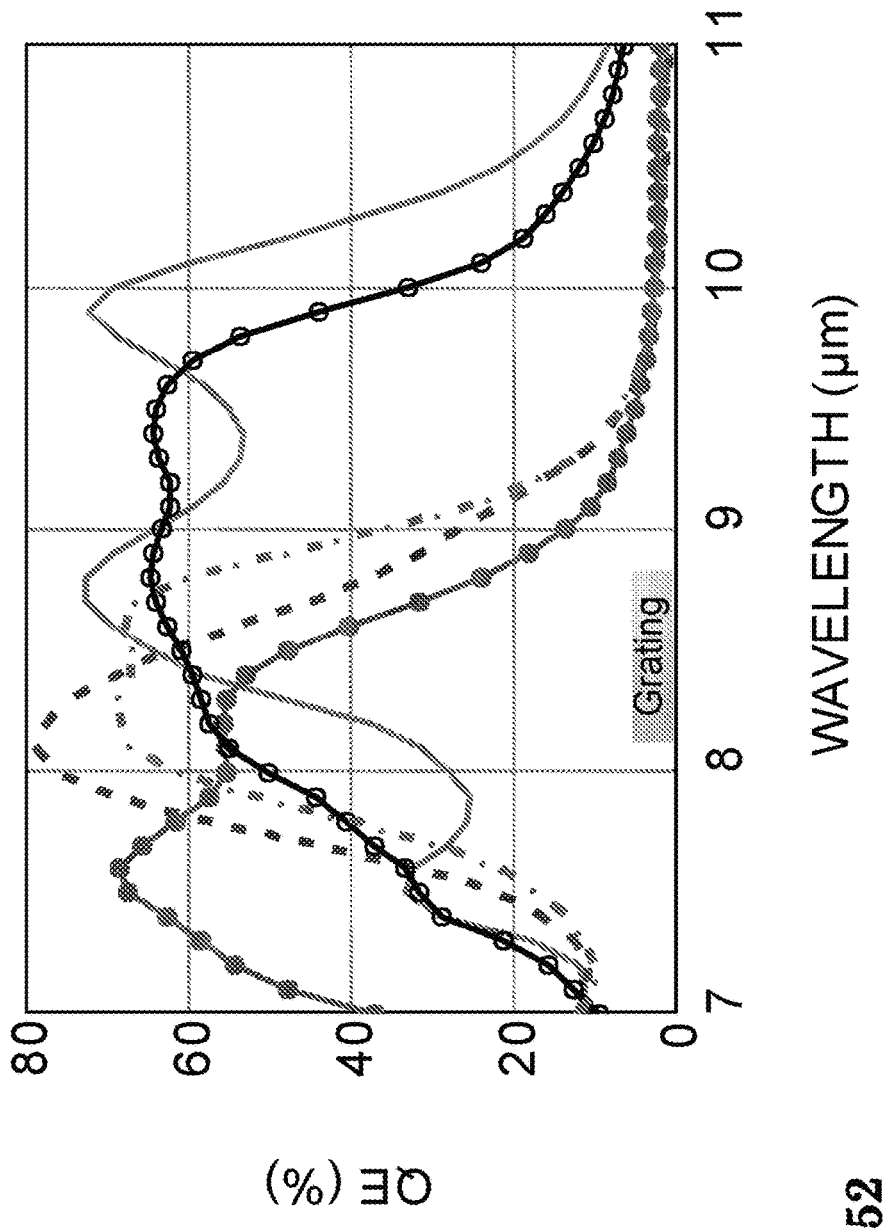
FIG. 52 is a graph showing the calculated quantum efficiency of several R-QWIPs with different patterns and layer thicknesses.

With different DE patterns in FIGS. 50A and 50B, different QE spectra will be obtained. FIG. 52 illustrates the calculated quantum efficiency of several R-QWIPS with different patterns and layer thicknesses. Also shown is typical quantum efficiency (QE) of gratings without properly designed resonant cavity. More specifically, FIG. 52 shows, for example, the optimized QEs for five patterns. This calculation is performed with the assumption that a is constant across the wavelength range and is equal to 0.2/µm. It is much larger than the QE of 5% observed in a typical commercial QWIP camera, which employs a grating but without a properly designed resonant cavity as the light coupling element.

Figure 53A:
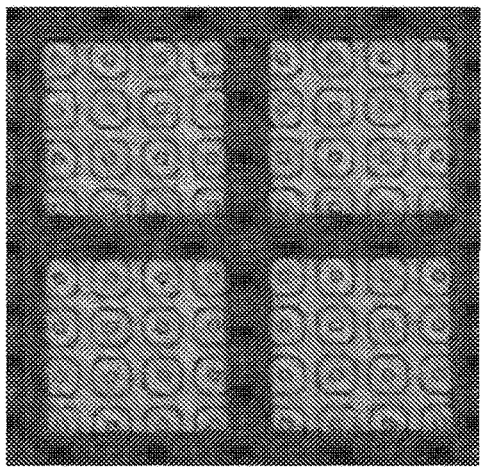
FIG. 53A is an illustration showing the R-QWIP design #1 studied.
Figure 53C:
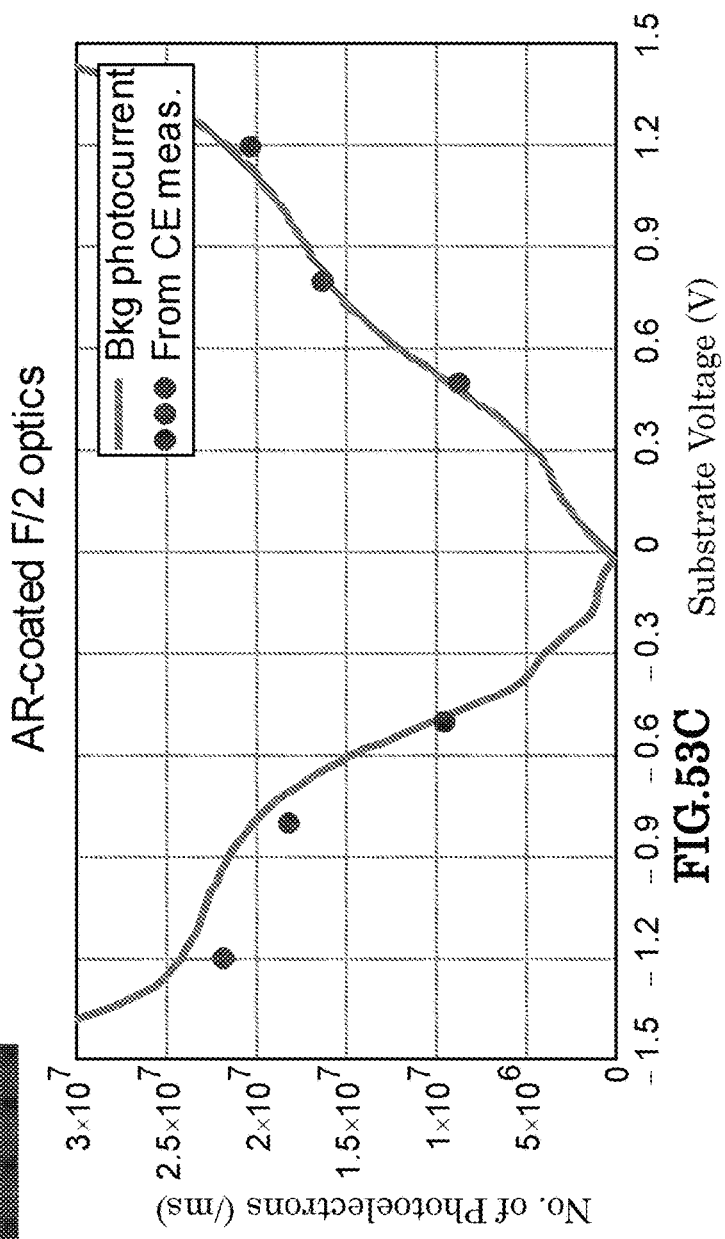
FIG. 53C is an illustration showing the measured dc current (curve) under 18° C. background with F/2 anti-reflection coated optics. The circles are those calculated from the observed QE spectrum and the 18° C. blackbody, showing consistency.
Figure 53B:
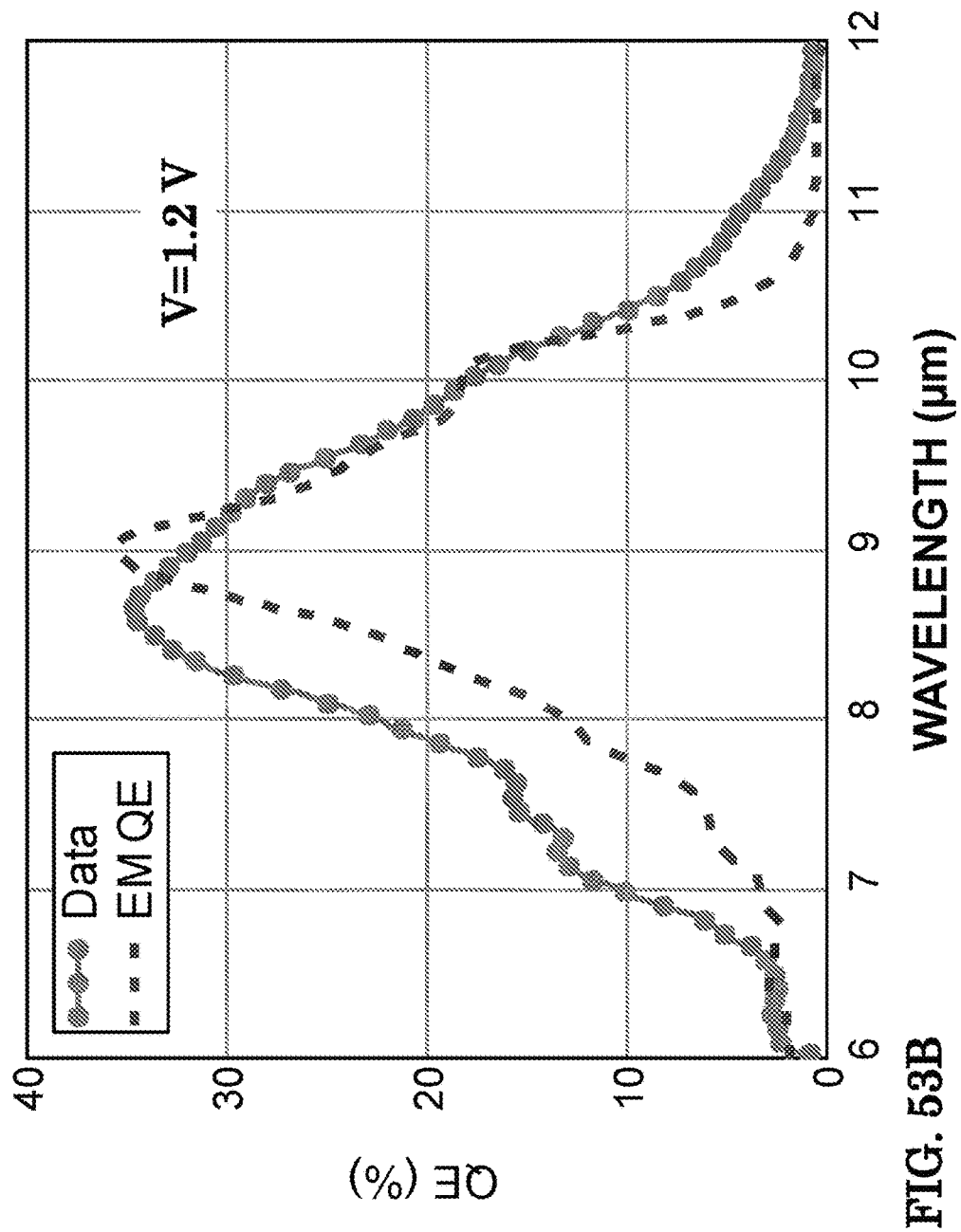
FIG. 53B is an illustration showing the measured QE (curves with circles) and the calculated QE (dashed curve), which are in reasonable agreement.

The high QE of several R-QWIP designs have been substantiated by experiment. In FIG. 53, shown is a ring-resonator-QWIP similar to that in FIG. 51A-D with a pixel area of, for example, 23×23 µm² and a metal cover area of 20×20 µm². The experimental pixel structure is shown in FIG. 53A. With this structure and the calculated material α, the calculated peak QE is 35.8% as shown by the dashed curve of FIG. 53B. This peak QE matches well with the experimental value of 34.7%, which is shown by the red curve with circles in FIG. 53B. The observed detector photocurrent is high at 2E7 e/ms at bias of 1.2V and F/2 optics.

By changing both the pixel area and the metal cover area to 21.5×21.5 µm² as shown in FIG. 54A, the R-QWIP can be further optimized. The calculated QE is 66% as indicated in FIG. 54B, which also matches the experimentally measured value of 72%. The corresponding dc photocurrent is measured to be 3E7 e/ms at 1.5V.

In the following, examples are given for specific applications of R-QWIPs. Illustrated in FIG. 55 is an R-QWIP is designed to match the transmission window of a medium dispersed in air so that the objects behind that medium can be observed by the detector without the optical glare from the foreground. FIG. 55A illustrates a designed R-QWIP structure. FIG. 55B illustrates the calculated QE with the detection spectrum closely matched to the transmission characteristics of the medium.

In FIG. 56, an R-QWIP is designed to match the absorption spectrum of a medium, e.g. a methane gas, so that the presence of the medium can be detected against a uniform infrared background.

FIG. 56 A shows the designed R-QWIP structure. FIG. 56 B illustrated the capability of designing a detector structure which is aligned with the absorption spectrum of a chemical, to provide enhanced chemical detection. Specifically, FIG. 56B illustrates the calculated QE with the detection spectrum closely matched to the absorption spectrum of methane gas. FIG. 56 B also shows the atmospheric transmission.

As illustrated in FIGS. 57A and 57B, an R-QWIP is designed to match the atmospheric transmission windows so that the detector can be designed to detect several wavelength bands simultaneously. FIG. 57A shows the designed R-QWIP structure. FIG. 57B shows the calculated QE with the detection spectrum closely matched to the atmospheric transmissions. The wavelength selectivity, if an application requires, can be obtained by either using voltage tunable materials or using several QWIP material stacks, each sensitive to one wavelength bands.

Figure 58A:
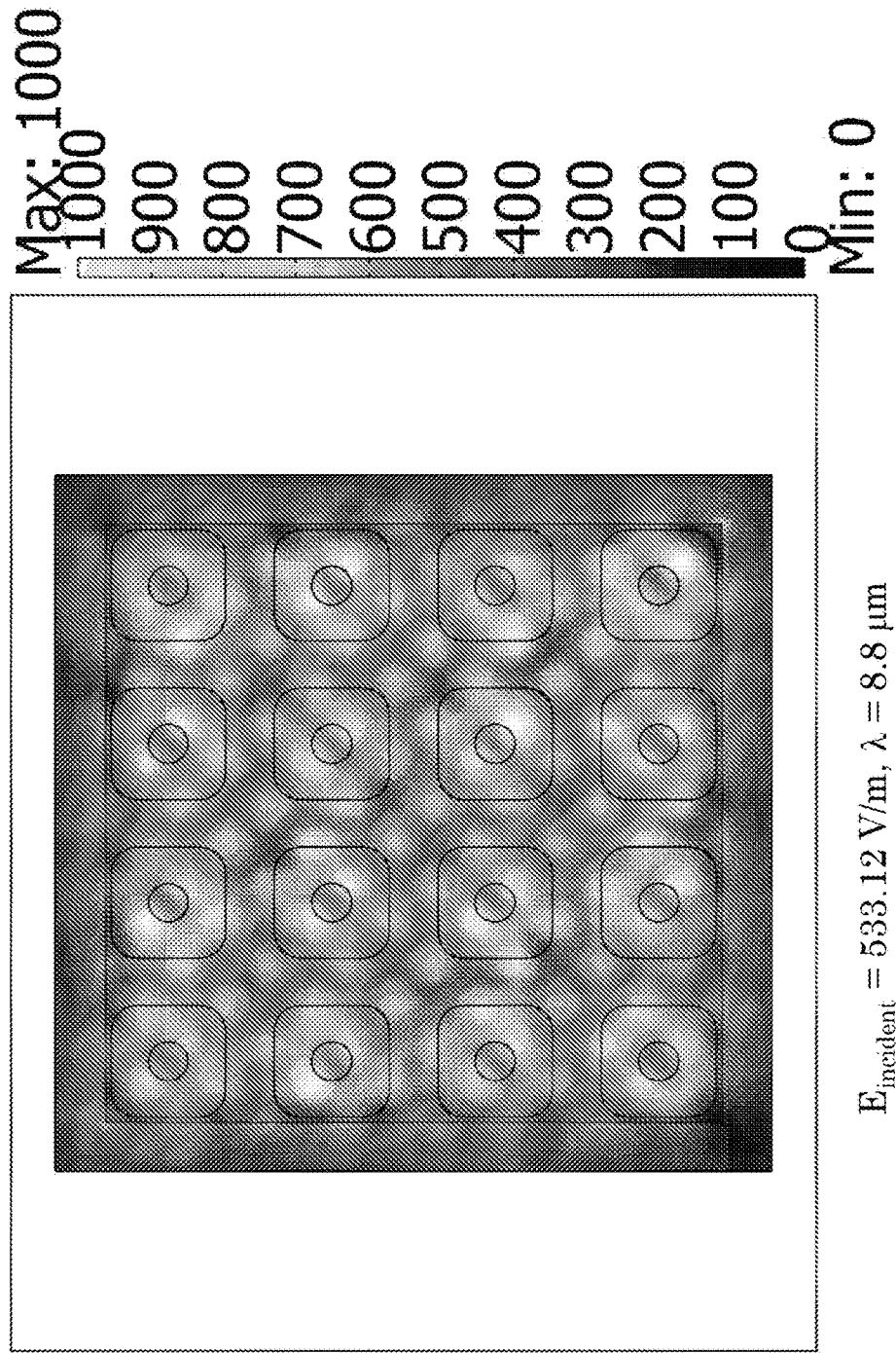
FIG. 58A is an illustration of a top view of a mercury cadmium telluride (R-HgCdTe) embodiment with a pattern of rings as its diffractive element and also the absolute E field pattern.

Although the preferred embodiments of the present invention have largely been directed towards the QWIP type detectors, using for example, GaAs, the principles of the present invention may be practiced using other materials such as, for example, HgCdTe. In order to show the resonant infrared detector structure is applicable to other infrared materials that possess isotropic absorption properties and absorb normal incident light, a HgCdTe infrared detector was compared with a conventional detector geometry and the resonant detector structure of FIG. 51A. The conventional detector is a bare detector within thick substrate and without rings on top. FIG. 58A (having a ring DE pattern similar to FIG. 51A) shows that the R-HgCdTe detector geometry can increase the QE by 3.7 times in the wavelength of 9.5 µm. The same detector structure can also similarly improve the InAsSb infrared materials and other infrared materials.

Figure 58B:
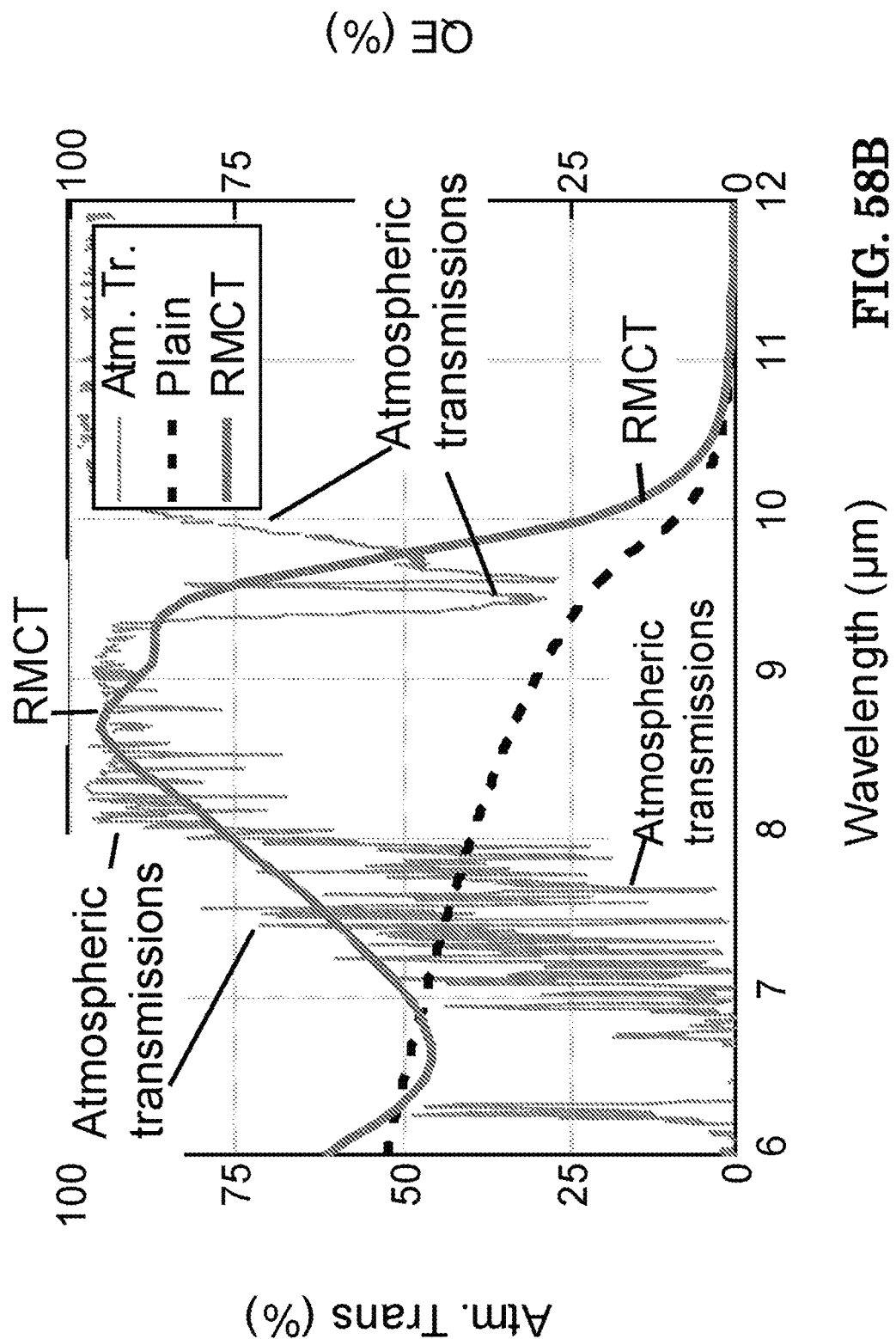
FIG. 58B is an illustration showing the QE of a plain HgCdTe detector (i.e. without diffractive elements) shown in black dashed curve and an R-MCT detector in the thicker solid curve. The R-MCT detector is able to increase the QE of a plain detector in the wavelength region where the atmosphere is transparent to infrared radiation as indicated by the thin solid curve.

Specifically, FIG. 58A shows the top view of the R-HgCdTe with a pattern of rings as the diffractive element and also the absolute E field patterns. FIG. 58B shows the QE of a plain HgCdTe detector (i.e., without diffractive elements) (shown by dashed line with a QE value of about 50% at the left margin to 0% at a wavelength of between 10 and 11 microns) and a R-MCT detector (using the principles of the present invention) in the solid curve. The R-MCT detector (using the principles of the present invention) is able to increase the QE of a plain detector in the wavelength region where the atmosphere is transparent to infrared radiation indicated by the thin lined curved labeled atmospheric transmissions.

Detector Volume

Detector volume actually plays a crucial role in determining QE, in which it acts as a resonant cavity to the light diffracted from the DE. With the versatility of the finite element method, one is also able to consider a much wider variety of DEs whose patterns can be far more complex than that of a regular grating. In general, a DE can be in the form of a photonic Bravais lattice with a basis or in the form of irregularly distributed scatterers. The basis and scatterers can be of any 3-D geometrical objects. The opening up of these arbitrary patterns offers tremendous choices of QE characteristics both in spectral lineshape and in absolute magnitude. This versatility in the detector geometrical design adds to the well-known versatility in the QWIP material design. The combination of the two will yield a tremendous flexibility in designing the specific detector optical properties. The integration of a DE and a resonant cavity may be referred to as the resonator-QWIP or the R-QWIP. With different DE designs to suit different applications, there will be different types of R-QWIPs. A large number of these detector designs and obtained a wide range of coupling characteristics have been studied. Here, two of the simplest designs for illustration purposes are described: one is the grating-resonator-QWIP or GR-QWIP and another is the ring-resonator-QWIP or RR-QWIP.

Figure 59:
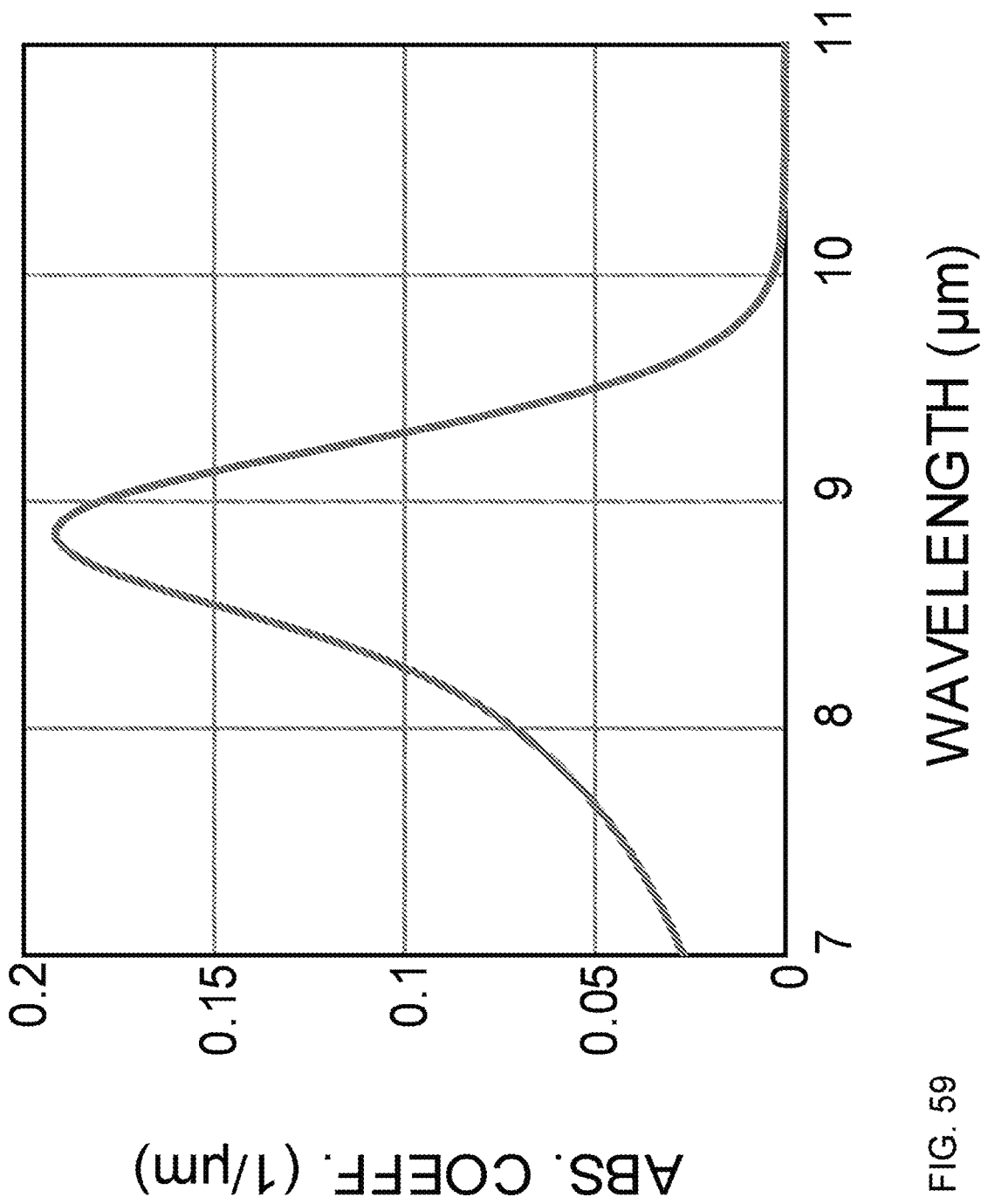
FIG. 59 shows the absorption coefficient α of a typical narrow band QWIP detector.
Figure 60B:
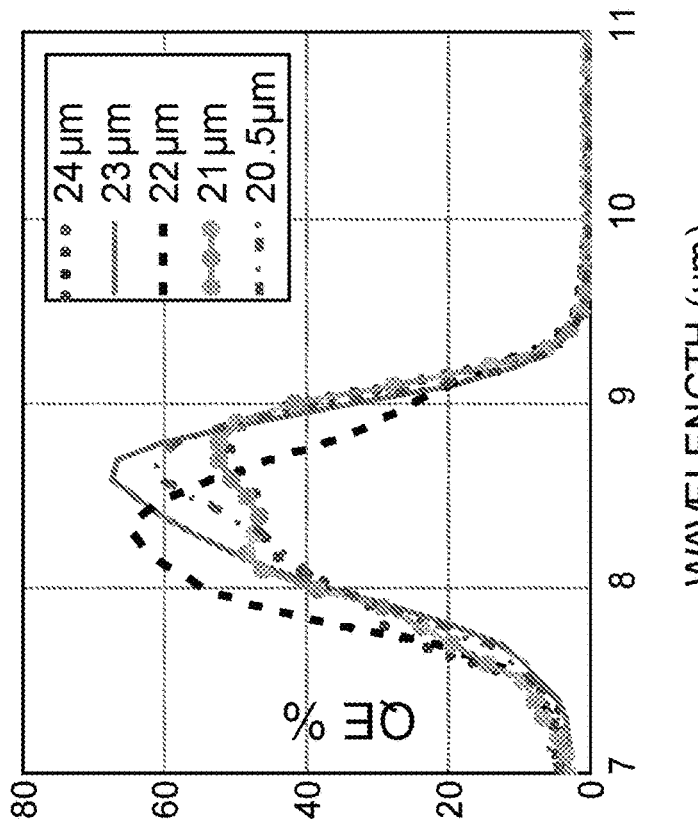
FIG. 60B is an illustration showing the calculated QE of a grating-resonator-QWIP for different detector size p for a varying α according to FIG. 59.
Figure 60A:
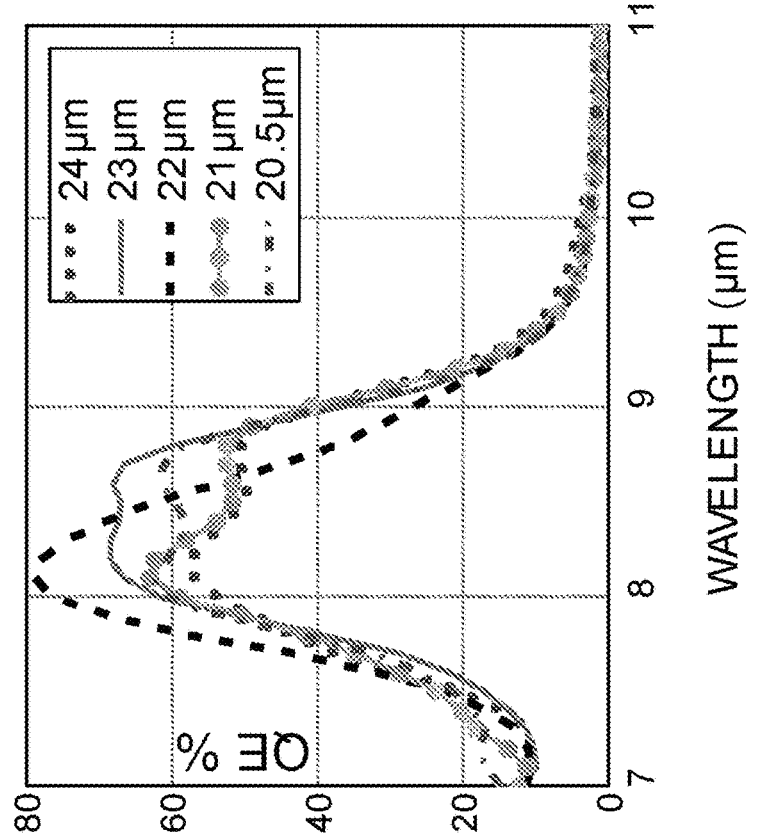
FIG. 60A shows the calculated QE of a grating-resonator-QWIP for different detector size p for a constant α of 0.20 $\mu m^{-1}$.

First, a 25-µm pitch GR-QWIP without an AR-coating for 8-9 µm detection is optimized. The value of α is either assumed to be constant at 0.20 µm$^{-1}$ or a narrowband spectrum shown in FIG. 59. The period of the grating is first set at 2.7 µm. All the rest of the parameters, such as the active layer thickness, the grating height, the bottom contact thickness, and the pixel linear size p, are adjusted to give the maximum QE in the 8-9 µm band. FIG. 60 shows one of the optimizing procedures by varying p alone, while all other parameters have been optimized. The result shows that the pixel size has a modest effect in the QE in this case. For a constant α, the maximum QE is 78.6% achieved by a p=22 µm GR-QWIP at wavelength=8.1 µm.

The above modeling shows that the GR-QWIP is a promising detector structure for narrowband detection. Using an array of square rings as the DE instead, the coupling bandwidth can be widened as shown in FIG. 61A. In this structure, the outer dimension of each ring is 4 µm and the inner dimension is 1.4 µm. The wider bandwidth is beneficial even for a narrow band material as seen in FIG. 61B. It reduces the spectral variations with different p and preserves the absorption lineshape of the material. The largest QE in FIG. 59A is 73.1% achieved at p=21.5 µm and wavelength=9.9 µm.

Since these GR-QWIPs and RR-QWIPs will be built on a very thin active material layer, the photoconductive gain can be as large as 0.6 at full bias. Therefore, the estimated conversion efficiency is about 40%, which is adequate for many high-speed applications.

Modeling of Imperfections and Crosstalks

Figure 62:
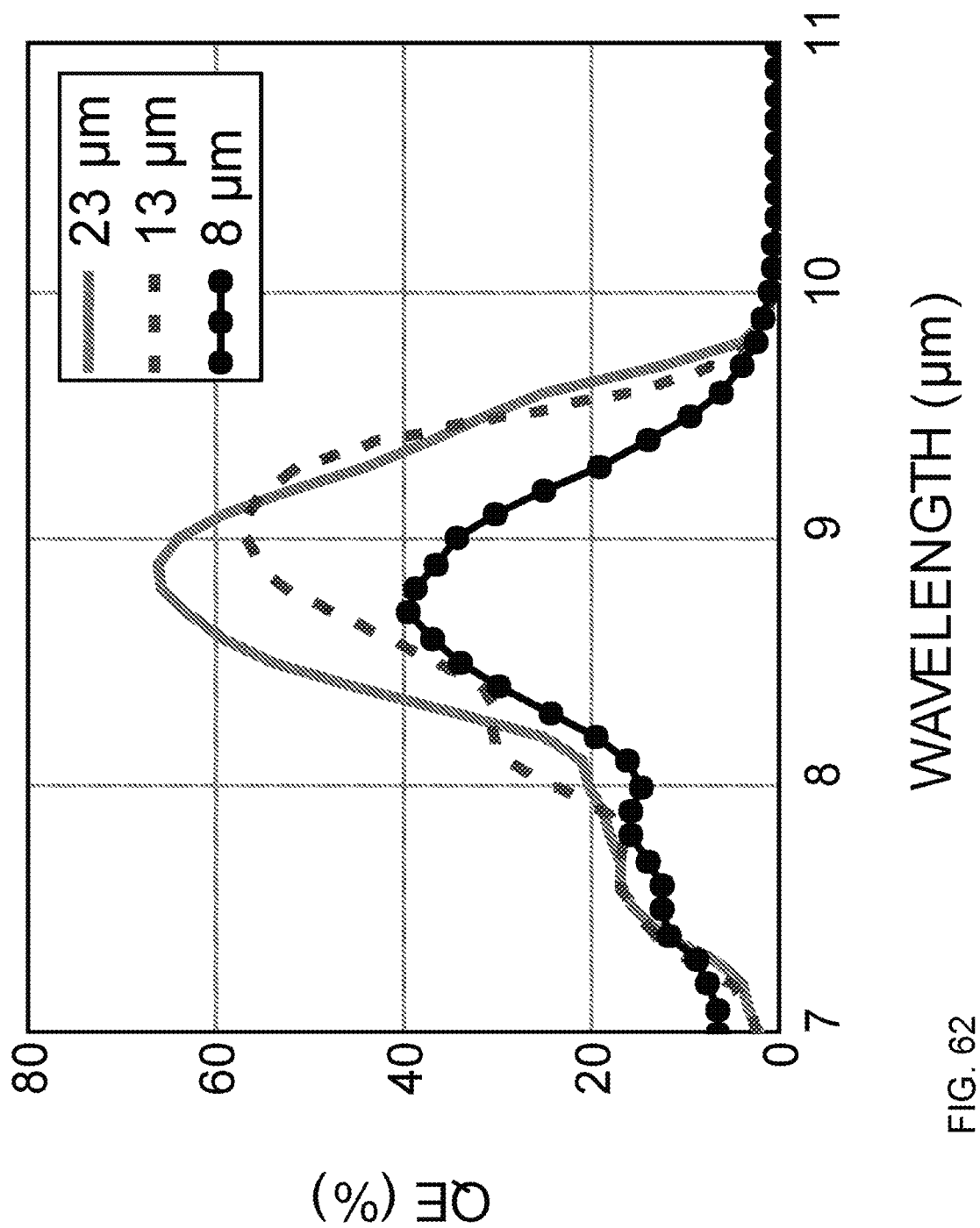
FIG. 62 is an illustration showing the quantum efficiency obtained in modeling the optimized RR-QWIPs with rounded ring corners.

The above calculations assumed that the designed structures can be produced faithfully in experiment, which may not always be feasible technologically or economically. The present model is adept in determining the impacts of processing imperfections such as size nonuniformity and deformed DEs by modeling the actual fabricated structures. The subsequent optimization can be performed on the realizable patterns. FIG. 62 shows one of such examples in modeling the optimized RR-QWIPs with rounded ring corners. The result for the 23-μm detector shows that by adjusting other detector parameters, the rounded rings can have very similar QE as the square rings. Based on the rounded ring structure, one can also design efficient detectors for smaller pixel sizes. As shown in FIG. 62, the detector may have 57% QE for 13-μm pixels and 40% QE for 8-μm pixels.

Figure 63:
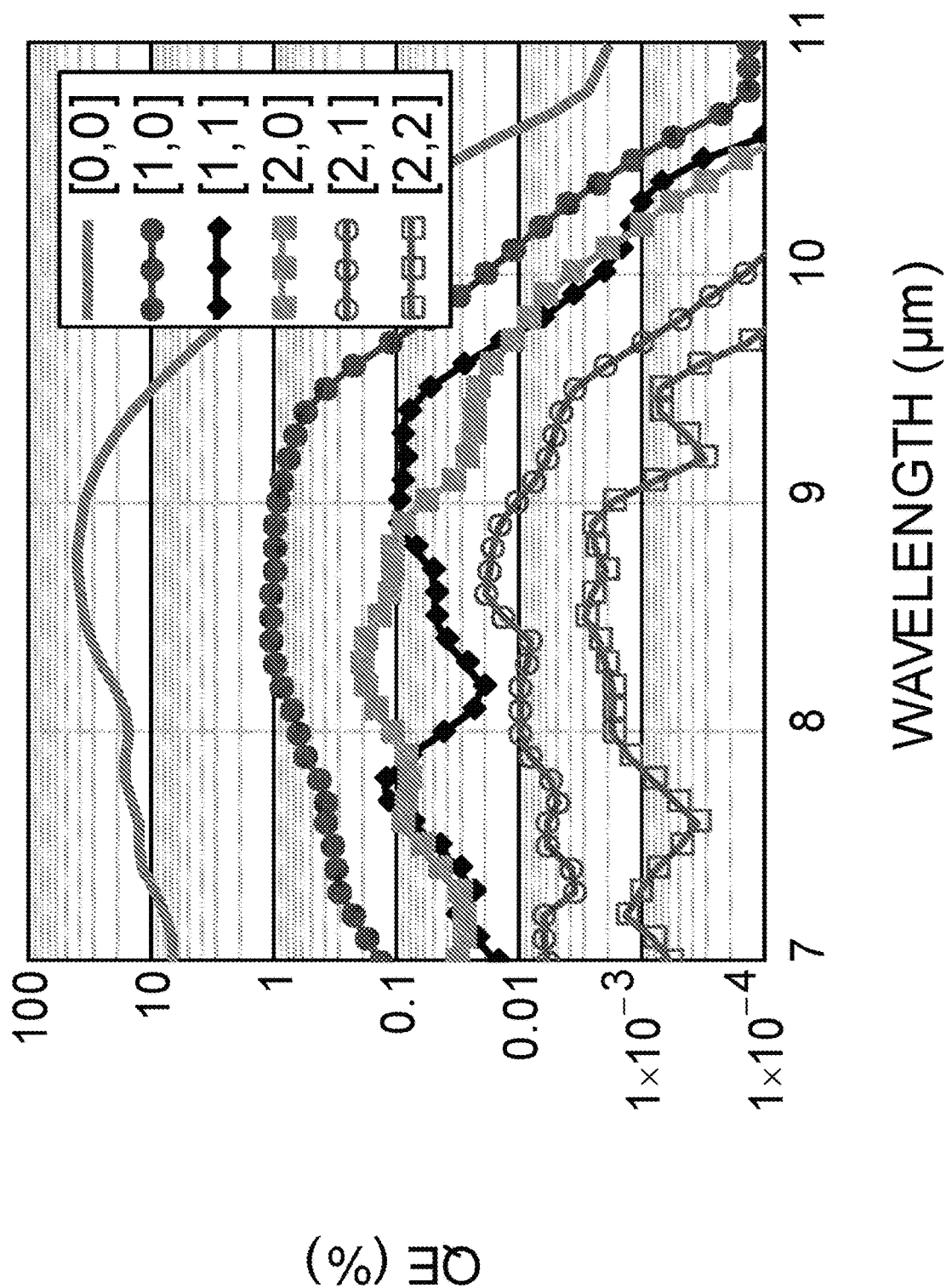
FIG. 63 is an illustration showing plots of an example for the 10-μm pitch arrays, in which the result for five nearest neighbors is plotted. From this calculation, the cross-talk is estimated to be less than 2.5% for the RR-QWIP structure.

EM modeling can also be used to determine other FPA properties such as pixel cross-talk. For small pitch arrays, cross-talk due to pixel optical diffraction is a concern. In order to determine the amount of cross-talk, one can evaluate the values of QE of the surrounding pixels while only the center pixel pitch area is illuminated. FIG. 63 shows an example for the 10-μm pitch arrays, in which the result for five nearest neighbors is plotted. From this calculation, the cross-talk is estimated to be less than 2.5% for the RR-QWIP structure.

Dual Band Quantum Well Infrared Photodetector

In applications U.S. Pat. No. 8,704,209 entitled "Photodetectors Using Resonance and Method of Making" and U.S. Pub. Patent Application No. 2013/0145330 entitled "Computer Designed Resonant Photodetectors and Method of Making," both of which are herein incorporated by reference, and in the foregoing, QWIPs are described that are sensitive to the vertical optical polarization Ez, and generally a single wavelength band.

Simultaneous resonance may be achieved in two separate wavelength bands, with which a dual band QWIP can be realized. In addition, broadband resonance may be achieved to match the broadband absorption characteristics of bulk infrared material such as Mercury Cadmium Telluride (MCT) materials and bandgap engineered materials such as InAs/InAsSb type II strained superlattice (SLS) materials. Also, broadband resonant absorption for solar cells and thermophotovoltaic cells may be achieved using the present invention.

Although the terminology "QWIP" expressly refers to infrared photodetectors, this description of a preferred embodiment is not limited to particular detector materials and optical wavelengths, and applicable to all types of electromagnetic wave sensors and energy convertors in the entire EM spectrum from RF to UV.

Dual Band Photodetection

FIG. 64 is an illustration of a preferred embodiment dual band resonant structure. The preferred embodiment illustrated in FIG. 64 enables strong optical resonances in two or more bands (or wavelength ranges) with the capability of operating each band individually to obtain spectral information from each band. Material and structure selection for the voltage tunable QWIP material would include material structures described in U.S. Pat. No. 7,217,929 ('929 Patent) entitled "Systems Involving Voltage Tunable Quantum Well Infrared Photodetectors (QWIPs) and Related Methods," (herein incorporated by reference as though fully rewritten herein). The '929 Patent describes two detector materials, one of which is a detector material structure comprising two absorbing layers separated by a barrier layer. Each absorbing layer is sensitive to one specific wavelength band. Under one bias voltage polarity, only one absorbing layer is active and therefore the detector only collects signal from that particular band. In the reversed bias, a different band is detected. Using a resonant structure design of a preferred embodiment, two different resonant wavelengths may be achieved; the individual material layer be placed appropriately inside the resonant volume.

Each detector section or pixel 110 may be, for example, 10 μm on each side. Detector section or pixel 110 may comprise 4 diffractive elements (or rings) 112, each having a metal (e.g., gold) layer (or cover) 114. The shape of the diffractive elements may vary and the present invention is not limited to a specific design.

Figure 65A:
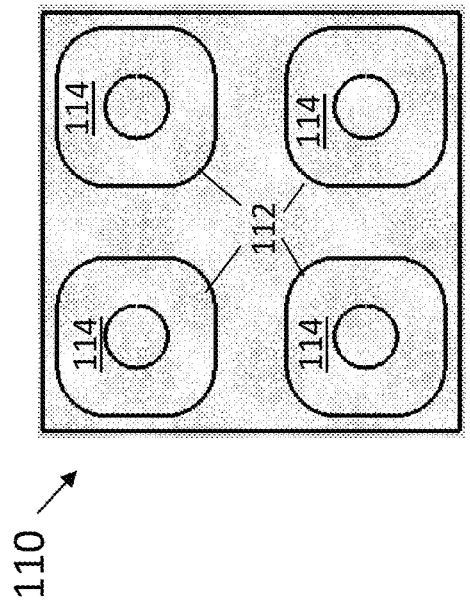
FIG. 65A is the top view of the detector section (or pixel) 110 comprising a plurality of diffractive elements 112 which may have adjacent metal layers 114.
Figure 65B:
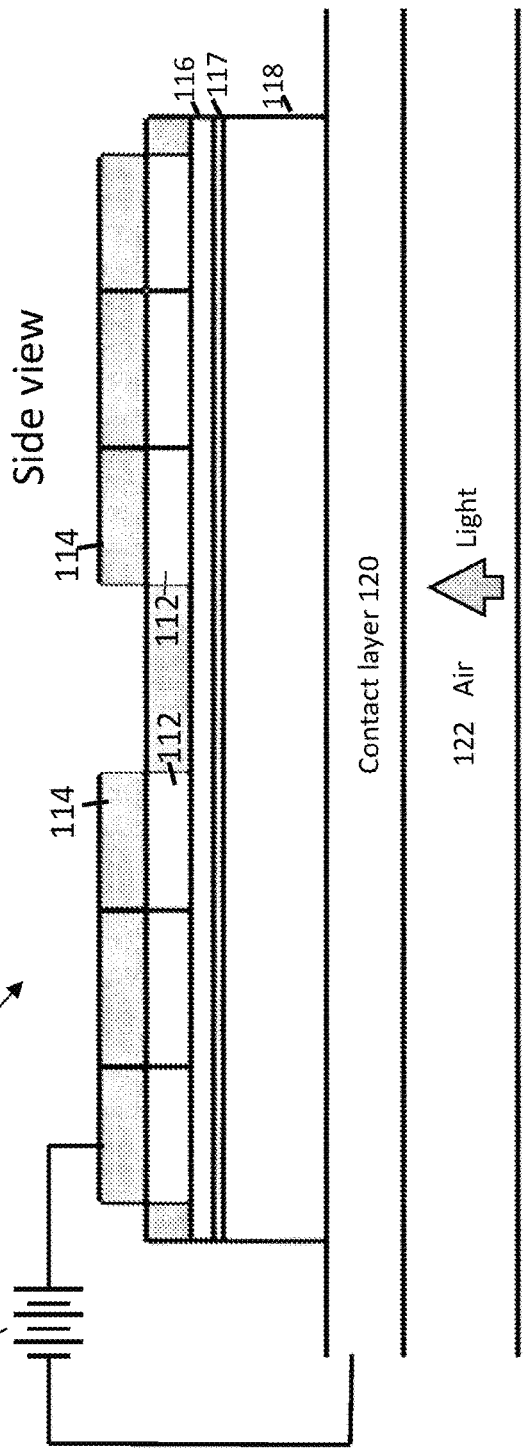
FIG. 65B is the side view of the detector section (or pixel) 110 comprising a plurality of diffractive elements 112 which may have adjacent metal layers 114.
Figure 66:
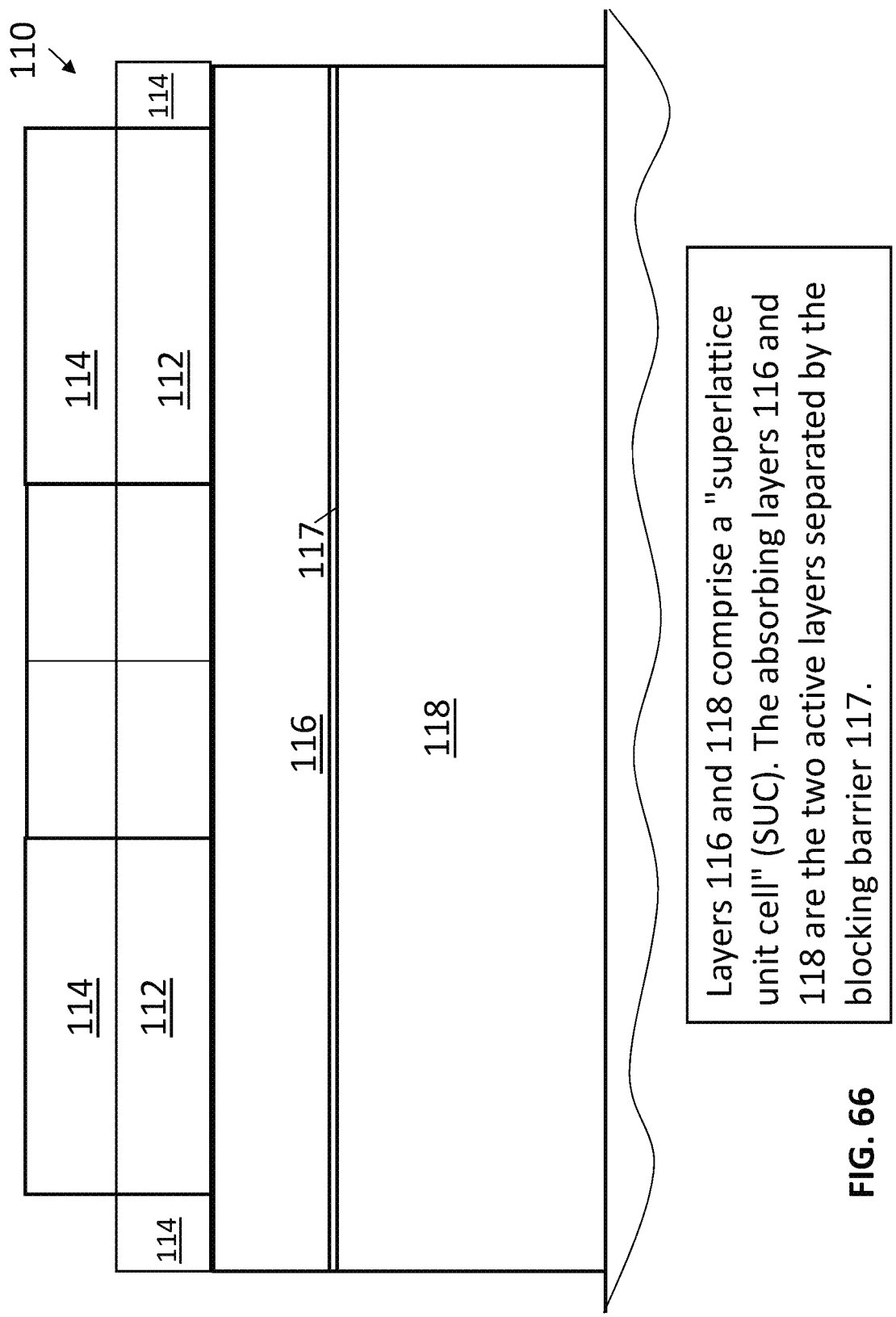
FIG. 66 is an illustration showing an expanded view of layers 116 and 118 which comprise a "superlattice unit cell" (SUC). The absorbing layers 116 and 118 are the two active layers separated by the blocking barrier 117.

FIGS. 65A, 65B and 66 are top, side and expanded views of the detector section (or pixel) 110 comprising a plurality of diffractive elements 112 which may have adjacent metal layers 114. Absorbing layers 116 and 118 for absorbing different wavelengths of light may be separated by a barrier layer 117. The present invention uses optical resonance to make both bands (layers 116, 118) more sensitive than other optical coupling structures. Battery 124, as schematically represented, provides power through contact with metal layers 114 and contact layer 120. Portion 112 comprises air. Light enters the detector as shown in FIG. 65B. The number of absorbing layers 116 and 118 may vary and the present invention is not limited to a specific number of layers. Layer 116 absorbs light in the long wavelength band (LW layer) and layer 118 absorbs light in the mid wavelength band (the MW layer). The two layers are separated by a barrier layer 117. These rings may be covered with a metal layer such as gold.

In FIGS. 64-66, the resonant structures have multiple resonant wavelengths. The resonant structures need to be modified for dual band or multiband detection. By only measuring the photocurrent generated from the incident light, one does not know whether the incident light is in band 1 or band 2 or a combination of the two bands since the absorption in all the bands contributes to the photocurrent. To distinguish the signal from the individual bands, a special detector material structure is used, similar in nature to superlattice unit cell 1 (SUC1), described in FIG. 4 of U.S. Pat. No. 7,217,926, issue date May 15, 2007, entitled "Systems involving voltage tunable quantum well infrared photodetectors (QWIPs) and related methods," by Kwong-Kit Choi, the inventor herein. Although absorption takes place in both bands in the detector material, the detector produces photocurrent only in band 1 in one bias polarity (for example, positive bias) and produces photocurrent only in band 2 under the opposite bias (e.g., negative bias). By alternating the polarity of the applied bias, one can obtain the spectral information of the incident light. The detector material comprises multiple periods of SUCs in order to build up a thick absorbing layer. In the preferred embodiment, which allows for thin absorbing layers, only one SUC period is utilized.

More specifically, a superlattice unit cell (SUC) consists of a quantum well superlattice (SL2) 116 on top of another quantum well superlattice (SL1) 118, separated by a blocking barrier 117. The SUC is sandwiched between a top contact layer 112, which is made into diffractive elements, and a bottom contact 120. The top contact 112 may be made of 4000 Å GaAs with doping density of $1E18$ $cm^{-3}$. The top absorbing layer 116, which is the LW layer, may comprise 19 periods of 68 Å GaAs/35 Å $Al_{0.38}Ga_{0.62}As$ with doping density of $0.8E18\ cm^{-3}$ in the GaAs well. The blocking barrier 117 may be a 1000 Å AlGaAs with the Al composition be graded from 0.22 to 0.38 from top to bottom, and may be undoped. The bottom absorbing layer 118, which is the MW layer, may comprise 96 periods of 38 Å $In_{0.25}Ga_{0.75}As$/55 Å $Al_{0.38}Ga_{0.62}As$ with doping density of $2E18\ cm^{-3}$ in the InGaAs well. The bottom contact 120 may be made of 7000 Å GaAs with doping density of $2E18\ cm^{-3}$. The number of periods and compositions may vary according to the detection wavelengths and the above structure is only an example.

With electromagnetic modeling, one is able to determine the coherent electromagnetic field distribution inside the detector active volume, which is occupied by a superlattice unit cell (SUC). A SUC comprises a band 1 absorbing layer 116 (e.g. the long wavelength band), a current blocking barrier 117, and a band 2 absorbing layer 118 (e.g. the mid wavelength band). In particular, the mid wavelength (MW) electric field distribution is evenly distributed along the thickness of the entire material as shown in FIG. 69B while that of the long wavelength (LW) band is situated within a short distance below the diffraction ring elements (DRE). Based upon this information, one is able to design the superlattice unit cell SUC layer structure properly. For example, a thin long wavelength layer 116 may be placed just below the diffractive elements 112 to match the long wavelength electric field location and a relatively thick middle wavelength layer 118 may be placed below the blocking barrier 117 to match the evenly distributed mid wavelength electric field distribution. By matching the absorbing layers with the optical electric field locations, one can achieve sensitive detection in both bands. If the order of the layer arrangement is reversed, the detector will not be sensitive in the long wavelength (LW) band.

The resonant volume of the preferred embodiment comprises layers 116, 117, 118, and 120. The barrier layer 117 is a barrier for conducting electrons, but not a barrier for light. As such preferably there are be no boundaries to light within the detector volume as it travels through all layers as one single layer since the refractive index of all the layers are the same. The boundary for light is at the top metal layer, the bottom material/air interface, and the vertical mesa sidewalls. The light bounces around within these boundaries and establishes an interference pattern, as shown in FIGS. 69 B and D. The interference pattern depends on the wavelength of light. At the wavelength of 5.1 um, as shown FIG. 69B, the resonant |E| field is evenly distributed along the vertical z axis. Therefore, the MW absorbing layer is placed at the bottom of the layer stack, and it is relatively thick. But at the wavelength of 8.7 μm, the strong |E| field extends only narrowly from the top of the resonant volume. Therefore, the LW absorbing layer is placed in this part of the detector volume with its thickness matching the |E| extension. According to the preferred embodiment, the thickness of the absorbing layers is designed and placed in the appropriate locations according to the resonant |E| field patterns.

Figure 67A:
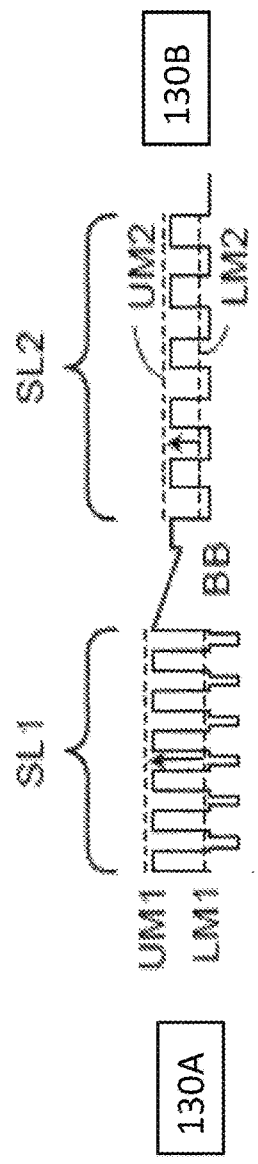
FIG. 67A is a depiction of a superlattice unit cell (SUC) under zero bias.
Figure 67B:
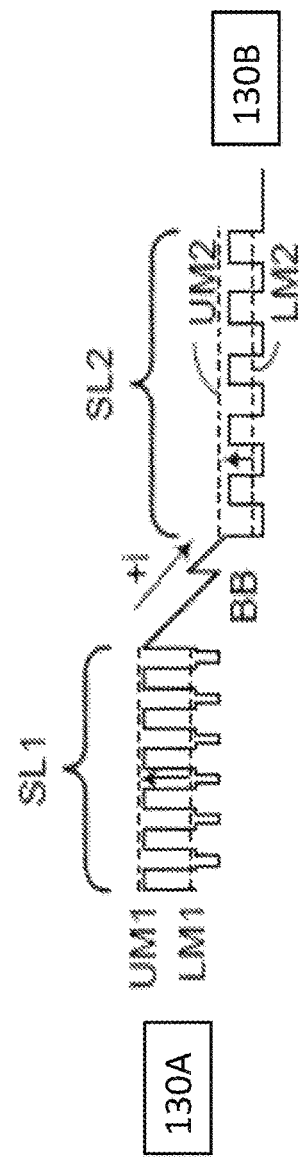
FIG. 67B is an illustration depicting when a positive bias (arbitrarily defined) is applied across the metal contacts 130A, 130B, wherein the photocurrent (+i) from the superlattice 1 (SL1) passes through the blocking barrier (BB).
Figure 67C:
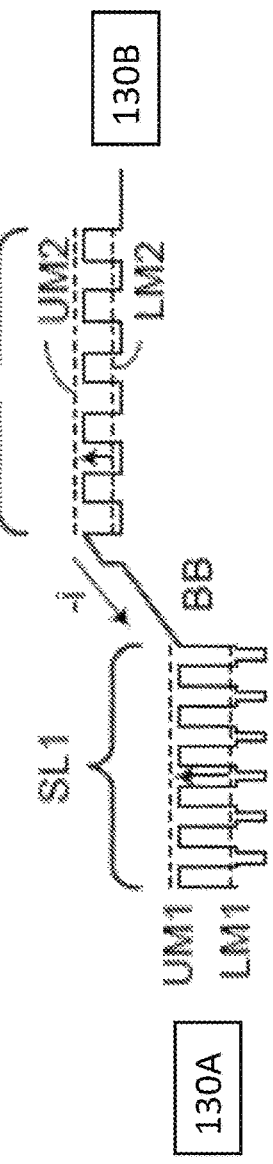
FIG. 67C is an illustration depicting the result when a negative bias (arbitrarily defined) is applied across the metal contacts 130A, 130B, wherein the photocurrent (−i) from the superlattice 2 (SL2) passes through the blocking barrier (BB).

FIGS. 67A through 67C show the energy levels and band structure of a superlattice unit cell (SUC) under different bias conditions. FIG. 67A shows the band diagram under zero bias. In the quantum well superlattice SL1, there are two minibands (lower and upper) LM1 and UM1. The electrons located in LM1 can absorb infrared light of a particular wavelength band (band 1) and be promoted to UM1. Likewise, in the quantum well superlattice SL2, there are two minibands LM2 and UM2. The electrons resided in LM2 can absorb infrared light of another wavelength band (band 2) and be promoted to UM2. The wavelength band is determined by the energy difference between the respective minibands in each superlattice. Since electrons can conduct efficiently in any minibands, the promotion to the upper minibands does not affect the current flow within each superlattice when a voltage is applied across the superlattices individually.

Since the two superlattices in the SUC are highly conductive both with and without light, they act as conducting contact layers when a voltage is applied to the entire unit of SUC. The current flow across the SUC is then determined by the resistance of the current blocking barrier (BB) between the two SLs. The resistance of BB is in turn determined by the electron populations in UM1 under positive bias and UM2 under negative bias since only those electrons are energetic enough to overcome the barrier height of BB and can pass through the barrier. Since the electron populations in UM1 and UM2 are determined by the light intensity in band 1 and band 2 respectively, the current flow across the SUC under different bias polarities will reveal the radiation intensity in the respective bands. FIG. 67B shows the current flow (+i) from UM1 in SL1 to SL2 when the metal contact 130B is biased positively relative to the metal contact 130A. The current flow will be directly proportional to the UM1 electron population, which in turn depends on the light intensity in band 1. Likewise, FIG. 67C shows the current flow (−i) from UM2 in SL2 to SL1 when the metal contact 130B is biased negatively relative to the metal contact 130A. The current flow in this case will be directly proportional to the UM2 electron population, which in turn depends on the light intensity in band 2.

To further explain the detector operation, one can consider a detector structure in FIG. 68A-C. FIGS. 68A through 68C are diagrams illustrating a stand-alone superlattice structure (SL1) together with a blocking barrier (BB). The SL2 layer on the right of the SUC is replaced by a contact layer. No high energy electrons are present in this usual contact layer with or without light in band 1. The stand-alone superlattice structure (SL1) comprises a number of quantum wells (QWs) that are strongly coupled such that the ground states of the QWs share energy across SL1 and, also, the excited states of the QWs share energy across SL1. The shared energy of the ground states is referred to as the lower miniband (LM1) while the shared energy of the excited states is referred to as the upper miniband (UM1). The stand-alone superlattice structure (SL1) of FIGS. 68A through 68C may be used to construct a detector, as further described in FIGS. 4A through 4C in U.S. Pat. No. 7,217, 926, herein incorporated by reference. However, SL1 of FIGS. 68A through 68C, while capable of absorbing radiation, does not function as a detector because both the upper miniband (UM1) and the lower miniband (LM1) of SL1 are equally conducting. Stated differently, in the absence of other structural components that limit the flow of electrons, the stand-alone structure of FIGS. 68A and 68C does not function as a detector. In order to convert SL1 into a detector, a thick blocking barrier (BB) is added to one end of SL1. The blocking barrier BB allows electrons in UM1 to conduct through the entire structure from one contact 130A (+z) to another contact 130B (−z). However, the blocking barrier BB blocks the conduction of electrons in LM1. The current due to the electrons in UM1 is designated as i2, while the current due to the electrons in LM1 is designated as i1. Without the presence of light, the electrons are located only in LM1. Since BB prevents the conduction of electron in LM1 passing from contact 130A into contact 130B, it is reduced to zero and there is no current flow within the circuit. In contrast, in the presence of light, electrons in LM1 absorb light and promote (or excite) to UM1. These photoelectrons in UM1, thus, create an electrical current i2. Since BB permits conduction of electrons in UM1, i2 is unaffected by BB. Hence, the photocurrent +i under positive bias from the structure of FIG. 68A is equal to i2. Given these conditions, the stand-alone structure SL1, in combination with BB, functions under a positive bias, but does not function under a negative bias.

As shown in FIG. 68B, when a positive bias is applied, low-energy electrons entering from the top contact 130A pass into LM1, where the low-energy electrons absorb energy at wavelength Al. The absorption of energy promotes (or excites) the low-energy electrons into high-energy electrons in UM1. The high-energy electrons in UM1 pass into the conduction band of the blocking barrier BB and are collected at the contact 130B. The collected electrons lose energy to phonons (dissipation of energy to the lattice) and plasmons (transfer of energy to surrounding electrons), and, hence, become low-energy electrons. As shown in FIG. 68B, the presence of energy (e.g., light) allows the electrons to complete the circuit, thereby resulting in a large current +i. Conversely, in the absence of energy (e.g., light), the low-energy electrons in LM1 do not transition to UM1. Hence, in the absence of energy, the conduction of low-energy electrons in LM1 is blocked by BB.

As shown in FIG. 68C, when a negative bias is applied, low-energy electrons enter from the contact 130B. These low-energy electrons are blocked by BB. Since the low-energy electrons have not yet reached SL1, the low energy electrons do not transition into high-energy electrons. Hence, the low-energy electrons do not overcome the blocking barrier BB and, therefore, the electrons do not complete the circuit. In this regard, the current flow in the circuit remains low due to the low-energy electrons being blocked by BB, both in the absence of light and in the presence of light. The photocurrent −i under negative bias is, thus, zero. This situation remains true when SL2 is present in the contact layer respective to band 1 radiation since band 1 radiation does not create high energy electrons in UM2. Further details relating to the superlattice structures are described in U.S. Pat. No. 6,979,825, entitled "Quantum-Grid Infrared Photodetector (QGIP) Spectrometers and Related Methods," by Kwong-Kit Choi (inventor herein), filed on Apr. 11, 2003 (herein incorporated by reference as reproduced herein in its entirety). Referring now to FIG. 69A, when light is incident from the bottom of the detector as shown in FIG. 64, an interference pattern is established in the detector. With the preferred detector geometry displayed in FIG. 64, one can achieve maximum E in both wavelength bands (located in layers 116 and 118) centered at 5.1 μm and 8.7 μm simultaneously. Referring now to FIGS. 69A-D, FIG. 69A illustrates the $E_z$ distribution in the mid plane of the MW layer 116 at λ=5.1 μm, FIG. 69B illustrates the center plane across the middle of the rings at λ=5.1 μm, FIG. 69C illustrates the mid plane of the LW layer at λ=8.7 μm, and FIG. 69D illustrates the center plane across the middle of the rings at λ=8.7 μm. However, the $E_z$ distribution in the vertical direction (the z direction) is different in different bands as seen in FIGS. 69B and 69D. The $E_z$ distribution at wavelength λ=5.1 μm is broadly distributed across the two active layers. In contrast, E at λ=8.7 μm is strongly localized within 0.2 μm below the diffractive elements (DEs). With this information from electromagnetic modeling, the detector layers are designed to be 0.2 μm thick for LW, which is on top of a 0.9 μm thick MW layer, separated by a 0.1 μm thick barrier layer. With this geometrical resonant design coupled with the described material structure, strong infrared absorption will take place in the respective layers, and a sensitive dual band detector is realized.

Optical Resonances at Multiple Wavelengths

Optical resonances can occur at multiple wavelengths simultaneously for a given detector pixel volume and diffractive element (DE). When an incident light of a broad spectrum hits the diffractive element, light of different wavelengths is diffracted at different angles according to Bragg's law: 2d sin ∂=nλ, where d is the spacing between the two closest geometrical objects (GOs), ∂ is the diffraction angle, n is the diffraction order, and λ is the wavelength in the detector material. Some of these angles can give rise to constructive interference in a pixel volume, leading to several resonant wavelengths. Furthermore, since light with a particular λ and its overtones λ, λ/2, λ/3, . . . will diffract at the same angle ∂ in different orders, light at the overtone wavelengths can resonate under the same volume as the fundamental wavelength. For this particular reason, detectors can be generally designed with λ and its first overtone λ/2 for two-color resonant detection. If λ falls into the 8-10 μm wavelength band, its first overtone will fall into the 4-5 μm band, thus creating a long wavelength/mid wavelength resonant detector. In addition to diffraction along the closest geometrical object (GO) neighbor plane, diffraction can occur diagonally, in which the spacing d assumes a different value. A different spacing will give rise to a new series of Bragg diffractions, creating more resonant wavelengths. Overall, there can be multiple resonant peaks at different wavelengths for a given resonator structure. The goal of a multi-wavelength design is to choose the shape of the geometrical objects (GOs), their distribution, and the pixel volume to provide strong resonances at the wavelengths of interest simultaneously. FIGS. 57A and 57B shows a design example that provides three resonant peaks that match the three atmospheric transmission windows.

FIG. 70 is a further example of a graph showing two resonant peaks representing the calculated quantum efficiency (QE) in each absorbing layer of a dual band Quantum Well Infrared Detector (QWIP). The thin lines (forming shaded areas) represent the radiation transmission in the atmosphere. The darker dashed curve shows the calculated detector quantum efficiency spectrum under positive bias and the solid line shows the detector quantum efficiency under negative bias. Both bands exceed 50% QE. The detection spectrum of this dual band detector match well with the atmospheric transmission windows. When the detector is biased positively at the bottom contact relative to the metal reflector at the top contact, only the long wavelength band is detected. Conversely, under negative bias, only the mid wavelength band is detected.

Detectors with Polarization-Independent Absorption

The resonant structure of the preferred embodiments is also applicable to areas other than polarization dependent quantum well infrared photodetectors (QWIPs), such as, achieving broadband resonance to match the broadband absorption characteristics of bulk infrared material such as Mercury Cadmium Telluride (MCT) materials and bandgap engineered materials such as InAs/InAsSb type II strained superlattice (SLS) materials. Also within the scope of the present invention is achieving broadband resonant absorption for solar cells and thermophotovoltaic cells.

The diffractive elements diffract light at a large off-axis angle to create a sizable $E_z$ component from the $E_x$ and $E_y$ components of the normal incident light. The fact that the obliquely traveling light cannot escape the absorption volume creates an opportunity to greatly increase the internal optical intensity via resonance. The large optical intensity benefits all types of detectors regardless of their polarization absorption properties. It lessens the requirements of the material thickness t and its absorption coefficient α. Near the absorption cutoff wavelength of the material where α is small, the resonant structure enhances its quantum efficiency and thus expands the cutoff wavelength of the material.

In applying the concept of resonance to mercury cadmium telluride (also cadmium mercury telluride, MCT or CMT) materials, for a plain layer of MCT material with a refractive index n, absorption coefficient α, and thickness t, the classical QE of a non-resonant detector is given by $$QE = \frac{4\pi}{(1+n)^2}(1 - e^{-\alpha \cdot 2t}), \quad (A\text{-}1)$$

where 2t is the round-trip optical path length of light inside the material layer. Assuming a constant α of 0.2 μm$^{-1}$, the classical QE is 27.5% for a thickness of 1.2 μm. However, when the MCT material is fabricated into a resonant detector, its QE is given by $$\eta = \frac{1}{P_0}\int_V dI(\vec{r}), \quad (A\text{-}2)$$
$$= \frac{n(\lambda)\alpha(\lambda)}{AE_0^2}\int_V |E_z(\vec{r})|^2 d^3r,$$

where $P_0$ is the incident optical power, I is the internal intensity, E(r) is the total optical electric field under resonance, $E_0$ is the incident optical electric field, and A is the detector area. The preferred embodiment resonant MCT structure shown in FIG. 71 comprises an active HgCdTe infrared absorbing material sandwiched between a top CdTe contact layer, which is fabricated into DEs, and a bottom CdTe contact layer. The top surface is covered by a metal layer, which is not shown. The embodiment shown in FIG. 71 may, for example, have a pixel area of 24 μm×24 μm and an absorbing layer thickness of 1.2 μm.

Figure 72:
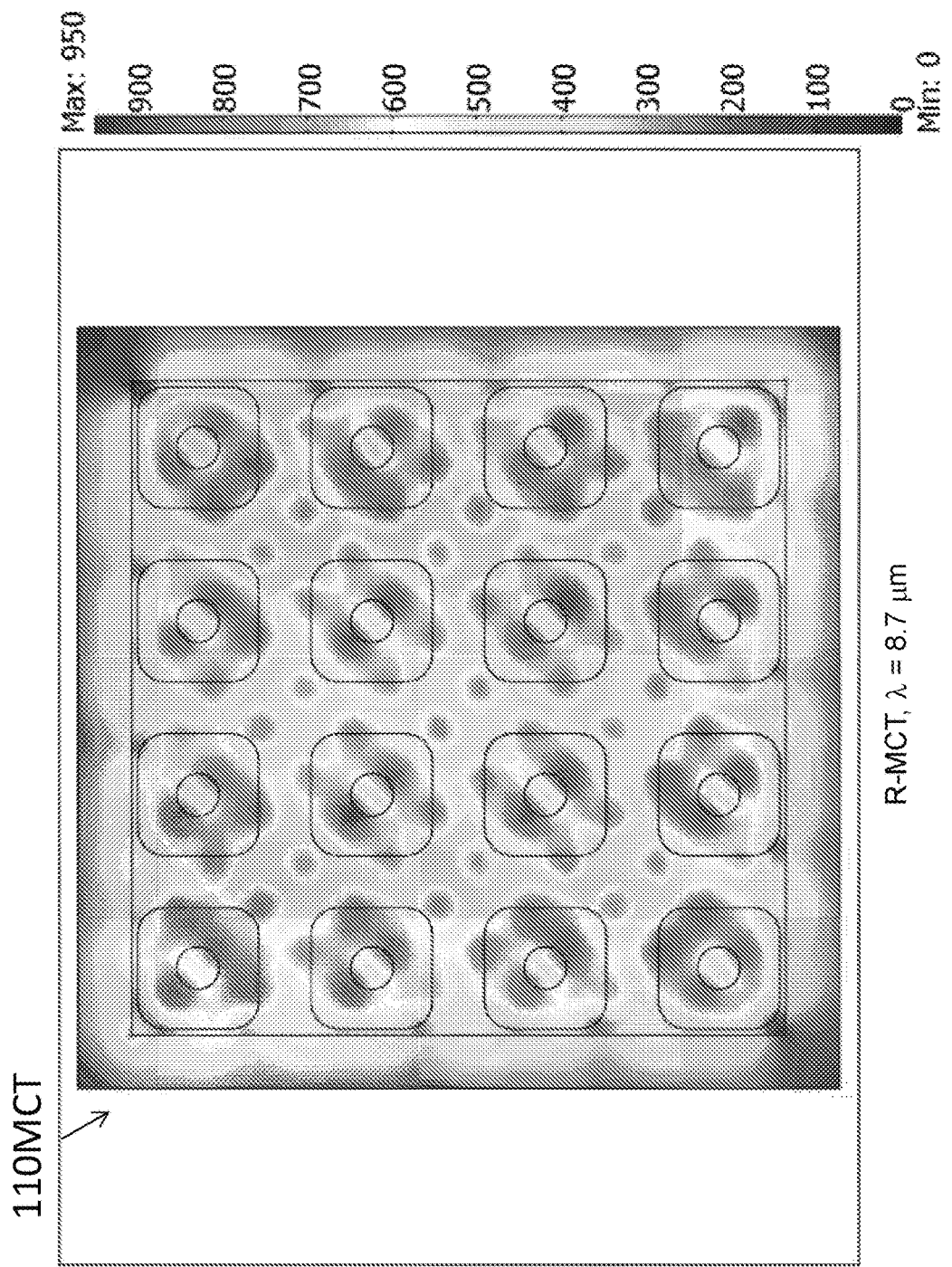
FIG. 72 is an illustration showing the horizontal cross section of the |E| distribution in the mid plane along the x-y direction for the alternate preferred embodiment shown in FIG. 71. Shown is the |E| distribution at the mid plane of the absorbing layer and at the resonant peak wavelength of 8.7 µm.

FIG. 72 is an illustration showing the horizontal cross section of the absolute magnitude of the electric field (|E|) distribution in the mid plane along the x-y direction for the alternate preferred embodiment 110MCT shown in FIG. 71. Shown is the |E| distribution at the mid plane of the absorbing layer and at the resonant peak wavelength of 8.7 μm.

Figure 73:
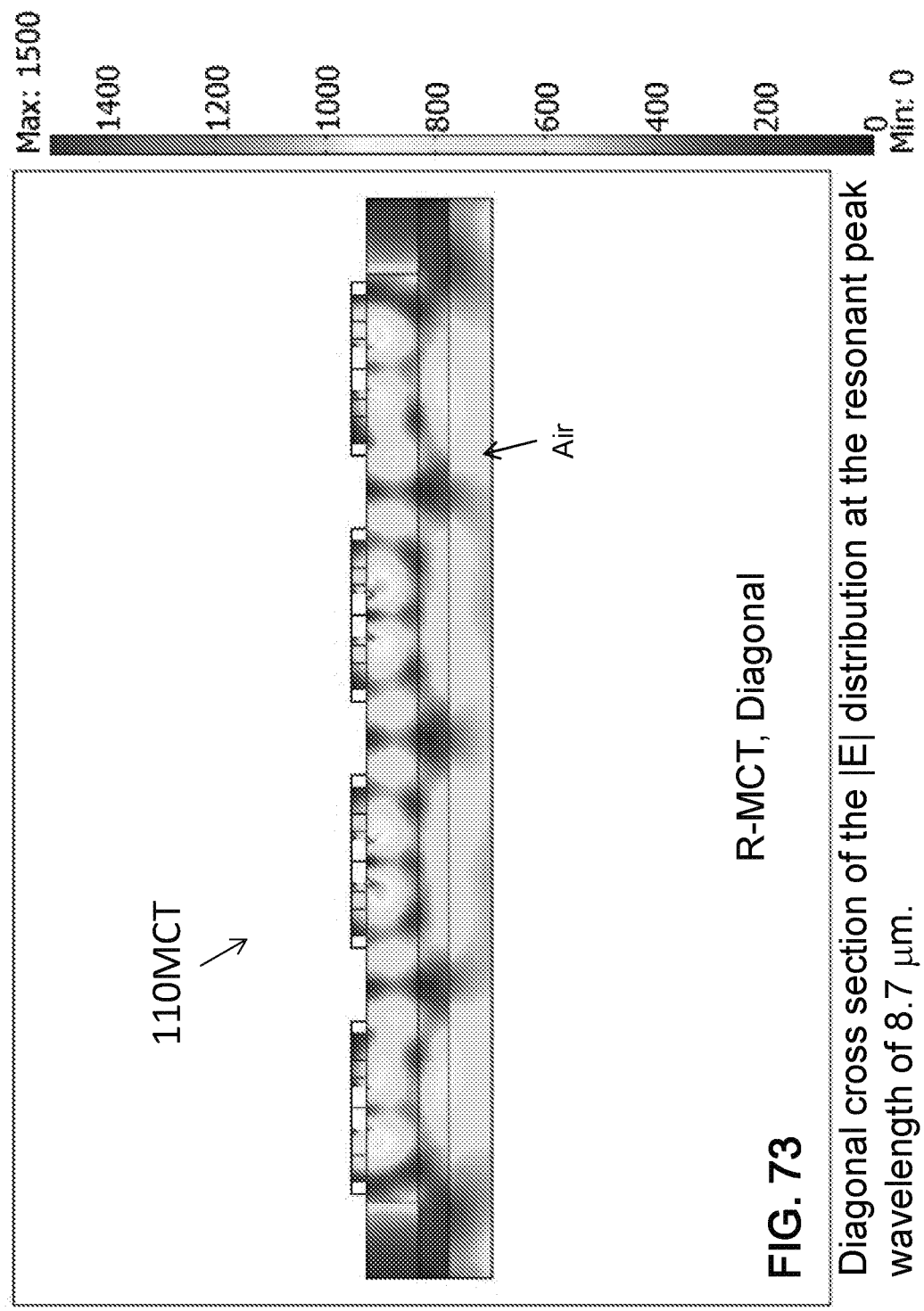
FIG. 73 is an illustration showing the |E| distribution in the diagonal cross-section along the z direction for the preferred embodiment resonant mercury cadmium telluride MCT structure shown in FIG. 71.

FIG. 73 is an illustration showing the horizontal cross section of the |E| distribution in the diagonal cross-section of the absorbing layer along the z direction for the alternate preferred embodiment 110MCT shown in FIG. 71. FIG. 73 shows the diagonal cross section of the |E| distribution at the resonant peak wavelength of 8.7 μm.

Figure 74:
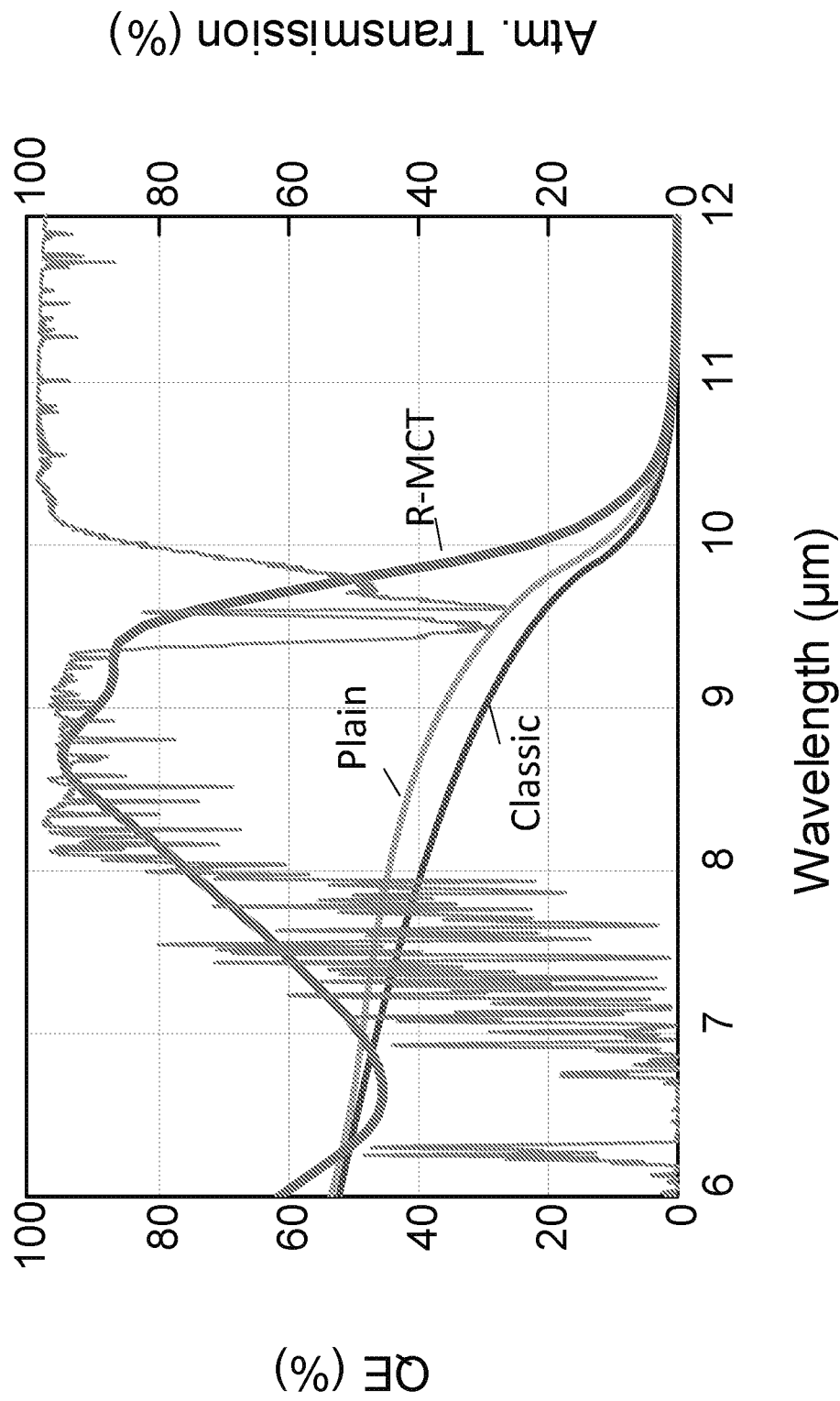
FIG. 74 is a graphical illustration showing the calculated QE for a classical material without mesa sidewalls, a detector with a plain mesa, and a detector with the resonant structure shown in 71.

FIG. 74 is a graphical illustration in which the calculated |E|, the QE of the alternate preferred embodiment MCT resonator structure of FIG. 71 is evaluated. Shown in FIG. 74 is the calculated QE for a typical wavelength varying α of MCT. At λ=9 μm, α is about 0.2 μm$^{-1}$. Using the classical quantum efficiency calculation equation (A-1) (shown above), the quantum efficiency is calculated to be about 27%. Due to diffraction effects along the detector mesa perimeters, a plain detector with vertical sidewalls has a slightly higher quantum efficiency at 35%. However, using a resonant structure, the QE increases to 92% at the peak wavelength. This calculation demonstrates the benefits of a resonant structure when it is applied to isotropic absorption materials. Also shown in FIG. 74, for comparison purposes, is the calculated QE at different wavelengths for a classical material without mesa sidewalls, a detector with a plain mesa, and a detector with the resonant structure shown in FIG. 71.

Figure 75:
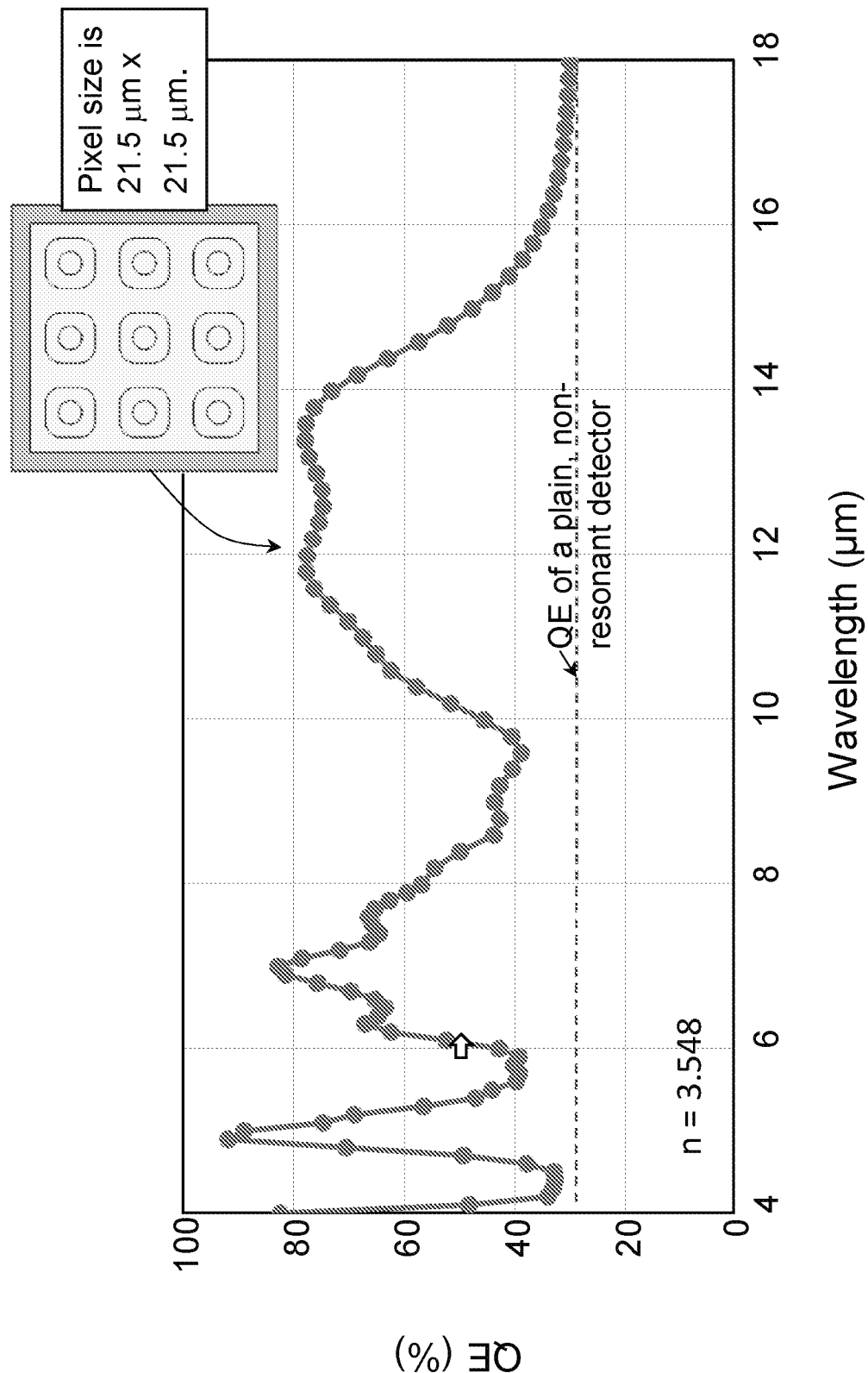
FIG. 75 is a graphical illustration showing a comparison of a resonant photodetector to the quantum efficiency of a plain, non-resonant photodetector (as shown by dashed line) Also shown in an insert is an alternate preferred embodiment resonant detector structure for which dimensions of the pixel size are 21.5 µm×21.5 µm.

In order to show that the resonant structure can provide a broad enhancement to an isotropic material, FIG. 75 is an illustration showing an alternate preferred embodiment resonant detector structure having a broad resonant enhancement. The structure dimensions are shown in the insert where the pixel size is 21.5 μm×21.5 μm. The dashed line shows the QE of a plain, non-resonant detector. The diffractive element pattern is shown in the insert. The embodiment shown in FIG. 75 provides a general quantum efficiency increase to an isotropic detector having a constant α of 0.2 μm$^{-1}$. Without the benefit of resonance, the classical quantum efficiency would have been 30%. Instead, using resonance, the quantum efficiency is increased to 80% or higher at certain wavelength regimes.

The principles of the present invention can be utilized with other materials, such as, for example, another isotropic absorption material, which is the InAs/InAsSb type II strained superlattice (SLS). A superlattice is a series of thin layers of two semiconductors alternately joined together. Different from the quantum well superlattices in QWIPs, InAs/InAsSb type-II SLS forms a lower miniband in valance band of InAsSb and the upper miniband in the conduction band of InAs. Because of the interband nature of the optical transition, the infrared absorption is isotropic, independent of the optical polarization, similar to the bulk MCT materials.

Figure 76:
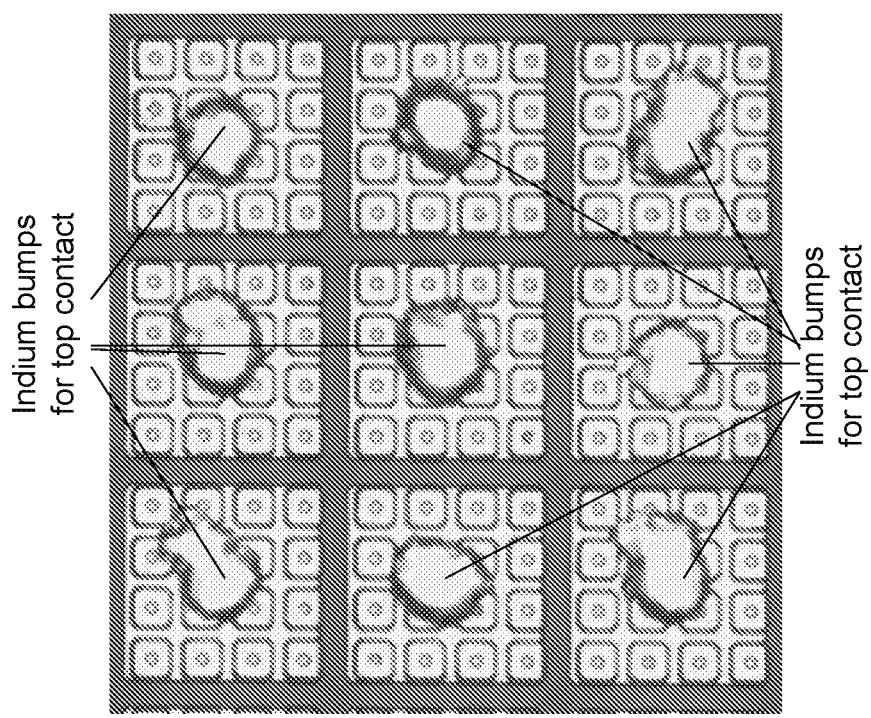
Figure 77:
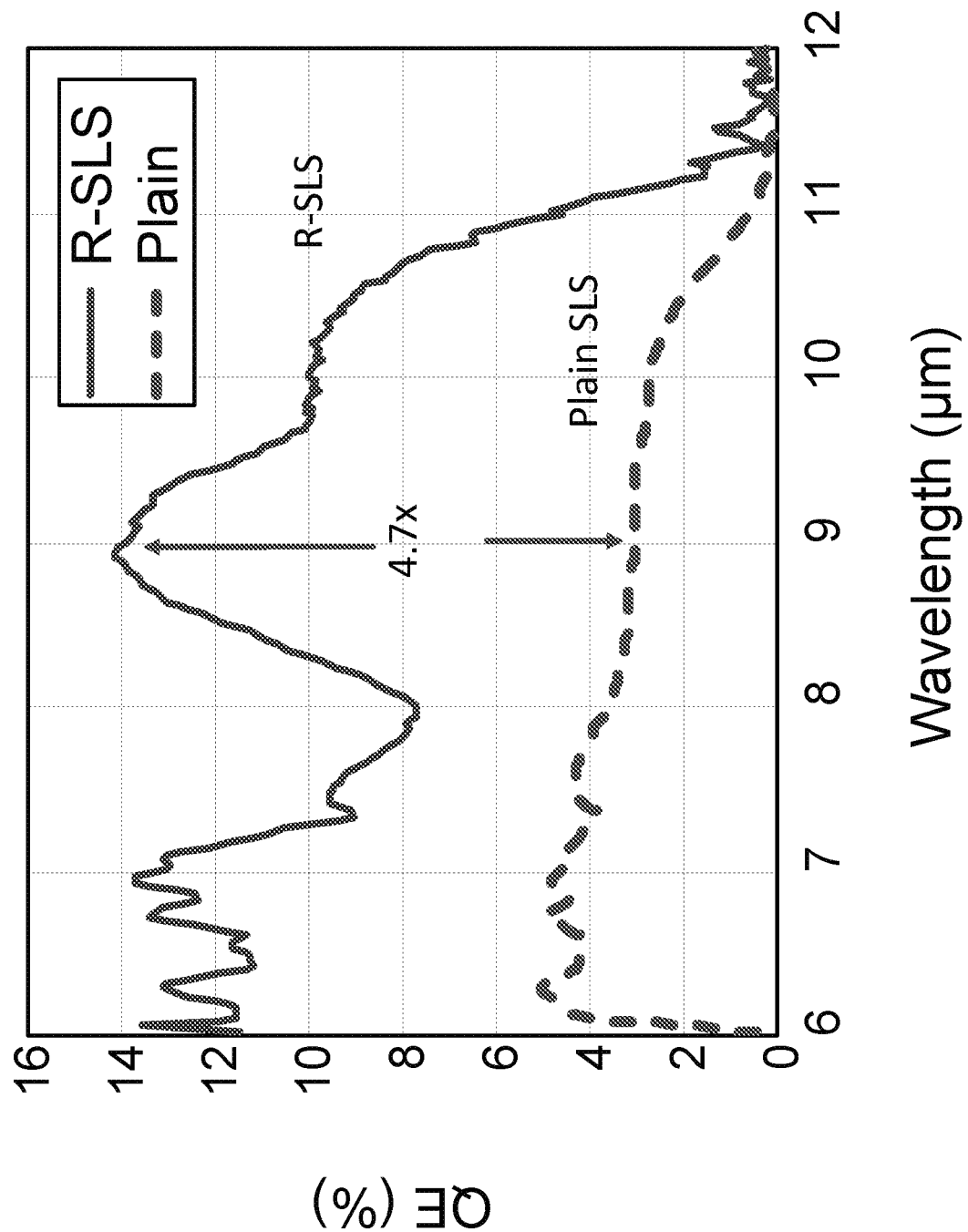

Similar to the resonant structure shown with respect to the preferred embodiment of FIG. 71, FIG. 76 illustrates the fabricated superlattice (SLS) detector structure, and FIG. 77 illustrates the measured QE spectrum. As illustrated in FIG. 77, the resonant structure of FIG. 76 increases the quantum efficiency in comparison to a plain SLS detector, which in this case is 3.0%, to 14.0% at 9 μm, a 4.7 times increase. The fabricated resonant SLS detector structures shown in FIG. 76 comprise blobs of indium bumps at the centers of every pixels for top contact electrical connections.

Figure 78:
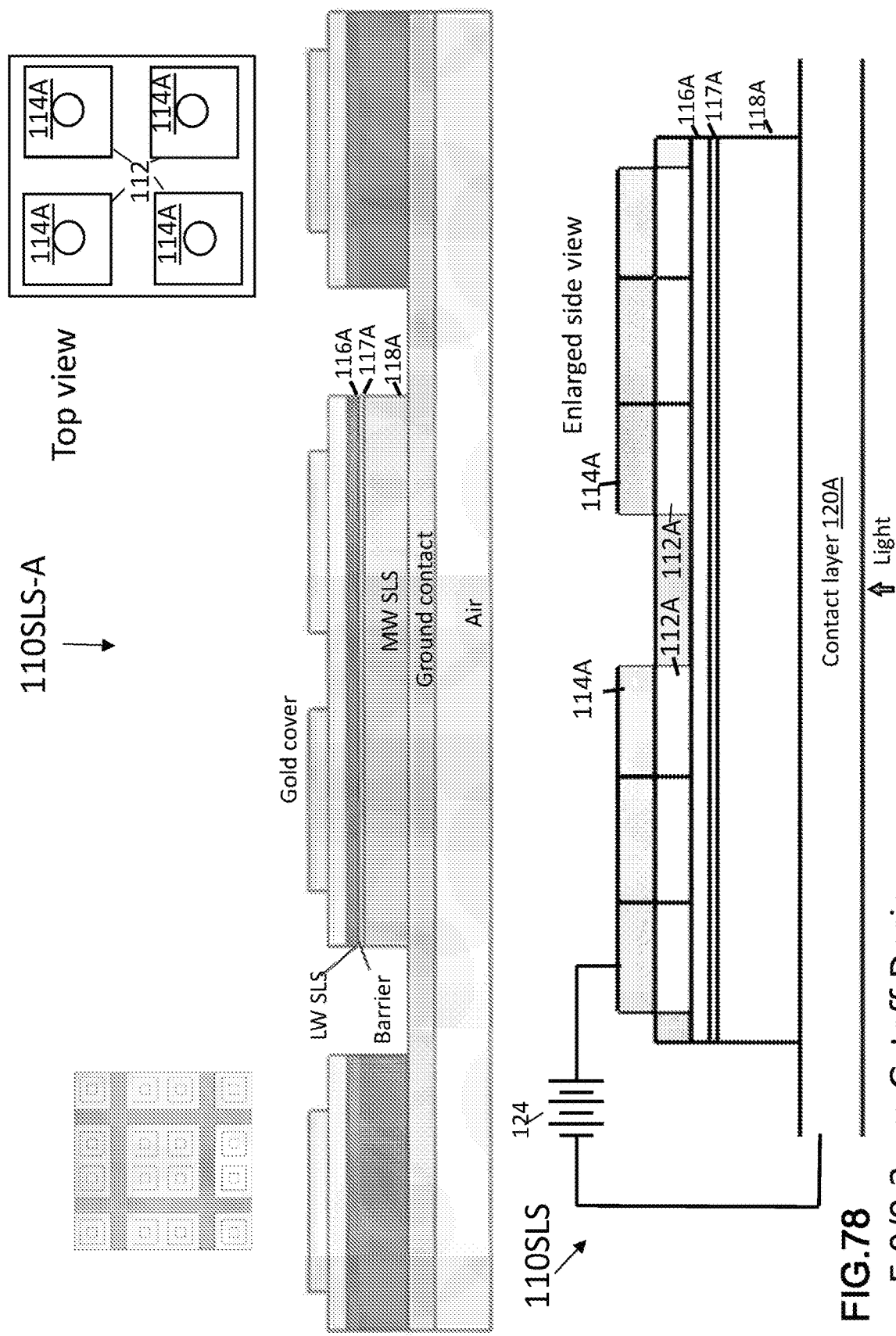

Resonant dual band detection can also be applied to MCT and type-II SLS as in QWIPs. FIG. 78 is an illustration of an alternate preferred embodiment 110SLS-A having a dual wavelength range which may be, for example, a mid-wavelength of approximately 5.0 μm and a long wavelength of approximately 9.2 μm. The two-color type-II strained layer superlattice (SLS) detector material is grown by molecular beam epitaxy. For example, the material may be grown on a GaSb wafer substrate. The structure comprises a ground contact layer 120A, a mid-wavelength absorbing layer 118A, a barrier 117A, a long wavelength absorbing layer 116A, and a top contact layer 112A, which may be etched into ring structures to form the diffraction elements. The ring-shaped diffractive elements 112A may be formed from GaSb and have height of approximately 0.34 μm and may be capped by a metallic layer 114 which may be a gold cover 5000A thick.

For embodiment of FIG. 78 the middle and long wavelengths are 5.0/9.2 μm. The middle wavelength absorber layer 118A and long wavelength absorber layer 116A each comprise a superlattice structure (SLS). As an example, the mid wavelength absorber layer 118A may comprise a superlattice structure (SLS) having 150 periods of $In_yGa_{1-y}As/InAs_zSb_{1-z}$ with a total thickness of 0.8 μm. The barrier layer 117A may be a single layer of $Al_{1-u}Ga_uAs_vSb_{1-v}$ with a thickness of approximately 0.1 µm. The long wavelength absorber layer 116A may comprise 18 periods of $InAs_p Sb_{1-p}$/InAs with a total thickness of 0.2 µm. The top contact layer 112A may be a single layer of GaSb with a thickness of 0.34 µm. The pixel pitch may be approximately 12 µm and the pixel size may be 10 µm. The ring-shaped diffractive elements 112 may have, for example, an inner ring dimension of 1.3 µm, an outer ring dimension of 3.3 µm and a ring center to center separation of 4.7 µm. The ground contact layer 120A may be approximately 5000 Å and comprise 64 periods of InAs/GaSb layers with a total thickness of 0.4 µm and 18 periods of $InAs_xSb_{1-x}$/InAs with a total thickness of 0.1 µm, with the total combined thickness of 0.5 µm.

The reason why the ground contact layer is a superlattice structure comprising periods of InAs/GaSb layers (as opposed to the singular layer for a quantum well structure) is because, in the case of GaSb and InAsSb, the carriers easily tunnel through the barriers and from mini-conduction bands and mini-valence bands. The carrier optical transitions between the minibands can be used for infrared absorption. With respect to quantum well infrared photodetectors (QWIPs), both minibands are within in the conduction band of GaAs/AlGaAs. For superlattice structures (SLS), the lower miniband is in the valance band of InAsSb and the upper miniband is in the conduction band of InAs. At the lower layer, it is undesirable to have the minibands in the absorbing layer be disturbed by the contact layer. If the contact layer is made of GaSb substrate material, the carriers of the minibands cannot cross over to the GaSb conduction band or valance band and be carried away. However, a similar superlattice structure can be made in the contact layer with very similar miniband structure, it just has a larger miniband energy gap so that it does not absorb light of interest.

Figure 79:
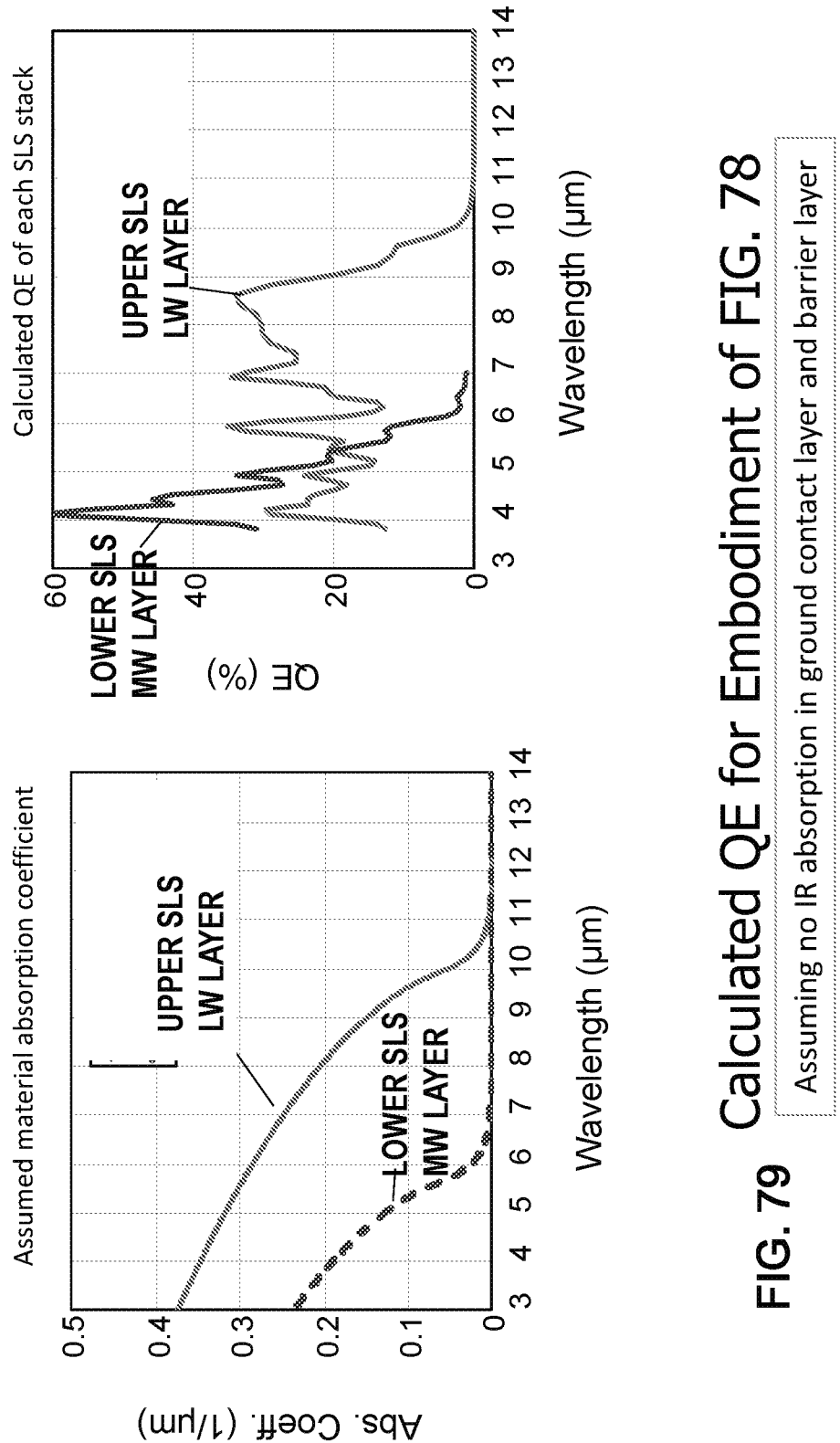
Figure 80:
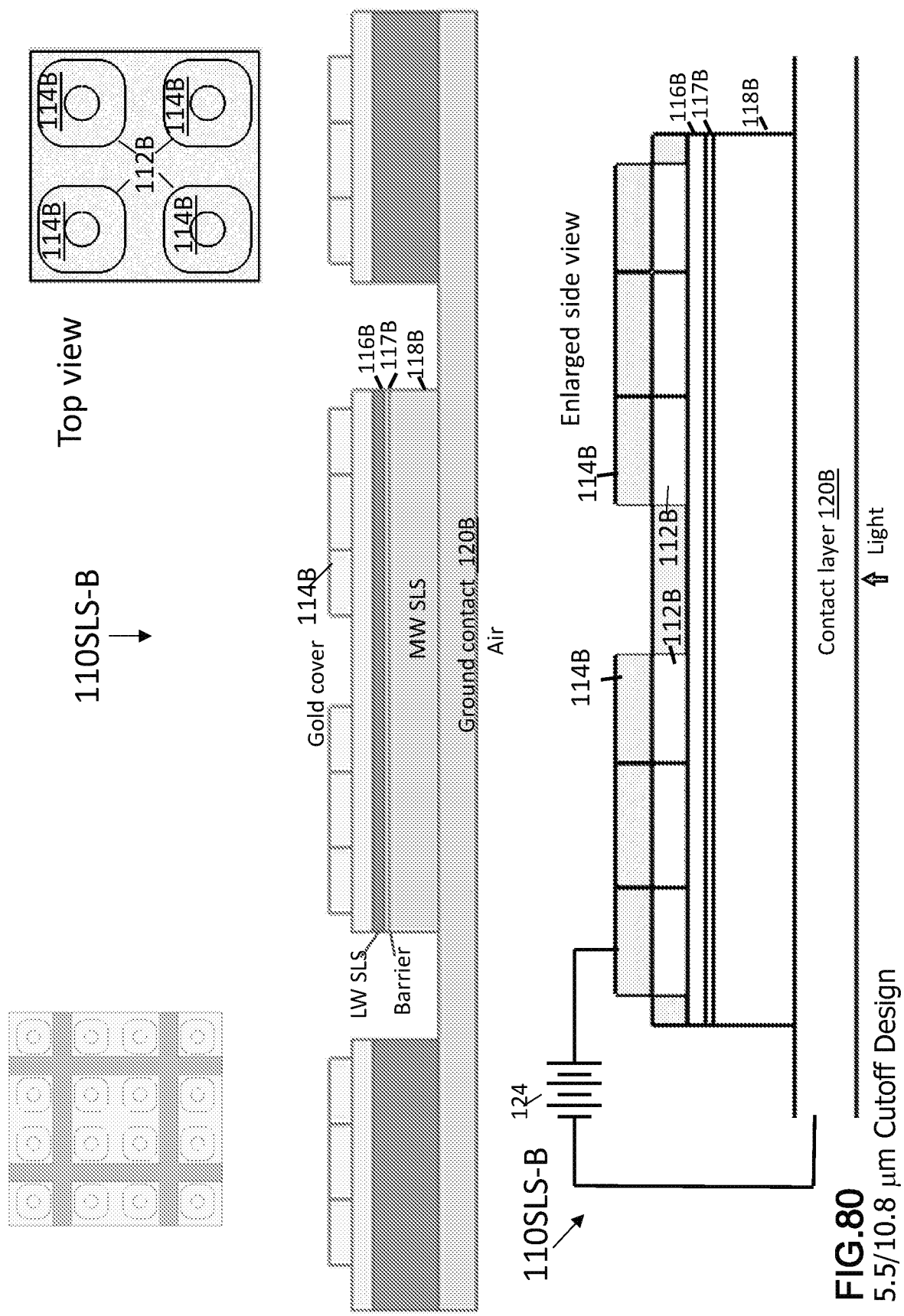

FIG. 79 is a graphical illustration showing, inter alia, the calculated quantum efficiency for the embodiment of FIG. 80

FIG. 80 is an illustration of an alternate preferred embodiment 110SLS-B with a different set of detection bands, which are 5.5 µm and 10.8 µm. To achieve a different resonant wavelengths from that in FIG. 79, the layer thicknesses may be designed to be, for example: top contact 112B (0.2 µm), LW layer 116B (0.2 µm), barrier layer 117B (0.1 µm), MW layer 118B (0.9 µm), and the bottom contact layer 120B (0.7 µm). The ring-shaped diffractive elements 112B may have, for example, an inner ring dimension of 1.5 µm, an outer ring dimension of 3.8 µm and a ring center to center separation of 5.5 µm.

Figure 81:
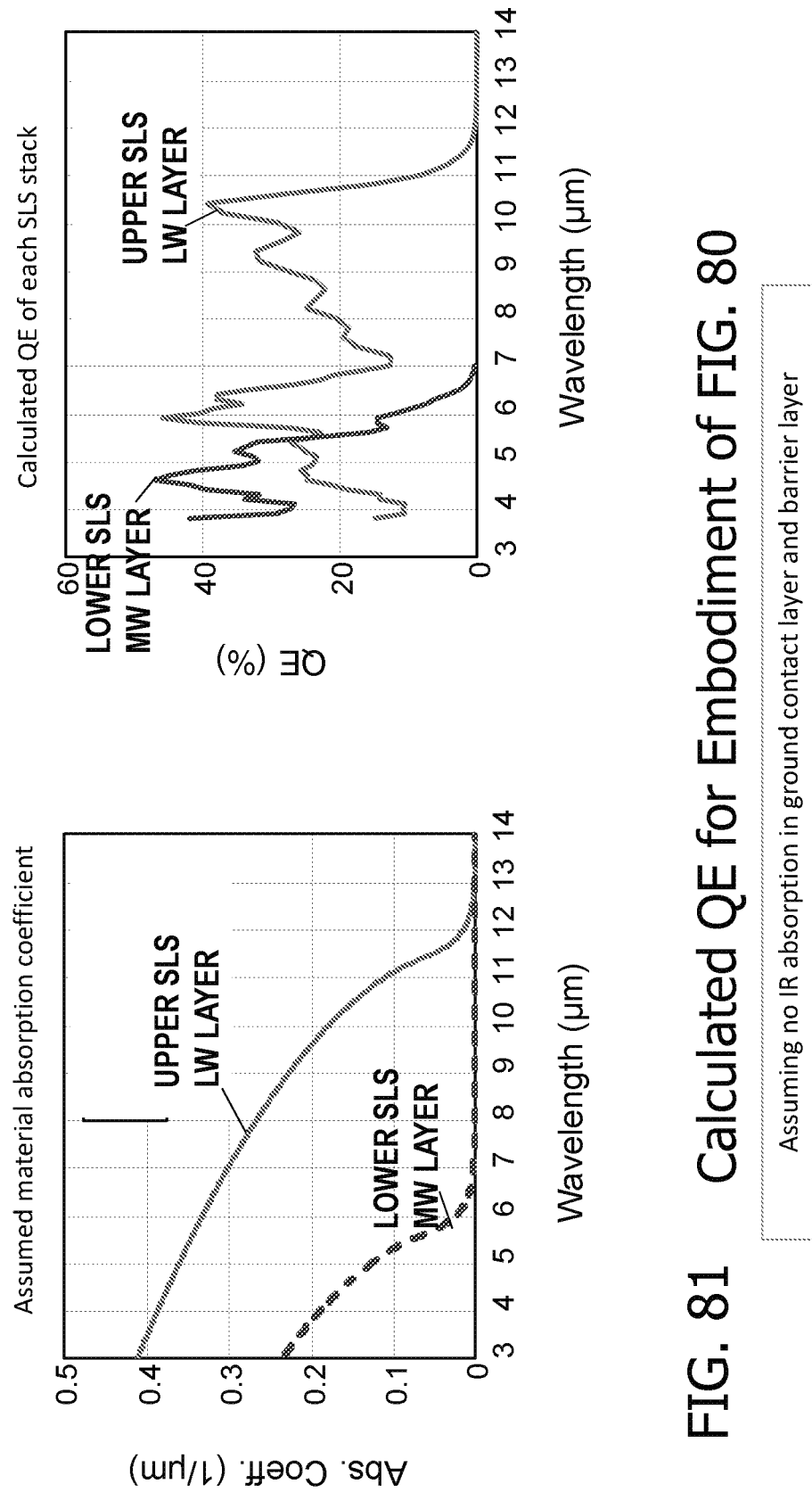

FIG. 81 is a graphical illustration showing, inter alia, the calculated quantum efficiency for the embodiment of FIG. 80.

The two-color type-II strained layer superlattice (SLS) detector is similar in function and application to the two-color QWIP detector. By using the SLS material, one can obtain a higher photocurrent than the QWIP material and thus the SLS detector can be operated at a higher speed and at a higher temperature. However, SLS material takes more time to grow, has lower material quality, is more expansive, has a larger spectral cross-talk, and has larger noise than the QWIP detector.

Solar Cells

The concepts of the present invention which enhance the quantum efficiency of photodetectors are also applicable to solar and thermophotovoltaic cells. Solar cells, which are operated in the visible wavelength regime, and thermophotovoltaic cells, which are operated in the infrared wavelength regime, behave similarly as the described infrared detectors but they are being used as power convertors. The generated photocurrent under a powerful light source, such as the Sun or a hot furnace, is used to power electrical equipment. Since Maxwell equations are the same at different wavelength scales, the resonant structures are the same as those in the infrared regime except that the physical dimensions of the device are scaled in proportion to the wavelength ratio. For example, by scaling down the physical dimensions of a $\lambda=9$ µm resonant detector by a factor of 15, the detector will resonate at $\lambda=0.6$ µm or 600 nm.

Figure 82:
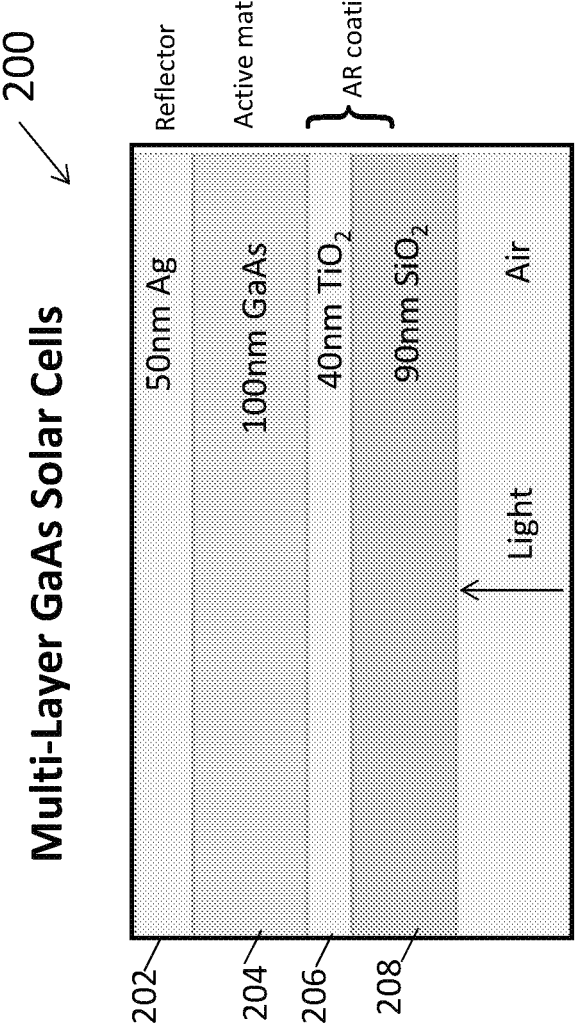
Figure 83:
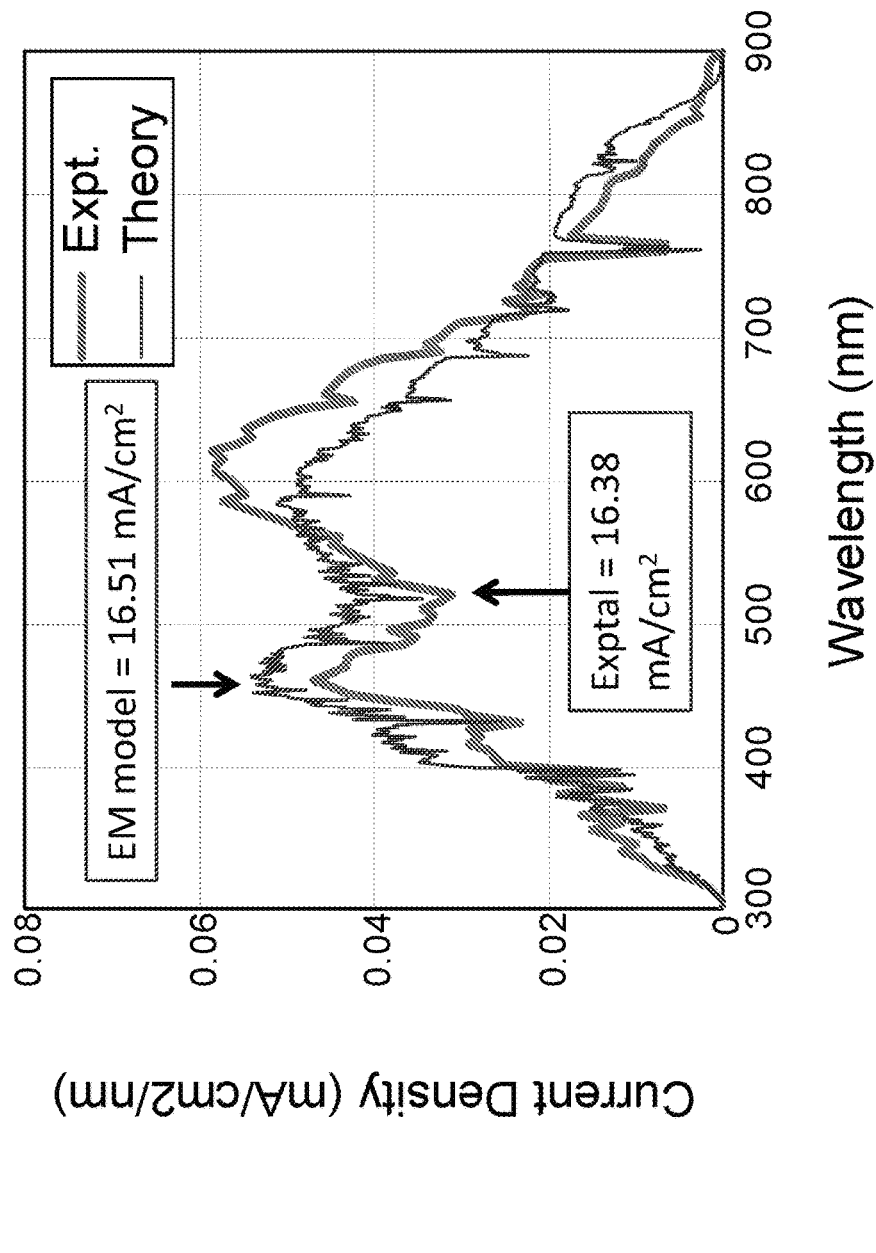
Figure 84:
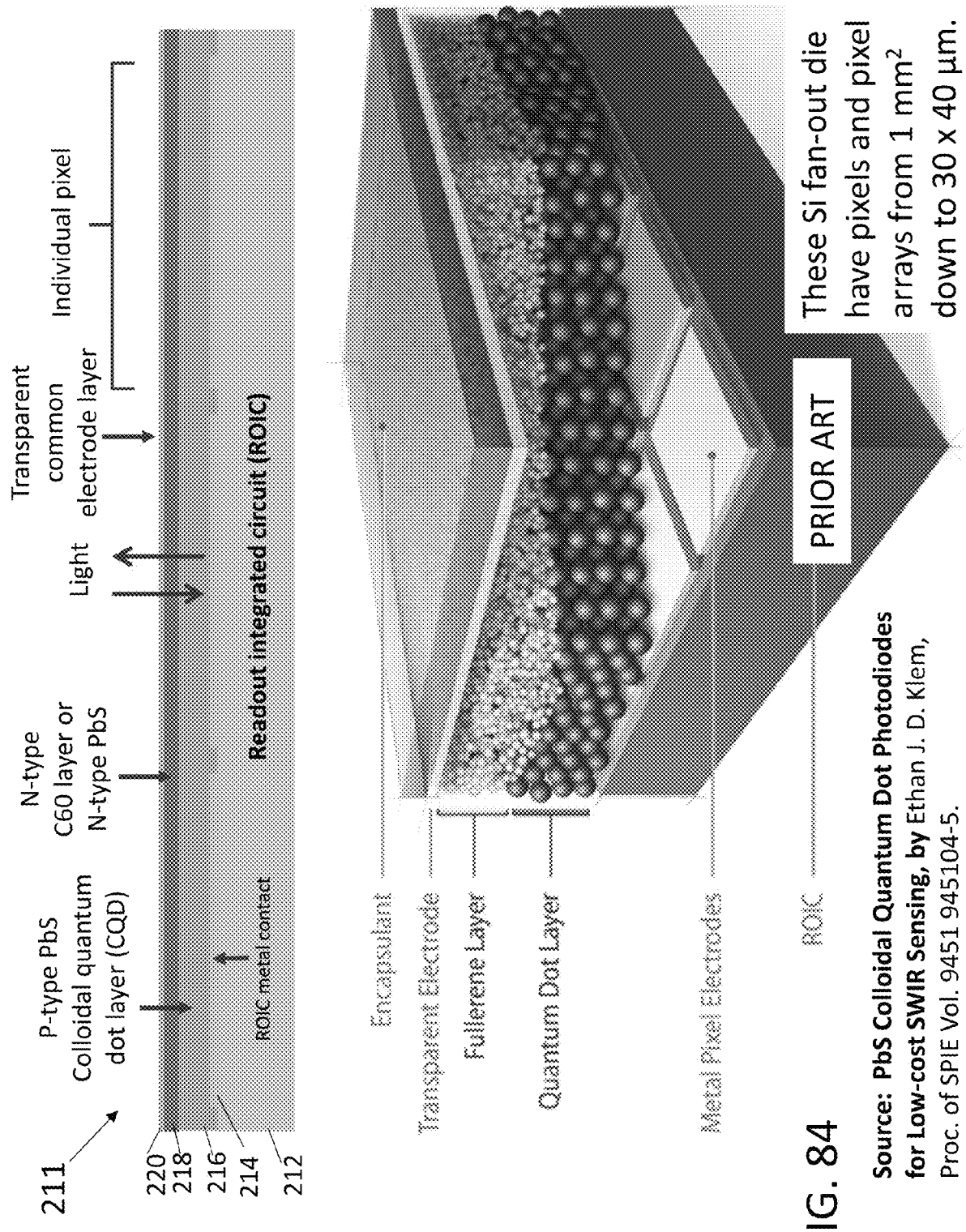

Electromagnetic modeling (EM) (see Equation (A-2) is applicable to the visible wavelength regime. Shown in FIG. 82 illustrates an alternate preferred embodiment multi-layer GaAs solar cell comprising an active GaAs layer 204 as the light absorbing material, which is sandwiched between a silver reflector top layer 203 and a TiO2/SiO2 bottom layer 206/208. Light is incident at the bottom layer, as shown in FIG. 82. FIG. 83 shows the calculated photocurrent density according to Equation (A-2), which agrees with the measured value. Therefore, by fabricating the solar cells using a resonant structure similar to, for example, FIG. 71 but with 15 times reduction in dimensions, the quantum efficiency and thus the power conversion efficiency will be increased.

In summary, the concepts of the present invention provide universal multiple wavelengths or broadband quantum efficiency enhancement for all types of electromagnetic wave sensors and energy convertors. For example, a resonant focal plane array camera can be used as an upgrade replacement for all non-resonant cameras. With its high quantum efficiency of about 70% without using an anti-reflection coating, the resonant detector is a sensitive detector structure in the long wavelength band and can be used to replace any detector system in use. Dual band R-QWIP FPAs, as well as dual band R-MCT and R-SLS FPAs, can be made in high resolutions such as 4 megapixels or higher and will be the unique choice for many mid wavelength and long wavelength applications in terms of availability, sensitivity, stability, reliability, speed, resolution, and cost. The applications include night vision, all weather navigation, infrared astronomy, space exploration, earth resources exploration, environmental protection, geological survey, homeland security, industrial quality control, maintenance and diagnostics, and medical imaging etc.

In general, a preferred embodiment resonant structure, constructed using the principles of the present invention, may comprise a layer of electromagnetic wave absorbing material that is made into a specific resonant size, and a set of diffractive elements on top the material layer to diffract the radiation back into the absorbing material in the manner that excites multiple or broadband resonances in that absorbing layer thereby increasing the quantum efficiency of isotropic as well as anisotropic EM wave absorbing materials.

Preferred Embodiment Resonator-Colloidal Quantum Dot (R-CQD) Detectors

Colloidal Quantum Dot detectors are known, as disclosed in, inter alia, the publication "PbS Colloidal Quantum Dot Photodiodes for Low-cost SWIR Sensing," by E. J. D. Klem, et al., Proc. of SPIE Vol. 9451, 945104 (2015). To increase the quantum efficiency, the present invention is directed to, inter alia, adding a diffractive metallic surface on to the ROIC metal contact pad, which has a set of rings as its diffractive elements as shown in FIG. 85. The present invention produces an increase in quantum efficiency of a 100-nm thick PbS detector by a factor of 2 to 6 in the entire range of wavelength investigated (i.e. from 900 nm to 1700 nm). Construction of the resonant Colloidal Quantum Dot Detector of the present invention may comprise using a computer simulation to determine an optimal configuration for at least one wavelength range occurring when waves reflected by the diffractive element form a constructive interference pattern inside the absorbing region. The detector material layer thicknesses may be adjusted to achieve optical resonance within the detector active volume, with which a resonant-Colloidal Quantum Dot (R-QCD) detector is formed.

The resonance of the preferred embodiments may also be achieved through experimentation by using the intrinsic material optical properties (n, k) as determined by ellipsometry measurements. The results of these measurements can be used to deduce (n, k); however, the present invention is not limited to this methodology, and encompasses using the known (n, k) from any source to optimize the resonant structure using EM modeling.

As mentioned in the preceding paragraphs, the rings are used to diffract the incident light at particular angles such that when they make a round trip circuit and go back to the original location, they will be in phase with the newly diffracted light. Both the (n, k) values and the distance traveled in the round trip loop determines the phase. Therefore, one method is to first determine or obtain the (n, k) value, then adjust the rings, the layer thicknesses, and the pixel size until the phase matching condition occurs. Optimally the average quantum efficiency within certain range of wavelength (0.9 to 1.7 µm in this case) is maximized rather than the peak value, so the detector parameters are varied systematically in steps to see the overall effects in different wavelengths for this type of modeling.

The extraction of (n, k) from the ellipsometry method is well known to those of ordinary skill in the art as reported, inter alia, at Wikipedia under "Ellipsometry." The present invention is not limited to any particular method as to how the (n, k) are determined.

The thickness of the various layers are determined by varying the thicknesses in steps in the computer model, which is performed automatically by programming. However, the thickness of the BCP/InO/AZO film, which is used for protection/encapsulation and for better electrical contact, can be made very thin and these layers do not change significantly the overall thickness. One can include this film in the QE optimization in principle if desired.

The computer modeling or programming may be done using COMSOL software using the procedure described in the COMSOL manual.

During device operation, photons are absorbed in both the PbS and the $C_{60}$ layers with photo-generated electron-hole pairs separated by internal electric fields, allowing for operation at low or zero external applied bias. However, applying a reverse bias across the diode structure can result in increased charge collection efficiency. PbS colloidal QDs serve as the primary absorbing layer at SWIR wavelengths. This layer is deposited from solution using a low-cost starting material and traditional solution processing techniques such as spin coating. The novelty of the structure is the use of a PbS-$C_{60}$ heterojunction that provides both efficient charge separation of photo-generated excitons and efficient charge carrier extraction. In this structure, holes are transported through the PbS (p-type) layer and electrons through the $C_{60}$ (n-type) layer.

Resonant infrared detectors may comprise two main components: a detector pixel volume and a diffractive element. The design of the diffractive element may begin with the size and shape of the geometrical objects (GOs) and their distribution. See for example the designs shown in FIGS. 5B, 6A, 12, 15A, 17A, 34, 42, 43, 50A, 50B, 51A, and FIG. 64.

The present invention is not limited to a particular geometric object design. The design of the geometric object may give rise to strong optical scattering in the wavelength range of interest. However, a strong scattering does not always produce a strong absorption in a confined space. Since light is an electromagnetic (EM) wave, it may be subjected to interference with the lights from other optical paths within the detector volume. In general, only a detector with certain size and shape can yield a phase matching condition such that the interference is constructive. Generally, under such condition, the light can circulate back to the same location with the same phase as the later incident light so that their electric fields superpose to produce a stronger optical intensity. In other words, certain detector sizes can resonate with the incident light of particular wavelengths, and the detector volume in this case is used as a resonator. The selection of the optimal design involves both the scattering elements on top and the pixel dimensions.

As explained in the foregoing, the detector pixel volume may further comprise of a bottom contact layer common to all pixels in an array, an active light absorbing volume (or region) with arbitrary sidewall profiles, and a top contact layer. The diffractive element (DE) may be placed on top of the top contact layer. The diffractive element may comprise a collection of geometrical objects placed on specific locations within the top contact area. These geometrical objects can be made of the same top contact material or a new material. The top contact together with the geometrical objects is then covered by a metal layer for ohmic contact and for light reflection and confinement. The pattern of the geometric objects can appear in any form. They can either be arranged in a regular array or be distributed randomly. The individual geometric objects can be of any size and shape in 3 dimensions, and they can also be voids in otherwise a solid layer of material. Some examples of the diffractive elements are shown in FIG. 50. This detector structure is used to detect light incident from the bottom of the detector. The design of the detector begins with the size and shape of the geometric objects and their distribution. They may give rise to strong optical scattering in the wavelength range of interest. However, a strong scattering does not always produce a strong absorption in a confined space. Since light is an electromagnetic (EM) wave, it may be subjected to interference with the lights from other optical paths within the detector volume. In general, only a detector with certain size and shape can yield a phase matching condition such that the interference is constructive. Generally, under such condition, the light can circulate back to the same location with the same phase as the later incident light so that their electric fields superpose to produce a stronger optical intensity. In other words, certain detector sizes can resonate with the incident light of particular wavelengths, and the detector volume in this case is used as a resonator. In this section, it is referred to as a resonator-Colloidal Quantum Dot Detector and the design involves both the scattering elements on top and the pixel dimensions.

Except for the textured metallic surface and the predetermined layer thicknesses, there may be no other differences in the production of Resonate-Colloidal Quantum Dot Detectors (R-CQDs) and planar CQDs. In a Resonator Colloidal Quantum Dot Detector array, there may not be physical sidewalls in each detector pixel for electrical isolation among different detector pixels. In this case, the resonant effects will be weaker than those with sidewalls as the light diffracted near the pixel boundary will be lost to the surrounding. Nevertheless, the quantum efficiency reduction is small for certain chosen material thickness such that the resonant structure sustains localized oscillating optical modes within each ring as schematically depicted in FIG. 85. Illustrated in FIG. 85 is a preferred embodiment Resonant Colloidal Quantum Dot detector 300 comprising a layer of p-type lead-sulfide (PbS) material 306 (used for forming quantum dots in a colloidal suspension) deposited directly on top of a metallic diffraction surface contact pad 304 of a readout integrated circuit (ROIC) 302. An n-type layer 308 of n-type carbon-60 (C60) may be deposited on top of the PbS layer 306 to form a PN heterojunction photodiode. Alternatively, the layer 308 may comprise n-type PbS so as to form a homojunction photodiode. A layer 310 of conducting, transparent material then covers the photodiode to serve as a common conducting layer.

Before designing the preferred embodiment Colloidal Quantum Dot detectors, electromagnetic (EM) modeling may be first applied to the prior art planar hetero- and homo-junction detectors. In these detectors, a composite layer of Aluminum doped Zinc oxide (AZO) and Indium oxide (InO) is served as the common contact layer. FIG. 86 shows the layer structures and the modeled quantum efficiency spectrum within the wavelength range of 900 nm to 1700 nm. In addition, the classical quantum efficiency is also calculated based on ray-tracing techniques for heterojunction. The classical quantum efficiency is consistent with the EM result, confirming the validity of the EM approach.

Referring now to FIGS. 87A and 87B, a heterojunction preferred embodiment Resonator-Colloidal Quantum Dot (R-CQD) detector with pixel size of 2.4×2.4 µm² with a 3 µm pitch is designed as show in FIG. 87A. In this optional detector structure, there may be physical sidewalls in each detector pixel. After a uniform PbS layer 306A is deposited onto the metallic diffractive surface 304A, the PbS layer 306A is etched into 2.4×2.4 µm² squares and the gaps in between are filled with an insulating dielectric material such as $SiO_2$. Afterward, a common layer 308A of fullerene C60 and a thin transparent contact layer 310A are deposited. The thickness of the BCP/InO/AZO film 310A, which is used for protection/encapsulation and for better electrical contact, can be made very thin and the layers 310A do not change significantly the overall thickness.

By using a set of 3×3 rings and designing and adopting a PbS layer 306A of 230-nm thick and C60 layer 308A of 180-nm thick, an average quantum efficiency of approximately 46.8% is predicted in FIG. 87C, which is higher than the approximately 21% for the planar detector.

Figure 88C:
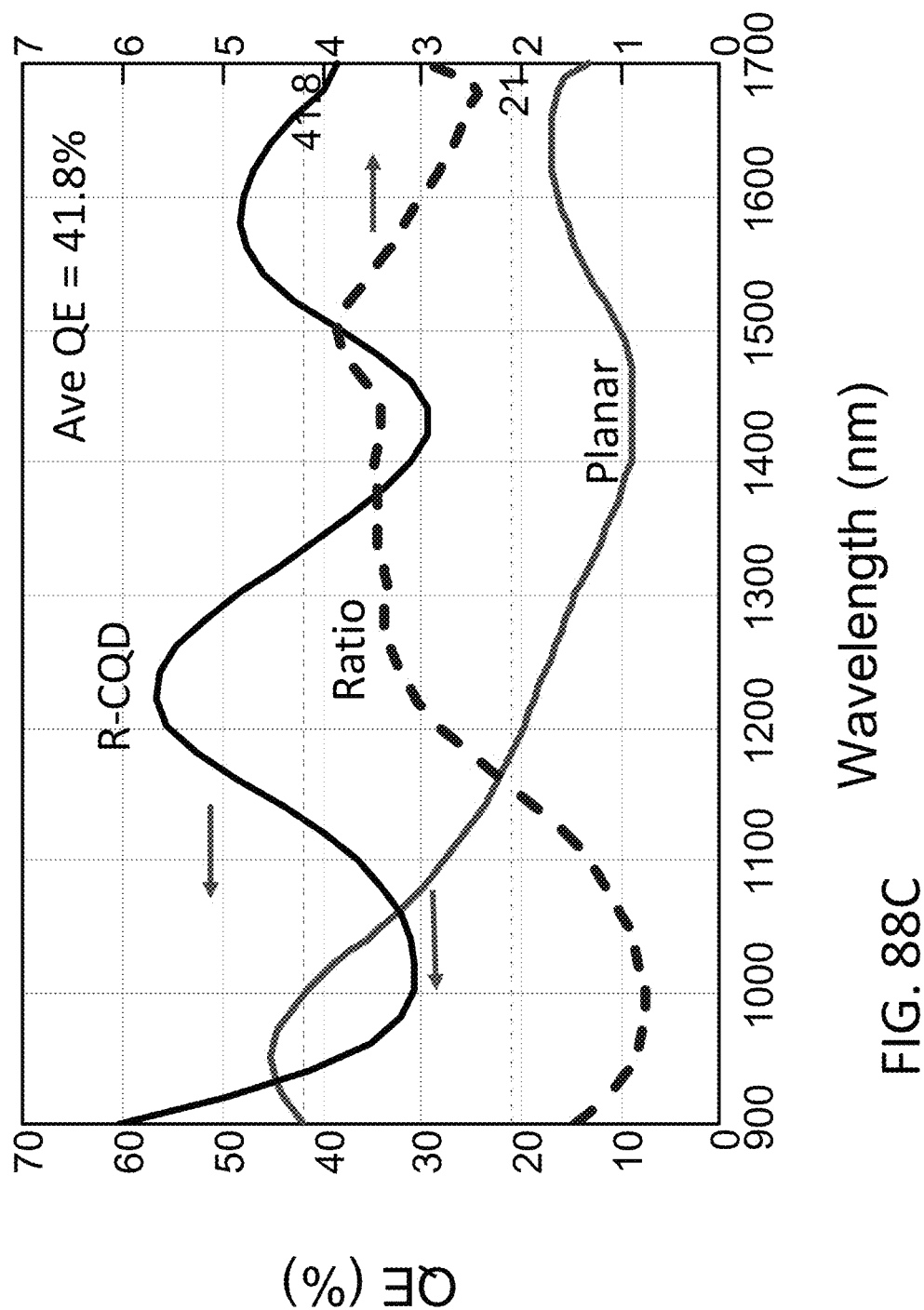

FIGS. 88A and 88B illustrate an alternate construction (without physical sidewalls) of a preferred embodiment of Resonator-Colloidal Quantum Dot (R-CQD) detector array. After a uniform PbS layer 306B is deposited onto the metallic diffractive surface 304B, there is no etching of the PbS layer 306B. Instead, a common layer of material 308B, which may be fullerene C60, for example, is deposited directly on top of the uniform PbS layer. Thereafter, a thin transparent contact layer 310B may be deposited. The thickness of the BCP/InO/AZO film 310B, which is used for protection/encapsulation and for better electrical contact, can be made very thin and the layers 310B do not change significantly the overall thickness. By using a set of 3×3 rings and designing and adopting a PbS layer 306B of 230-nm thick and C60 layer 308B that may be 180-nm thick, an average QE of approximately 41.8% is predicted, as shown in FIG. 88C. The modeled QE is which is slightly lower than that with physical sidewalls. On the other hand, the production process simpler without etching.

By substituting an n-type PbS layer of the same thickness for the C60 layer, a homojunction preferred embodiment Resonant-Colloidal Quantum Dot (R-CQD) detector may be produced. The homojunction detector has the advantage of larger QE because of the thicker combined absorbing layer. The modeled QE of the similar 2.4×2.4 µm² detector with and without sidewalls 55.6% and 51.0%, respectively.

After the PbS colloidal quantum dots absorb light, the collection of the photocarriers at the electrical contact can vary substantially depending on the mobility of photocarriers under further chemical treatment of this layer. Some of the photocarriers may not be able to transverse across the 230 nm thick active layer (as represented by layers 306A and 306B in FIGS. 87B and 88B, respectively) and reach the C60 layer (as represented by layers 308A and 308B in FIGS. 87B and 88B, respectively) in the heterojunction detector. It is advantageous to reduce the thickness of the PbS layer while maintaining the same QE.

In the preferred embodiment resonant detectors, because of resonant accumulation of light, the quantum efficiency is not sensitive to the absorbing layer thickness, provided that the total thickness is substantially the same for resonance. For example, in FIG. 87B, the total thickness of the resonator-detector was determined by computer modeling to be 410 nm, which is shared between 230 nm PbS and 180 nm C60, plus a thin transparent conducting layer. The same total resonant thickness can be maintained if the PbS layer is reduced by x amount while the C60 layer is increased by the same x amount, while keeping the transparent conducting layer the same. The optimum thickness of the PbS layer will be governed by the diffusion length $L_{diff}$ of the photocarriers, which is the average traveling distance of the photocarriers before they recombine with the opposite charges. In general, the PbS optimum thickness should be less than $L_{diff}$.

FIG. 89A is an illustration showing a heterojunction preferred embodiment Resonant-Colloidal Quantum Dot (R-CQD) detector, which may have, for example, a pixel size of 2.4×2.4 µm² with a 3 µm pitch. In this optional detector structure, there may be physical sidewalls in each detector pixel. After a uniform thick PbS layer 306C and a uniform C60 layer 308C are deposited onto the metallic diffractive surface 304C, the PbS layer 306C and the C60 layer 308C are etched into 2.4×2.4 µm² squares and the gaps in between are filled with an insulating dielectric material such as $SiO_2$. Afterward, a common layer 308C of fullerene C60 and a thin transparent contact layer 310C, which may be a BCP/InO/AZO film, are deposited.

A calculated average quantum efficiency of 35.7% resulted from a modelled preferred embodiment resonant CQD detector shown in FIG. 89A, with a 100-nm thick PbS layer (instead of a 230-nm). To maintain the same total thickness of 410 nm, the C60 layer 308C (shown in FIG. 89A) was increased from 180 nm to 310 nm. Note that the average quantum efficiency of 35.7% for the embodiment of FIG. 89B is only reduced mildly from the 46.8% in FIG. 87C, in contrast to the active layer being thinner by 2.3 times. The much thinner detector will ensure the photocarriers are collected in the electrical contact. Similarly, in FIG. 90B, the QE of that without sidewalls is 32.6%, reduced from the 35.7% in FIG. 89B.

The above resonator-CQDs can be made from many different types of material, not necessarily lead sulfide (PbS) or carbon 60 (C60). Lead Selenide and mercury telluride colloidal quantum dots have been used for mid wave and long wave infrared detection.

Colloidal semiconductor nanocrystals are synthesized from solutions, with difference from usual circumstances being that the final product neither precipitates nor remains dissolved. Upon heating the solution to a high temperature, the precursors decompose forming monomers which then nucleate and generate nanocrystals. Temperature must be high enough to allow for rearrangement and annealing of atoms during the synthesis process while it must be low enough to promote crystal growth.

The quantum dot materials for the preferred embodiments shown in FIGS. 85A, 87B, 88B, 89A and 90A can be made of binary compounds, in addition to the lead sulfide and fullerene (C60), such as lead selenide, cadmium selenide, cadmium sulfide, cadmium telluride, indium arsenide, and indium phosphide. Dots may also be made from ternary compounds such as cadmium selenide sulfide. These quantum dots can contain as few as 100 to 100,000 atoms within the quantum dot volume, with a diameter of ~10 to 50 atoms. This corresponds to about 2 to 10 nanometers, and at 10 nm in diameter, nearly 3 million quantum dots could be lined up end to end and fit within the width of a human thumb.

FIG. 90A is an illustration showing the cross-section of a heterojunction R-CQD detector without physical sidewalls and which has a thinner 100-nm PbS CQD layer.

FIG. 90B is an illustration showing the modeled QE of the R-CQD detector in comparison with the 100-nm thick planar detector.

Optimization

As mentioned previously, resonance may be optimized by varying parameters through experimentation by using the intrinsic material optical properties (n, k) as determined by ellipsometry measurements. The rings in 304A, 304B and 304C are used to diffract the incident light at particular angles such that when they make a round trip circuit and go back to the original location, they will be in phase with the newly diffracted light. Both the (n, k) values and the distance traveled in the round trip loop determines the phase. Therefore, one method is to first determine or obtain the (n, k) value, then adjust the rings, the layer thicknesses, and the pixel size until the phase matching condition occurs. The thickness of the various layers are determined by varying the thicknesses in steps in the computer model, which is performed automatically by programming.

In accordance with the principles of one of preferred embodiments and/or methodologies of the invention, although the invention is not limited to any one preferred embodiment or methodology, optimal resonance and optimal quantum efficiency was determined by varying the parameters to achieve optimal quantum efficiency. A computer program may be designed to adjust the structural dimensions within the modeling to run different parameter sweeps automatically to obtain optimized structural parameters. For example, based on a common set of initial parameters of (inner ring diameter, ring height, PbS layer thickness, C60 layer thickness)=(INd, DEt, PBSt, C60t)= (220 nm, 100 nm, 230 nm, 200 nm), each parameter was changed individually while keeping others constant. In the INd parameter sweep, the ratio of outer ring diameter/inner ring diameter was kept to be a constant at 550/220 and the ratio of ring spacing/inner ring diameter to be a constant at 800/220. The upper middle figure shows that when INd changes from 100 nm to 260 nm, the average QE changes from 42.8% to 37.7%, going through a maximum of 51.2% at INd=180 nm. Similarly, the QE of other parameter sweeps are also shown.

As used herein, a "sweep" is conducted by varying one of the parameters while keeping the other parameters constant, one may determine the optimal value for one of the parameters. This is referred to herein as a "sweep." The quantum efficiency for the detector configuration may be determined by computer simulation. Next, another one of the potentially determinative parameters is varied in a second "sweep" while the other parameters are held constant. Subsequently, a third parameter is varied and a third sweep is conducted. The sweeps may be conducted for each parameter. The quantum efficiencies for the detector configuration during the parameter sweeps are determined by computer simulation. An equation that may be used to determine the quantum efficiency is $$\eta = \frac{1}{P_0} \int_V dI(\vec{r}),$$
$$= \frac{n\alpha}{AE_0^2} \int_V |E(\vec{r})|^2 d^3r.$$

where $P_0$ is the incident optical power, I is the internal intensity, $E(r)$ is the total optical electric field under resonance, $E_0$ is the incident optical electric field, and A is the detector area. The embodiment shown in FIG. 87B may, for example, have a pixel area (or pitch) of 3 μm by 3 μm and an absorbing layer thickness of approximately 410 nanometers.

FIGS. 91A through 91E are illustrations showing structural optimization for a 3 μm pitch design. In FIGS. 91A through 91E, based on a common set of initial parameters of (inner ring diameter (INd)=220 nm, ring height (DEt)=100 nm, PbS layer thickness (PBSt)=230 nm, C60 layer thickness (C60t)=200), each parameter was changed individually while keeping the others constant. In the inner ring diameter (INd) parameter sweep (changing of the INd 220 nm parameter), the ratio of outer ring diameter/inner ring diameter ratio was kept constant at 550/220 and the ratio of ring spacing/inner ring diameter constant at 800/220. FIG. 91C shows that when inner ring diameter (INd) changes from 100 nm to 260 nm, the average QE changes from 42.8% to 37.7%, going through a maximum of 51.2% at INd=180 nm. Similarly, the quantum efficiency (QE) of other parameter sweeps are also shown in FIGS. 91C though 91E. In FIG. 91C, the inner diameter varied incrementally from 100 nm (QE=42.8%), 140 nm (QE=46.2%), 180 nm (QE=51.2%), 220 nm (QE=49.2%), to 260 nm (QE=37.7%). The INd parameter sweep, the ratio of outer ring diameter/inner ring diameter was kept at 550/220 and the ratio of ring spacing/ inner ring diameter kept constant at 800/220. FIG. 91D is an illustration showing structural optimization at 3 μm pitch when the thickness of the C60 layer changes from 120 nm (QE=48.1%), 160 nm (QE=48.8%), 200 nm (QE=49.2%), 240 nm (QE=49.2%), the average QE changes from 48.1% to 49.2%, going through a maximum of 49.2% at C60 layer thicknesses of 200 and 240 nanometers. FIG. 91E is an illustration showing structural optimization at 3 μm pitch when the diffractive element (ring) thickness was varied from 70 nm (QE=48.1%), 160 nm (QE=48.8%), 200 nm (QE=49.2%), 240 nm (QE=49.2%), the average QE changes from 48.1% to 49.2%, going through a maximum of 49.2% at C60 layer thicknesses of 200 and 240 nanometers Referring now to FIG. 92A, this figure shows the detector geometry when the inner ring diameter, outer ring diameter, and ring spacing are scaled up proportionally in the inner ring diameter (INd) sweep. The quantum efficiency (QE) maximum is obtained at INd=180 nm. However, the corresponding pixel size is too small for the 3 μm pixel pitch as it leaves a lot of empty space (i.e. a small fill factor). Consequently, when the inner ring diameter (INd) is 220 nm resulting in an average QE of 49.2%, this inner ring diameter is chosen to be the optimum INd value at a 3 um pitch array.

Note that when the initial INd is 220 nm, the other parameters are OUd=440 nm, SPd=800 nm. When INd changes, OUd and SPd change in proportion. Also shown in FIG. 92A is a graph showing the relationship between k and the absorption coefficient α

FIG. 92B is an illustration showing via equations, for the purposes of the graph in FIG. 92A, the relationship between the intensity (I) and the absorption coefficient α and k. In FIG. 92B, I is the intensity in the material, $I_0$ is the incident intensity, x is the traveling distance, E is the electric field, $\varepsilon_0$ is the vacuum permittivity, c is the velocity of light, n is the real part of the complex refractive index, ik is the imaginary part, ω is the angular frequency, K is the complex wave vector.

$$I = I_0 e^{-\alpha \cdot x}$$

$$I = \frac{n\varepsilon_0 c}{2}|E|^2$$

$$= \frac{n\varepsilon_0 c}{2}E_0^2 |e^{i(\omega t - K \cdot x)}|^2$$

$$= \frac{n\varepsilon_0 c}{2}E_0^2 \left|e^{i(\omega t - \frac{2\pi}{\lambda}(n+ik)\cdot x)}\right|^2$$

$$= \frac{n\varepsilon_0 c}{2}E_0^2 \left|e^{i(\omega t - \frac{2\pi n}{\lambda}x)}\right|^2 e^{-\frac{4\pi k}{\lambda}x}$$

$$= \frac{n\varepsilon_0 c}{2}E_0^2 e^{-\frac{4\pi k}{\lambda}x}$$

$$= I_0 e^{-\frac{4\pi k}{\lambda}x}$$

$$\Rightarrow \alpha = \frac{4\pi k}{\lambda}$$

Another parameter to be considered when determining the optimal quantum efficiency is the pitch size. FIG. 93A is a graphical illustration showing a comparison of preferred embodiments where the pitch size is varied between 3 and 4 nanometers. The upper part of the illustration showing a preferred embodiment having a pitch size of 3 nanometers and the upper graph showing quantum efficiency results of a preferred embodiment having a pitch size of 3 nanometers with an average quantum efficiency of 46.8%. The lower part of the illustration shows a preferred embodiment having a pitch size of 4 nanometers with the lower graph showing its quantum efficiency with an average quantum efficiency of 48.0%.

FIG. 93B is a graphical illustration showing, for a preferred embodiment having a pitch size of 3 nanometers without sidewalls wherein the quantum efficiency results are shown with an average quantum efficiency of 41.8%.

The terminology "quantum dots" or "colloidal quantum dot" means, as described in Wikipedia, very small semiconductor particles, only several nanometers in size, so small that their optical and electronic properties differ from those of larger particles. Many types of quantum dot will emit light of specific frequencies if electricity or light is applied to them, and these frequencies can be precisely tuned by changing the dots' size, shape and material, giving rise to many applications. Different sized quantum dots emit different color light due to quantum confinement. Colloidal semiconductor nanocrystals are synthesized from solutions, much like traditional chemical processes. The main difference is the product neither precipitates as a bulk solid nor remains dissolved. Heating the solution at high temperature, the precursors decompose forming monomers which then nucleate and generate nanocrystals. Temperature is a critical factor in determining optimal conditions for the nanocrystal growth. It must be high enough to allow for rearrangement and annealing of atoms during the synthesis process while being low enough to promote crystal growth. The concentration of monomers is another critical factor that has to be stringently controlled during nanocrystal growth. The growth process of nanocrystals can occur in two different regimes, "focusing" and "defocusing". At high monomer concentrations, the critical size (the size where nanocrystals neither grow nor shrink) is relatively small, resulting in growth of nearly all particles. In this regime, smaller particles grow faster than large ones (since larger crystals need more atoms to grow than small crystals) resulting in "focusing" of the size distribution to yield nearly monodisperse particles. The size focusing is optimal when the monomer concentration is kept such that the average nanocrystal size present is always slightly larger than the critical size. Over time, the monomer concentration diminishes, the critical size becomes larger than the average size present, and the distribution "defocuses".

As used herein, the terminology "quantum efficiency" (labeled as QE or η) refers to the (absorption) quantum efficiency with the optimal efficiency being one. In the case of Quantum well photodetectors, absorption takes place only if the electric field vector of the radiation has a component perpendicular to the QW layer planes, which necessitates the angle of incidence with respect to these planes being different from zero. Upon entry into the pixel, scattered radiation is decomposed into transverse electric (TE) polarization with the electric field vector parallel to the QW planes, and transverse magnetic (TM) with the electric field vector orthogonal to this direction (Ez). Only TM polarization (or Ez) leads to quantum well absorption. Being sensitive only to the vertical polarization, Ez, the quantum efficiency (QE) of the detector is dependent on the pixel geometry, apart from its material properties. For any detectors and a given optical power $P_0$ incident normally on a detector area A, the absorption quantum efficiency, labeled as QE or η is $$\eta = \frac{1}{P_0}\int_V dI(\vec{r}),$$

$$= \frac{1}{P_0}\int_V \alpha I(\vec{r}) d^3 r,$$

$$= \frac{\alpha}{A\frac{c\varepsilon_0}{2}E_0^2}\int_V \frac{nc\varepsilon_0}{2}|E_z(\vec{r})|^2 d^3 r,$$

$$= \frac{n\alpha}{AE_0^2}\int_V |E_z(\vec{r})|^2 d^3 r,$$

According to Wikipedia, and as used herein, the term quantum efficiency (QE) means incident photon to converted electron (IPCE) ratio, of a photosensitive device. The term is a measurement of a device's electrical sensitivity to light. In a charge-coupled device (CCD) it is the percentage of photons hitting the device's photoreactive surface that produce charge carriers. It is measured in electrons per photon or amps per watt. Since the energy of a photon is inversely proportional to its wavelength, QE is often measured over a range of different wavelengths to characterize a device's efficiency at each photon energy level. The QE for photons with energy below the band gap is zero.

As used herein, the terminology "photo detection device" includes but is not limited to photo detectors, photosensors, photo transistors, photodiodes, solar cells, and the like. Photo detection devices are sensors of light or other electromagnetic energy and has a p-n junction that converts light photons into current. The absorbed photons make electron-hole pairs in the depletion region.

As used herein, the terminology pixel pitch means the linear spacing allocated to each pixel in a detector array.

As used herein, the terminology mesh means a partition of the geometry model into small units of simple shapes.

As used herein, E represents the vertical optical electric field, as depicted for example in FIG. 47.

As used herein, the terminology "protuberance" means an outward projection of material such as a sharply raised surface, bulge, bump, protrusion or formation extending from the surface.

As used herein the terminology "resonance" when used in conjunction with the light being received into a detector is explained as follows. Since light is an electromagnetic wave, the phases of the reflected wave from the bottom interface, the diffracted waves from other locations and the waves reflected at the pixel sidewalls have to be matched to form a constructive interference pattern inside the active region; i.e., what is referred to herein as resonance. This can be accomplished by, inter alia, selecting a diffractive element pattern, adjusting detector pixel volume thickness and the pixel area. In accordance with the principles of the present invention, when the phase matching condition is reached, the intensity of light will be greatly amplified due to resonance, and the detector (pixel volume) is said to be in resonance with the diffracted light. The pixel volume in this case acts as a resonant cavity. For example, when incident light of a particular λ enters into the detector pixel, it will be diffracted, in the case of a grating at a specific θ, or in the case of a diffractive element or region at multiple angles. The diffracted light rays will reflect at the pixel sidewalls and within the resonant cavity and form an interference pattern. If this interference pattern constitutes to a large integrated intensity, the cavity is said to be in resonance.

As used herein the terminology "diffraction" or "diffractive" means the process by which light or other system of waves is spread out as a result of passing through a narrow aperture or across an edge, which may be accompanied by interference, constructive interference, and/or resonance between (or occurring with) the wave forms produced. As used herein, the terminology "diffractive element" means elements formed in the detector material that diffract light incident normally from the bottom side of the detector back into the detector active volume at large diffracted angles. If the diffracted angles are larger than the critical angle for total internal reflection at the bottom layer/air interface, the light will be reflected at this interface back into the detector material. Since light is an electromagnetic wave, the phases of the reflected wave from the bottom interface, the diffracted waves from other locations and the waves reflected at the pixel sidewalls have to be matched to form a constructive interference pattern inside the active region; i.e., what is referred to herein as resonance. By adjusting the diffractive element patterns, adjusting the detector pixel volume thickness and the pixel area, when the phase matching condition is reached, the intensity of light will be greatly amplified, and the pixel volume is said to be in resonance with the diffracted light. The pixel volume, in conjunction with the diffractive element, acts as a resonant cavity. With a greatly increased light intensity, a large quantum efficiency (QE) can be achieved. The terminology "diffractive" as it relates to diffractive optical elements or regions may include phase elements that operate by means of interference and diffraction to produce distributions of light that may, inter alia, produce enhanced optical efficiency.

As used herein, the terminology "absorbing region" and absorption region, absorbing layer and absorption layer have the same or similar meaning. Absorption of electromagnetic radiation, as discussed in Wikipedia, is the way in which the energy of a photon is taken up by matter, typically the electrons of an atom. Thus, the electromagnetic energy is transformed into internal energy of the absorber, for example thermal energy. The reduction in intensity of a light wave propagating through a medium by absorption of a part of its photons is often called attenuation. Usually, the absorption of waves does not depend on their intensity (linear absorption), although in certain conditions (usually, in optics), the medium changes its transparency dependently on the intensity of waves going through, and saturable absorption (or nonlinear absorption) occurs.

As used herein the terminology "computer" means numerical computing device.

As used herein the terminology "absorption coefficient" means—a measure of the rate of decrease in the intensity of electromagnetic radiation (in the form of light) as it passes through the selected material; the fraction of incident radiant energy absorbed per unit mass or thickness of an absorber material.

As used herein, the terminology "eigenfunction" of a system is the signal f(t) which when input into the system, produces a response y(t)=λf(t) with the complex constant λ For example, for solutions in the form of $\Psi=A_n e^{ik_n z}+B_n e^{-ik_n z}$ where $A_n$ and $B_n$ are the eigen functions and $k_n$ the eigen values.

As used herein the terminology "angle for total internal reflection" or "total internal reflection" occurs when a light wave strikes a boundary at an angle larger than a critical angle with respect to the normal to the surface. When the refractive index is lower on the other side of the boundary and the incident angle is greater than the critical angle, the light wave does not pass through and is entirely reflected. The critical angle is the angle of incidence above which the total internal reflection occurs.

Although various preferred embodiments of the present invention have been described herein in detail to provide for complete and clear disclosure, it will be appreciated by those skilled in the art, that variations may be made thereto without departing from the spirit of the invention.

It should be emphasized that the above-described embodiments are merely possible examples of implementations. Many variations and modifications may be made to the above-described embodiments. All such modifications and variations are intended to be included herein within the scope of the disclosure and protected by the following claims.

The invention claimed is:

1. A photo detection device comprising:
a contact layer through which light enters;
an absorbing region positioned such that light admitted through the contact layer passes into the absorbing region;
at least one diffractive element operatively associated with the absorbing region operating to diffract light into the absorbing region; the configuration of the at least one diffractive element being determined by computer simulation to determine an optimal diffractive element and absorbing region configuration for optimal quantum efficiency for at least one predetermined wavelength detection range, the at least one diffractive element operating to diffract light entering through the contact layer such that phases of diffracted waves from locations within the photo detection device or waves reflected by sidewalls and waves reflected by the at least one diffractive element form a constructive interference pattern inside the absorbing region.

2. The photo detection device of claim 1 for detection of quantum dots; and wherein the quantum dots comprise as few as 100 to 100,000 atoms within the quantum dot volume, with a diameter of approximately 10 to 50 atoms.

3. The photo detection device of claim 1 wherein the absorbing region comprises at least one of lead sulfide, fullerene (C60), lead selenide, cadmium selenide, cadmium sulfide, cadmium telluride, indium arsenide, indium phosphide, cadmium selenide sulfide.

4. The photo detection device of claim 1 wherein the at least one diffractive element is positioned such that light is reflected back into the absorbing region and wherein a resonant cavity is formed in the photo detection device.

5. The photo detection device of claim 1 wherein the absorbing region comprises sidewalls and wherein light diffracted from the at least one diffractive element strikes the sidewalls at an incident angle larger than the critical angle for total internal reflection.

6. The photo detection device of claim 1 further comprising a reflective layer positioned such that light is reflected back into the absorbing region such that a resonant cavity is formed in the photo detection device; and wherein resonance is achieved through experimentation by using the intrinsic material optical properties as determined by ellipsometry measurements.

7. The photo detection device of claim 1 wherein the absorbing region comprises a plurality of quantum dots for receiving light and wherein the at least one diffractive element is positioned within the photo detection device in accordance with resonant field patterns developed by computer simulation.

8. The photo detection device of claim 1 wherein the at least one diffractive element has a configuration determined by design parameters and wherein the design parameters are varied individually to determine the optimal configuration, and wherein the absorbing region comprises p-type layer having a first thickness parameter and an n-type layer having a second thickness parameter and wherein the design parameters and first and second thicknesses are changed individually while keeping the other parameters constant, and wherein computer simulation is performed in order to determine and compare the quantum efficiency for each parameter.

9. The photo detection device of claim 1 comprising a plurality of pixels having sidewalls and wherein the phases of the reflected waves from the contact layer, the diffracted waves from the at least one diffractive element and the waves reflected from the sidewalls form a constructive interference pattern inside the absorbing region and wherein the determination of the at least one optimal diffractive element and absorbing region configuration comprises selecting at least one diffractive element pattern, adjusting detector pixel volume thickness and the pixel area.

10. The photo detection device of claim 1 comprising a plurality of regions defined by sidewalls and wherein incident light of a plurality of wavelength ranges entering between the sidewalls and diffracted at multiple angles is reflected by the sidewalls to form a constructive interference pattern, and wherein detection of a plurality of wavelengths is achieved through different orders of diffraction in a single common resonant volume between the sidewalls.

11. The photo detection device of claim 10 wherein the regions are the size of quantum dots and wherein the absorbing region is formed by a p-type and n-type material constructed to produce carriers in response to quantum dot radiation.

12. The photo detection device of claim 1 wherein the absorbing layer comprises multiple layers of quantum dot responsive semi-conductor material; and wherein the at least one diffractive element comprises three-dimensional reflection surfaces constructed to spread the incident light in a plurality of different directions back into the absorbing layer to optimize quantum well absorption of the incident light.

13. A photo detection device comprising:
a contact layer through which light enters;
an absorbing region positioned such that light admitted through the contact layer passes into the absorbing region;
at least one diffractive element comprising at least one protuberance operatively associated with the absorbing region operating to diffract light into the absorbing region; the configuration of the photo detection device being determined by computer simulation to determine at least one optimal diffractive element and absorbing region configuration for optimal quantum efficiency for at least one predetermined wavelength range, the at least one diffractive element operating to diffract light entering through the contact layer such that phases of diffracted waves from locations within the photodetector including waves reflected by sidewalls and waves reflected by the at least one diffractive element form a constructive interference pattern inside the absorbing-region that produces resonance and increases the quantum efficiency.

14. The photo detection device of claim 13 wherein the absorbing region comprises at least one of lead sulfide, fullerene (C60), lead selenide, cadmium selenide, cadmium sulfide, cadmium telluride, indium arsenide, indium phosphide, cadmium selenide sulfide.

15. The photo detection device of claim 13 wherein the configuration of the photo detection device comprises a plurality of reflective walls, the configuration of plurality of the reflective walls within the absorbing region being determined using computer simulation to determine optimal diffraction occurring when light entering the contact layer is diffracted such that the phrase of the diffracted wave at one location and the phrases of waves returning back to the same location, by reflection and diffraction, from all other locations within the detector volume form a constructive interference pattern inside the active region to thereby achieve resonance.

16. The photo detection device of claim 13 wherein the absorbing region is formed of at least one material n-type and p-type material and wherein the configuration of the diffractive element is determined by three-dimensional computer simulation that operates to simulate the light absorption within the photodetector; the computer simulation comprising the steps of:
inputting the composition of the at least one material;
inputting the configuration of the absorption region and the diffractive element;
calculating the electromagnetic field distributions using the three-dimensional computer simulation;
calculating the eigen functions and energies of the at least one material;
using three-dimensional computer simulation, changing the size and shape of the diffractive element such that a different set of eigen modes are created and the excitation of these eigen modes, and their superpositions if they are degenerate, by the incident light determine the detector quantum efficiency spectrum which is used to calculate the quantum efficiency of the detector configuration geometry; whereby the configuration geometry is selected based on the three-dimensional computer simulation.

\* \* \* \* \*

UNITED STATES PATENT AND TRADEMARK OFFICE
CERTIFICATE OF CORRECTION

PATENT NO. : 11,049,985 B2  
APPLICATION NO. : 15/856632  
DATED : June 29, 2021  
INVENTOR(S) : Choi et al.

Page 1 of 1

It is certified that error appears in the above-identified patent and that said Letters Patent is hereby corrected as shown below:

On the Title Page

Item (12), delete "Choi" and insert --Choi et al.--.

Item (72), Inventor(s) should be corrected to read:  
Kwong-Kit Choi, Brookeville, MD (US);  
Dorota Temple, Cary, NC (US)  
Ethan Kelm, Chapel Hill, NC (US)

Signed and Sealed this  
Eighteenth Day of October, 2022

Katherine Kelly Vidal  
*Director of the United States Patent and Trademark Office*